US012684754B2

(12) United States Patent
Hwang et al.

(10) Patent No.: US 12,684,754 B2
(45) Date of Patent: Jul. 14, 2026

(54) CAPACITORLESS 3D DRAM DEVICE AND MANUFACTURING METHOD THEREOF

(71) Applicant: SEOUL NATIONAL UNIVERSITY R&DB FOUNDATION, Seoul (KR)

(72) Inventors: Cheol Seong Hwang, Seoul (KR); Sun Jin Lee, Seoul (KR); Seo Young Jang, Gyeonggi-do (KR)

(73) Assignee: Seoul National University R&DB foundation, Seoul (KR)

( * ) Notice: Subject to any disclaimer, the term of this patent is extended or adjusted under 35 U.S.C. 154(b) by 414 days.

(21) Appl. No.: 18/577,057

(22) PCT Filed: Oct. 23, 2023

(86) PCT No.: PCT/KR2023/016497

§ 371 (c)(1),
(2) Date: Jan. 5, 2024

(87) PCT Pub. No.: WO2025/023375

PCT Pub. Date: Jan. 30, 2025

(65) Prior Publication Data

US 2025/0098140 A1     Mar. 20, 2025

(30) Foreign Application Priority Data

Jul. 26, 2023   (KR) ........................ 10-2023-0097422
Jul. 26, 2023   (KR) ........................ 10-2023-0097439

(51) Int. Cl.
*H10B 12/00*        (2023.01)
(52) U.S. Cl.
CPC .................................... *H10B 12/00* (2023.02)

(58) Field of Classification Search
None
See application file for complete search history.

(56) References Cited

U.S. PATENT DOCUMENTS

| | | | |
|---|---|---|---|
| 2006/0044870 A1 | 3/2006 | Bhattacharyya et al. | |
| 2021/0159231 A1* | 5/2021 | Lee ........................ | G11C 11/405 |
| 2021/0375867 A1 | 12/2021 | Chiang et al. | |
| 2022/0392901 A1 | 12/2022 | Liu et al. | |
| 2023/0081882 A1 | 3/2023 | Ma et al. | |

(Continued)

FOREIGN PATENT DOCUMENTS

| | | |
|---|---|---|
| KR | 10-2021-0063111 | 6/2021 |
| KR | 10-2022-0005866 | 1/2022 |

(Continued)

OTHER PUBLICATIONS

International Search Report mailed Apr. 9, 2024 for PCT/KR2023/016497.

*Primary Examiner* — Michelle Mandala

(57) ABSTRACT

The present disclosure discloses a capacitorless 3D DRAM device including a write bit line extending in a vertical direction, a write word line extending in a horizontal direction, a write transistor connected to the write bit line and the write word line, and defined to include a first channel material layer, a first gate insulating layer, and a portion of the write word line, a read bit line extending in the vertical direction, a read word line extending in the horizontal direction, and a read transistor connected to the read bit line and the read word line.

44 Claims, 94 Drawing Sheets

(56)                    References Cited

U.S. PATENT DOCUMENTS

| | | | |
|---|---|---|---|
| 2023/0138620 A1* | 5/2023 | Liu | H10B 41/20 |
| | | | 257/315 |
| 2023/0146353 A1* | 5/2023 | Or-Bach | G11C 11/005 |
| | | | 257/324 |
| 2024/0074137 A1* | 2/2024 | Kao | H10B 12/00 |

FOREIGN PATENT DOCUMENTS

| | | |
|---|---|---|
| KR | 10-2022-0047047 | 4/2022 |
| KR | 10-2022-0049866 | 4/2022 |
| KR | 10-2022-0091366 | 6/2022 |

* cited by examiner (top-view)

X (top-view)

Y (top-view)

(top-view)

(top-view)

(Z-cut)

(Z-cut)

CAPACITORLESS 3D DRAM DEVICE AND MANUFACTURING METHOD THEREOF

This application claims the priority of Korean Patent Application No. 10-2023-0097422, filed on Jul. 26, 2023, and 10-2023-0097439, filed on Jul. 26, 2023 in the KIPO (Korean Intellectual Property Office), the disclosure of which is incorporated herein entirely by reference. Further, this application is the National Stage application of International Application No. PCT/KR2023/016497, filed on Oct. 23, 2023, which designates the United States and was published in Korean. Each of these applications is hereby incorporated by reference in their entirety into the present application.

TECHNICAL FIELD

The present invention relates to semiconductor/electronic devices and manufacturing methods thereof, and more particularly, to memory devices and manufacturing methods thereof.

BACKGROUND ART

There is a continuous need to increase the performance of semiconductor devices and the degree of integration of semiconductor devices. The technology for arranging the unit cells of semiconductor devices two-dimensionally, that is, in a planar manner, is reaching its limit in increasing the degree of integration of semiconductor devices. Accordingly, the attempts are being made to develop technologies that greatly increase the degree of integration of semiconductor devices by three-dimensionally integrating the unit cells of the semiconductor devices. In this regard, the attempts to increase the integration degree of memory devices such as NAND devices or DRAM devices are being attempted in various forms. Furthermore, research and development are continuously being conducted to improve the performance and operating characteristics of memory devices.

Recently, DRAM with a 2T0C (two transistor zero capacitor) cell structure has been proposed as a new DRAM structure. 2T0C DRAM has the advantages that it may use a gate capacitance of a read transistor as a storage element, has a long data retention time, and form a cell with only a plurality of transistors without a capacitor.

However, since the existing 2T0C DRAM devices have a structure in which two types of word lines and two types of bit lines extend in the horizontal direction and are disconnected between cells in the vertical direction, it is difficult to stack and integrate them three-dimensionally. That is, as the first word line and the first bit line are arranged to be orthogonal to each other while extending in the horizontal direction, and similarly, the second word line and the second bit line are arranged to be orthogonal to each other while extending in the horizontal direction, there are problems that the cells are disconnected in the vertical direction, it is difficult to perform the manufacturing processes, and mass production impossible when the cells are stacked in a three-dimensional manner.

DISCLOSURE OF THE INVENTION

Technical Problem

The technological object to be achieved by the present invention is to provide a capacitorless three-dimensional dynamic random access memory (DRAM) device which may significantly improve degree of integration three-dimensionally, ensure excellent performance, and facilitate the manufacturing processes.

In addition, the technological object to be achieved by the present invention is to provide a capacitorless 3D DRAM device which may reduce the unit cell size.

In addition, the technological object to be achieved by the present invention is to provide a manufacturing method of the capacitorless 3D DRAM device described above.

The object to be achieved by the present invention is not limited to the objects mentioned above, and other objects not mentioned will be understood by those skilled in the art from the description below.

Technical Solution

According to one embodiment of the present invention, there is provided a manufacturing method of a capacitorless 3D DRAM device comprising: forming a stack unit including a stack portion including an insulating material layer, and a first channel material layer, a first gate insulating layer, an intermediate layer, a buffer layer, a separation layer which are sequentially stacked on the insulating material layer; forming a patterned stack having a plurality of pattern portions by patterning the stack unit, wherein the plurality of pattern portions extend in the first direction and are spaced apart from each other in a second direction orthogonal to the first direction; forming a structure including the patterned stack and a filling material by filling the filling material between the plurality of pattern portions; forming a first vertical hole penetrating through each of the plurality of pattern portions in a vertical direction in the structure; forming a first recess exposing the first gate insulating layer and the buffer layer by recessing the intermediate layer and the filling material around the first vertical hole of the structure; defining a write transistor including the first channel material layer, the first gate insulating layer, and a portion of a write word line by forming the write word line extending in the horizontal direction in the first recess; forming a write bit line extending in a vertical direction at a position corresponding to the first vertical hole; forming a second vertical hole penetrating through each of the plurality of pattern portions in a vertical direction in the structure; forming a second recess exposing the first gate insulating layer and the buffer layer by recessing the intermediate layer and the filling material around the second vertical hole of the structure; forming a third recess by recessing the first channel material layer and the first gate insulating layer exposed by the second vertical hole; forming a second gate insulating layer on an inner surface of the second vertical hole including surfaces of the second and third recesses; forming an electrode member filling an end region of the second recess on an area of the second gate insulating layer formed in the second recess; forming a second channel material layer on the second gate insulating layer and the electrode member exposed on the inner surface of the second vertical hole; defining a read transistor including a second channel layer pattern and the second gate insulating layer by defining a read word line extending in a horizontal direction from the electrode member and defining the second channel layer pattern from the second channel material layer by separating each of the electrode member and the second channel material layer; and forming a read bit line extending in a vertical direction at a position corresponding to the second vertical hole.

The intermediate layer may include a silicon nitride, the buffer layer may include a silicon, and the separation layer may include a silicon oxide.

In the forming the first recess, a plurality of first recesses may be connected in the second direction.

The defining the write transistor may include forming a write word line material layer inside the first recess and on an inner surface of the first vertical hole; removing a portion formed on the inner surface of the first vertical hole from the write word line material layer; and forming a first filling insulating layer which fills the first vertical hole.

The defining the write transistor may further include defining the write word line separated from the write word line material layer by forming a first etched portion crossing a central portion of the write word line material layer, and a central portion of the first filling insulating layer in the second direction; and forming a first gap fill insulating layer which fills the first etched portion.

The forming the write bit line may include forming a first through hole by etching the first filling insulating layer and the first gap fill insulating layer at a position corresponding to the first vertical hole of the structure; and forming the write bit line in the first through hole.

In the forming the second recess, a plurality of second recesses may be connected in the second direction.

The forming the electrode member may include forming an electrode material layer filling the end region of the second recess on the second gate insulating layer; and removing a remaining portion of the electrode material layer except for a portion disposed at the end region of the second recess by using a wet etching method.

After the forming the second channel material layer, the above method may further include removing portions formed on side surfaces of the separation layer and the buffer layer from the second channel material layer and the second gate insulating layer formed on the inner surface of the second vertical hole; forming a second filling insulating layer on the second channel material layer to fill the second and third recesses and the second vertical hole; forming a second through hole at a position corresponding to the second vertical hole in the second filling insulating layer; recessing the buffer layer, the second gate insulating layer, and the second channel material layer exposed by the second through hole; removing a portion formed on a side surface of the insulating material layer from the second channel material layer by forming a third through hole having a larger size than that of the second through hole at a position corresponding to the second through hole; and forming a third filling insulating layer to fill the third through hole.

After the forming the third filling insulating layer, the above method may further include defining the read word line separated from the electrode member and the second channel layer pattern separated from the second channel material layer by forming a second etched portion crossing the central portion of the electrode member, the central portion of the second channel material layer, and central portions of the second and third filled insulating layers in the second direction; and forming a second gap fill insulating layer which fills the second etched portion.

The forming the read bit line may include forming a fourth through hole by etching the third filling insulating layer and the second gap fill insulating layer at a position corresponding to the second vertical hole of the structure; and forming the read bit line in the fourth through hole.

The stack portion may be an upper stack portion, and the first channel material layer, the first gate insulating layer, the intermediate layer, the buffer layer, and the separation layer may be an upper first channel material layer, an upper first gate insulating layer, and an upper intermediate layer, an upper buffer layer and an upper separation layer, respectively and the stack unit may further include a lower stack portion disposed below the insulating material layer, and the lower stack portion may be a lower separation layer, a lower buffer layer, a lower intermediate layer, a lower first gate insulating layer, and a lower first channel material layer which are sequentially stacked from below.

The write transistor may be an upper write transistor, the read transistor may be an upper read transistor, and the upper write transistor and the upper read transistor may constitute an upper memory cell.

A lower memory cell having a structure in which the upper memory cell is upside down may be formed under the insulating material layer, and the lower memory cell may include a lower write transistor having a structure in which the upper write transistor is upside down, and a lower read transistor having a structure in which the upper read transistor is upside down.

According to another embodiment of the present invention, there is provided a capacitorless three-dimensional DRAM device comprising: a write bit line extending in a vertical direction; a write word line extending in a horizontal direction; a write transistor connected to the write bit line and the write word line, and defined to include a first channel material layer, a first gate insulating layer, and a portion of the write word line; a read bit line extending in the vertical direction; a read word line extending in the horizontal direction; a read transistor connected to the read bit line and the read word line, and defined to include a second channel layer pattern including a first portion which is disposed to be adjacent to the read bit line and extends in a horizontal direction, and a second portion which is spaced apart from the read bit line and extends in a direction having a given angle with respect to the first portion, and a second gate insulating layer.

The first portion of the second channel layer pattern may be in contact with the read bit line, and the second portion of the second channel layer pattern may extend in a vertical direction from an edge region of the first portion and may be spaced apart from the read bit line and may be configured to partially surround the read bit line.

The second portion may have a concave shape with respect to the read bit line.

The read word line may be arranged to surround a portion of an outer surface of the second portion between the second gate insulating layer and the second channel layer pattern.

The second gate insulating layer may be disposed between the first channel material layer and the second channel layer pattern and may have a structure surrounding the read word line, and one end portion of the second gate insulating layer may be in contact with an end portion of the second portion.

The read word line may have a structure in which arc-shaped electrode units are connected in series.

The write word line may have a structure in which arc-shaped electrode units are connected in series.

The write word line may be disposed between the write bit line and the read word line, and the read word line may be disposed between the write word line and the read bit line.

The write bit line may be shared by two adjacent memory cells on both sides of it, and the read bit line may be shared by two adjacent memory cells on both sides of it.

The write transistor may be an upper write transistor, the read transistor may be an upper read transistor, and the upper write transistor and the upper read transistor may form an upper memory cell.

A lower memory cell having a structure in which the upper memory cell is upside down may be disposed below the upper memory cell, and the lower memory cell may include a lower write transistor having a structure in which the upper write transistor is upside down, and a lower read transistor having a structure in which the upper read transistor is upside down.

According to another embodiment of the present invention, there is provided a manufacturing method of capacitorless 3D DRAM comprising: forming a stack having a stacked structure including a separation layer, and a first channel material layer, a first gate insulating layer, a first insulating layer, a second insulating layer, and a buffer layer which are sequentially stacked on the separation layer; forming a patterned stack including a plurality of pattern portions and first and second pattern extension portions extending in a direction connecting the plurality of pattern portions by patterning the stack, wherein the plurality of pattern portions extend in a first direction, and are spaced apart from each other in a second direction orthogonal to the first direction, and the first and second pattern extension portions extend in the second direction; a first structure including the patterned stack and a first filling material by filling the first filling material between the plurality of pattern portions and between the first and second pattern extension portions; forming a first vertical hole penetrating through each of the plurality of pattern portions in a vertical direction in the first structure; forming a first horizontal hole by removing the first insulating layer from the first pattern extension portion while forming a first recess by recessing the first insulating layer around the first vertical hole of the first structure; defining a write transistor including the first channel material layer, the first gate insulating layer, and a portion of a write word line by forming the write word line extending in a horizontal direction in the first recess and the first horizontal hole; removing the first filling material from the first structure and removing a portion of the first channel material layer from the first and second pattern extension portions; forming a second structure including the plurality of pattern portions, the first and second pattern extension portions, and a second filling material by filling the second filling material between the plurality of pattern portions where the write transistor is defined, and between the first and second pattern extension portions; forming a write bit line extending in a vertical direction at a position corresponding to the first vertical hole; forming a second vertical hole penetrating through each of the plurality of pattern portions in a vertical direction in the second structure; forming a second horizontal hole by removing the second insulating layer from the second pattern extension portion while forming a second recess by recessing the second insulating layer around the second vertical hole of the second structure; forming a third recess by recessing the first insulating layer, the first gate insulating layer, and the first channel material layer exposed by the second vertical hole; forming a second gate insulating layer on an inner surface of the second vertical hole including surfaces of the second and third recesses, and an inner surface of the second horizontal hole; forming a read word line extending in a horizontal direction on the second gate insulating layer in the second recess and the second horizontal hole; forming a second channel material layer on the second gate insulating layer and the read word line exposed on the inner surface of the second vertical hole; defining a read transistor including a second channel layer pattern and the second gate insulating layer by defining the second channel layer pattern from the second channel material layer; and forming a read bit line extending in a vertical direction at a position corresponding to the second vertical hole.

The first insulating layer may include a silicon nitride, the second insulating layer may include a silicon oxide, and the buffer layer may include silicon.

The separation layer may include a silicon oxide having a first density, and the second insulating layer may include a silicon oxide having a second density less than the first density.

The defining the write transistor may include forming a write word line material layer inside the first recess and the first horizontal hole and an inner surface of the first vertical hole; removing a portion formed on the inner surface of the first vertical hole from the write word line material layer; and forming a first filling insulating layer which fills the first vertical hole.

After the removing a portion formed on the inner surface of the first vertical hole from the write word line material layer, the above method according to the present invention may further include recessing a portion of the buffer layer exposed by the first vertical hole.

The forming the write bit line may include forming a first through hole by etching the first filling insulating layer at a position corresponding to the first vertical hole of the second structure; and forming the write bit line in the first through hole.

The forming the read word line may include forming an electrode material layer filling the second recess and the second horizontal hole on the second gate insulating layer; and removing a remaining portion except for a portion disposed in the second recess and the second horizontal hole of the electrode material layer.

After the forming the second channel material layer, the above method may further include forming a second filling insulating layer on the second channel material layer to fill the third recess and the second vertical hole; forming a second through hole in a position corresponding to the second vertical hole in the second filling insulating layer; recessing the buffer layer and the second channel material layer exposed by the second through hole; and forming a third filling insulating layer which fills the second through hole.

The forming the read bit line may include forming a third through hole by etching the third filling insulating layer or the second and the third filling insulating layers at a position corresponding to the second vertical hole of the second structure; and forming the read bit line in the third through hole.

A portion of the first insulating layer may remain between the first channel material layer of the write transistor and the read word line connected to the read transistor.

The stack may include a structure in which the stacked structures are repeatedly stacked, a plurality of write transistors corresponding to the write transistor may be stacked while being spaced apart from each other in the vertical direction, a plurality of read transistors corresponding to the read transistor may be stacked to be spaced apart from each other in the vertical direction, the write bit line may be commonly connected to a plurality of write transistors spaced apart from each other in the vertical direction, and the read bit line may be commonly connected to a plurality of read transistors spaced apart from each other in the vertical direction.

According to another embodiment of the present invention, there is provided a capacitorless 3D DRAM device comprising: a write bit line extending in a vertical direction; a write word line extending in a horizontal direction; a write transistor connected to the write bit line and the write word line, and defined to include a first channel material layer, a first gate insulating layer, and a portion of the write word line; a read bit line extending in a vertical direction; a read word line extending in a horizontal direction; and a read transistor connected to the read bit line and the read word line, and defined to include a second channel layer pattern and a second gate insulating layer; and wherein the write transistor and the read transistor constitute one memory cell, and the write word line and the read word line connected to the one memory cell are arranged at different heights.

The read word line may be disposed at a higher position than the write word line.

The write word line may include a line-type extension portion extending as a line shape in a direction perpendicular to a direction connecting the write transistor and the read transistor; and a protruding-type expansion portion which protrudes and expands from the line-type extension portion in a direction parallel to a direction connecting the write transistor and the read transistor.

The read word line includes a line-type extension portion extending in a line shape in a direction perpendicular to a direction connecting the write transistor and the read transistor; and a protruding-type expansion portion which protrudes and expands from the line-type extension portion part in a direction parallel to a direction connecting the write transistor and the read transistor.

A first insulating layer pattern may be disposed between the first channel material layer of the write transistor and the read word line connected to the read transistor, and between the first gate insulating layer and the second gate insulating layer.

The first insulating layer may be in contact with a side surface of the write word line and thus, may be disposed at the same height as the write word line.

The second channel layer pattern may include a first portion connected to the read bit line and extending in a horizontal direction; and a second portion extending in a direction having a given angle with respect to the first portion.

A plurality of write transistors corresponding to the write transistor may be stacked vertically spaced apart from each other, a plurality of read transistors corresponding to the read transistor may be stacked vertically spaced apart from each other, and the write bit line may be vertically spaced apart from each other. The write bit line may be commonly connected to a plurality of write transistors spaced apart from each other in the vertical direction, and the read bit line may be commonly connected to a plurality of read transistors spaced apart from each other in the vertical direction.

Advantageous Effects

According to embodiments of the present invention, a capacitorless 3D DRAM device which may significantly improve degree of integration three-dimensionally, secure excellent performance, reduce unit cell size, and facilitate the manufacturing process may be implemented. In particular, since the capacitorless 3D DRAM device according to an embodiment of the present invention has a structure in which the write bit line and the read bit line extend in the vertical direction, and the write word line and the read word line extend in the horizontal direction, it may be easy to manufacture a three-dimensional stacked structure in which the cells are connected to the vertical direction. According to this embodiment of the present invention, highly integrated and high-capacity devices may be easily manufactured, and mass production is possible. Furthermore, the size of the unit cell (i.e., a unit memory area) may be reduced by allowing two adjacent memory cells to share a write bit line and in addition, two adjacent memory cells to share a read bit line. According to one example, the 3D DRAM device may be a 2T0C type DRAM device or may be configured to include it.

According to embodiments of the present invention, it is possible to implement a capacitorless 3D DRAM device which can significantly improve the degree of integration three-dimensionally, secure excellent performance, and facilitate the manufacturing process. In particular, since the capacitorless 3D DRAM device according to an embodiment of the present invention has a structure in which the write bit line and the read bit line extend in the vertical direction, and the write word line and the read word line extend in the horizontal direction, it may be easy to manufacture a three-dimensional stacked structure in which the cells are connected in the vertical direction. According to this embodiment of the present invention, highly integrated and high-capacity devices can be easily manufactured, and mass production is possible. According to one example, the 3D DRAM device may be a 2T0C type DRAM device or may be configured to include it.

In addition, according to an embodiment of the present invention, a write word line and a read word line extending in the horizontal direction may be easily formed by forming a line-type extension portion across a cell separator (filling material) by using a layout. In addition, according to an embodiment of the present invention, the coupling phenomenon may be prevented between a first channel material layer and a read word line by disposing a first insulating layer pattern between the first channel material layer of a write transistor and the read word line connected to a read transistor.

However, the effects of the present invention are not limited to the above effects and may be expanded in various ways without departing from the technological spirit and scope of the present invention.

BRIEF DESCRIPTION OF THE DRAWINGS

FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A and 34A are cross-sectional diagrams for explaining an example of a manufacturing method of a capacitorless three-dimensional dynamic random access memory (DRAM) device according to an embodiment of the present invention.

FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, 30B, 31B, 32B, 33B and 34B are diagrams for explaining an example of a manufacturing method of a capacitorless 3D DRAM device according to an embodiment of the present invention.

FIGS. 1C, 2C, 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, 29C, 30C, 31C, 32C, 33C and 34C are cross-sectional diagrams for explaining an example of a manufacturing method of a capacitorless 3D DRAM device according to an embodiment of the present invention.

FIG. 35 to FIG. 37 are diagrams for explaining an example of a capacitorless 3D DRAM device according to an embodiment of the present invention.

FIGS. 38A, 39A, 40A, 41A, 42A, 43A, 44A, 45A, 46A, 47A, 48A, 49A, 50A, 51A, 52A, 53A, 54A, 55A, 56A, 57A, 58A, 59A and 60A are cross-sectional diagrams for explaining an example of a manufacturing method of a capacitorless three-dimensional dynamic random access memory (DRAM) device according to an embodiment of the present invention.

FIGS. 38B, 39B, 40B, 41B, 42B, 43B, 44B, 45B, 46B, 47B, 48B, 49B, 50B, 51B, 52B, 53B, 54B, 55B, 56B, 57B, 58B, 59B and 60B are cross-sectional diagrams for explaining an example of a manufacturing method of a capacitorless 3D DRAM device according to an embodiment of the present invention.

FIGS. 38C, 39C, 40C, 41C, 42C, 43C, 44C, 45C, 46C, 47C, 48C, 49C, 50C, 51C, 52C, 53C, 54C, 55C, 56C, 57C, 58C, 59C and 60C are cross-sectional diagrams for explaining an example of a manufacturing method of a capacitorless 3D DRAM device according to an embodiment of the present invention.

FIG. 61 to FIG. 64 are diagrams for explaining an example of a capacitorless 3D DRAM device according to an embodiment of the present invention.

BEST MODE FOR CARRYING OUT THE INVENTION

Figure 1A:
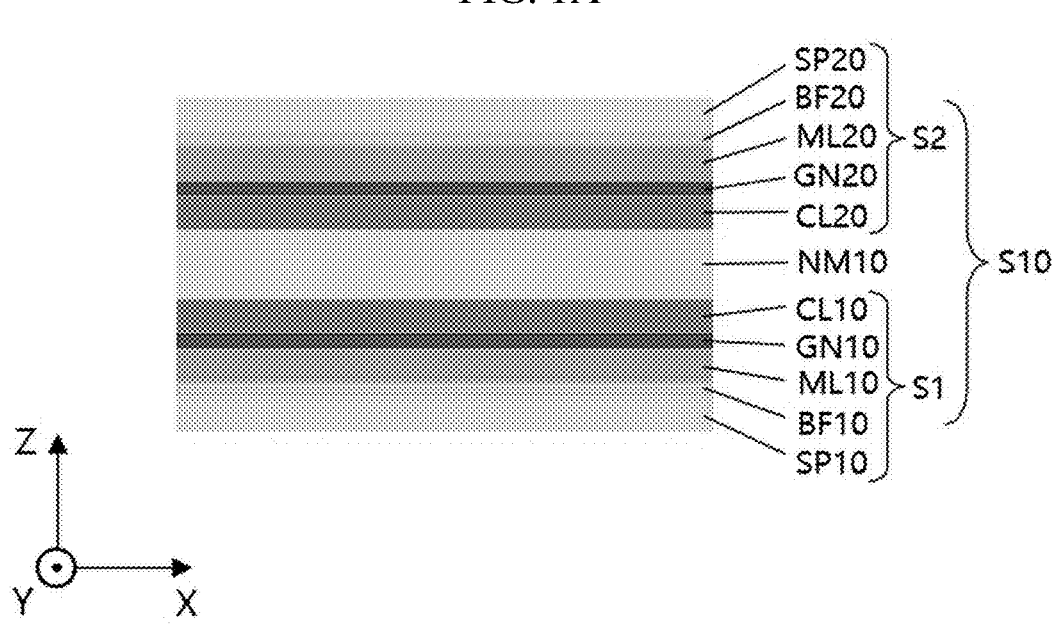

Hereinafter, the embodiments of the present invention will be described in detail with reference to the accompanying drawings.

The embodiments of the present invention to be described below are provided to more clearly explain the present invention to those skilled in the art, and the scope of the present invention is not limited by the following embodiments, and the embodiments may be modified in many different forms.

The terms used in this specification are used to describe specific embodiments and are not intended to limit the present invention. The terms indicating a singular form used herein may include plural forms unless the context clearly indicates otherwise. Also, as used herein, the terms, "comprise" and/or "comprising" specify the presence of the stated shape, step, number, operation, member, element, and/or group thereof and does not exclude the presence or addition of one or more other shapes, steps, numbers, operations, elements, elements and/or groups thereof. In addition, the term, "connection" used in this specification means not only a direct connection of certain members, but also a concept including an indirect connection in which other members are interposed between the members.

In addition, in connection with the description of this specification, the descriptions such as "first" and "second", "upper or top", and "lower or bottom" are intended to distinguish members, and limit or limit the members themselves. It is not used to mean a specific order, but rather a relative positional relationship and does not limit specific cases where other members are is in direct contact with the configuring members or another member is introduced into the interface between them. The same interpretation may be applied to other expressions which describe relationships between components.

In addition, in the present specification, when a member is said to be located "on" another member, this arrangement includes not only a case in which a member is in contact with another member, but also a case where another member exists between the two members. As used herein, the term, "and/or" includes any one and all combinations of one or more of the listed items. In addition, the terms of degree such as "about" and "substantially" used in the present specification are used as a range of values or degrees, or as a meaning close thereto, taking into account inherent manufacturing and substance tolerances, and exact or absolute figures provided to aid in the understanding of this application are used to prevent the infringers from unfairly exploiting the stated disclosure.

Hereinafter, embodiments of the present invention will be described in detail with reference to the accompanying drawings. A size or a thickness of areas or parts shown in the accompanying drawings may be slightly exaggerated for clarity of the specification and convenience of description. The same reference numbers indicate the same configuring elements throughout the detailed description.

FIG. 1A to FIG. 34C are diagrams for explaining an example of a manufacturing method of a capacitorless three-dimensional dynamic random access memory (DRAM) device according to an embodiment of the present invention. The capacitorless 3D DRAM device may be a 3D DRAM device (3D stack-type DRAM device) having a gain cell structure. For example, the capacitorless 3D DRAM device may be a 3D DRAM device having a two transistor zero capacitor (2T0C) cell structure.

The same numbers in FIGS. 1A to 34C (e.g., FIG. 1 in FIGS. 1A, 1B, and 1C) refer to the same steps. FIGS. 1A, 2A, 3A, 4A, 5A, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A are cross-sectional diagrams cut along the XZ plane. FIGS. 1B, 2B, 3B, 4B, 5B, 6B, 7B, 8B, 9B, 10B, 11B, 12B, 13B, 14B, 15B, 16B, 17B, 18B, 19B, 20B, 21B, 22B, 23B, 24B, 25B, 26B, 27B, 28B, 29B, 30B, 31B, 32B, 33B, 34B are plan diagrams (i.e. top-view) observed from above direction or cross-sectional diagrams cut in the XY plane (i.e. Z-cut view). FIGS. 1C, 2C, 3C, 4C, 5C, 6C, 7C, 8C, 9C, 10C, 11C, 12C, 13C, 14C, 15C, 16C, 17C, 18C, 19C, 20C, 21C, 22C, 23C, 24C, 25C, 26C, 27C, 28C, 29C, 30C, 31C, 32C, 33C, 34C are cross-sectional diagrams cut along the YZ plane.

Figure 1B:
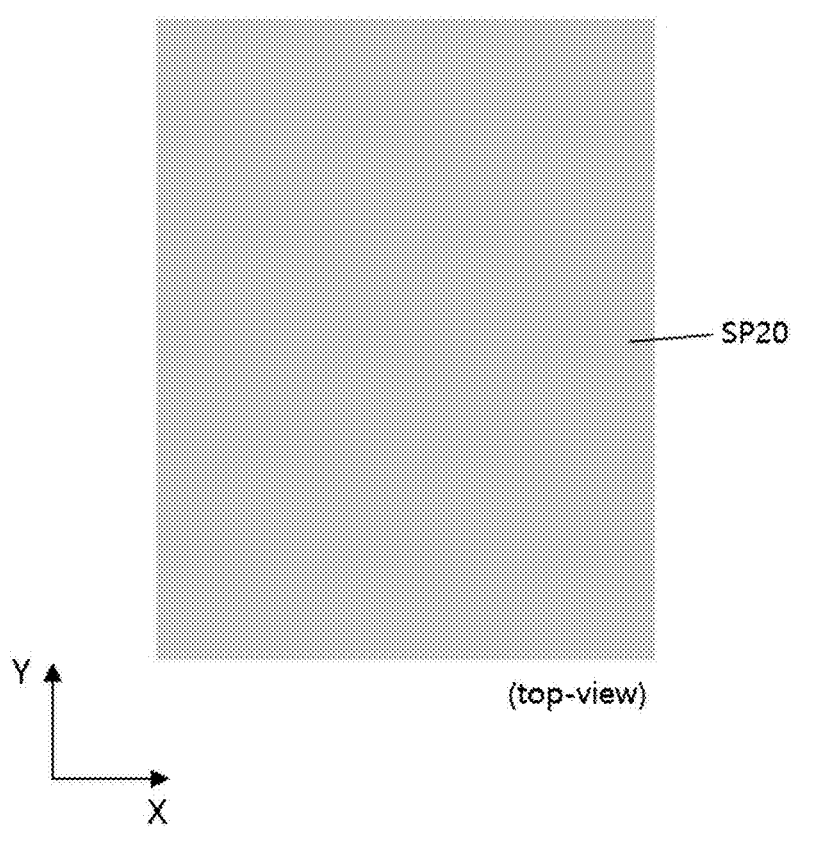
Figure 1C:
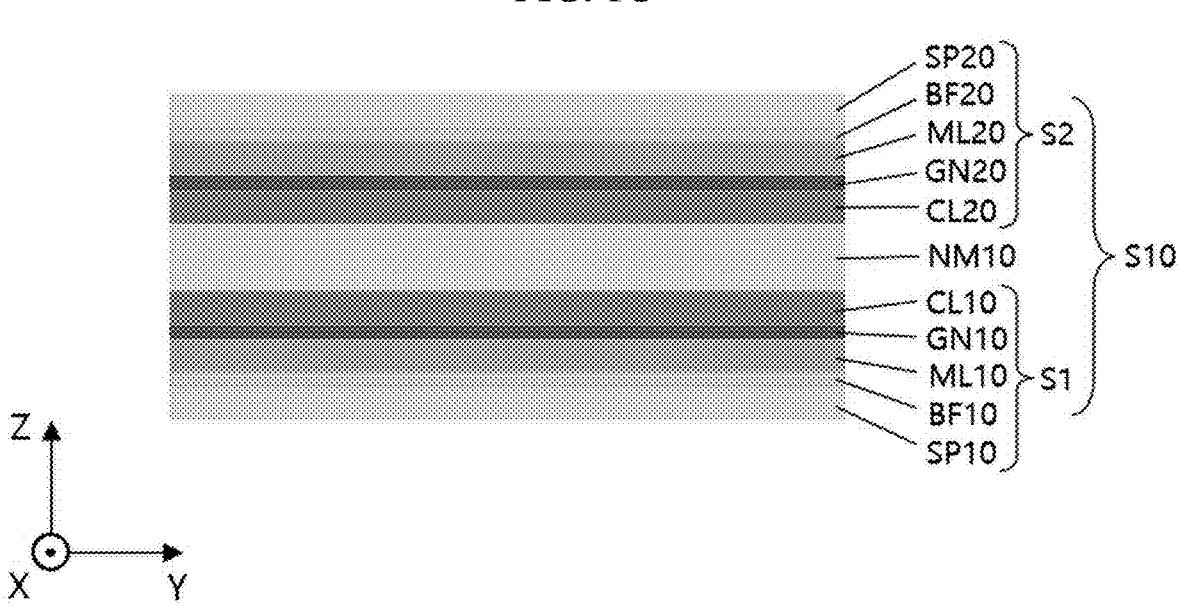

Referring to FIGS. 1A to 1C, a stack unit S10 may be formed on a predetermined substrate (not shown). A material of the substrate may be selected from a variety of materials. The substrate may include a semiconductor material or an insulating material. The substrate may include a semiconductor wafer. The substrate may include a bulk silicon substrate, a silicon-on-insulator (SOI) substrate, a germanium substrate, or a germanium-on-insulator (GOI), a silicon-germanium substrate, or a substrate formed by an epitaxial growth process.

An insulating material layer NM10 may be formed on the substrate. The insulating material layer NM10 may be formed through a deposition process. The insulating material layer NM10 may include an insulating material such as silicon oxide. A plurality of layers may be sequentially stacked on the insulating material layer NM10. The plurality of layers may constitute the upper stack portion S2. An upper first channel material layer CL20, an upper first gate insulating layer GN20, an upper intermediate layer ML20, an upper buffer layer BF20, and an upper separation layer SP20 may be deposited on the insulating material layer NM10. The upper stack portion S2 may have a stacked structure including the upper first channel material layer CL20, the upper first gate insulating layer GN20, the upper intermediate layer ML20, the upper buffer layer BF20, and the upper separation layer SP20.

The upper intermediate layer ML20 may be an insulating layer and may be deposited with a material different from the insulating material layer NM10. The upper intermediate layer ML20 may be formed as a layer having an etching rate different from those of the insulating material layer NM10 and the upper separation layer SP20 in a later etching process step. For example, the upper intermediate layer ML20 may be formed of or include a silicon nitride (e.g., $SiN_x$).

The upper buffer layer BF20 may be deposited on the upper intermediate layer ML20. The upper buffer layer BF20 may be formed as a material layer different from those of the insulating material layer NM10, the upper intermediate layer ML20, and the upper separation layer SP20. The upper buffer layer BF20 may be formed as a layer having an etching rate different from those of the insulating material layer NM10, the upper intermediate layer ML20, and the upper separation layer SP20 in a later etching process step. The upper buffer layer BF20, the insulating material layer NM10, the upper intermediate layer ML20, and the upper separation layer SP20 may have an etching selectivity to each other. For example, the upper buffer layer BF20 may include a silicon. As a specific example, the upper buffer layer BF20 may be formed to include a polysilicon layer.

The upper separation layer SP20 may be deposited on the upper buffer layer BF20. The upper buffer layer BF20 may be an insulating layer. The upper separation layer SP20 may be deposited as a layer of a material different from those of the upper intermediate layer ML20 and the upper buffer layer BF20. The upper separation layer SP20 may be formed as a layer having an etching rate different from those of the insulating material layer NM10, the upper intermediate layer ML20, and the upper buffer layer BF20 in a later etching process step. For example, the upper separation layer SP20 may include silicon oxide. In this case, the upper separation layer SP20 may be formed to include a silicon oxide layer more densely than the insulating material layer NM10. The insulating material layer NM10 may be composed of porous silicon oxide. The insulating material layer NM10 may include a silicon oxide having a first density, and the upper separation layer SP20 may include a silicon oxide having a second density greater than the first density.

The thickness of the upper buffer layer BF20 may be thinner than each of the upper intermediate layer ML20 and the upper separation layer SP20. The thickness of the insulating material layer NM10 may be thicker than each of the upper intermediate layer ML20 and the upper separation layer SP20.

A lower stack portion S1 may be further formed on the substrate before forming the insulating material layer NM10 and the upper stacked portion S2 on the substrate. First of all, after forming the lower stack portion S1, the insulating material layer NM10 and the upper stack portion S2 may be sequentially formed thereon. The lower stack portion S1 may have substantially the same structure as the structure in which the upper stack portion S2 is upside down vertically. The lower stack portion S1 may have a symmetrical (top-bottom symmetrical) structure with the upper stack portion S2 with the insulating material layer NM10 interposed therebetween. The insulating material layer NM10 may be a kind of intermediate separation layer.

The lower stack portion S1 may include a lower separation layer SP10, a lower buffer layer BF10, a lower intermediate layer ML10, a lower first gate insulating layer GN10, and a lower first channel material layer CL10 which are stacked sequentially from the bottom. The lower separation layer SP10, the lower buffer layer BF10, the lower intermediate layer ML10, the lower first gate insulating layer GN10, and the lower first channel material layer CL10 may be formed sequentially, and the insulating material layer NM10 may be formed on the lower first channel material layer CL10. Each of the lower first channel material layer CL10, the lower first gate insulating layer GN10, the lower intermediate layer ML10, the lower buffer layer BF10, and the lower separation layer SP10 may have substantially the same material composition as that of each of the upper first channel material layer CL20, the upper first gate insulating layer GN20, the upper intermediate layer ML20, the upper buffer layer BF20, and the upper separation layer SP20.

The lower stack portion S1, the insulating material layer NM10, and the upper stacked portion S2 may form one stack unit S10 in which a plurality of layers are stacked. A plurality of stack units S10 may be stacked on the substrate. The processes for depositing individual layers constituting the stack unit S10 may be performed by using various deposition techniques. For example, the above-mentioned layers may be deposited by using a thermal chemical vapor deposition (thermal CVD), a plasma enhanced CVD, a physical vapor deposition (PVD), or an atomic layer deposition (ALD) technology, etc.

Figure 2A:
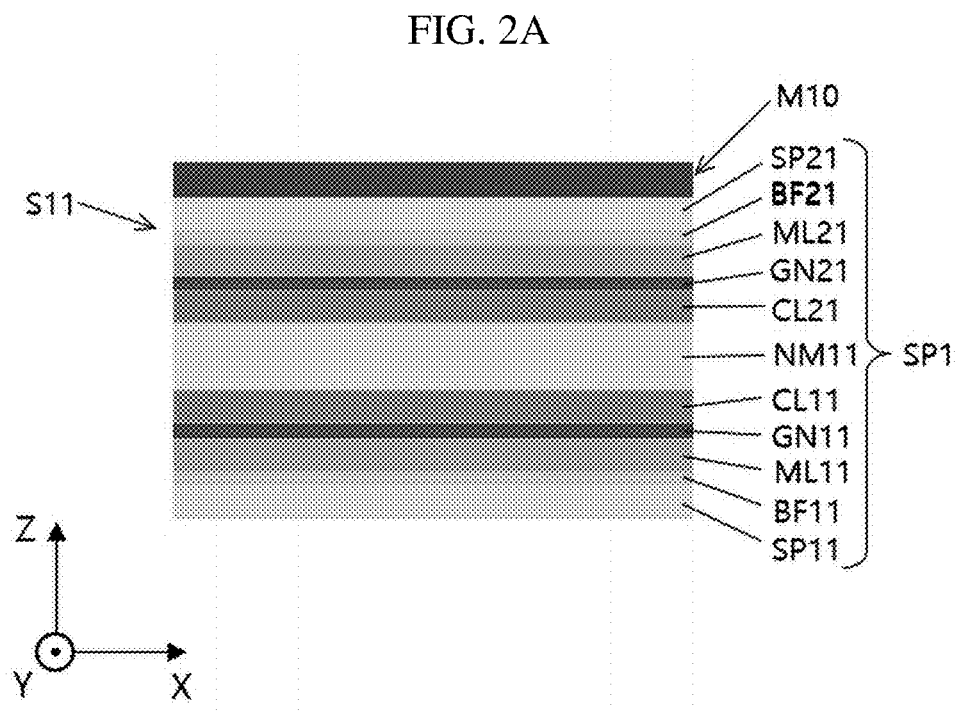
Figures 2B, 2C:
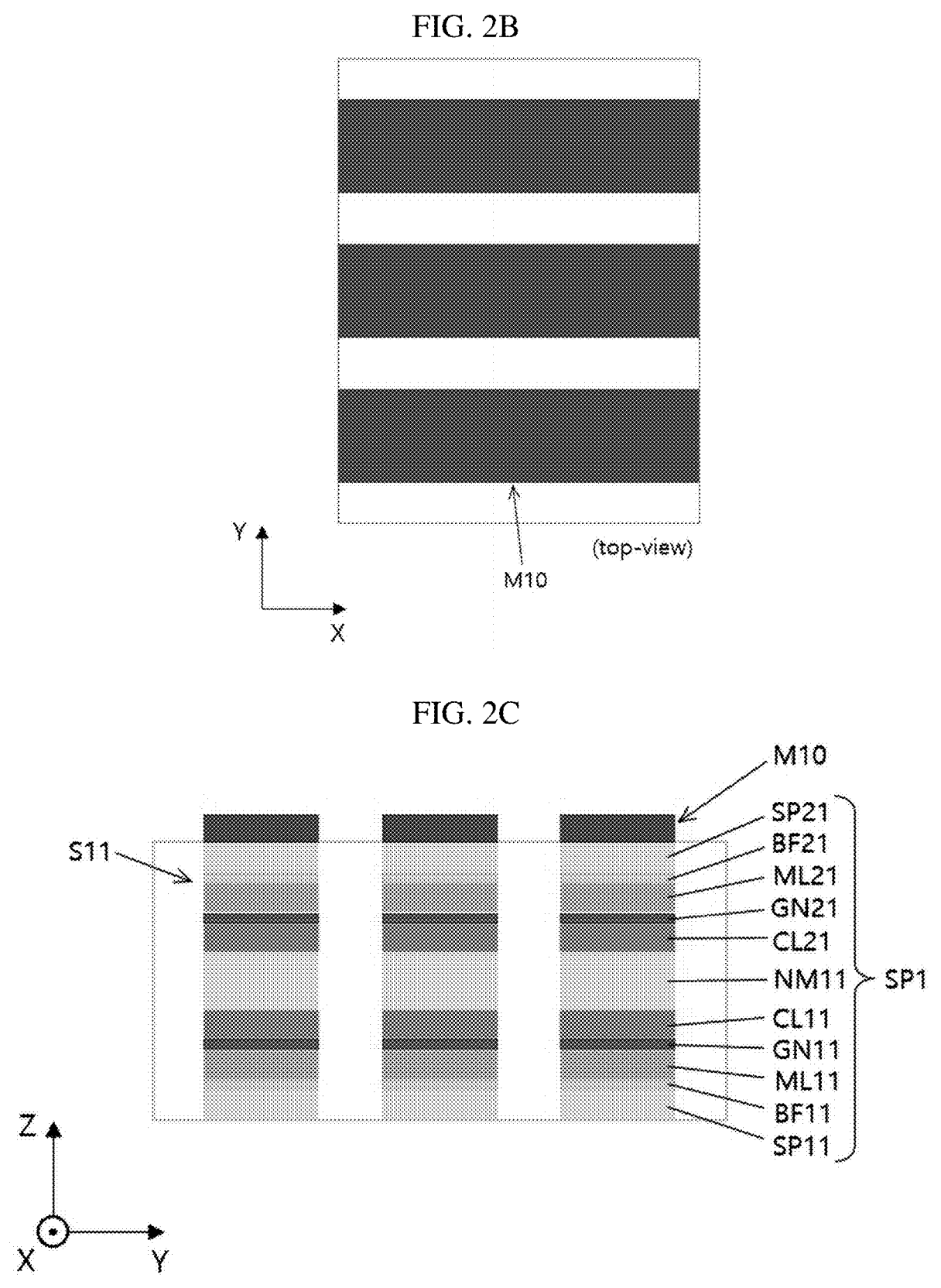

Referring to FIGS. 2A to 2C, the stack unit (S10 in FIG. 1A) may be patterned to form a patterned stack S11 having a plurality of pattern portions SP1. The plurality of pattern portions SP1 may have a shape extending in a first direction, for example, the X-axis direction, and may be spaced apart from each other in a second direction orthogonal (perpendicular) to the first direction, for example, the Y-axis direction. Empty spaces may be provided on both sides of the plurality of pattern portions in the second direction. The plurality of pattern portions SP1 may be spaced apart in the Y-axis direction and may be arranged side by side in the X-axis direction. This step may be a patterning step for dividing regions where cells will be formed, that is, a cell patterning step.

The pattern portion SP1 may include the upper first channel material layer CL21, the upper first gate insulating layer GN21, the upper intermediate layer ML21, the upper buffer layer BF21, and the upper separation layer SP21. The pattern portion SP1 may include an insulating material layer NM11. In addition, the pattern portion SP1 may further include the lower separation layer SP11, the lower buffer layer BF11, the lower intermediate layer ML11, the lower first gate insulating layer GN11, and the lower first channel material layer CL11. Each of the lower separation layer SP11, the lower buffer layer BF11, the lower intermediate layer ML11, the lower first gate insulating layer GN11, the lower first channel material layer CL11, the insulating material layer NM11, the upper first channel material layer CL21, the upper first gate insulating layer GN21, the upper intermediate layer ML21, the upper buffer layer BF21, and the upper separation layer SP21 may be a patterned material layer.

For the patterning process of FIGS. 2A to 2C, a first mask pattern M10 disposed on the stack unit (S10 in FIG. 1A) may be used. The first mask pattern M10 may have a predetermined pattern structure. The first mask pattern M10 may be, for example, a photoresist pattern. After the patterning process, the first mask pattern M10 may be removed.

Figure 3A:
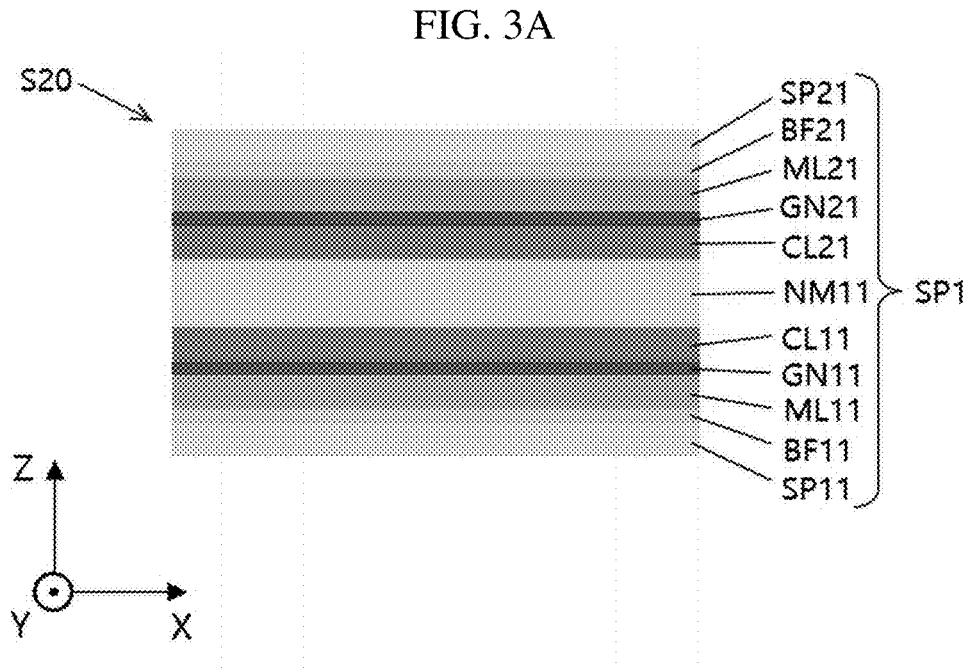
Figure 3B:
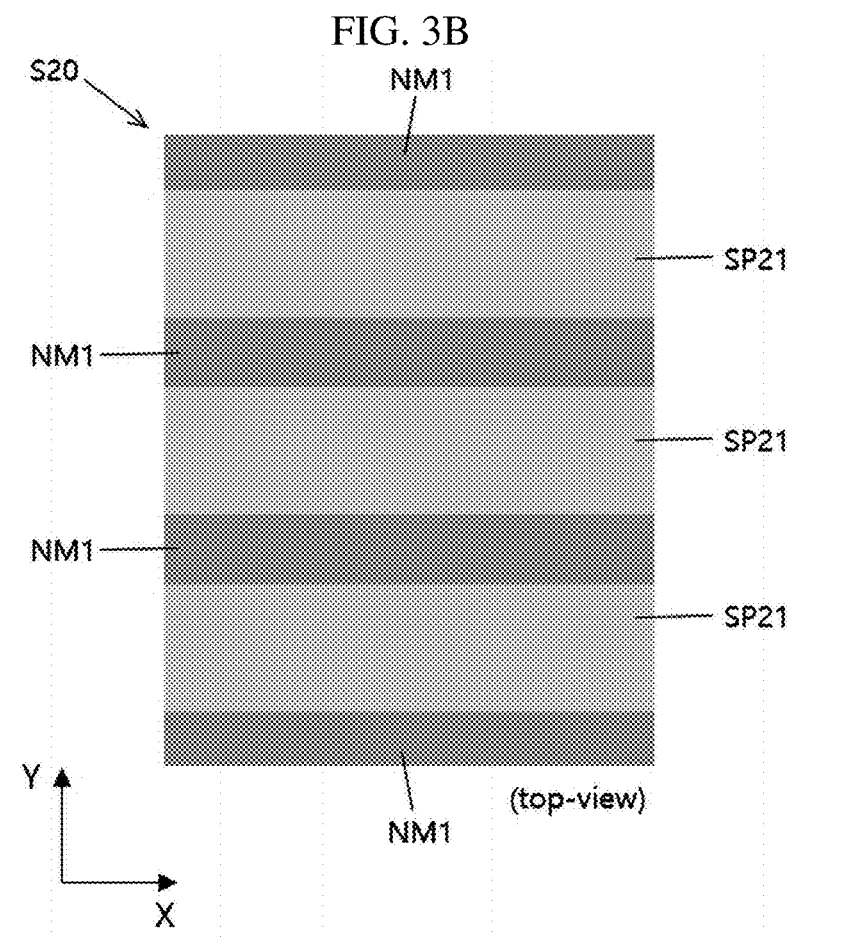
Figure 3C:
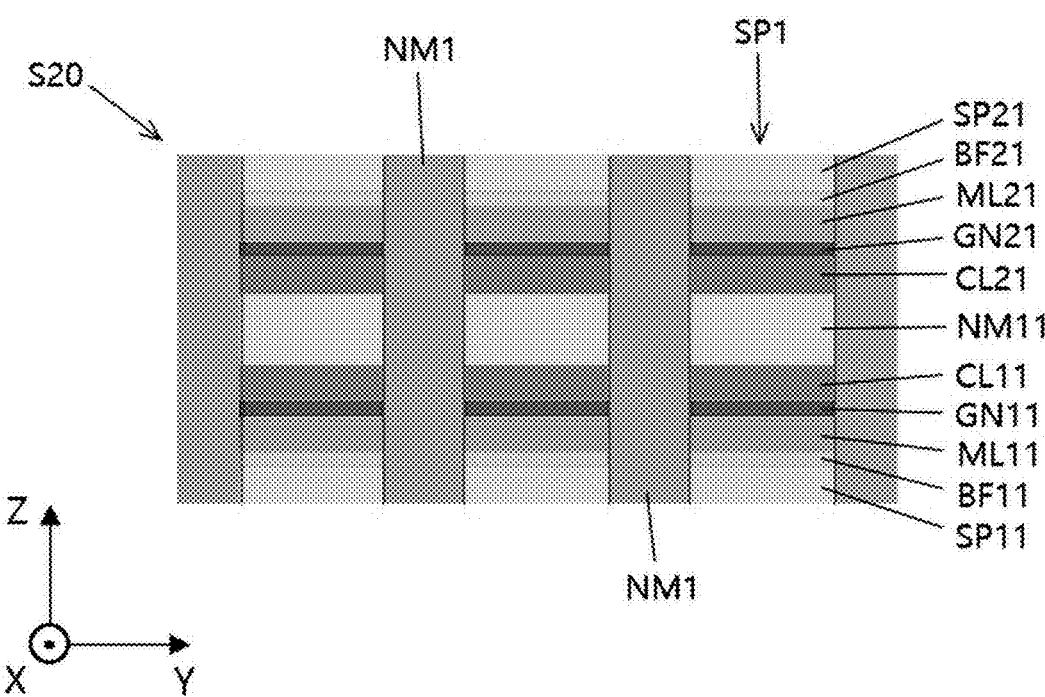

Referring to FIGS. 3A to 3C, a structure S20 including the patterned stack (S11 in FIG. 2A) and a filling material NM1 may be formed by filling the filling material NM1 between a plurality of pattern portions SP1. In other words, the structure S20 including the patterned stack (S11 in FIG. 2A)

and the filling material NM1 may be formed by filling the empty spaces on both sides of the plurality of pattern portions SP1 with the filling material NM1.

The filling material NM1 may have the same (or substantially the same) height as that of the pattern portion SP1. The filling material NM1 may be, for example, an insulating material. In this case, the filling material NM1 may be referred to as an 'insulating material layer' or an 'insulating material layer pattern'. The filling material NM1 may be formed of the same material as those of the lower intermediate layer ML11 and the upper intermediate layer ML21. As a non-limiting example, the filling material NM1 may include or be formed of a silicon nitride (e.g., $SiN_x$). Since portions of the filling material NM1, the lower intermediate layer ML11 and the upper intermediate layer ML21 may be etched together in a later process, it may be desirable to form them by using the same material (FIGS. 5A to 5C and FIGS. 16A to 16C).

Figure 4A:
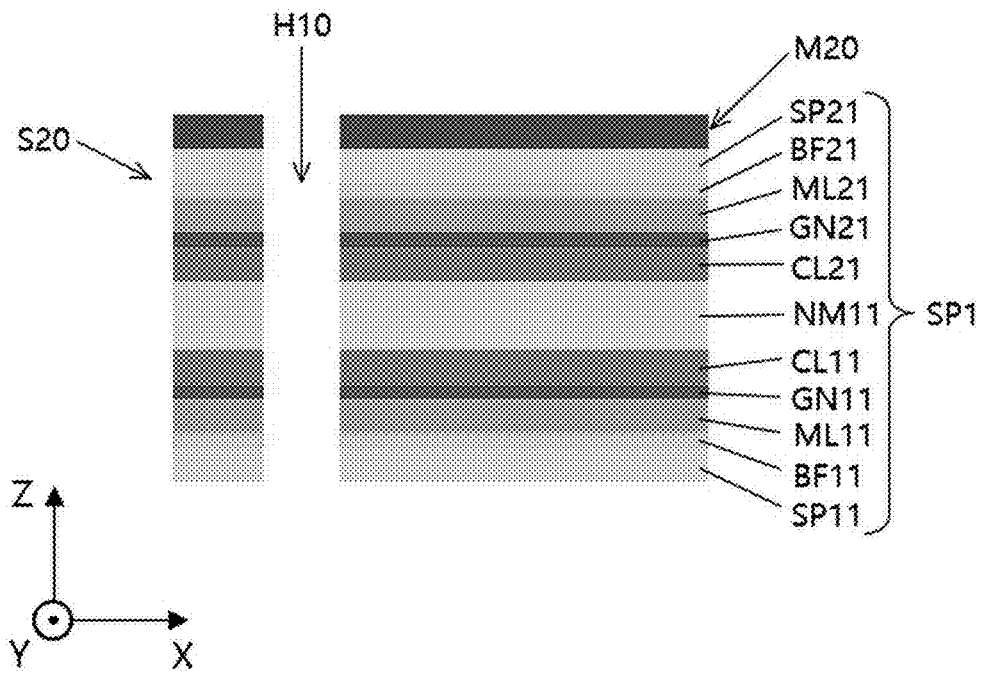
Figure 4B:
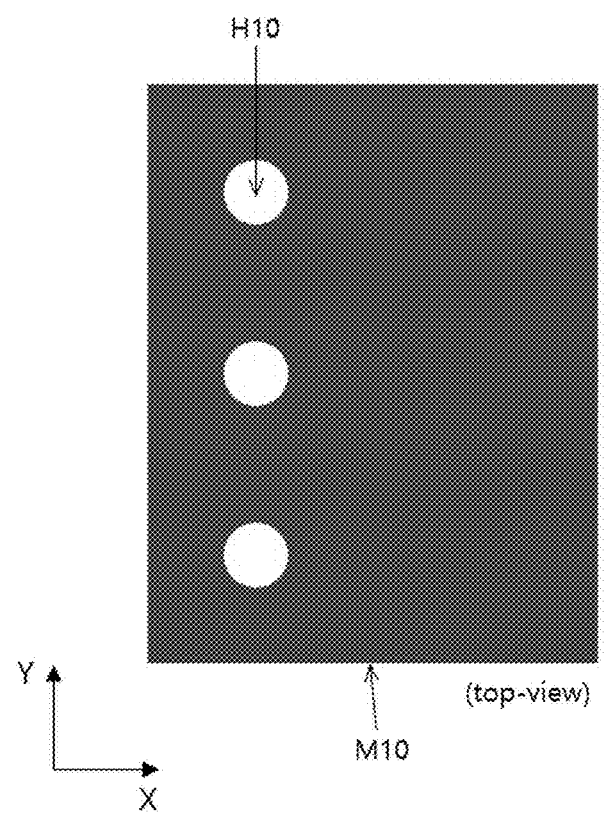
Figure 4C:
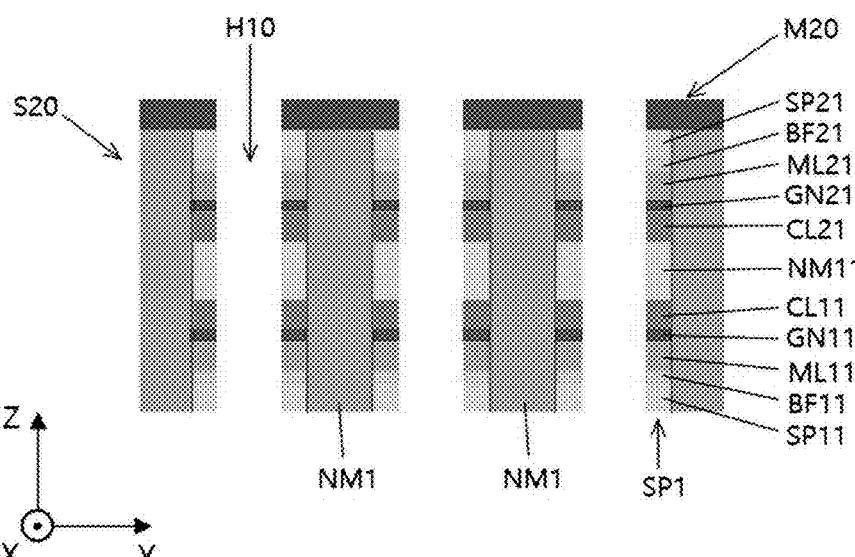

Referring to FIGS. 4A to 4C, a first vertical hole H10 penetrating through each of the plurality of pattern portions SP1 in a vertical direction may be formed in the structure S20. Each of the first vertical hole H10 may be formed to penetrate from the uppermost upper buffer layer SP21 to the lowermost lower buffer layer SP11 of the pattern portion SP1 in a predetermined region of the structure S20. The first vertical hole H10 may correspond to a region where a write bit line will be formed later. A plurality of first vertical holes H10 may be formed to be spaced apart from each other in the Y-axis direction.

A second mask pattern M20 may be used to form the first vertical hole H10. The second mask pattern M20 may have a predetermined opening pattern. The second mask pattern M20 may be, for example, a photoresist pattern. After forming the first vertical hole H10, the second mask pattern M20 may be removed. However, the removal timing of the second mask pattern M20 may vary. For example, the second mask pattern M20 may be removed after the recess process described in FIG. 5A.

Figure 5A:
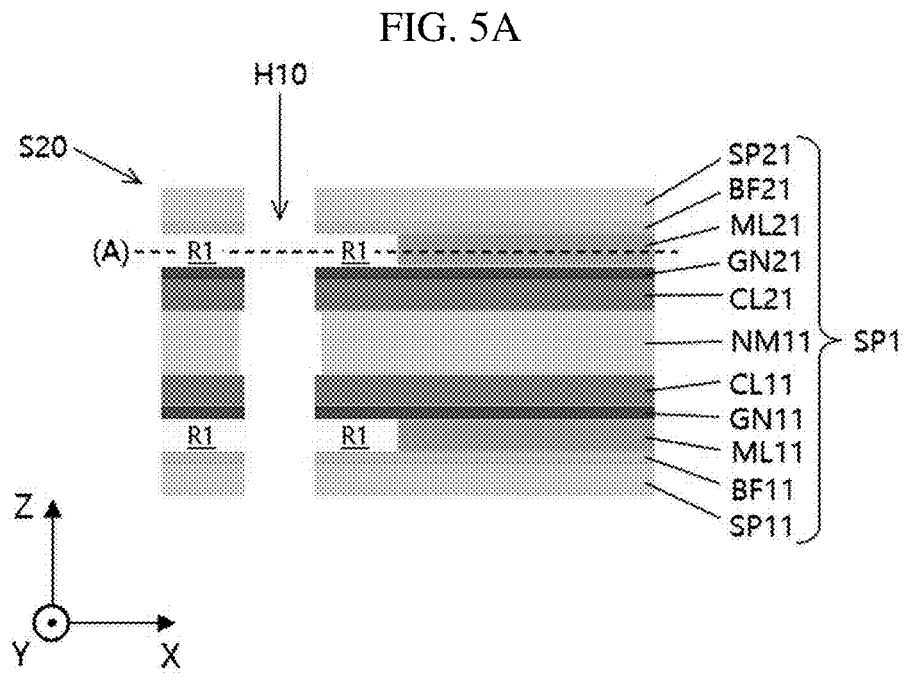
Figure 5B:
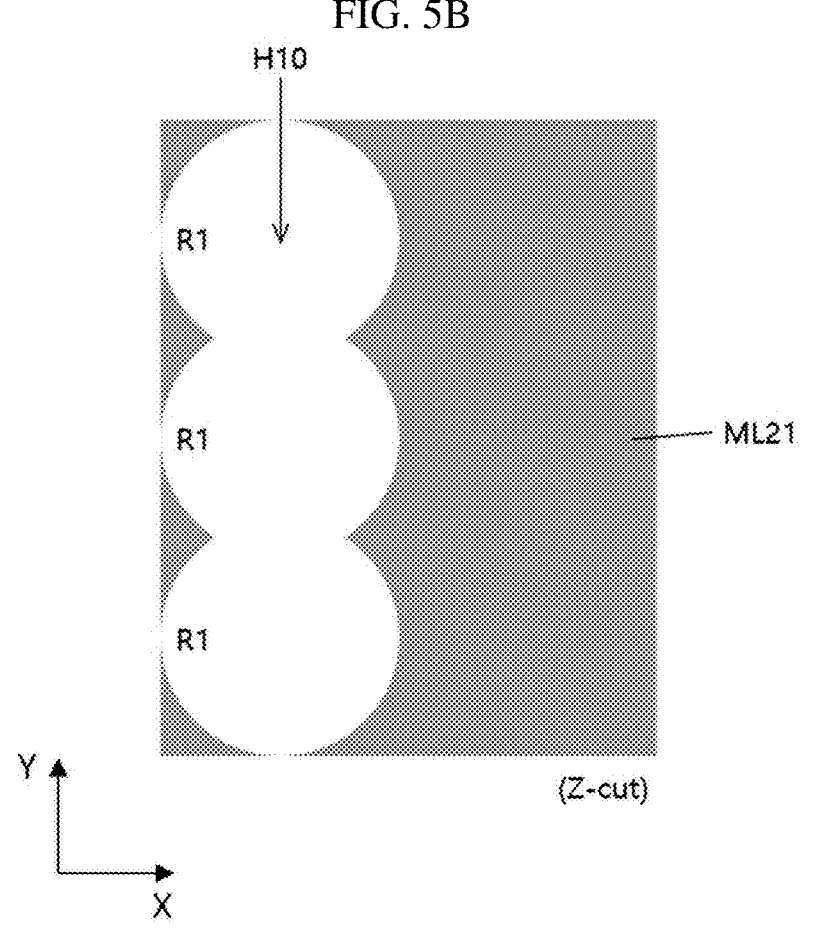
Figure 5C:
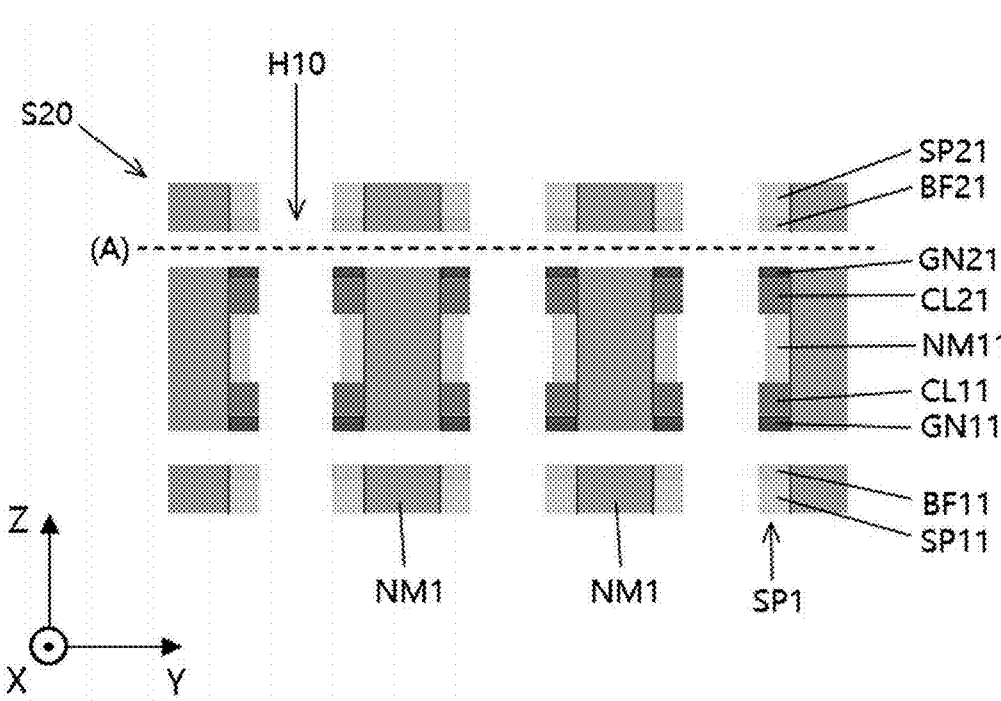

Referring to FIGS. 5A to 5C, a first recess R1 may be formed by recessing the upper intermediate layer ML21, the lower intermediate layer ML11, and the filling material NM1 around the first vertical hole H10 of the structure S20. A portion of each of the upper intermediate layer L21, the lower intermediate layer ML11, and the filling material NM1 may be selectively recessed etched by using a wet etching process using a wet etchant with etching selectivity to the upper intermediate layer ML21, the lower intermediate layer ML11, and the filling material NM1. At this time, a portion of the insulating material layer NM11 exposed by the first vertical hole H10 may also be slightly etched. The first gate insulating layer GN11/GN21 and the buffer layer BF11/BF21 may be exposed by the first recess R1. FIG. 5B may be a cross-sectional view taken along line (A) of FIG. 5A. FIG. 5C may be a cross-sectional view of a region where the first recess R1 is formed in FIG. 5B.

According to one embodiment, in the step for forming the first recess R1, a plurality of first recesses R1 may be connected in the second direction, that is, the Y-axis direction. This step may be performed to ensure that a write word line to be formed in the first recess R1 later has a shape extending in the Y-axis direction.

Figure 6A:
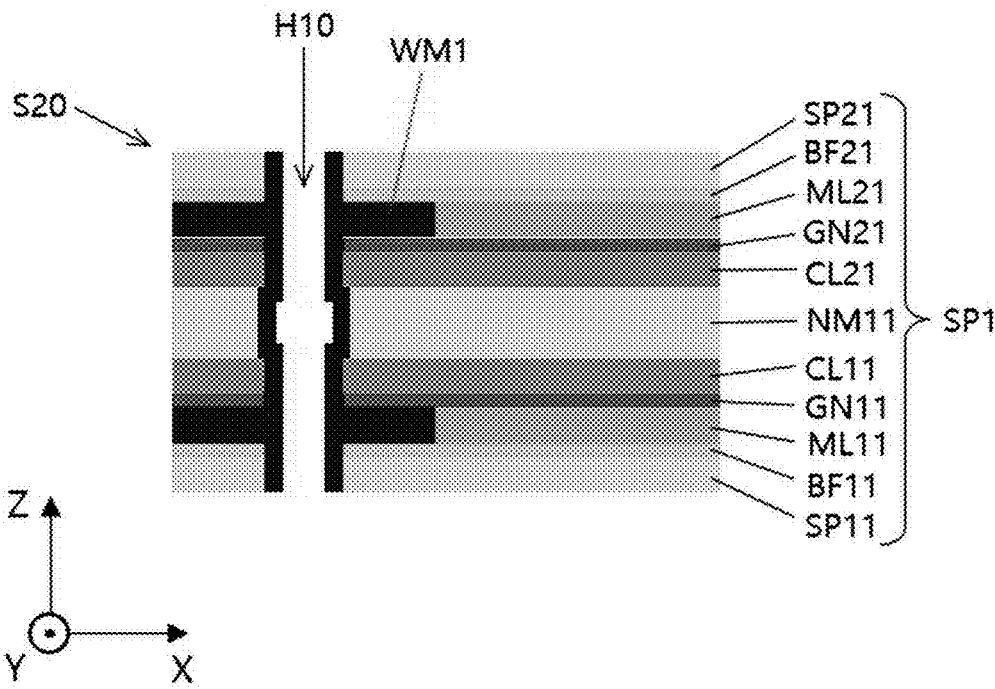
Figure 6B:
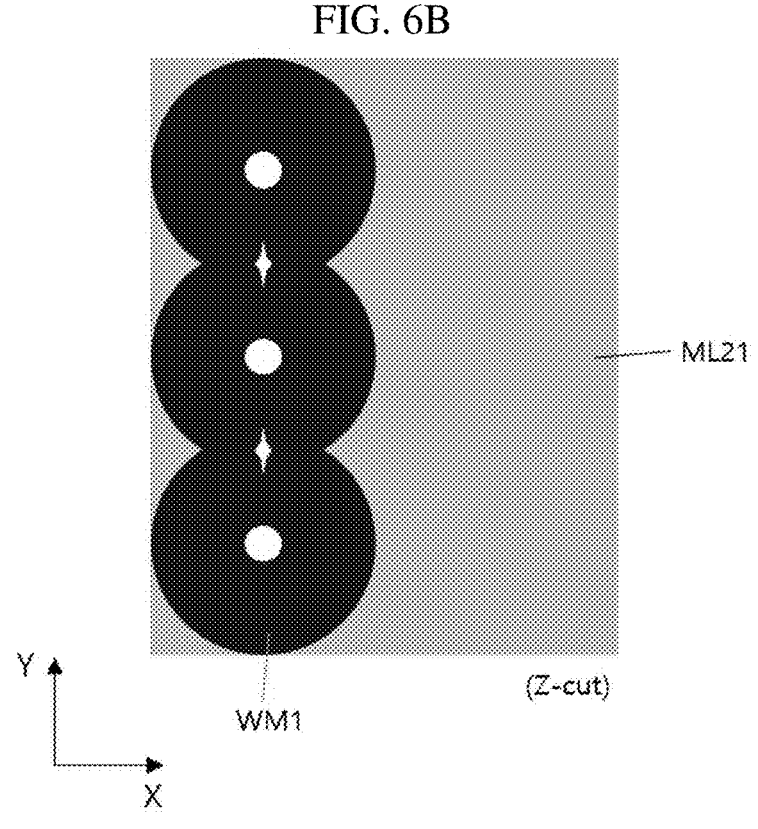
Figure 6C:
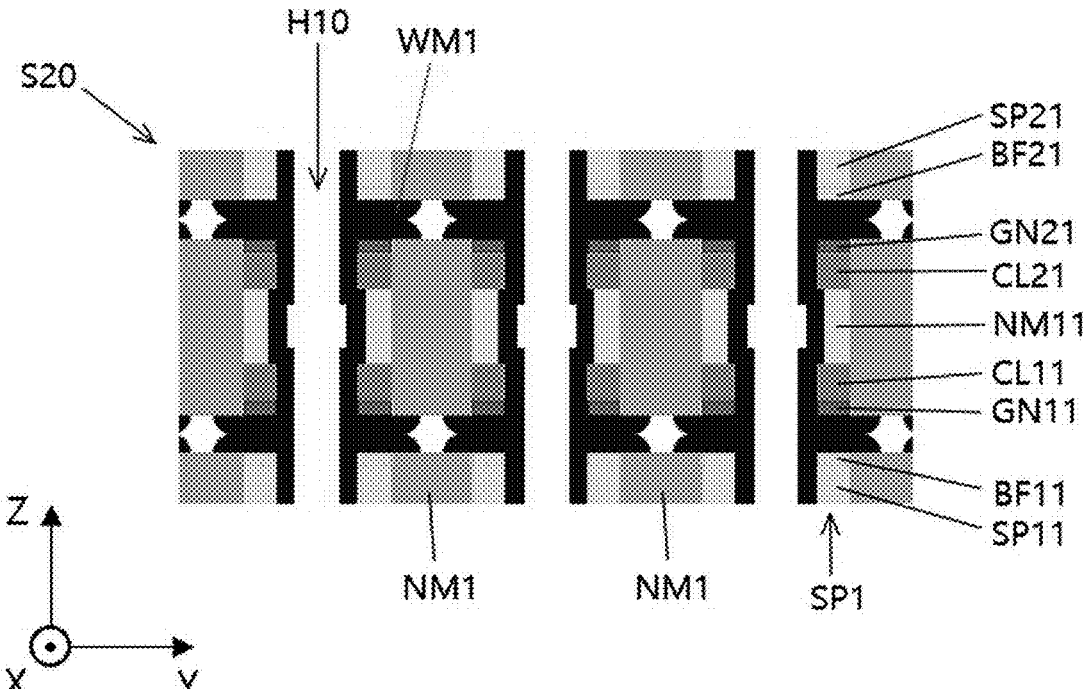

Referring to FIGS. 6A to 6C, a write word line material layer WM1 may be formed inside the first recess (R1 in FIG. 5A) and on an inner surface of the first vertical hole H10. The write word line material layer WM1 may include at least one of a metal, a metal compound, and a conductive silicon.

Figure 7A:
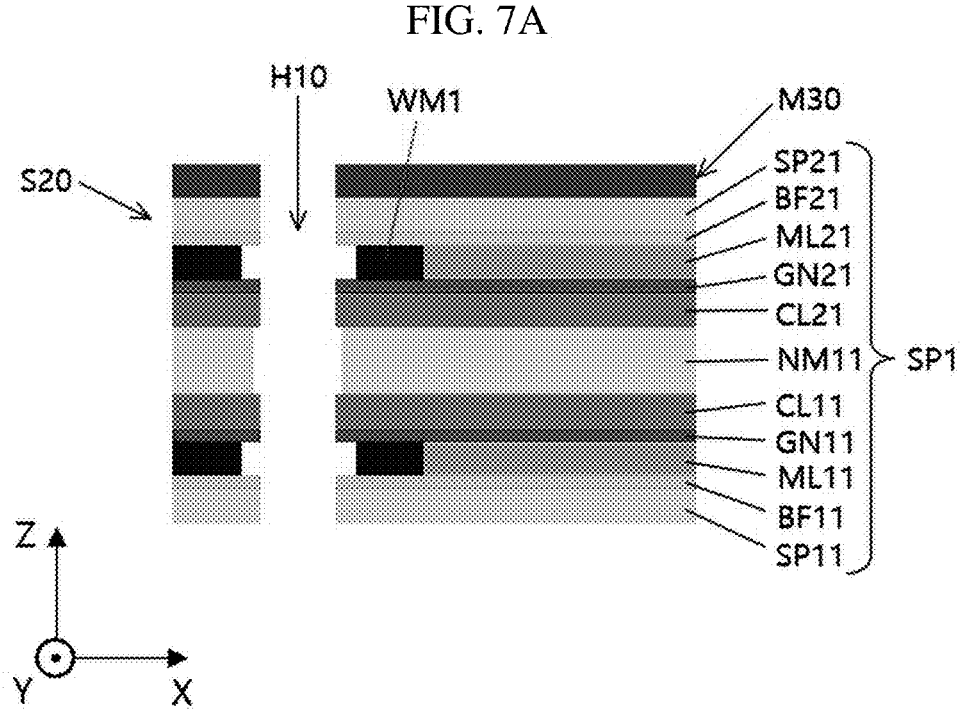
Figure 7B:
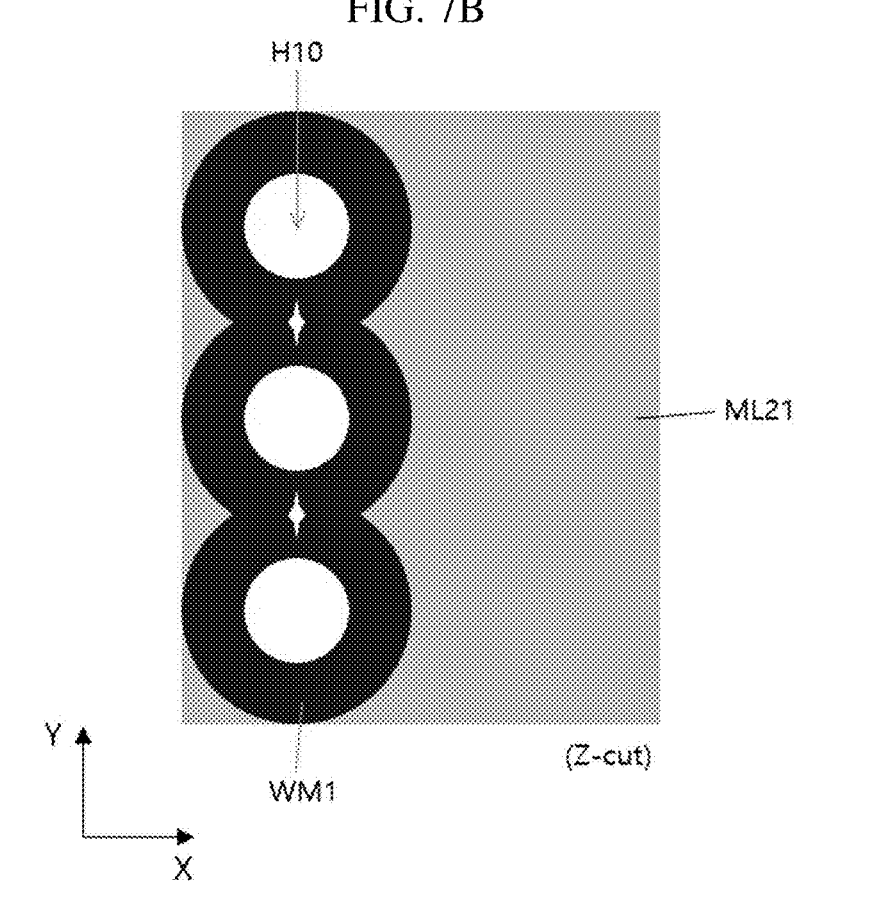
Figure 7C:
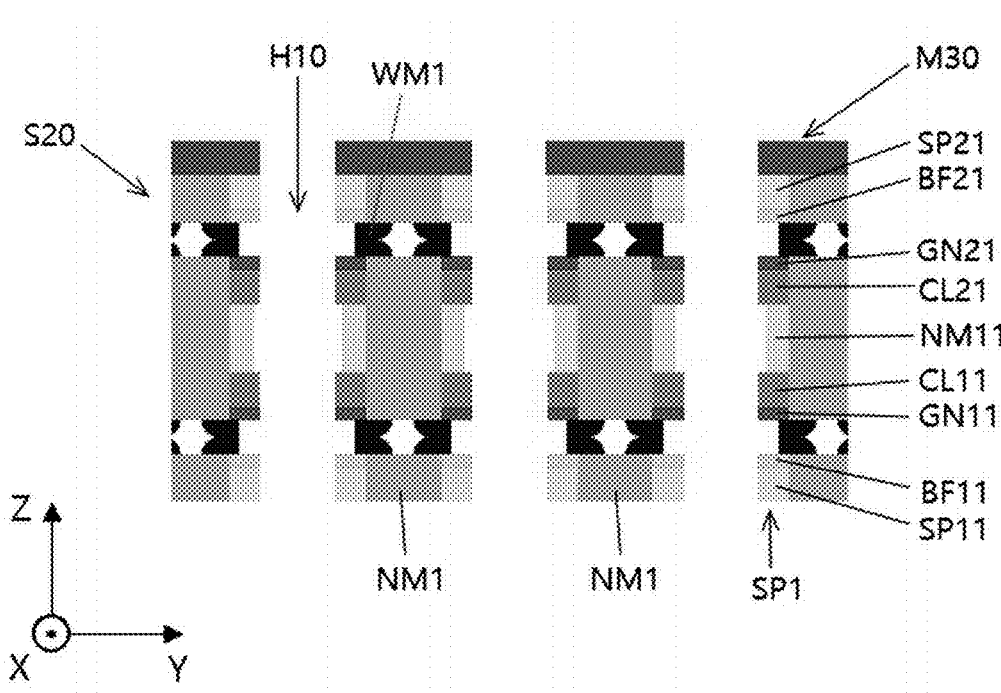

Referring to FIGS. 7A to 7C, a portion formed on the inner surface of the first vertical hole H10 in the write word line material layer WM1 may be removed. After forming a third mask pattern M30 with an opening pattern which exposes the region corresponding to the first vertical hole H10 on the structure S20, the portion formed on the inner surface of the first vertical hole H10 in the write word line material layer WM1 may be removed by performing a dry etching process using the third mask pattern M30 as an etch mask. Furthermore, a portion of the write word line material layer WM1 formed in the first recess (R1 in FIG. 5A) may be recessed. Accordingly, the write word line material layer WM1 remaining in this step may have a structure which is somewhat recessed with respect to the first vertical hole H10. The third mask pattern M30 may be, for example, a photoresist pattern. Afterwards, the third mask pattern M30 may be removed.

Figure 8A:
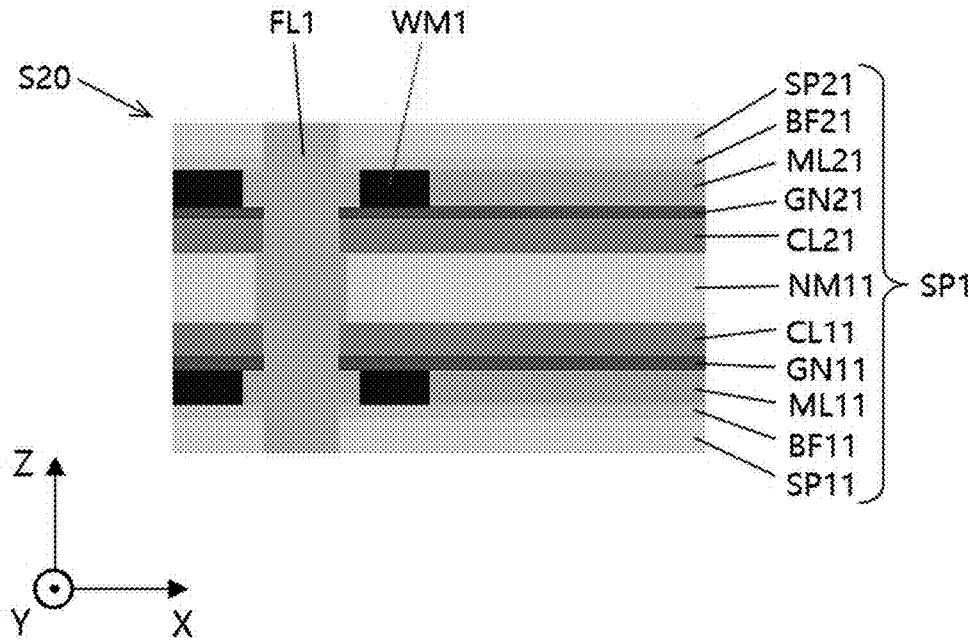
Figure 8B:
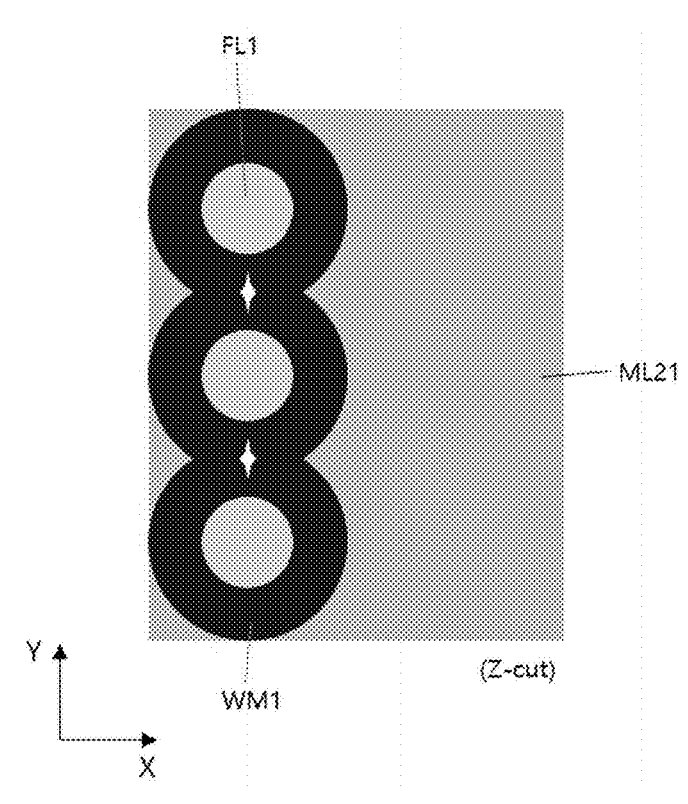
Figure 8C:
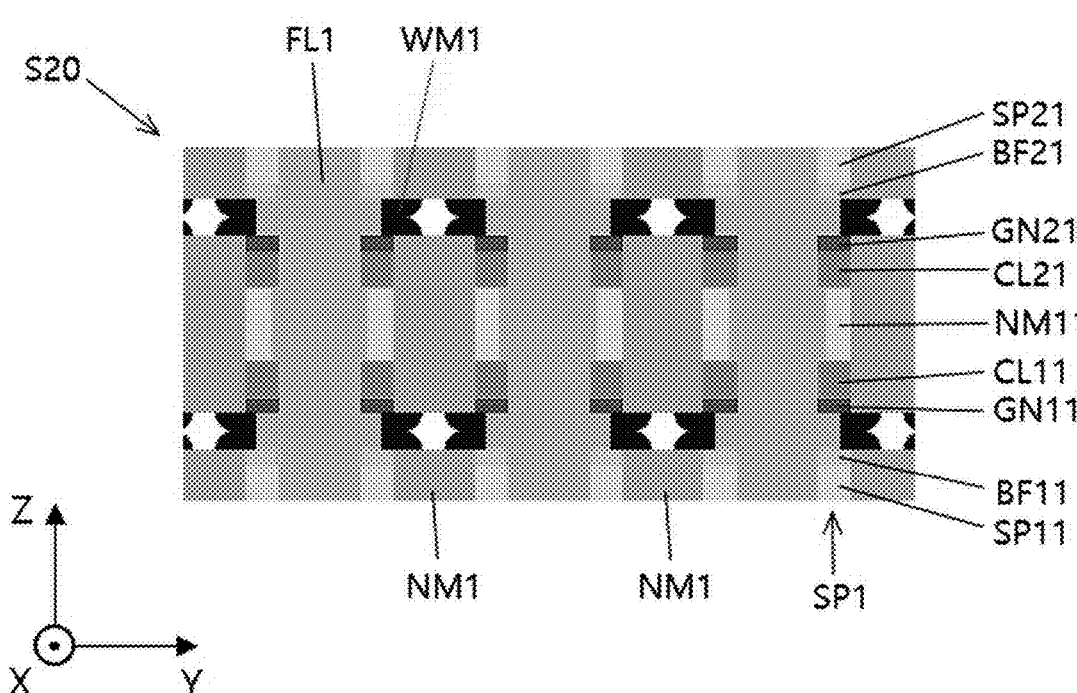

Referring to FIGS. 8A to 8C, a first filling insulating layer FL1 may be formed to fill the first vertical hole (H10 in FIG. 7A). The first filling insulating layer FL1 may be a type of gap fill material layer. As a non-limiting example, the first filling insulating layer FL1 may include a silicon oxide or be formed of a silicon oxide. The first filling insulating layer FL1 may be formed to fill the first vertical hole (H10 in FIG. 7A) and at the same time, may fill the empty space around the write word line material layer WM1.

Figure 9A:
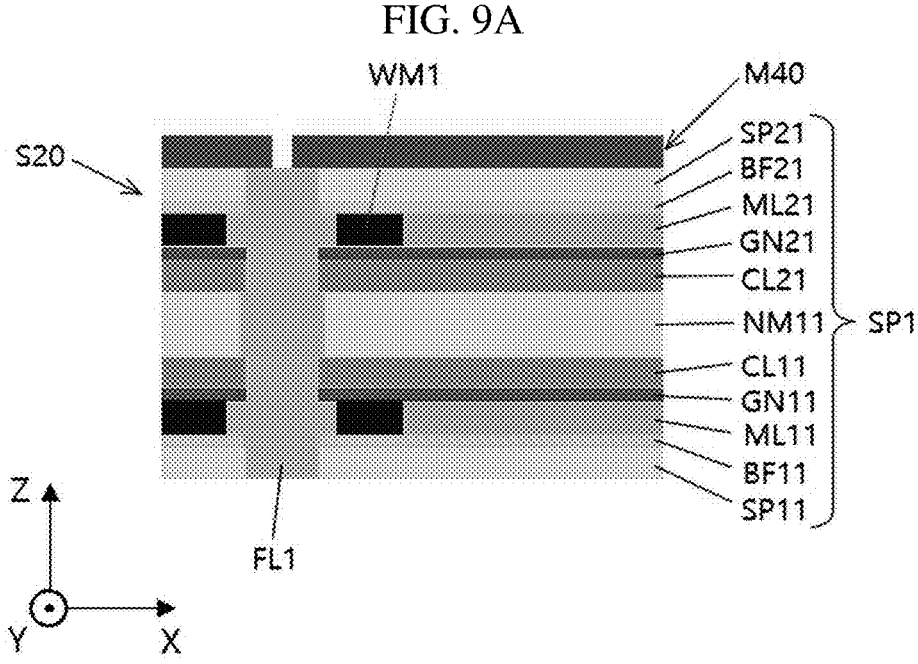
Figure 9B:
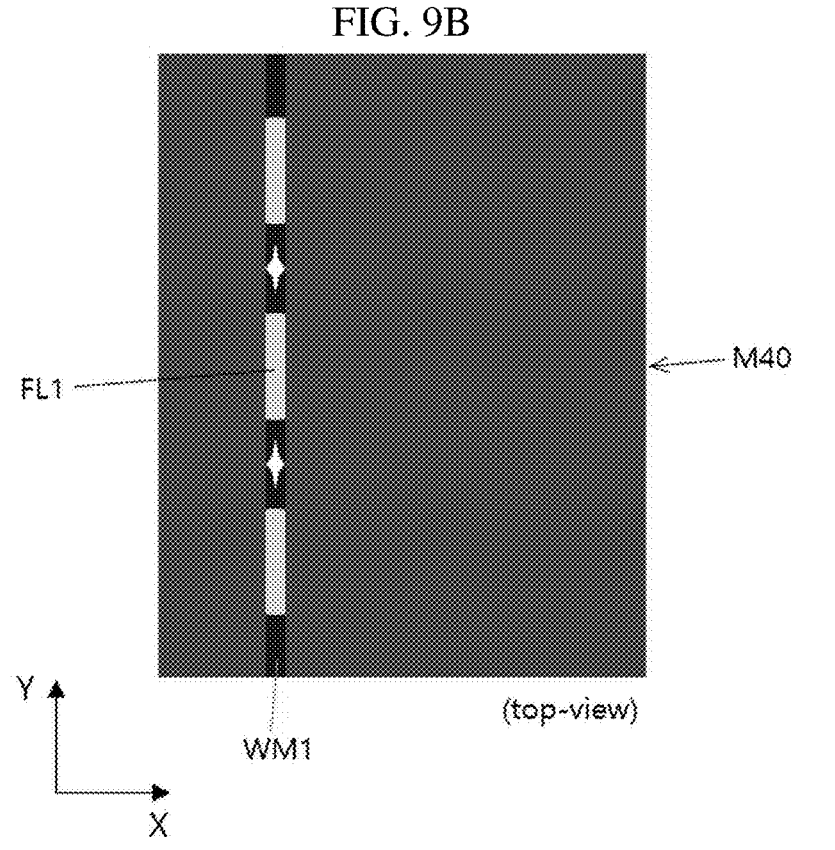
Figure 9C:
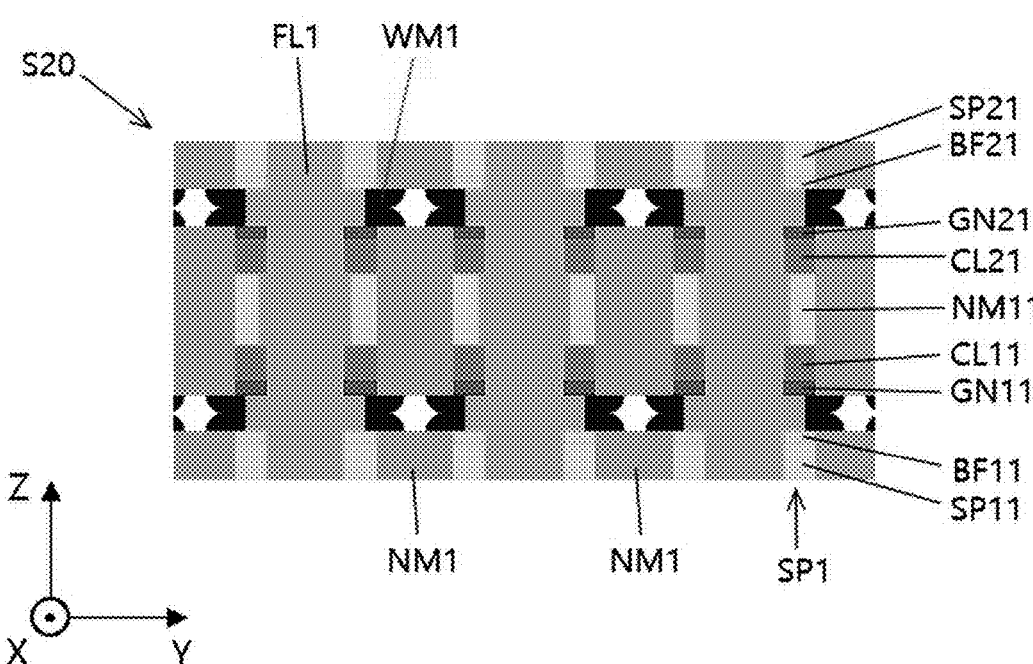

Referring to FIGS. 9A to 9C, a fourth mask pattern M40 may be formed on the structure S20. The fourth mask pattern M40 may have an opening pattern (an opening portion) extending in the Y-axis direction while exposing a central portion of the first filling insulating layer FL1. The fourth mask pattern M40 may be said to have a slit-type opening pattern. The fourth mask pattern M40 may be, for example, a photoresist pattern.

Figure 10A:
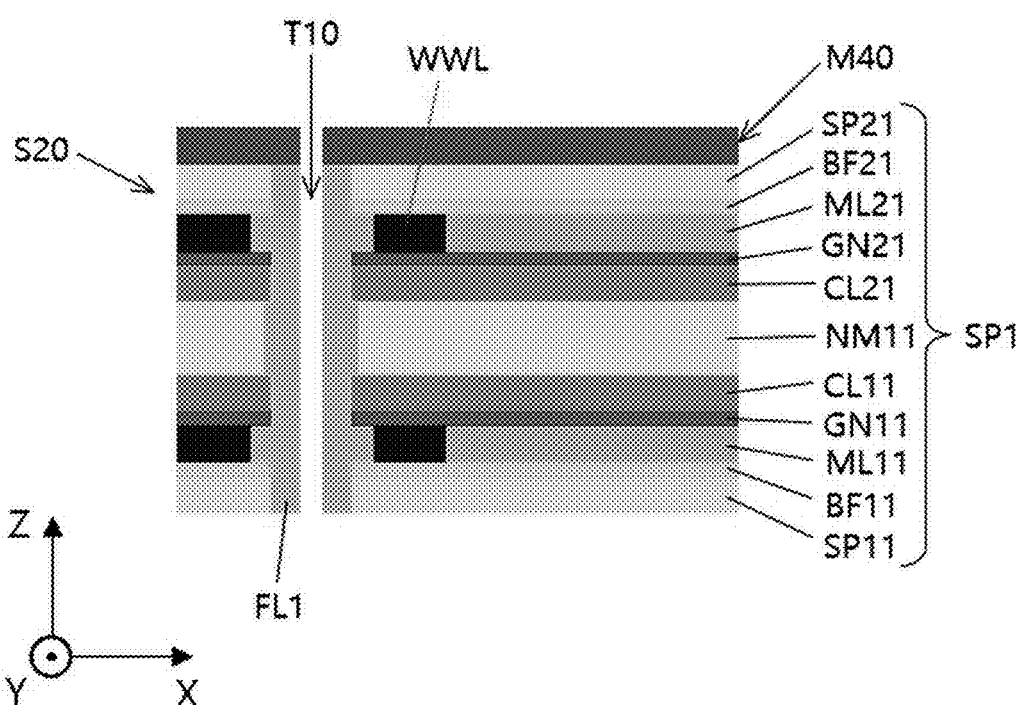
Figure 10B:
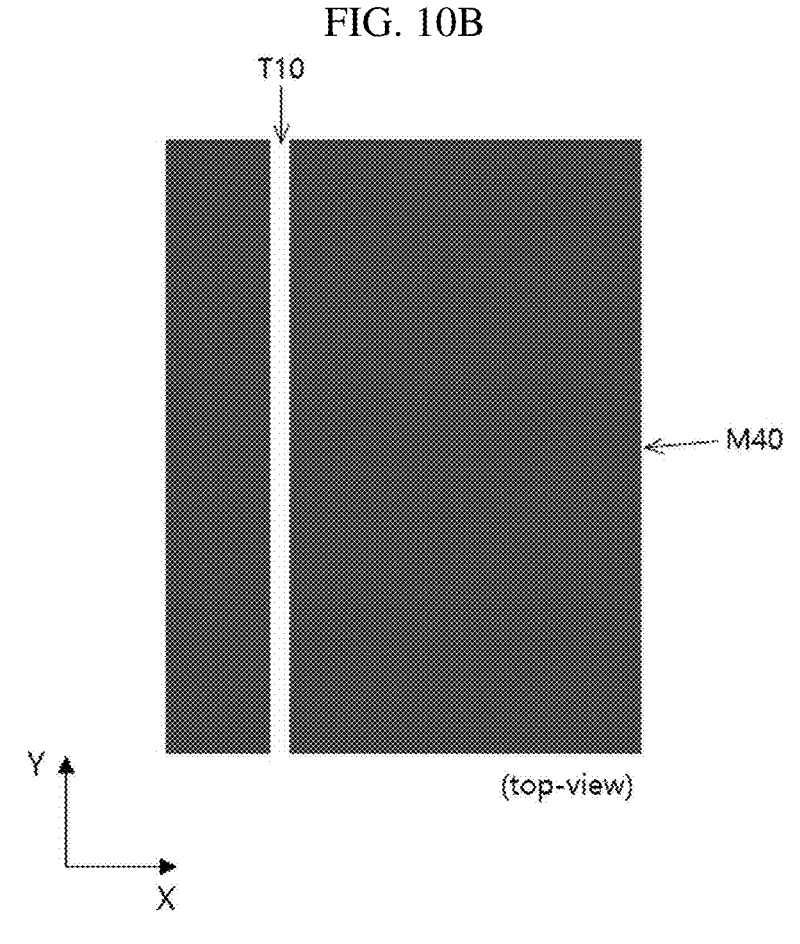
Figure 10C:
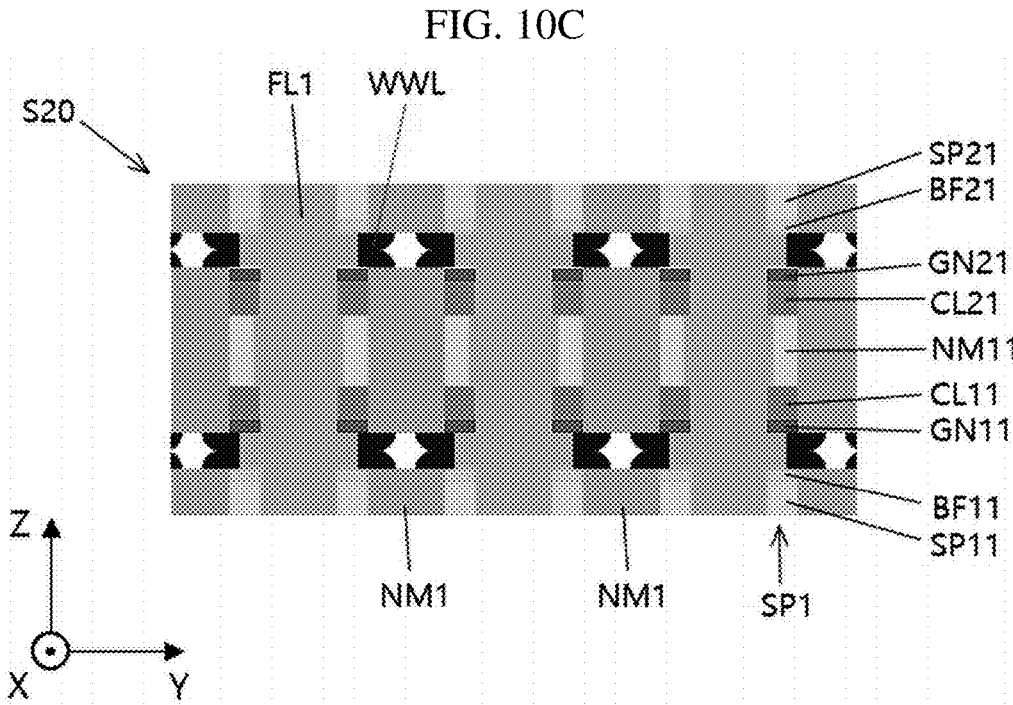

Referring to FIGS. 10A to 10C, a first etched portion T10 crossing the central portion of the write word line material layer (WM1 in FIG. 9B) and the central portion of the first filling insulating layer FL1 in the second direction, that is, the Y-axis direction may be formed by using the fourth mask pattern M40 as an etch mask. Thus, a write word line WWL may be defined from the write word line material layer WM1 in FIG. 9B. The first etched portion T10 may be formed through a dry etching process. The first etched portion T10 may be considered as a type of slit-type opening or trench. FIG. 10C is a cross-sectional diagram along the YZ plane observed from the region where the first etched portion T10 is formed. Afterwards, the fourth mask pattern M40 may be removed.

Figure 11A:
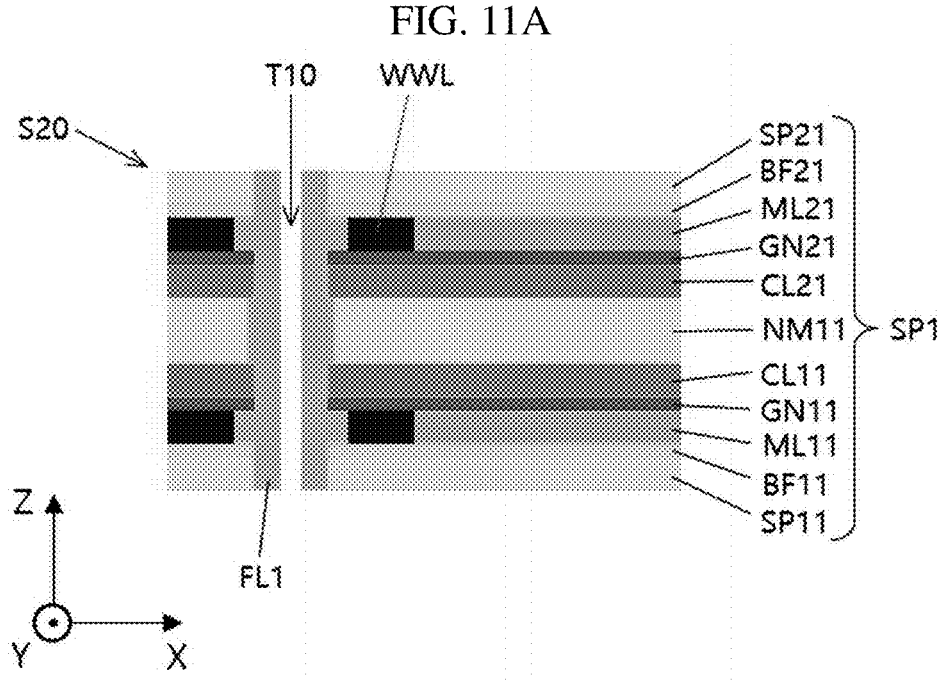
Figure 11B:
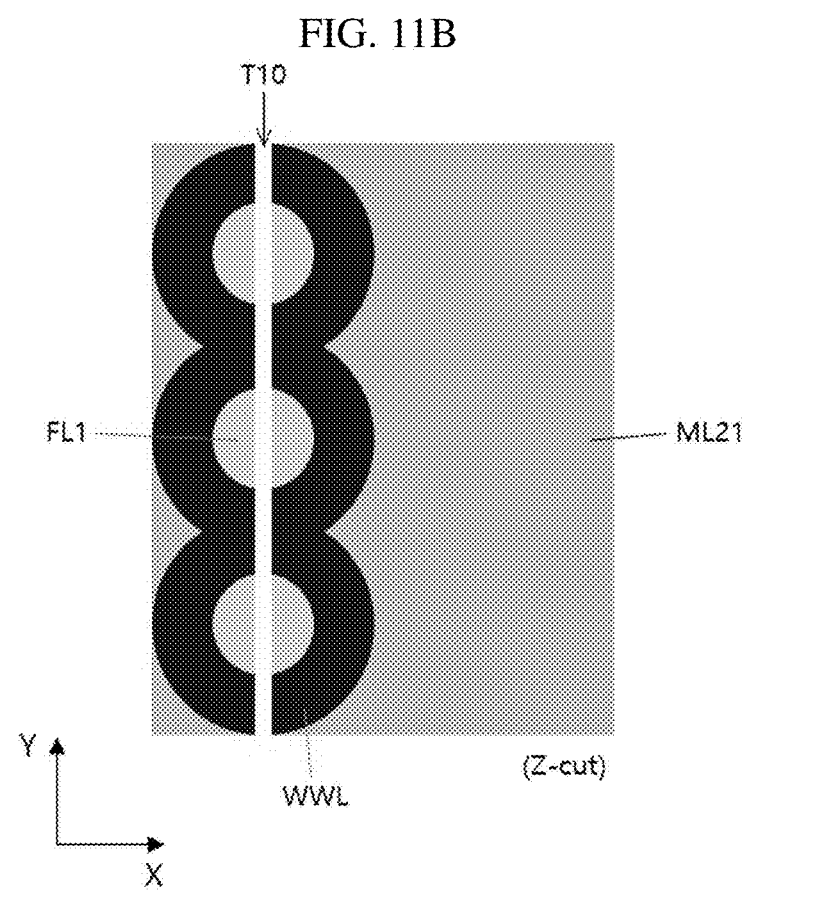
Figure 11C:
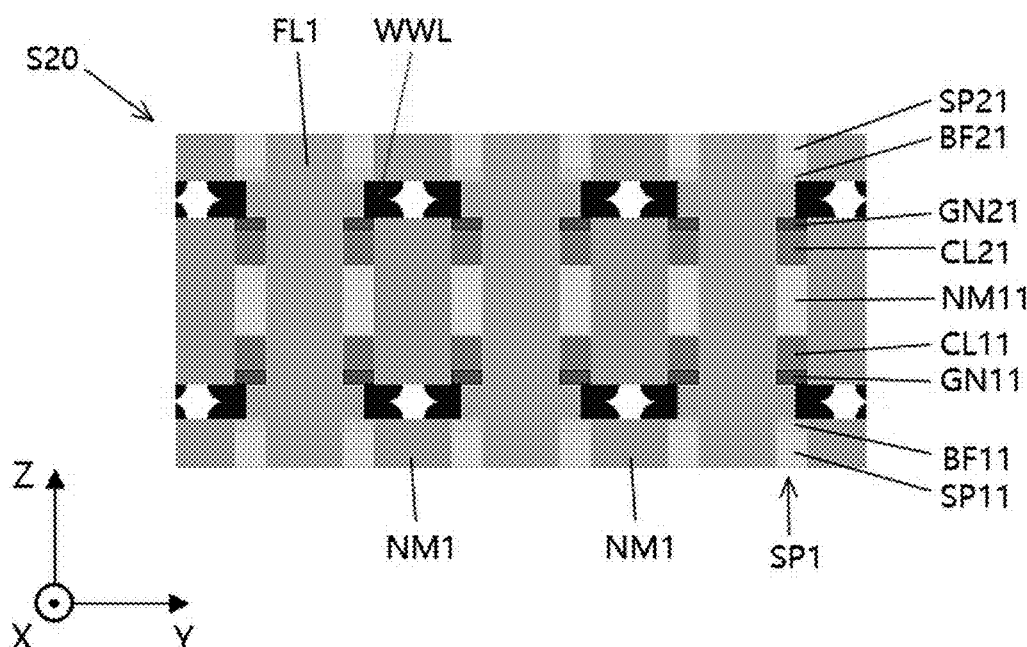

Referring to FIGS. 11A to 11C, a case where the fourth mask pattern M40 is removed from the structure of FIGS. 10A to 10C is illustrated. The write word line WWL may be defined on each of both sides of the first etched portion T10. The illustrated two write word lines WWL may be used as separate write word lines WWL.

Figure 12A:
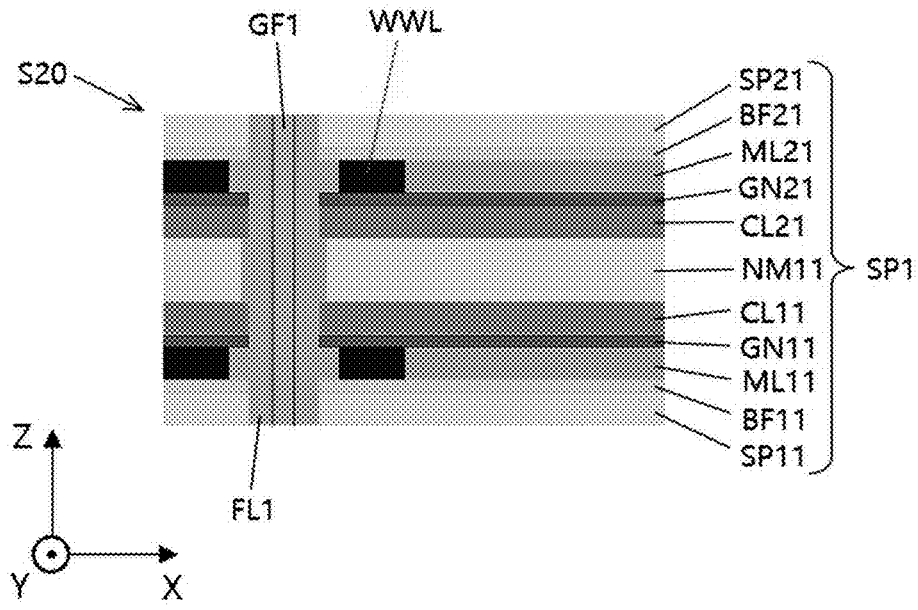
Figure 12B:
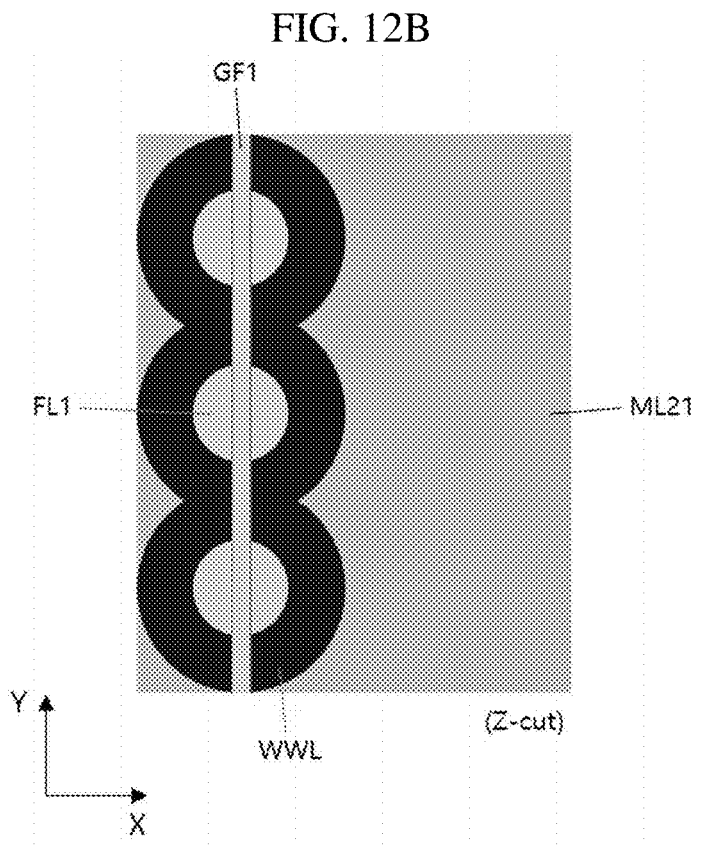
Figure 12C:

Referring to FIGS. 12A to 12C, a first gap fill insulating layer GF1 may be formed to fill the first etched portion (T10 in FIG. 11A). The first gap fill insulating layer GF1 may be formed of at least one of various insulating materials. As a non-limiting example, the first gap fill insulating layer GF1 may include a silicon oxide or be formed of a silicon oxide.

As described above, the write word line WWL extending in the horizontal direction is formed in the first recess (R1 in FIG. 5A) by using the method as illustrated in FIGS. 6A to 12C and thus, a write transistor including the first channel material layer CL11/CL21, the first gate insulating layer GN11/GN21, and a portion of the write word line WWL may be defined. In the embodiment of FIG. 12A, a lower write transistor structure including the lower first channel material layer CL11, the lower first gate insulating layer GN11, and a portion of the write word line WWL, and an upper write transistor structure including the upper first channel material layer CL21, the upper first gate insulating layer GN21 and a portion of the write word line WWL may be defined. However, the method of defining the write transistor is only an example and may vary.

Then, a write bit line (WBL of FIG. 14A) extending in the vertical direction at a position corresponding to the first vertical hole (H10 in FIG. 4A) may be formed by using the method as illustrated in FIGS. 13A to 14C. For reference, the expression 'corresponding' in this specification may mean the same thing, but may be a concept which broadly encompasses substantially the same or similar things. This may be applied equally throughout this specification.

Figure 13A:
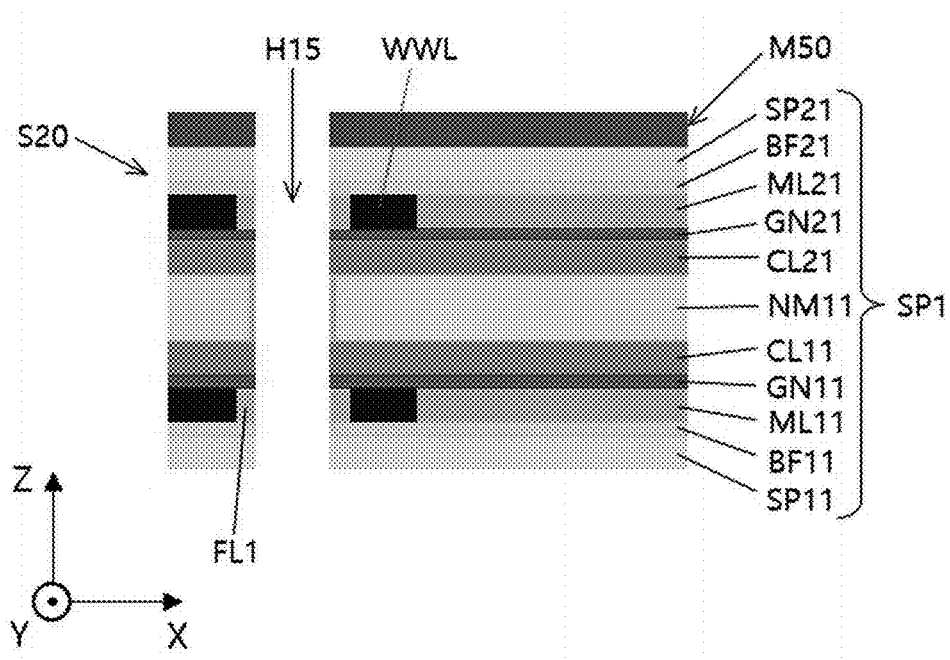
Figure 13B:
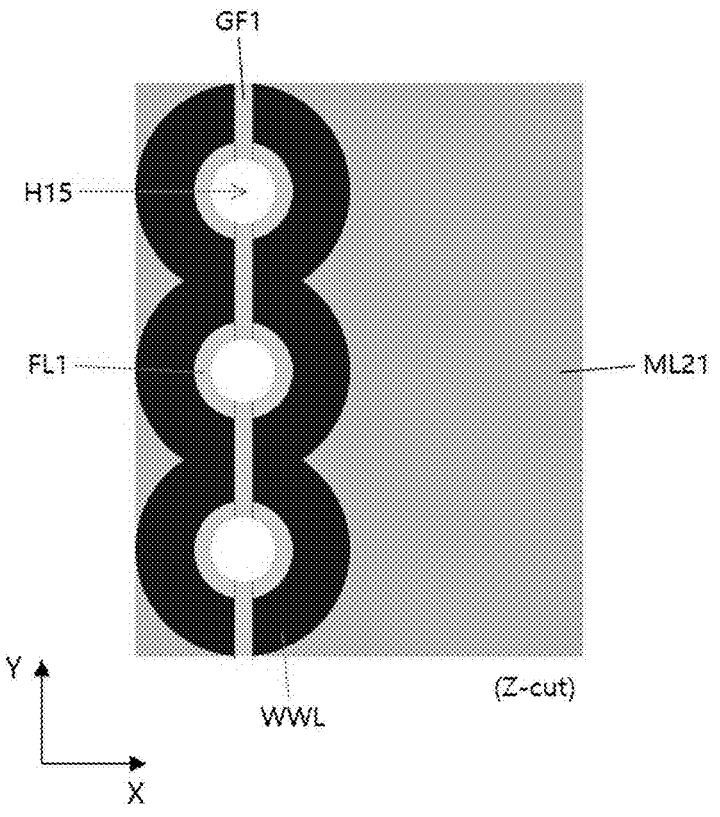
Figure 13C:
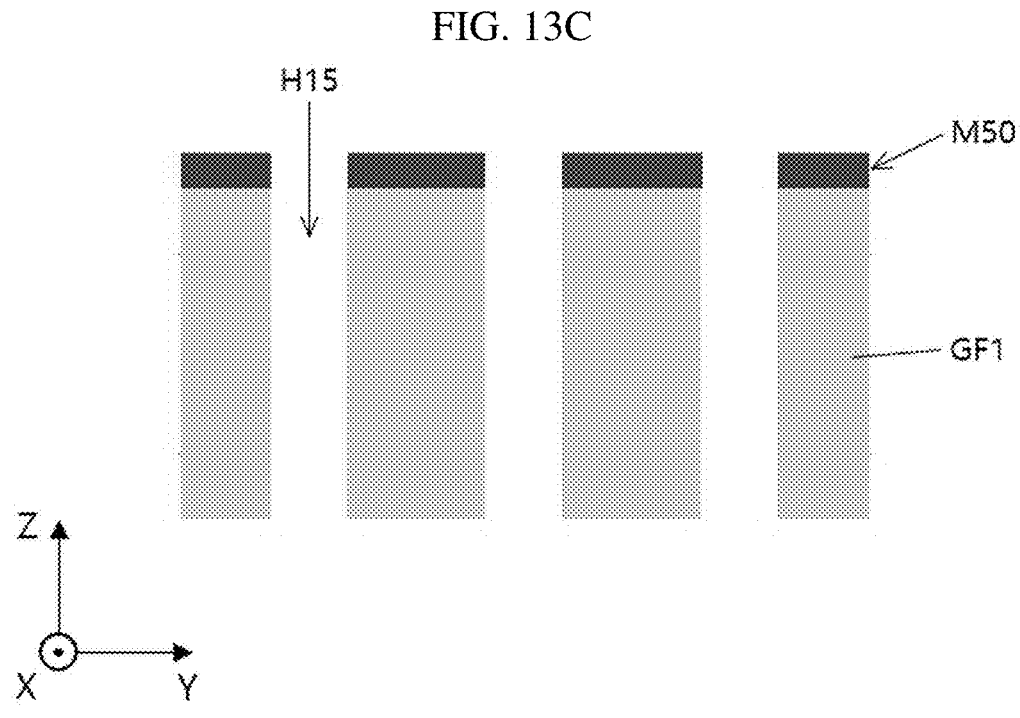

Referring to FIGS. 13A to 13C, a first through hole H15 may be formed by etching the first filling insulating layer FL1 and the first gap fill insulating layer GF1 at a position corresponding to the first vertical hole (H10 in FIG. 4A) of the structure S20. A fifth mask pattern M50 may be used to form the first through hole H15. The fifth mask pattern M50 may have a predetermined opening pattern. The fifth mask pattern M50 may be, for example, a photoresist pattern. After forming the first through hole H15, the fifth mask pattern M50 may be removed. However, the removal timing of the fifth mask pattern M50 may vary. For example, the fifth mask pattern M50 may be removed after the formation process of the write bit line WBL, which will be described in FIG. 14A.

Figure 14A:
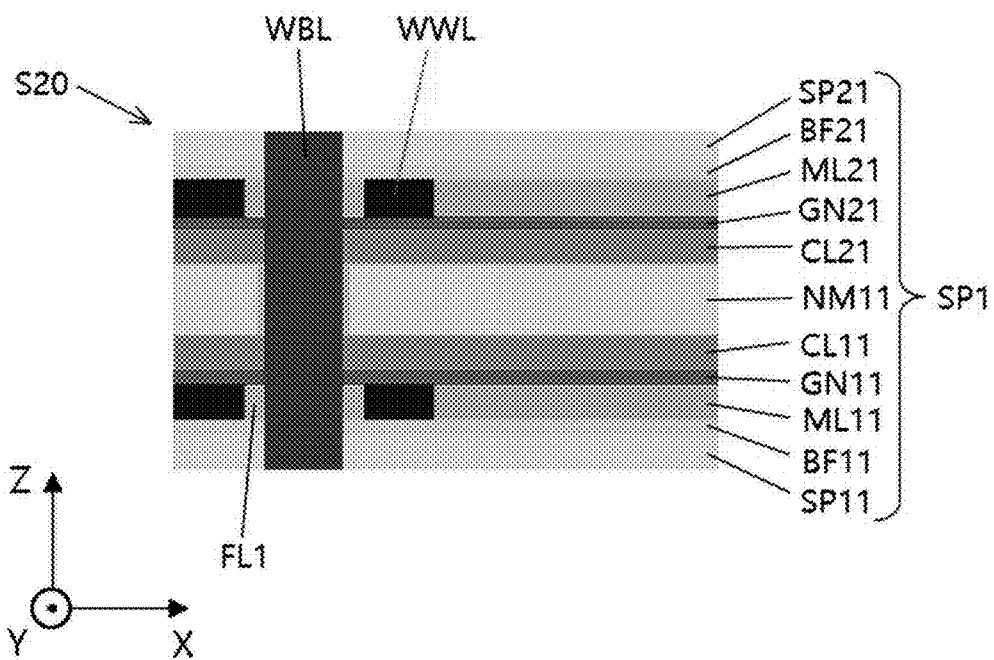
Figures 14B, 14C:
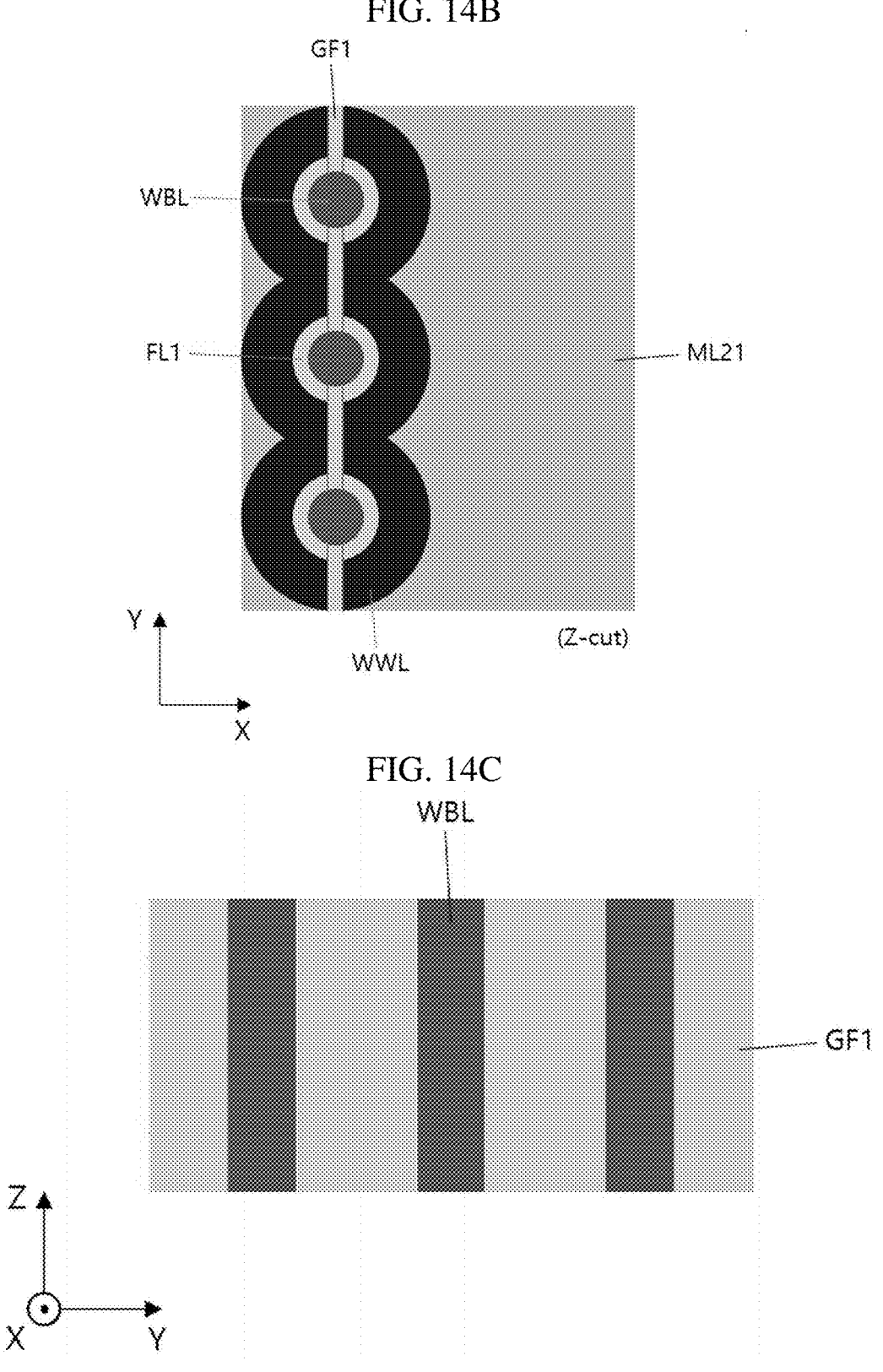

Referring to FIGS. 14A to 14C, the write bit line WBL may be formed in the first through hole (H15 in FIG. 13A). The write bit line WBL may include, for example, at least one of a metal, a metal compound, and a conductive silicon.

Figure 15A:
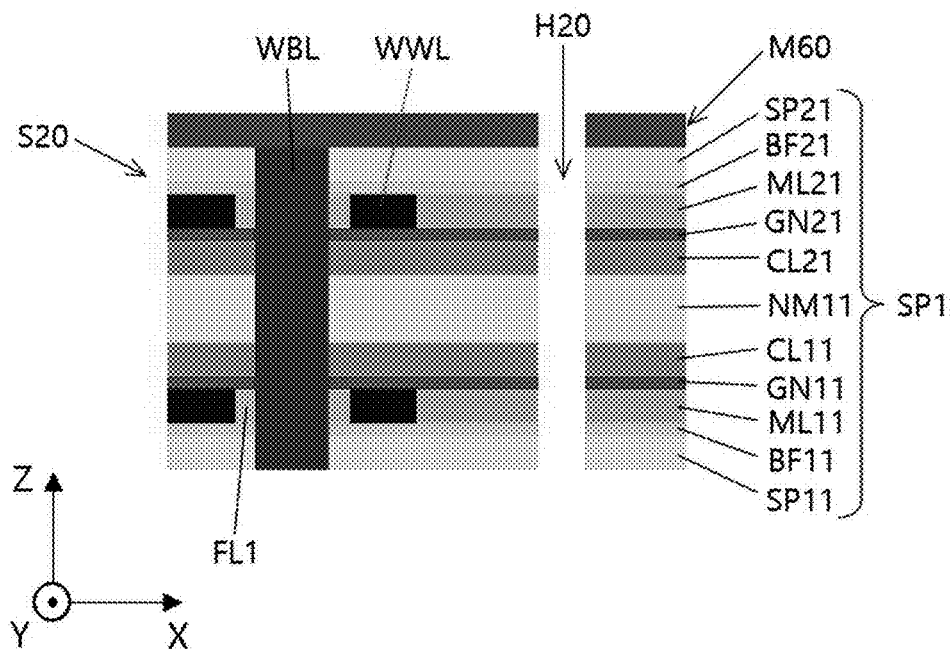
Figure 15B:
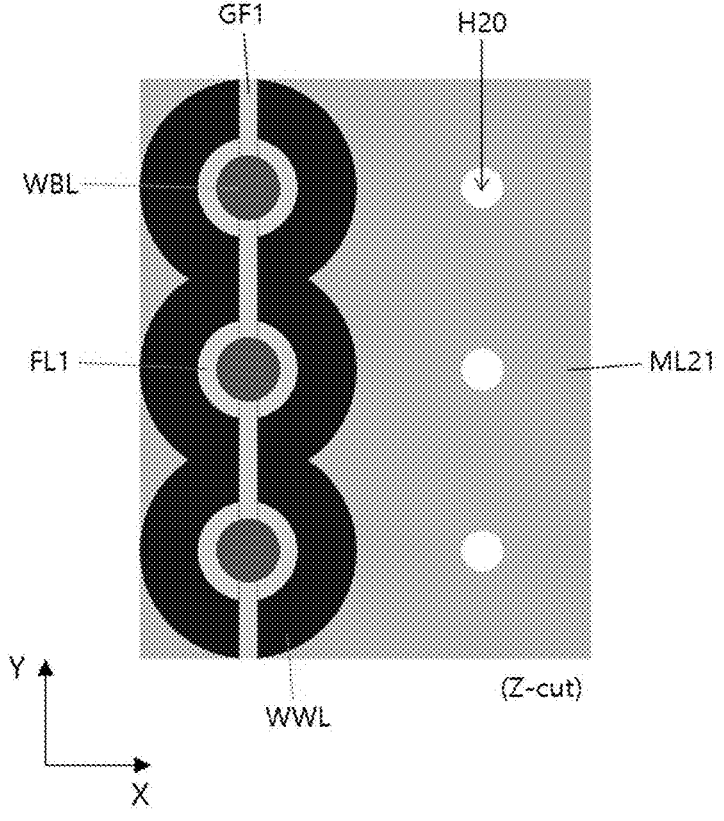
Figure 15C:
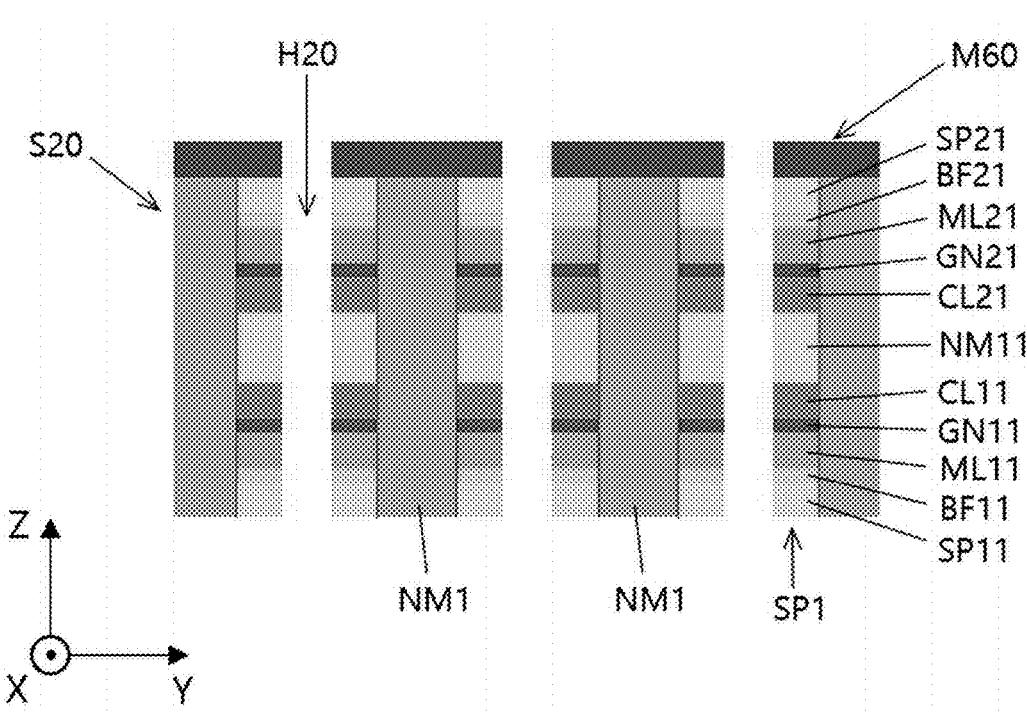

Referring to FIGS. 15A to 15C, a second vertical hole H20 to penetrate through each of the plurality of pattern portions SP1 in the vertical direction may be formed in the structure S20. The second vertical hole H20 may be formed in a region where a read transistor is to be formed, that is, a read transistor formation planned region.

Each of the second vertical holes H20 may be formed to penetrate from the upper buffer layer SP21 at the uppermost part of the pattern portion SP1 to the lower buffer layer SP11 at the lowermost part in a predetermined region of the structure S20. The second vertical hole H20 may correspond to a region where a read bit line will be formed later. However, the second vertical hole H20 may be formed to have a somewhat smaller diameter (size) than that of the read bit line to be formed later. A plurality of second vertical holes H20 may be formed to be spaced apart from each other in the Y-axis direction. FIG. 15C may be a cross-sectional diagram observed along the YZ plane at the portion where the second vertical hole H20 is formed in FIG. 15B.

A sixth mask pattern M60 may be used to form the second vertical hole H20. The sixth mask pattern M60 may have a predetermined opening pattern. The sixth mask pattern M60 may be, for example, a photoresist pattern. After forming the second vertical hole H20, the sixth mask pattern M60 may be removed. However, the removal timing of the sixth mask pattern M60 may vary. For example, the sixth mask pattern M60 may be removed after the recess process described in FIG. 16A or after the recess process described in FIG. 17A.

Figure 16A:
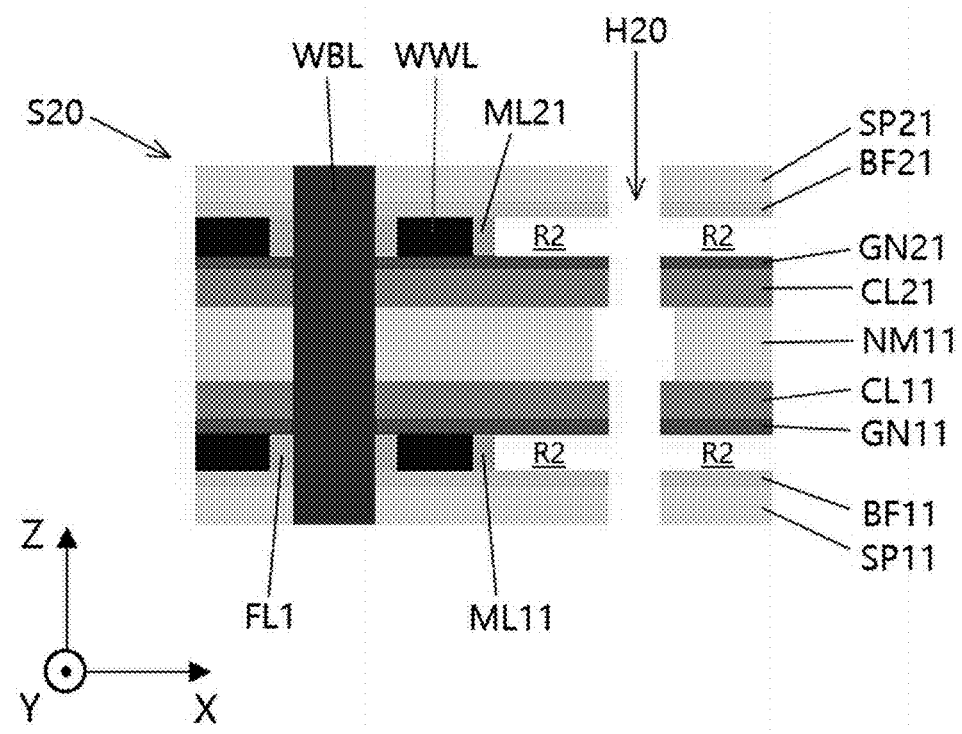
Figure 16B:
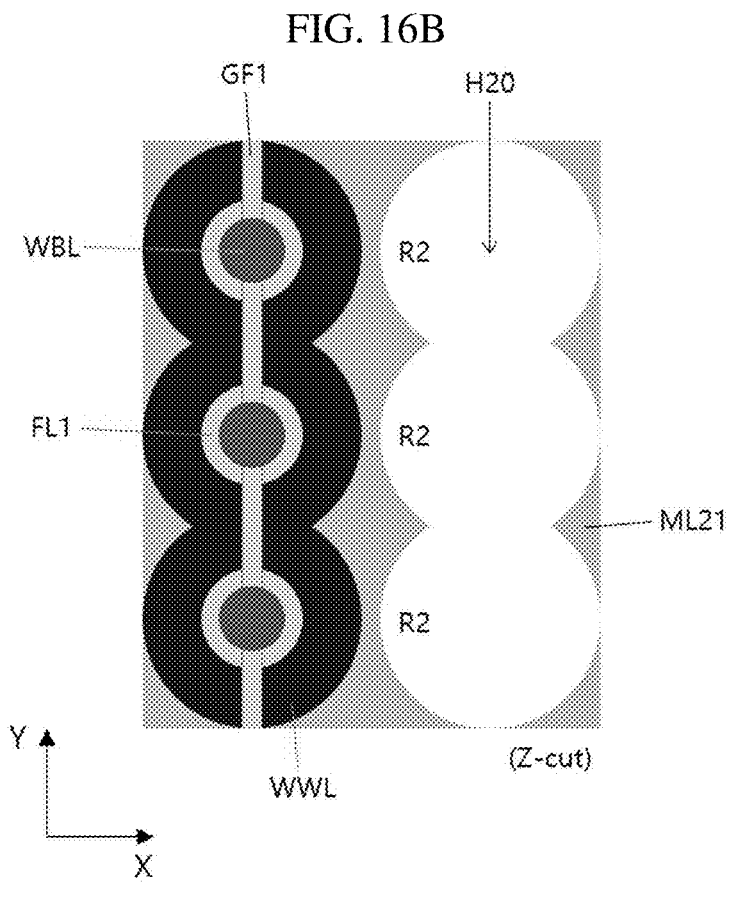
Figure 16C:
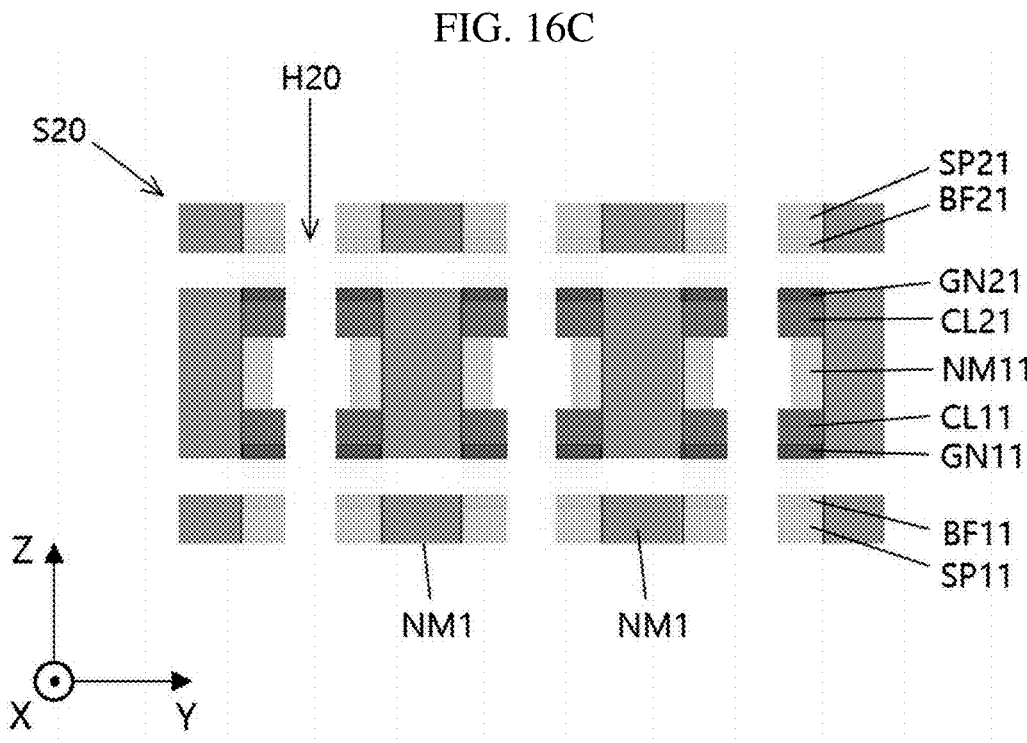

Referring to FIG. 16A to FIG. 16C, a second recess R2 may be formed by recessing the upper intermediate layer ML21, the lower intermediate layer ML11, and the filling material NM1 around the second vertical hole H20 of the structure S20. A portion of each of the upper intermediate layer ML21, the lower intermediate layer ML11, and the filling material NM1 may be selectively recessed (etched) by using a wet etching process using a wet etchant with etching selectivity with respect to the upper intermediate layer ML21, the lower intermediate layer ML11, and the filling material NM1. At this time, a portion of the insulating material layer NM11 exposed by the second vertical hole H20 may also be slightly etched. Here, a process for slightly etching (recessing) the insulating material layer NM11 may be necessary to form an insulating region in this portion later. The first gate insulating layer GN11/GN21 and the buffer layer BF11/BF21 may be exposed by the second recess R2. FIG. 16C may be a cross-sectional diagram of the region where the second recess R2 is formed in FIG. 16B.

According to one embodiment, in the step for forming the second recess R2, a plurality of second recesses R2 may be connected in the second direction, that is, the Y-axis direction. This connection may be configured to ensure that a read word line to be formed in the second recess R2 later has a shape extending in the Y-axis direction.

Figure 17A:
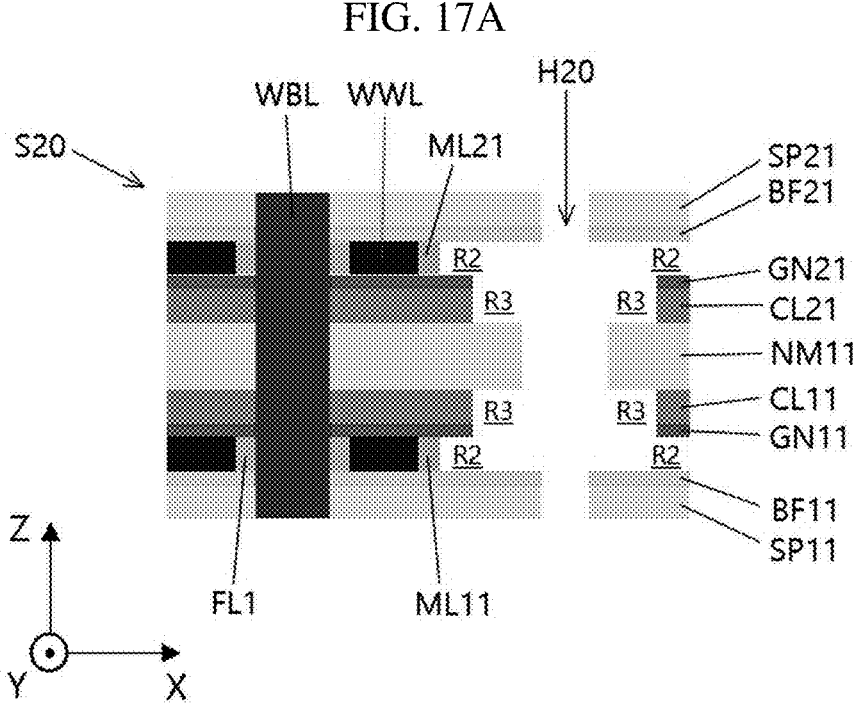
Figure 17B:
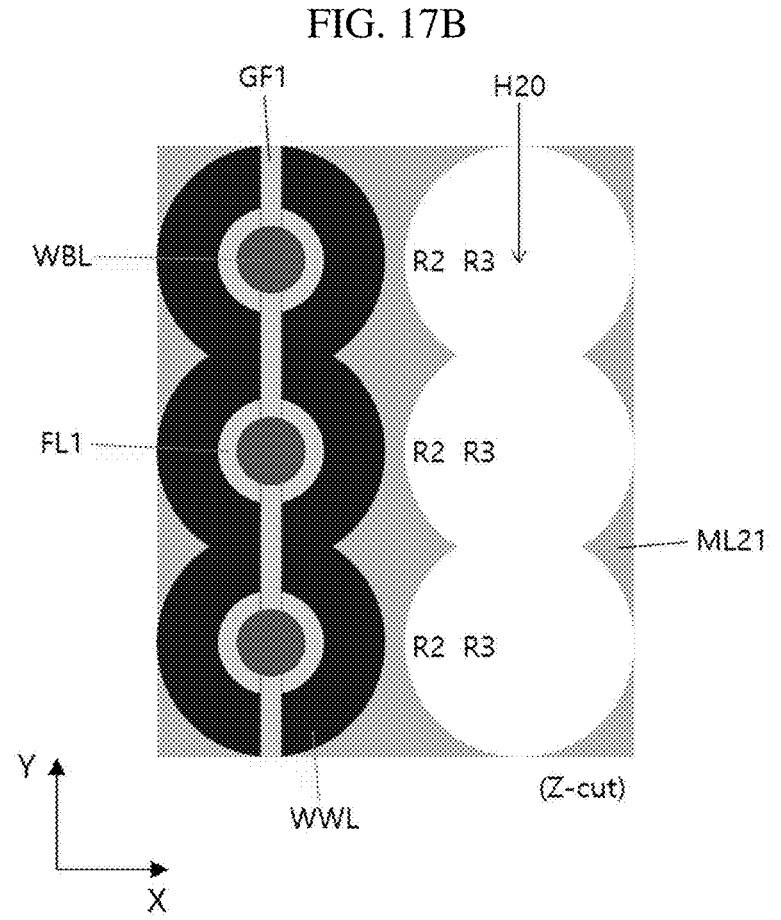
Figure 17C:
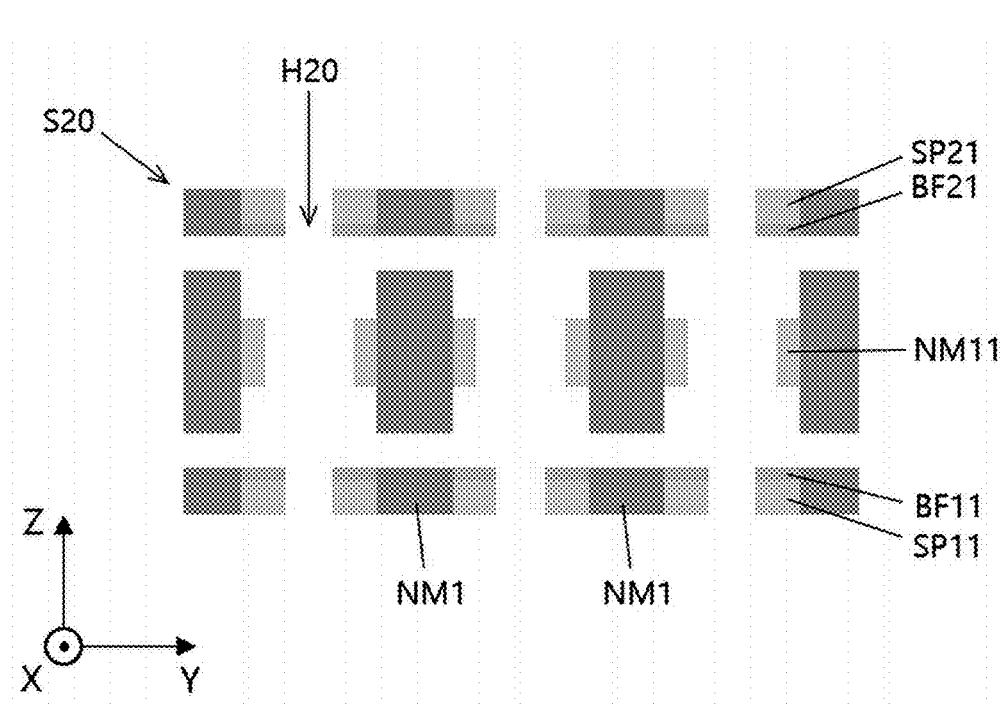

Referring to FIGS. 17A to 17C, a third recess R3 may be formed by recessing the first channel material layer CL11/CL21 and the first gate insulating layer GN11/GN21 exposed by the second vertical hole H20. The first channel material layer CL11/CL21 exposed by the second vertical hole H20 may be recessed by using a wet etching process, and in this process, the first gate insulating layer GN11/GN21 having a thin thickness may also be recessed together. Furthermore, the insulating material layer NM11 exposed by the second vertical hole H20 may be slightly further etched (recessed).

Figure 18A:
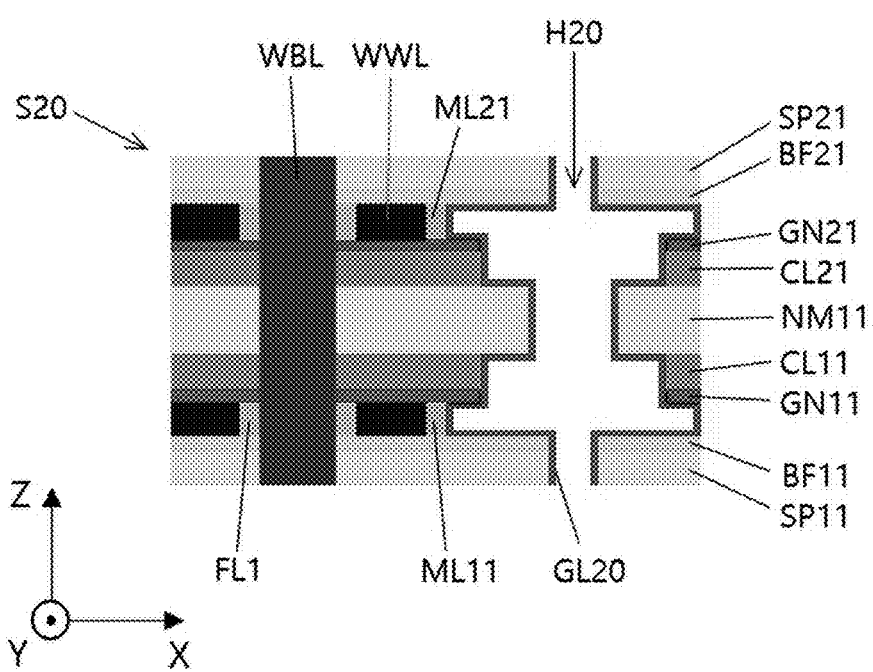
Figure 18B:
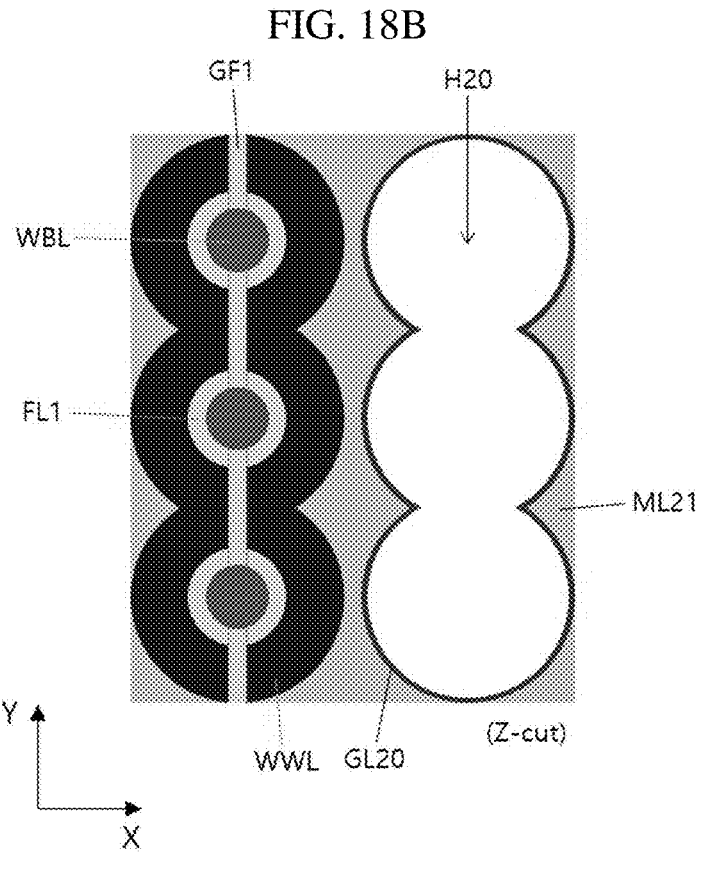
Figure 18C:
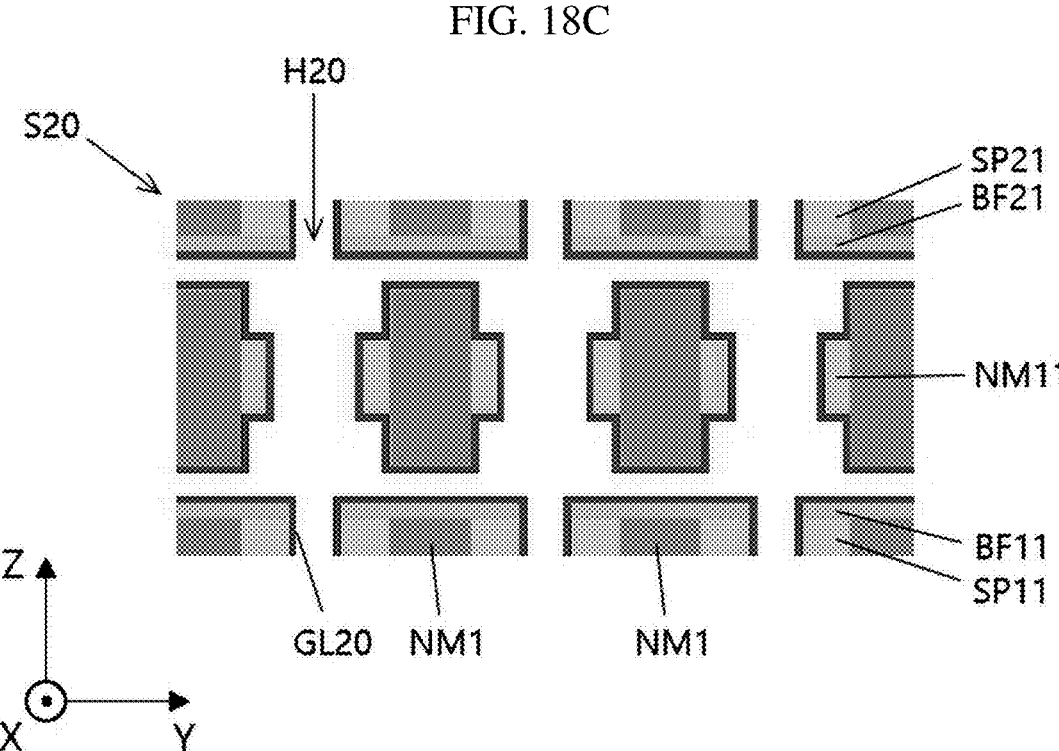

Referring to FIGS. 18A to 18C, a second gate insulating layer GL20 may be formed on the inner surface of the second vertical hole H20 including surfaces of the second and third recesses (R2 and R3 in FIG. 17A). The second gate insulating layer GL20 may be formed to include at least one of various insulating materials and may be formed, for example, through an atomic layer deposition (ALD) process. The second gate insulating layer GL20 may be formed conformally according to the shape of the surface on which the second gate insulating layer GL20 is deposited. The second gate insulating layer GL20 may be formed to be thinner than each of the lower first gate insulating layer GN11 and the upper first gate insulating layer GN21. Accordingly, the read transistor to be formed later may have a lower threshold voltage Vth than that of the write transistor.

Figure 19A:
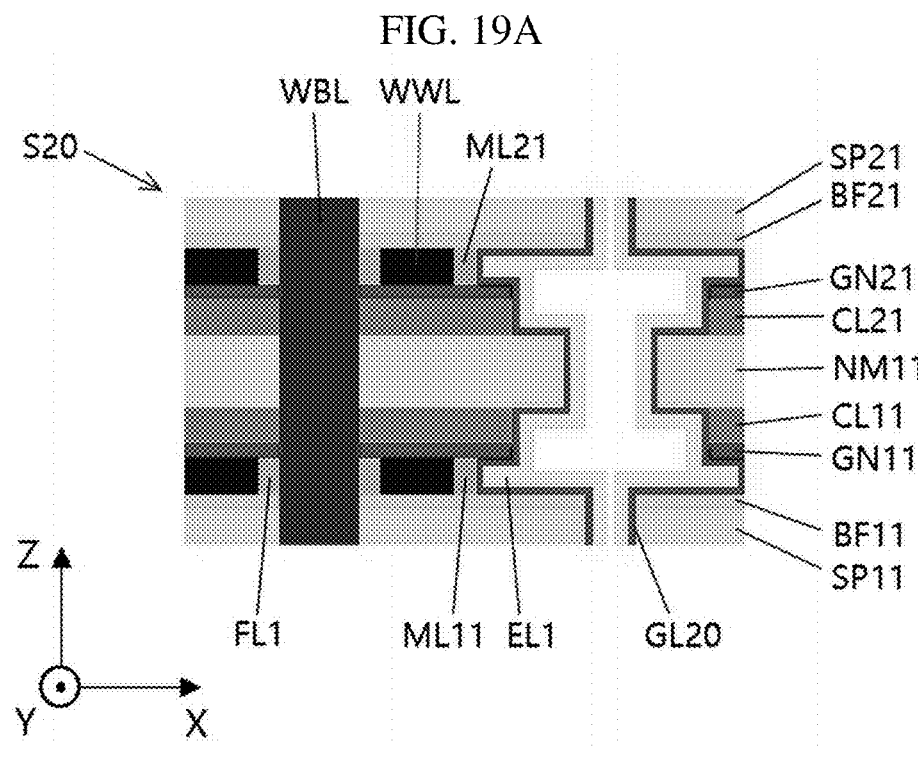
Figure 19B:
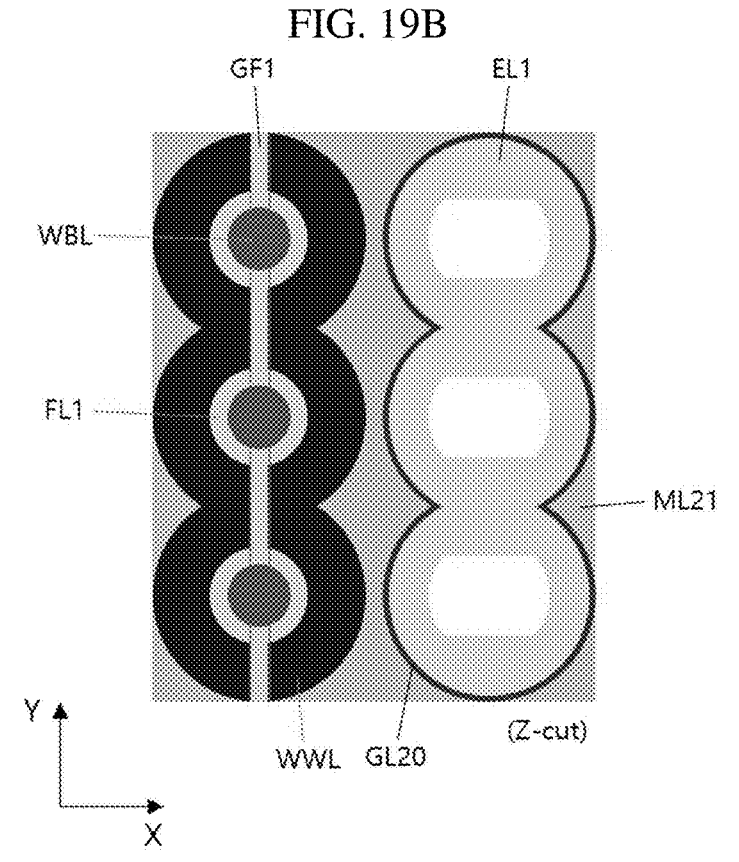
Figure 19C:
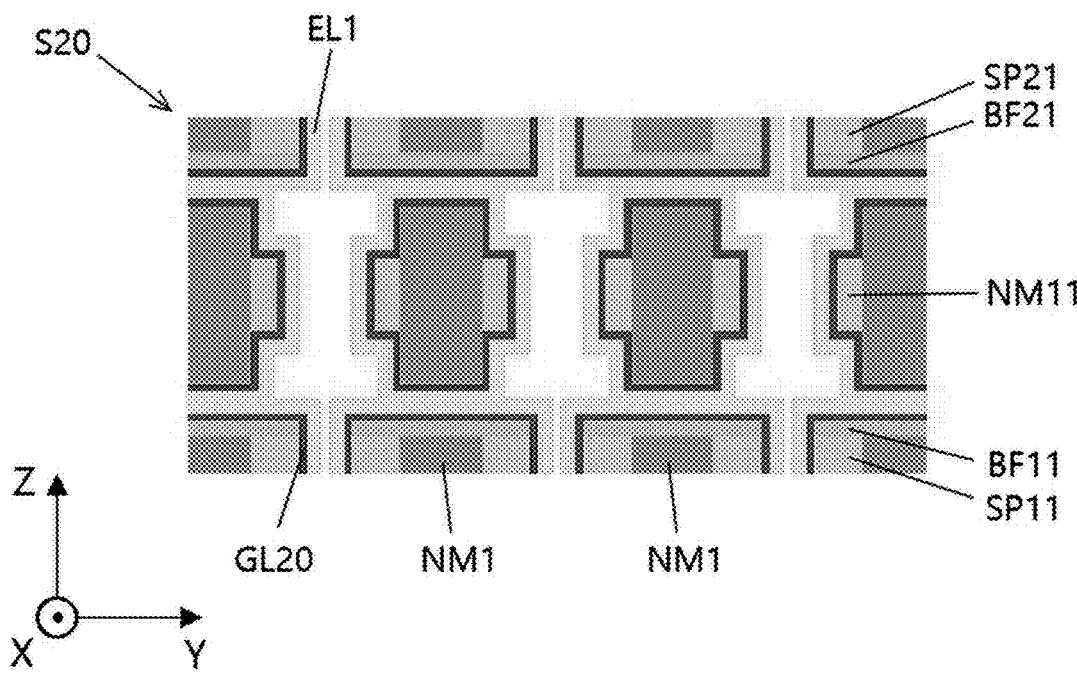

Referring to FIGS. 19A to 19C, an electrode material layer EL1 to fill an end region of the second recess (R2 in FIG. 17A) may be formed on the second gate insulating layer GL20. The electrode material layer EL1 may be formed on the entire surface of the second gate insulating layer GL20 and may have a thickness which fills an edge region, that is, the end region, of the second recess (R2 in FIG. 17A). The electrode material layer EL1 may be formed conformally according to the surface shape of the second gate insulating layer GL20.

Figure 20A:
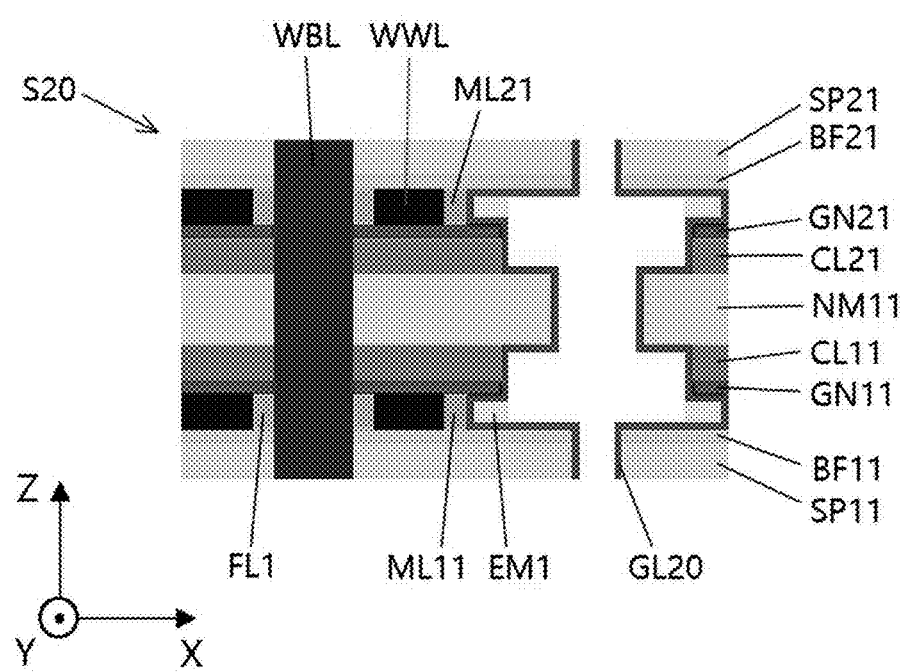
Figures 20B, 20C:
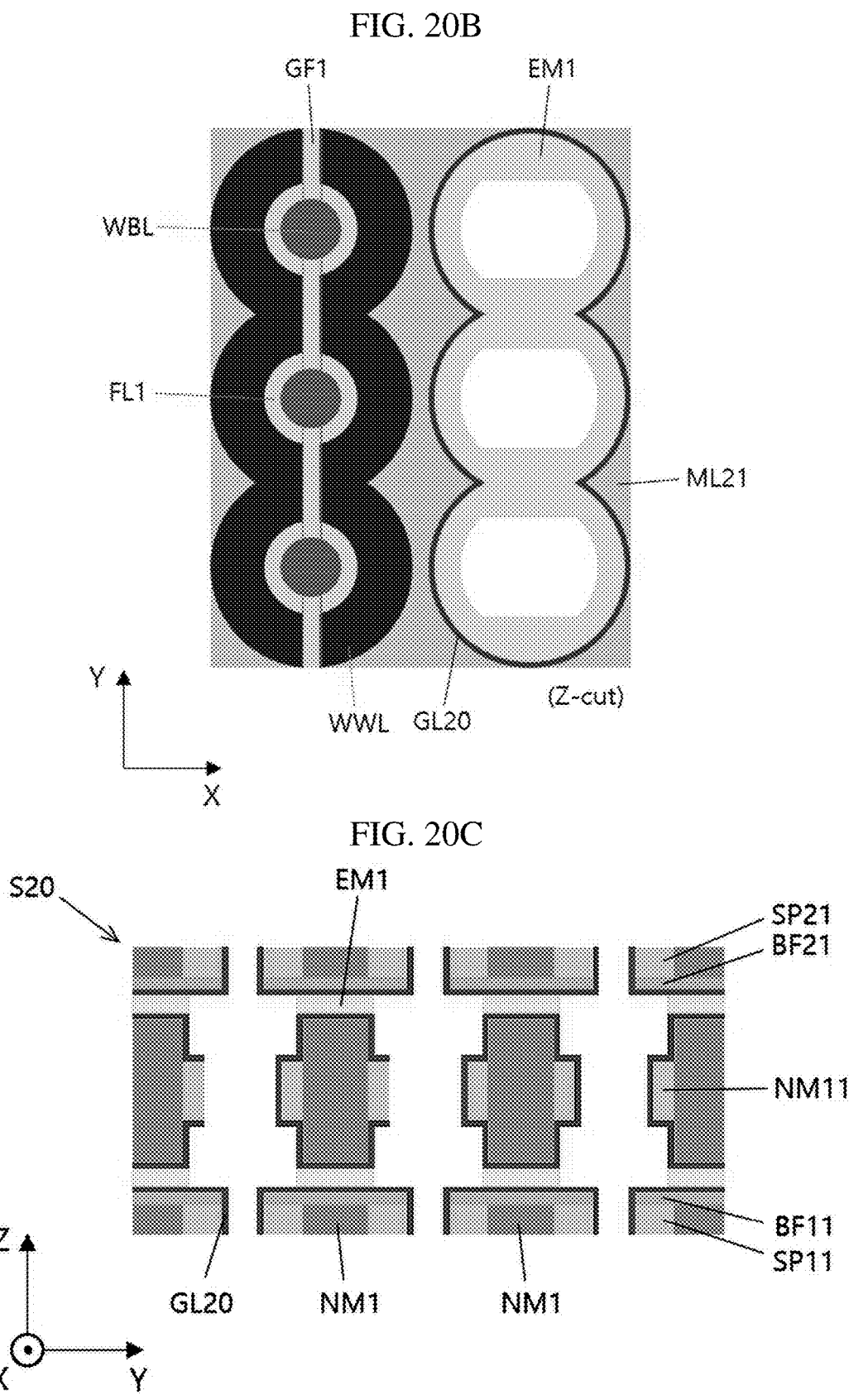

Referring to FIGS. 20A to 20C, an electrode member EM1 remaining in the end region of the second recess (R2 in FIG. 17A) may be formed from the electrode material layer (EL1 in FIG. 19A) by removing a remaining portion of the electrode material layer (EL1 in FIG. 19A) except for the portion disposed at the end region of the second recess (R2 in FIG. 17A). For example, the remaining portion may be removed while leaving only the electrode member EM1 provided at the end region of the second recess (R2 in FIG. 17A) by using the thickness difference between regions of the electrode material layer (EL1 in FIG. 19A) and through a wet etching process which may remove metal or metal compound. The specific method for forming the electrode member EM1 is not limited to the method described in FIGS. 19A to 20C and may vary depending on the case.

Figure 21A:
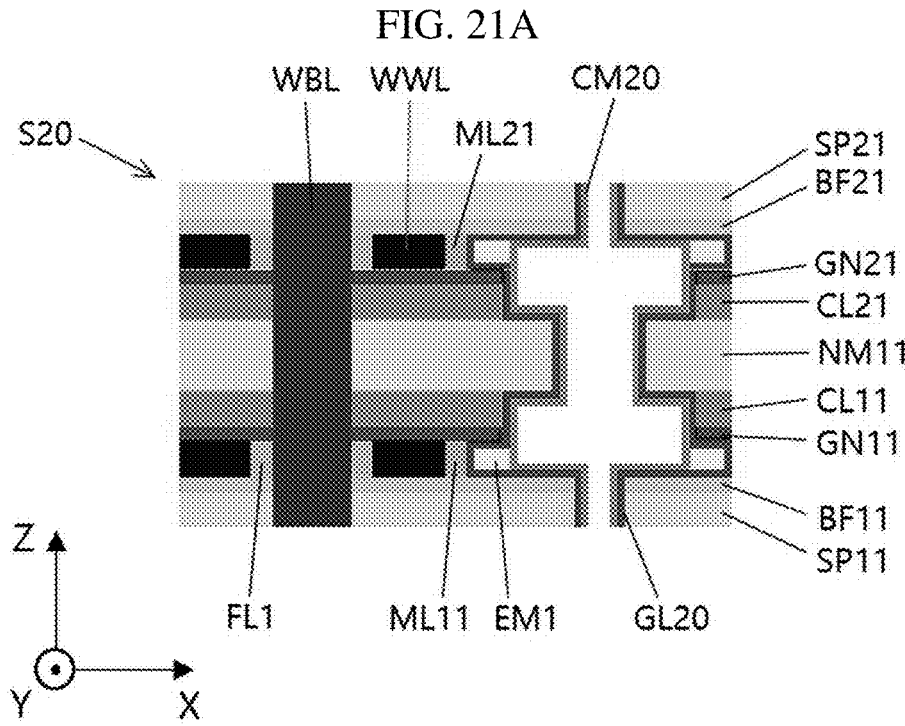
Figure 21B:
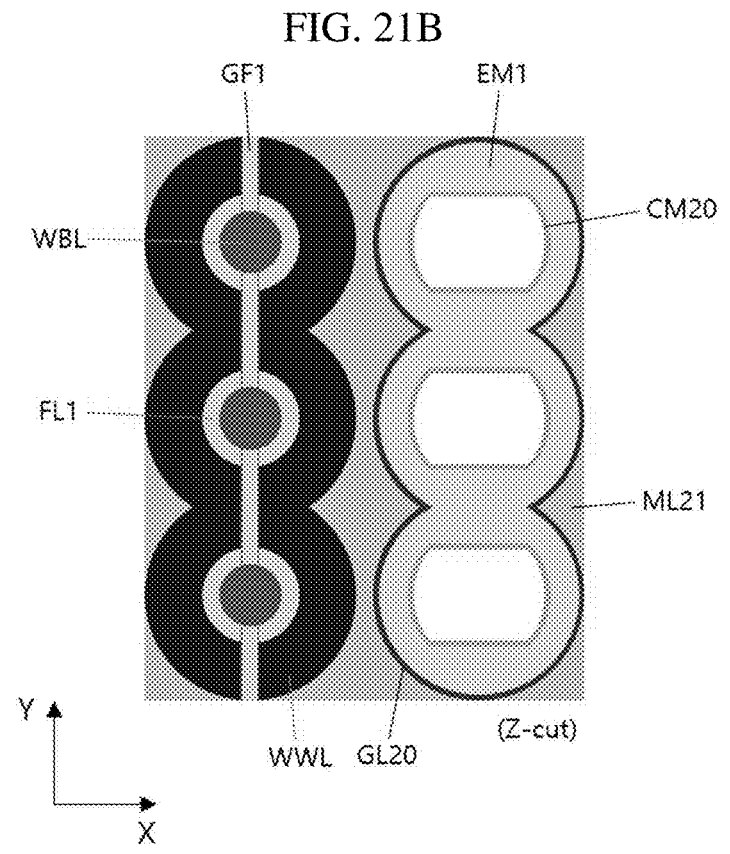
Figure 21C:
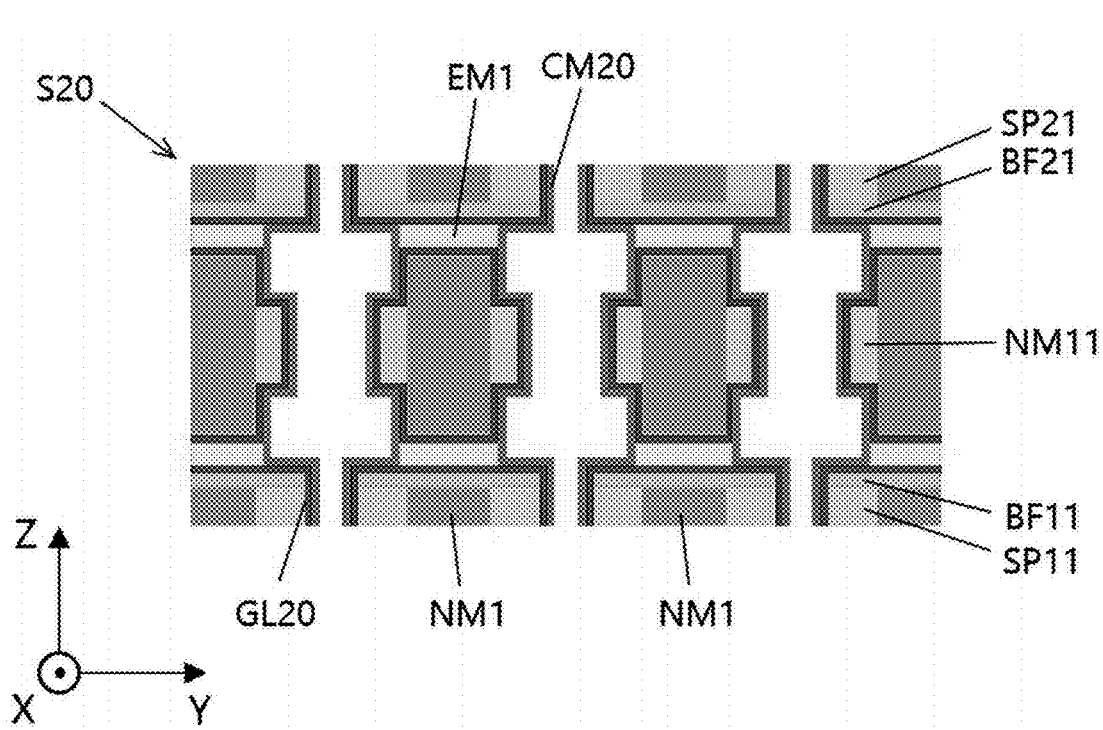

Referring to FIGS. 21A to 21C, a second channel material layer CM20 may be formed on the second gate insulating layer GL20 and the electrode member EM1 exposed on the inner surface of the second vertical hole (H20 in FIG. 18A). The second channel material layer CM20 may be formed through, for example, an ALD process. The second channel material layer CM20 may be conformally formed along the surface shapes of the second gate insulating layer GL20 and the electrode member EM1.

Figure 22A:
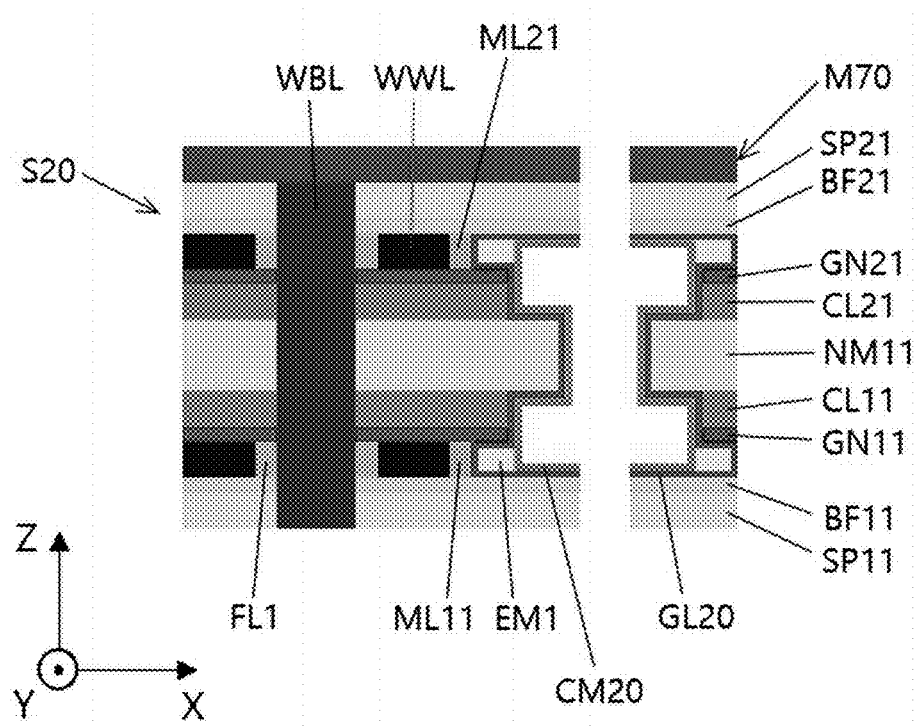
Figure 22B:
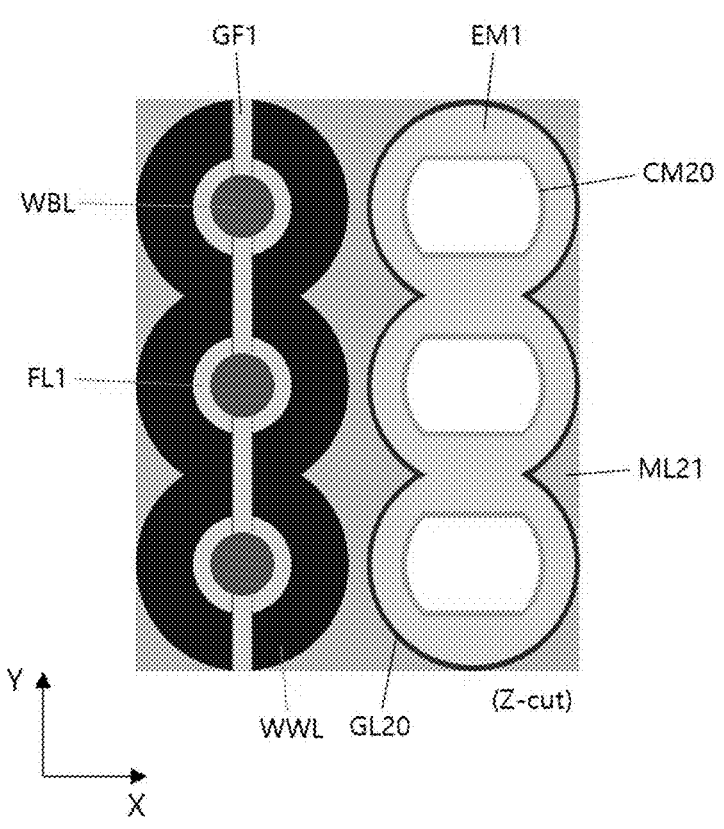
Figure 22C:
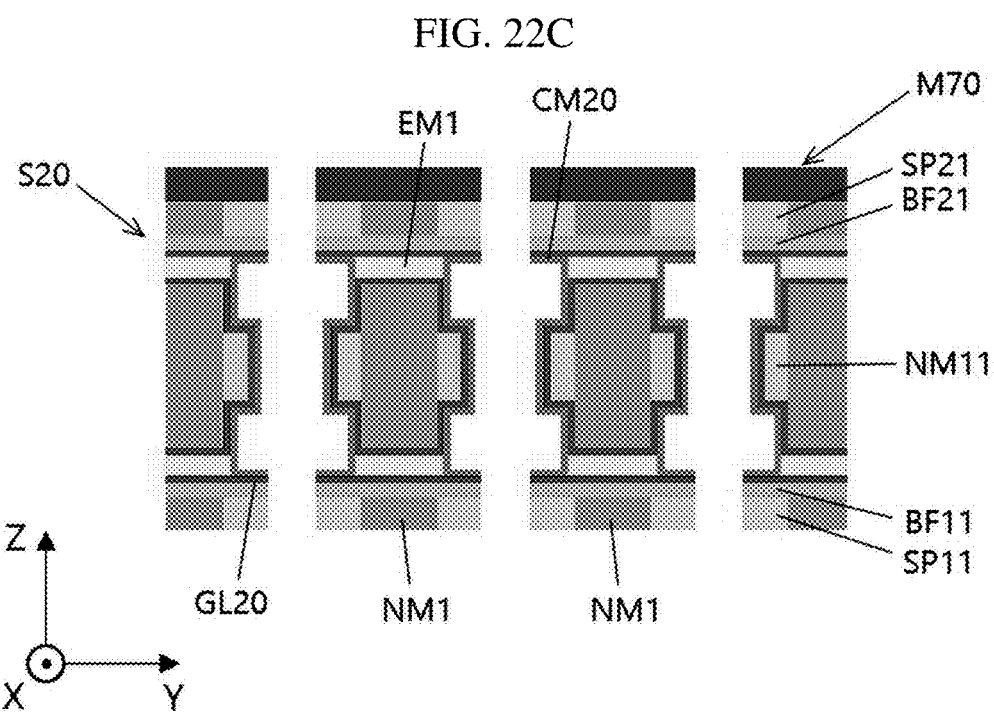

Referring to FIGS. 22A to 22C, portions formed on side surfaces of the buffer layers BF11 and BF21 and the separation layers SP11, SP21 may be removed from the second channel material layer CM20 and the second gate insulating layer GL20 formed on the inner surface of the second vertical hole (H20 in FIG. 18A). A seventh mask pattern M70 may be used for this process. The seventh mask pattern M70 may have a predetermined opening pattern. The seventh mask pattern M70 may be, for example, a photoresist pattern. For example, the seventh mask pattern M70 may be the same pattern as the sixth mask pattern M60 of FIG. 15A. After the step of FIG. 22A, the seventh mask pattern M70 may be removed.

Figure 23A:
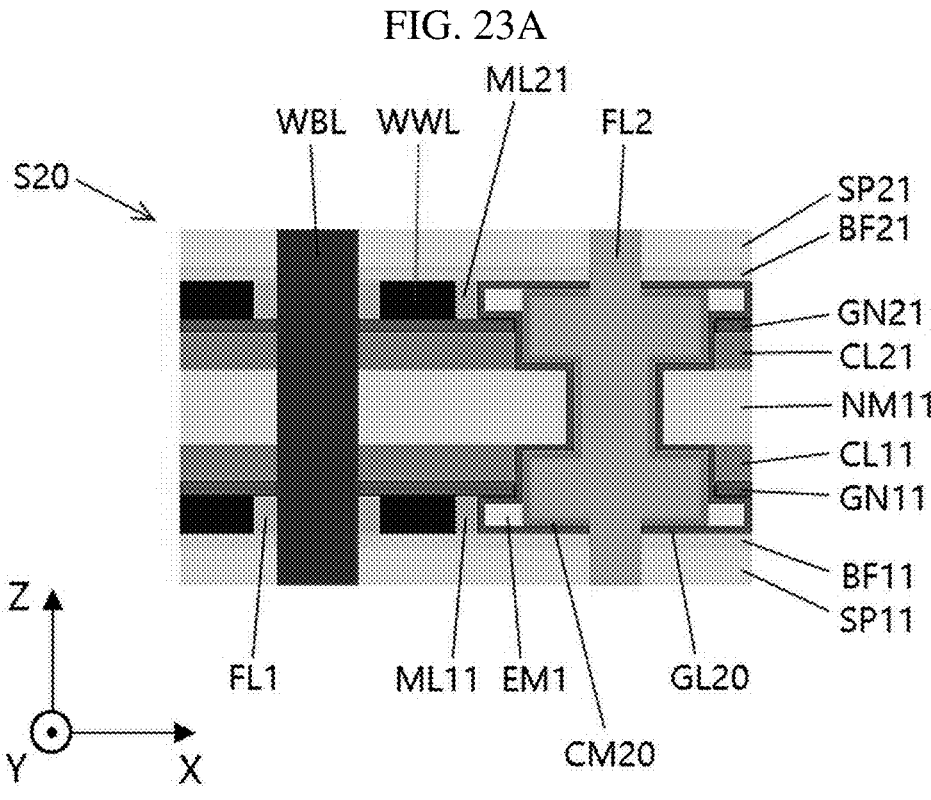
Figure 23B:
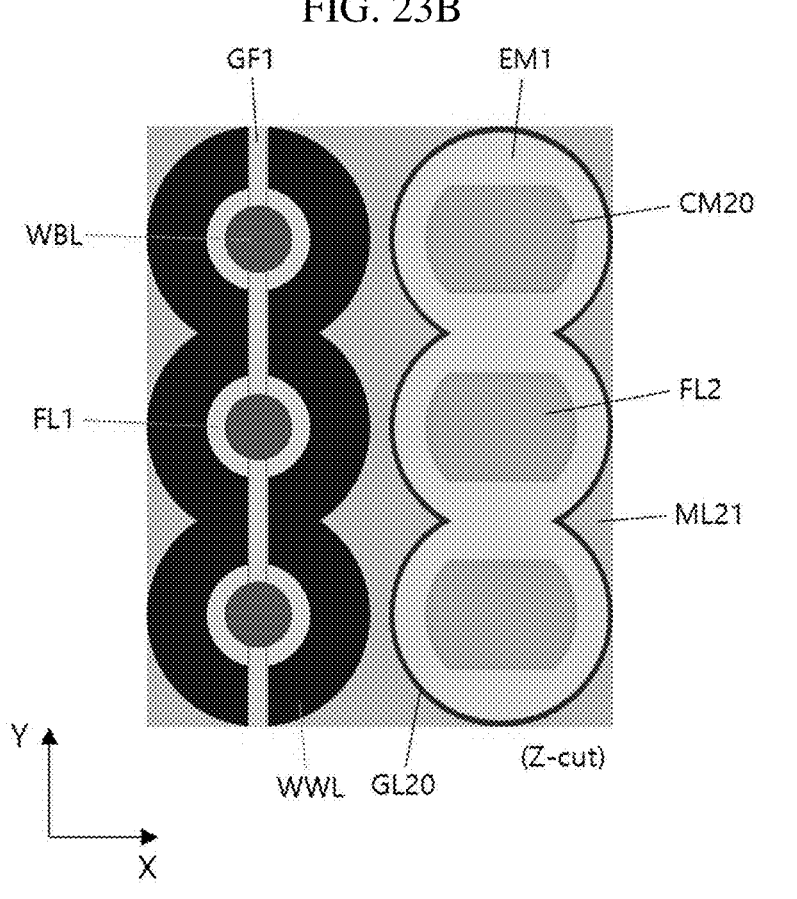
Figure 23C:
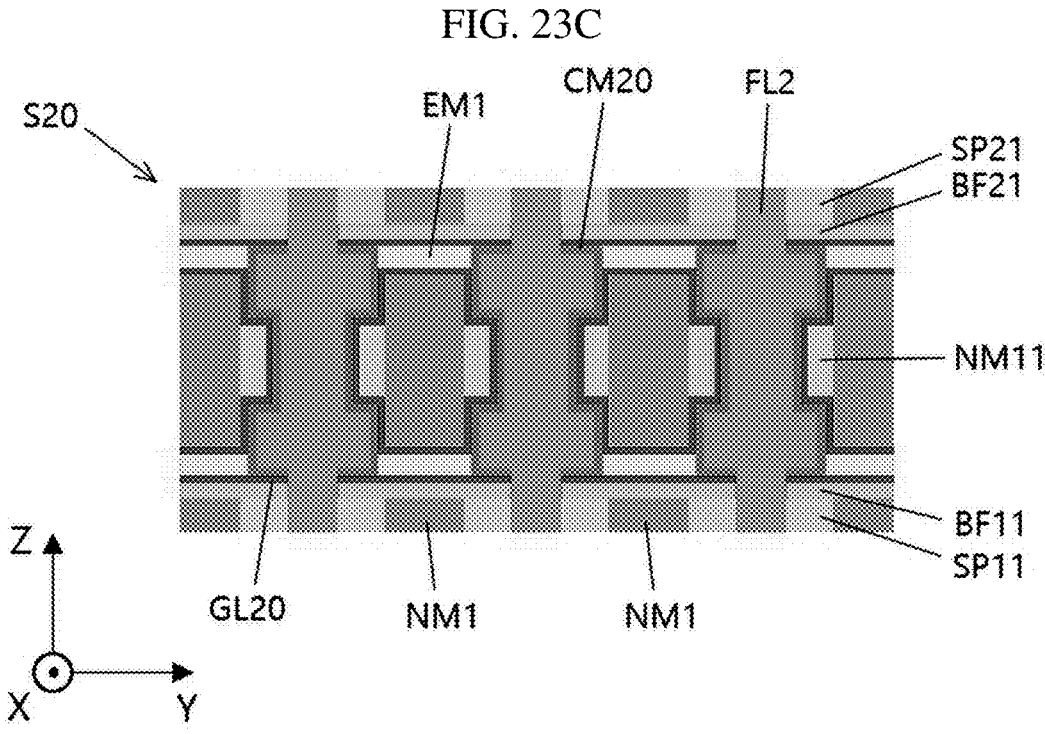

Referring to FIGS. 23A to 23C, a second filling insulating layer FL2 filling the second and third recesses (R2 and R3 in FIG. 17A) and the second vertical hole (H20 in FIG. 18A) may be formed on the second channel material layer CM20. As a non-limiting example, the second filling insulating layer FL2 may include a silicon oxide or be formed of a silicon oxide.

Figure 24A:
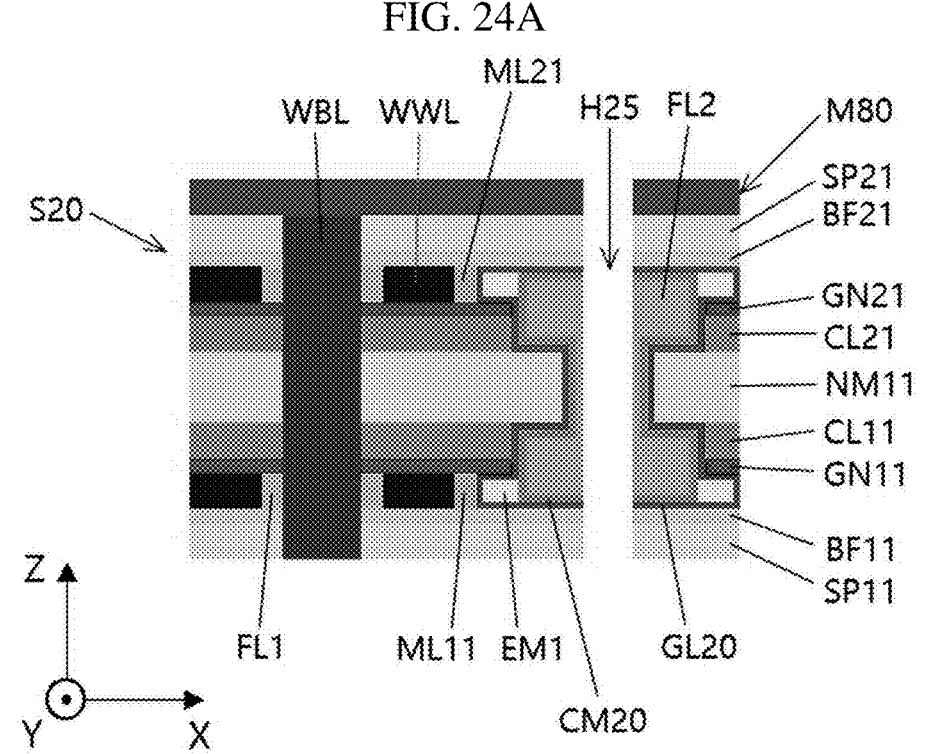
Figures 24B, 24C:
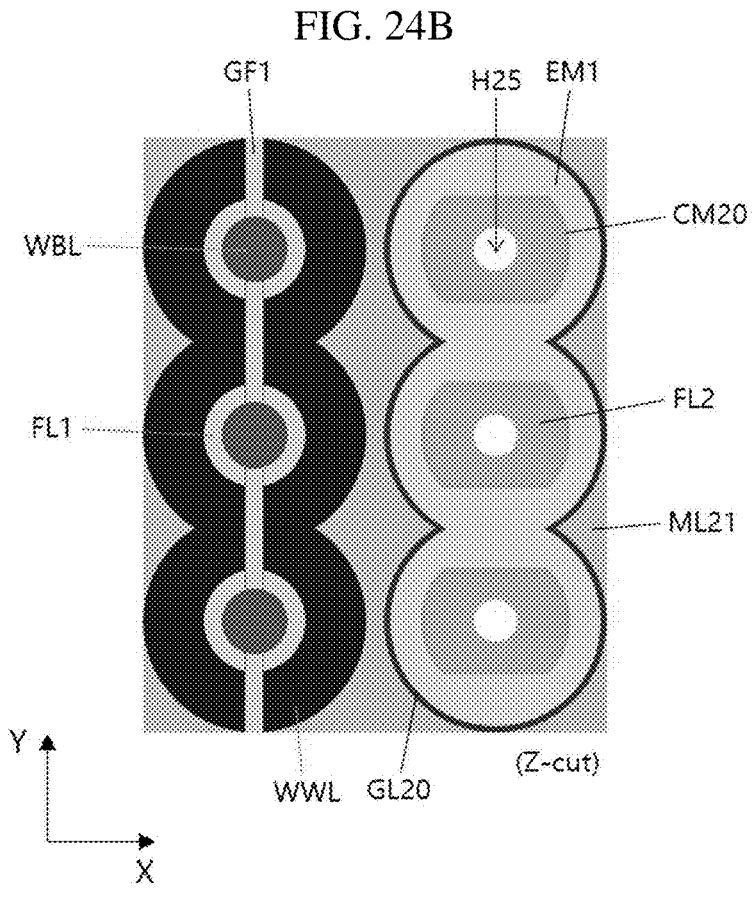

Referring to FIGS. 24A to 24C, a second through hole H25 may be formed at a position corresponding to the second vertical hole (H20 in FIG. 18A) of the second filling insulating layer FL2. The second through hole H25 may be formed through a dry etching process. The buffer layers BF11 and BF21 may be exposed through the second through hole H25. Furthermore, the second channel material layer CM20 formed on the inner side surface of the insulating material layer NM11 may not be exposed. An eighth mask pattern M80 may be used to form the second through hole H25. The eighth mask pattern M80 may have a predetermined opening pattern. The eighth mask pattern M80 may be, for example, a photoresist pattern.

Figure 25A:
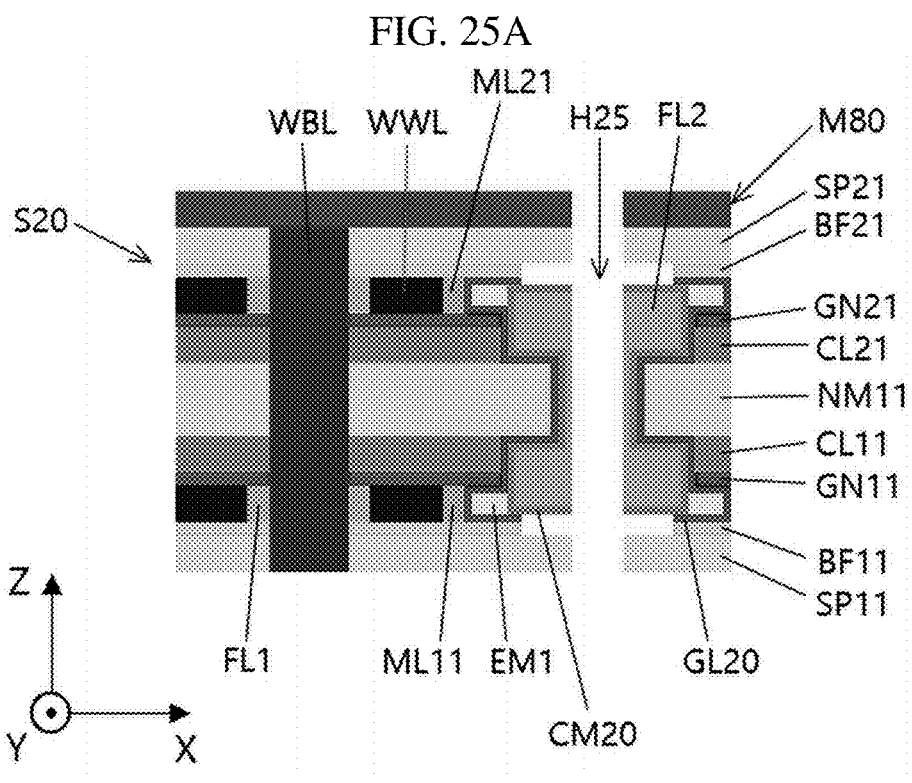
Figure 25B:
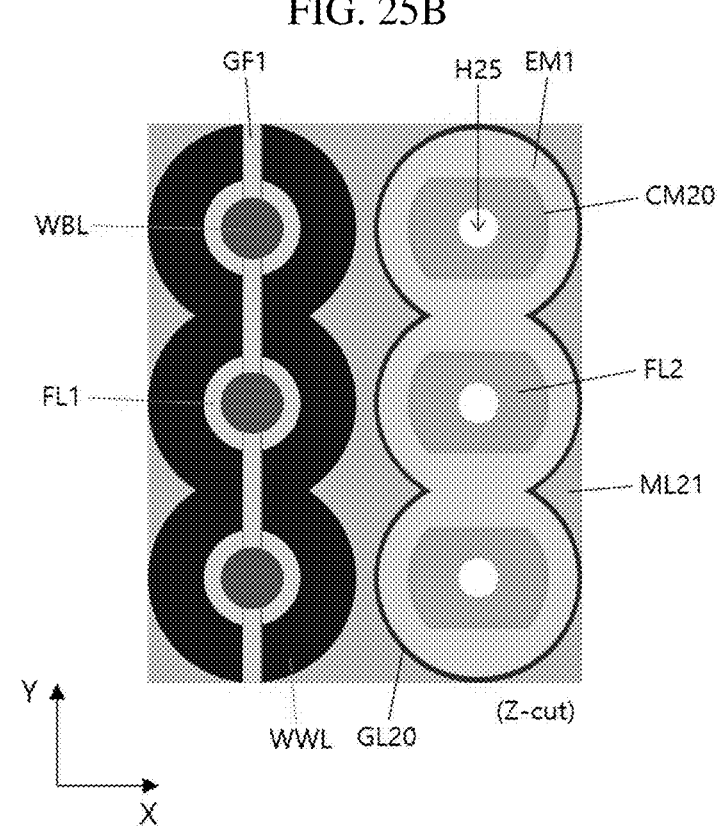
Figure 25C:
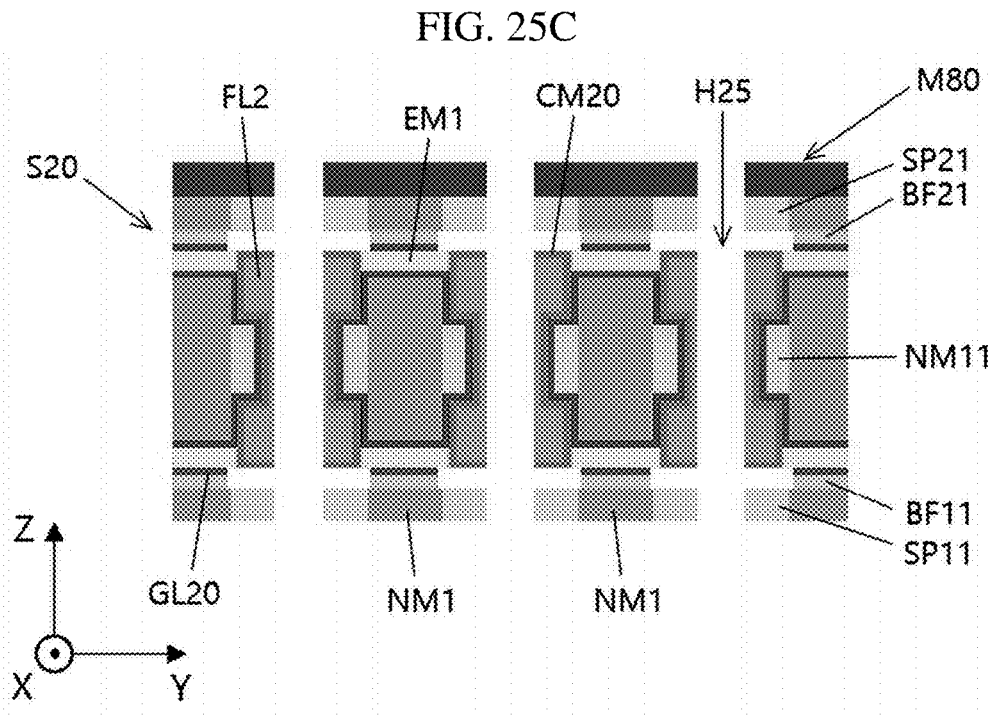

Referring to FIGS. 25A to 25C, the buffer layers BF11 and BF21 exposed by the second through hole H25 may be recessed. As a non-limiting example, the buffer layers BF11 and BF21 may be recessed through a selective wet etching process using aqueous ammonia. In the process for recessing the buffer layers BF11 and BF21, the second gate insulating layer GL20 may also be recessed. Alternatively, after recessing the buffer layers BF11 and BF21, the second gate insulating layer GL20 may be recessed. The recess depth of the buffer layers BF11 and BF21 and the second gate insulating layer GL20 may be adjusted by controlling the conditions of the etching process.

Figure 26A:
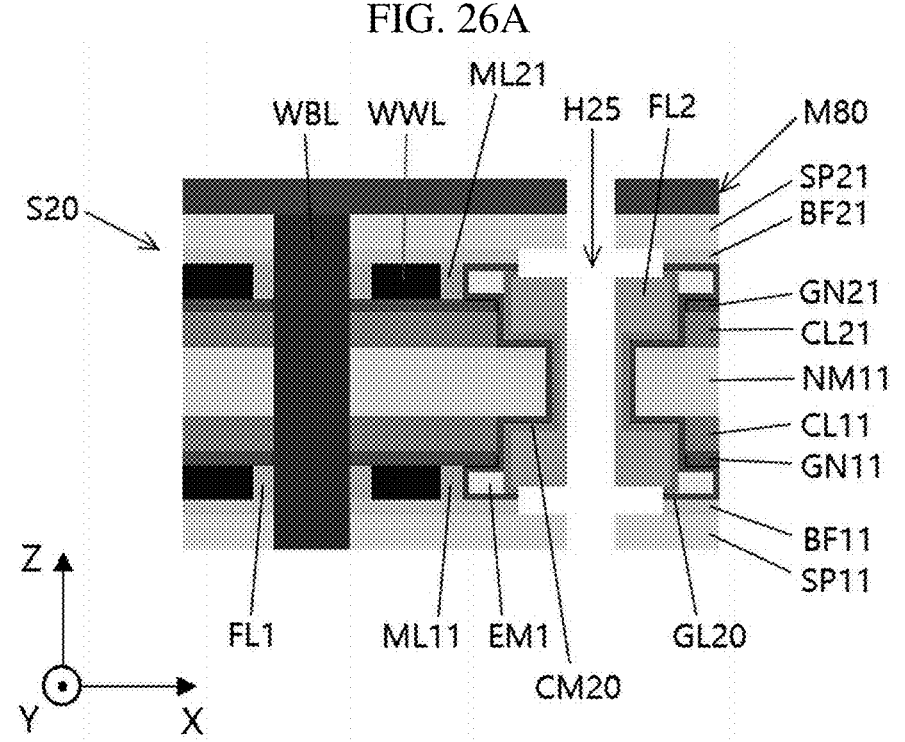
Figure 26B:
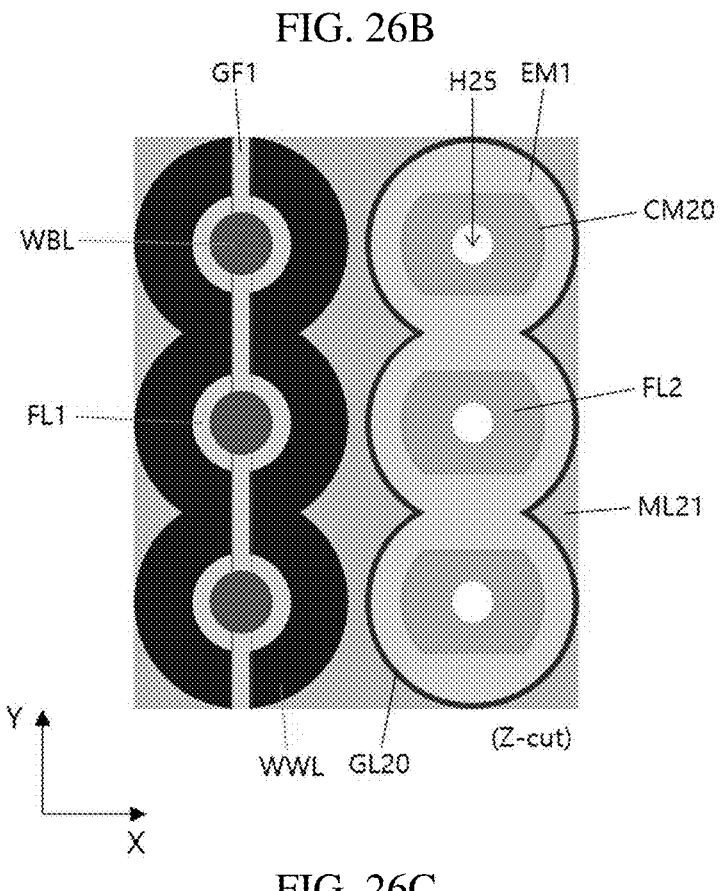
Figure 26C:
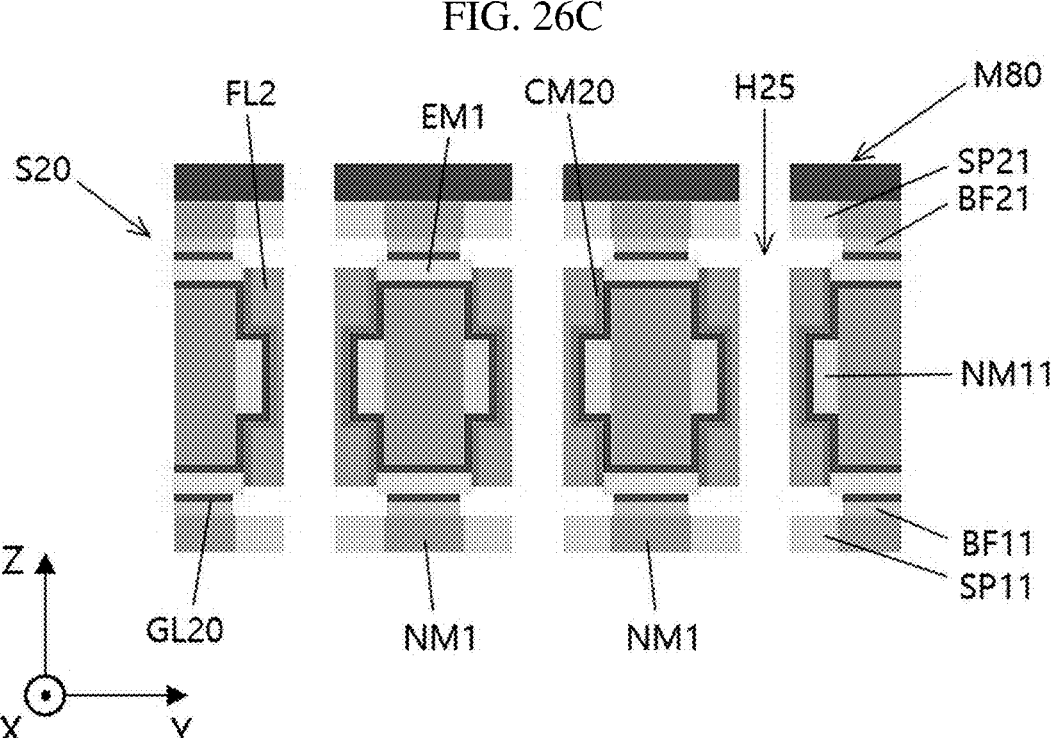

Referring to FIGS. 26A to 26C, a portion of the second channel material layer CM20 exposed by the process of FIG. 25A may be removed by recessing (etching). Then, the eighth mask pattern M80 may be removed.

Figure 27A:
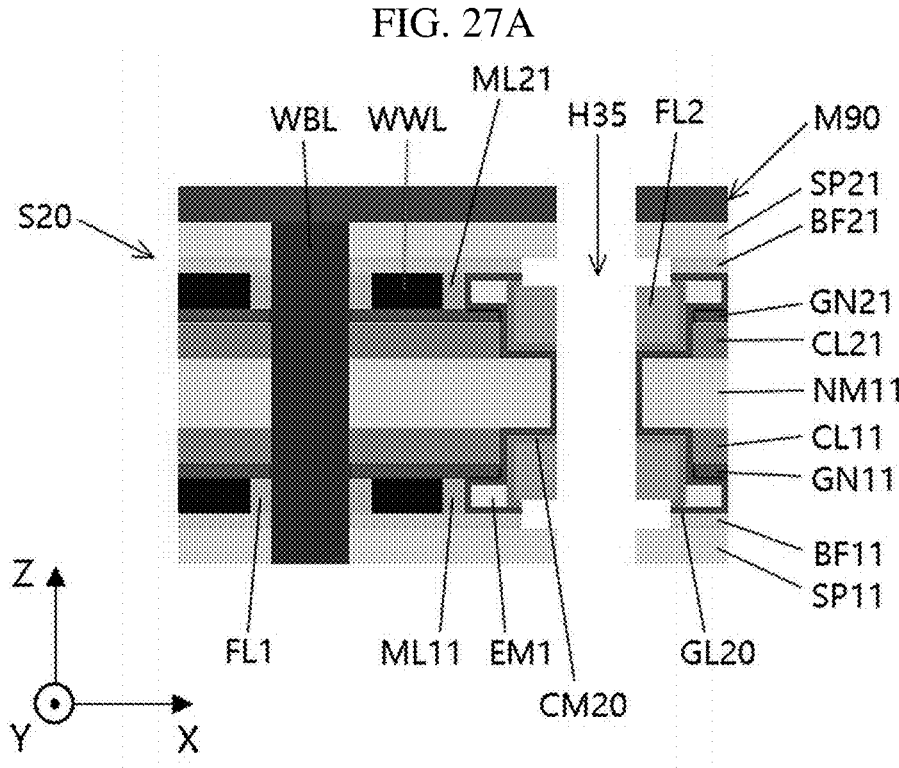
Figure 27B:
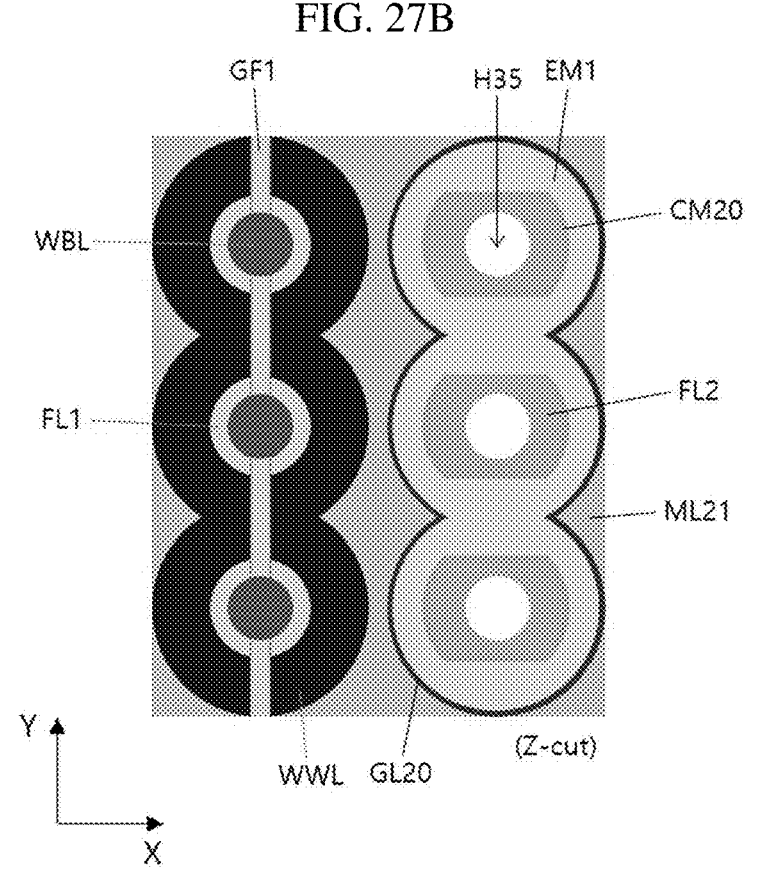
Figure 27C:
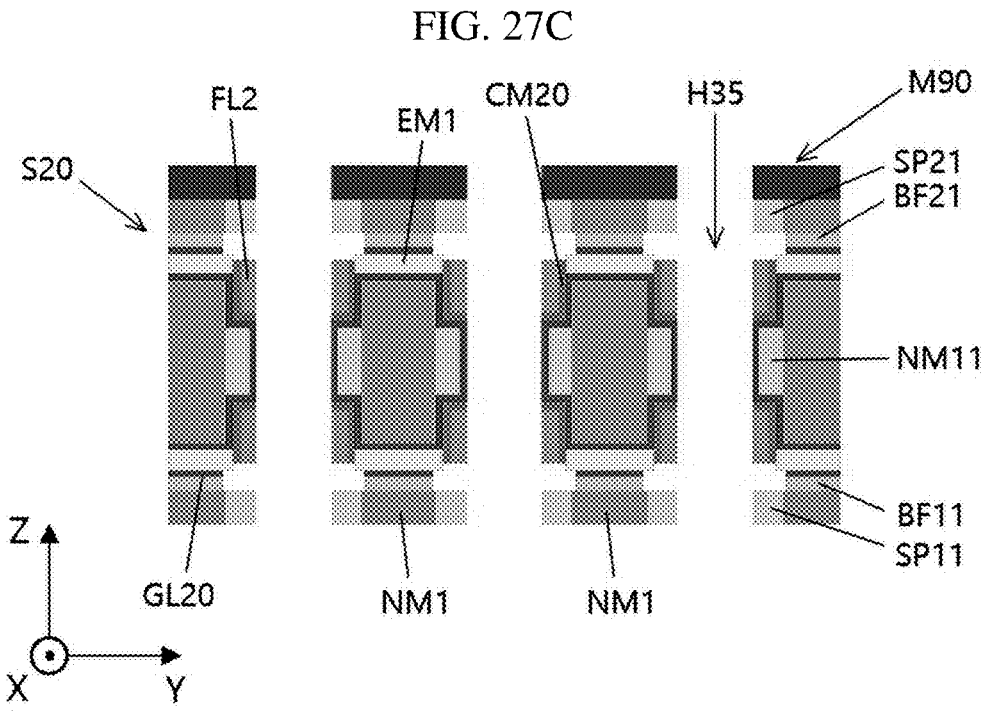

Referring to FIGS. 27A to 27C, a third through hole H35 having a larger size than that of the second through hole (H25 in FIG. 26a) may be formed at a position corresponding to the second through hole (H25 in FIG. 26a). As a result, the portion formed on the side surface of the insulating material layer NM11 from the second channel material layer CM20 may be removed. The third through hole H35 may correspond to a region where a read bit line will be formed.

A ninth mask pattern M90 may be used to form the third through hole H35. The ninth mask pattern M90 may have a predetermined opening pattern. The ninth mask pattern M90 may be, for example, a photoresist pattern. After forming the third through hole H35, the ninth mask pattern M90 may be removed. However, depending on the case, the removal timing of the ninth mask pattern M90 may vary.

Figure 28A:
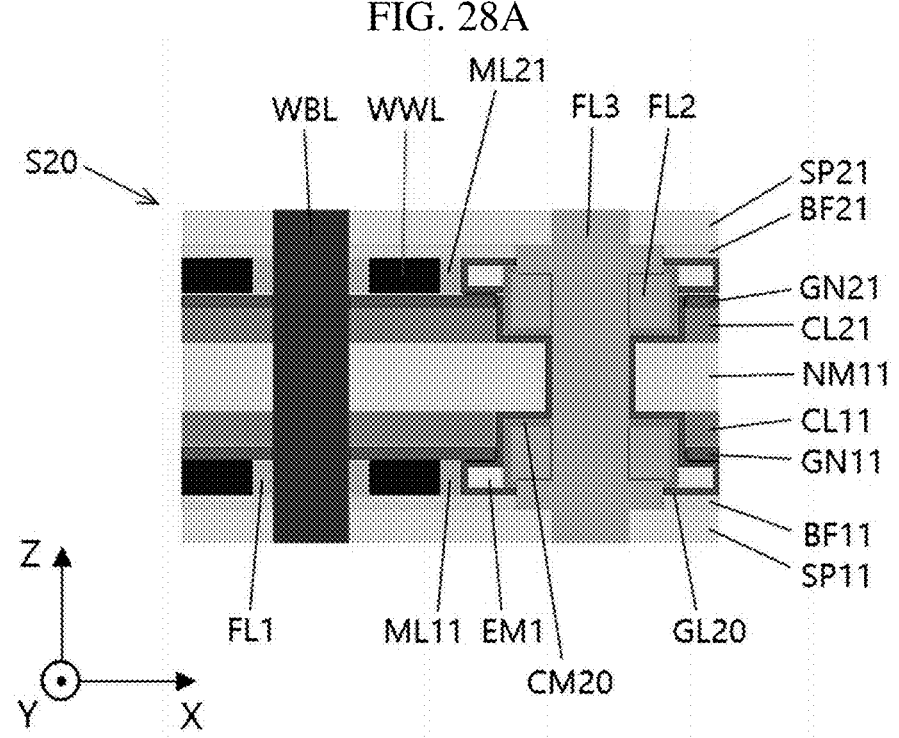
Figure 28B:
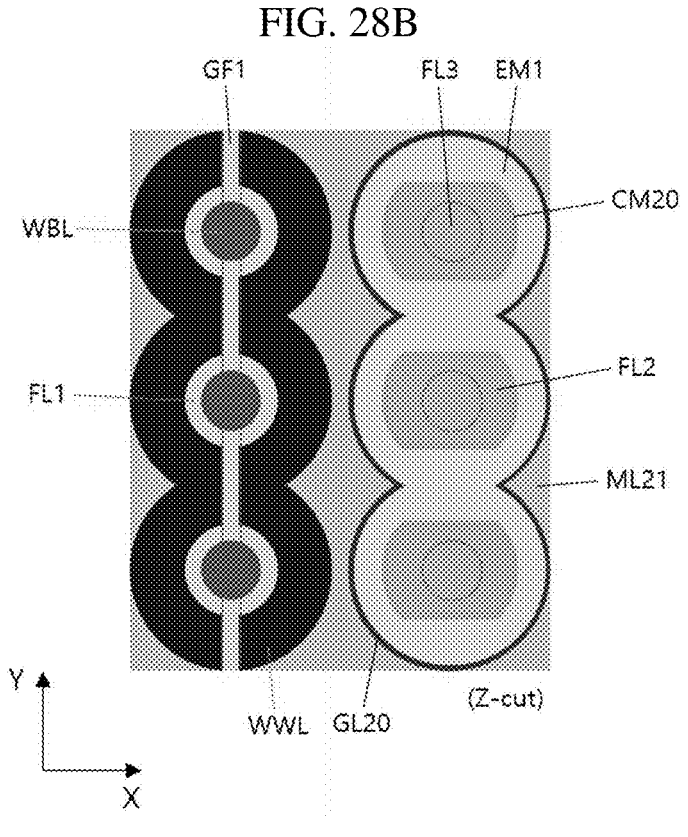
Figure 28C:
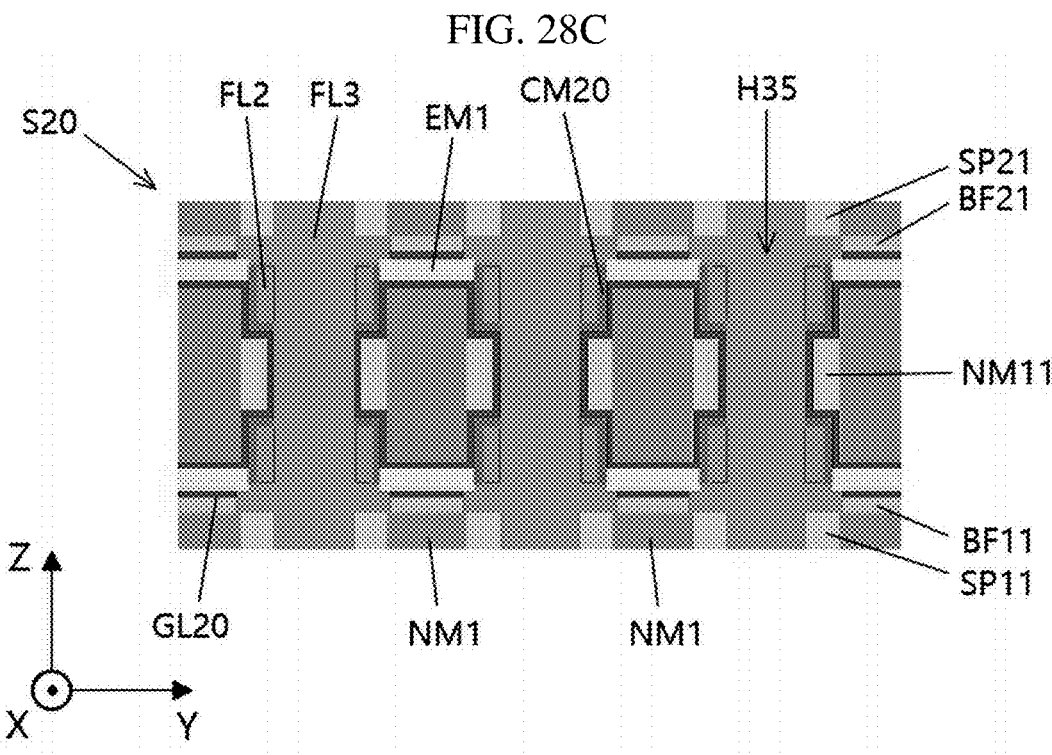

Referring to FIGS. 28A to 28C, a third filling insulating layer FL3 to fill the third through hole H35 may be formed. The third filling insulating layer FL3 may be a type of gap fill material layer. The third filling insulating layer FL3 may, as a non-limiting example, include a silicon oxide or be formed of a silicon oxide. The third filling insulating layer FL3 may be formed to fill the third through hole H35 (H35 in FIG. 27A), and to fill the empty space around it at the same time.

Figures 29A, 29B:
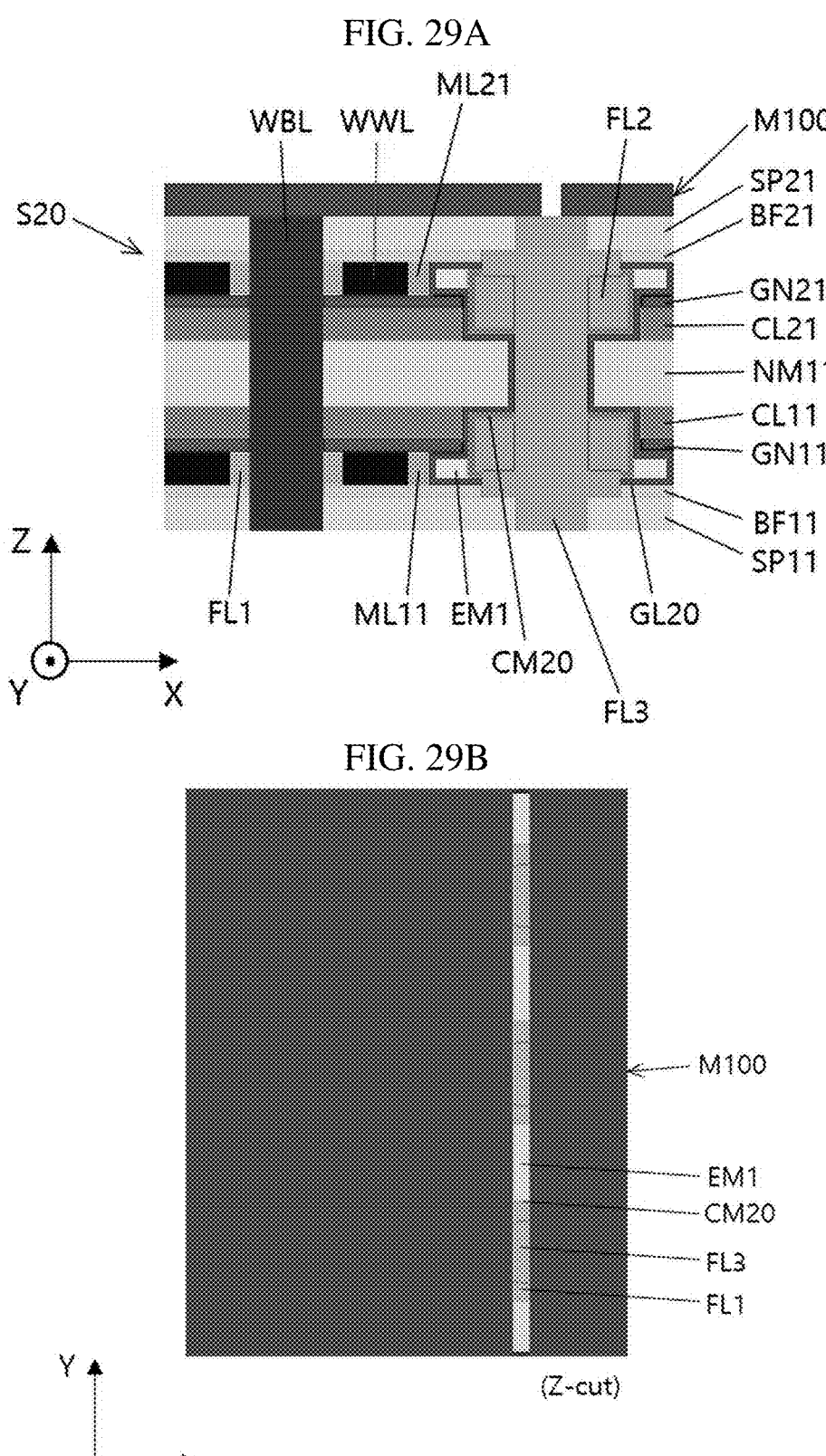
Figure 29C:
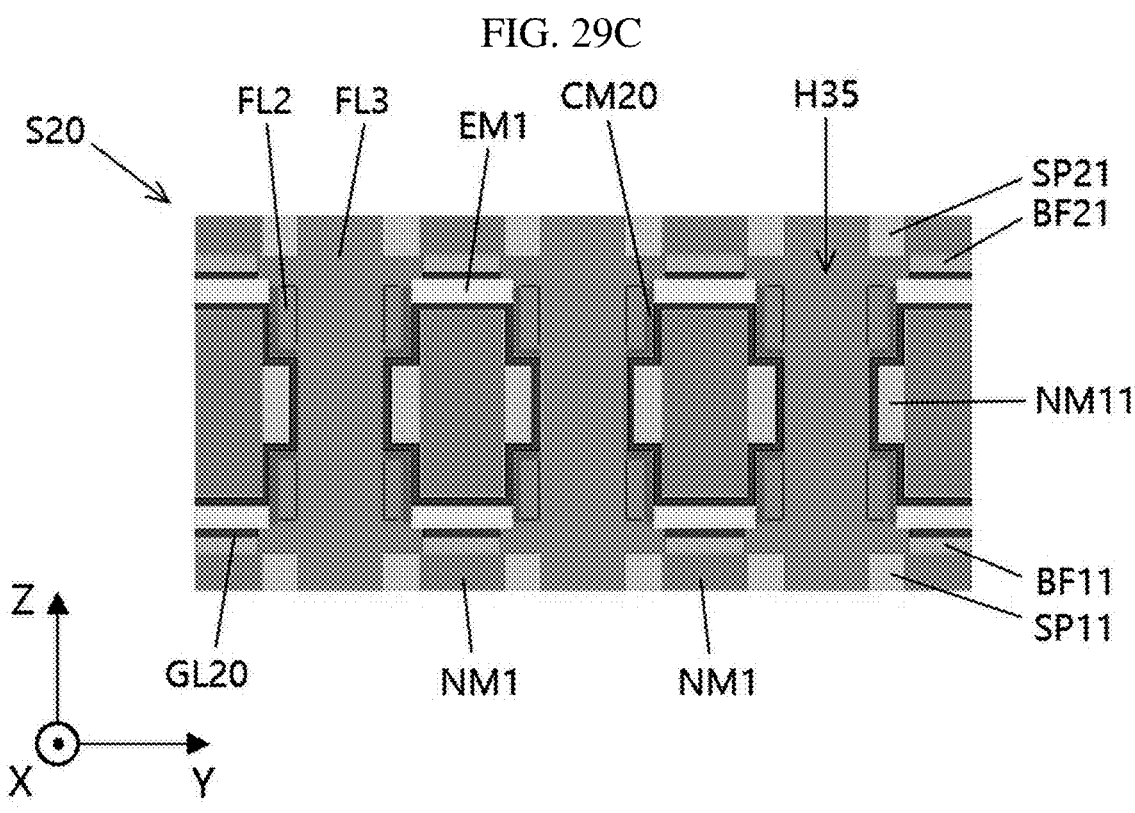

Referring to FIGS. 29A to 29C, a tenth mask pattern M100 may be formed on the structure S20. The tenth mask pattern M100 may have an opening pattern (an opening portion) extending in the Y-axis direction while exposing the central portion of the third filling insulating layer FL3. The tenth mask pattern M100 may be said to have a slit-type opening pattern. The tenth mask pattern M100 may be, for example, a photoresist pattern.

Figure 30A:
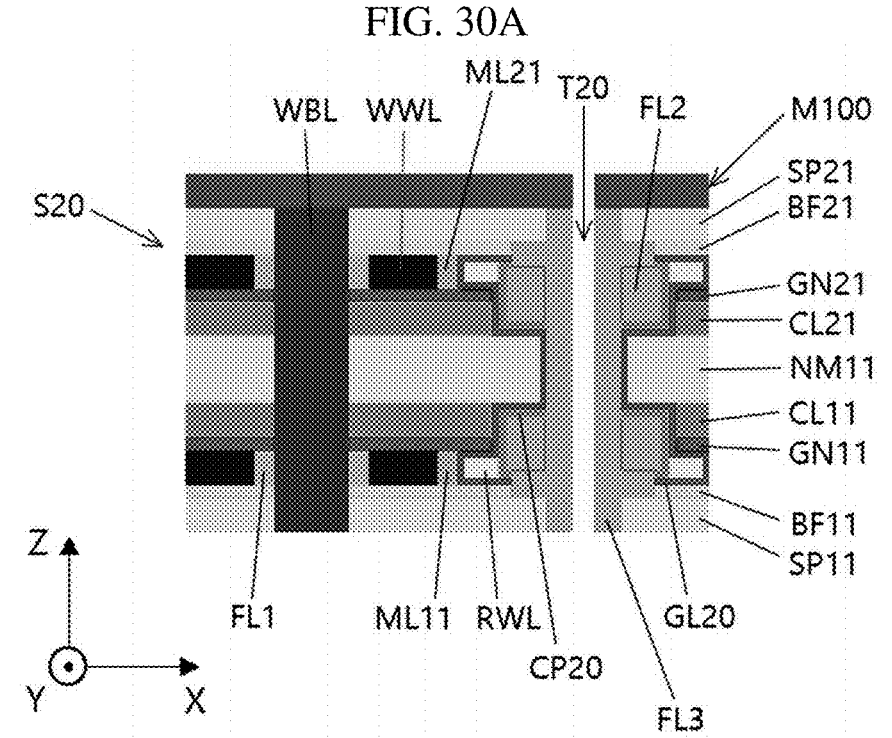
Figures 30B, 30C:
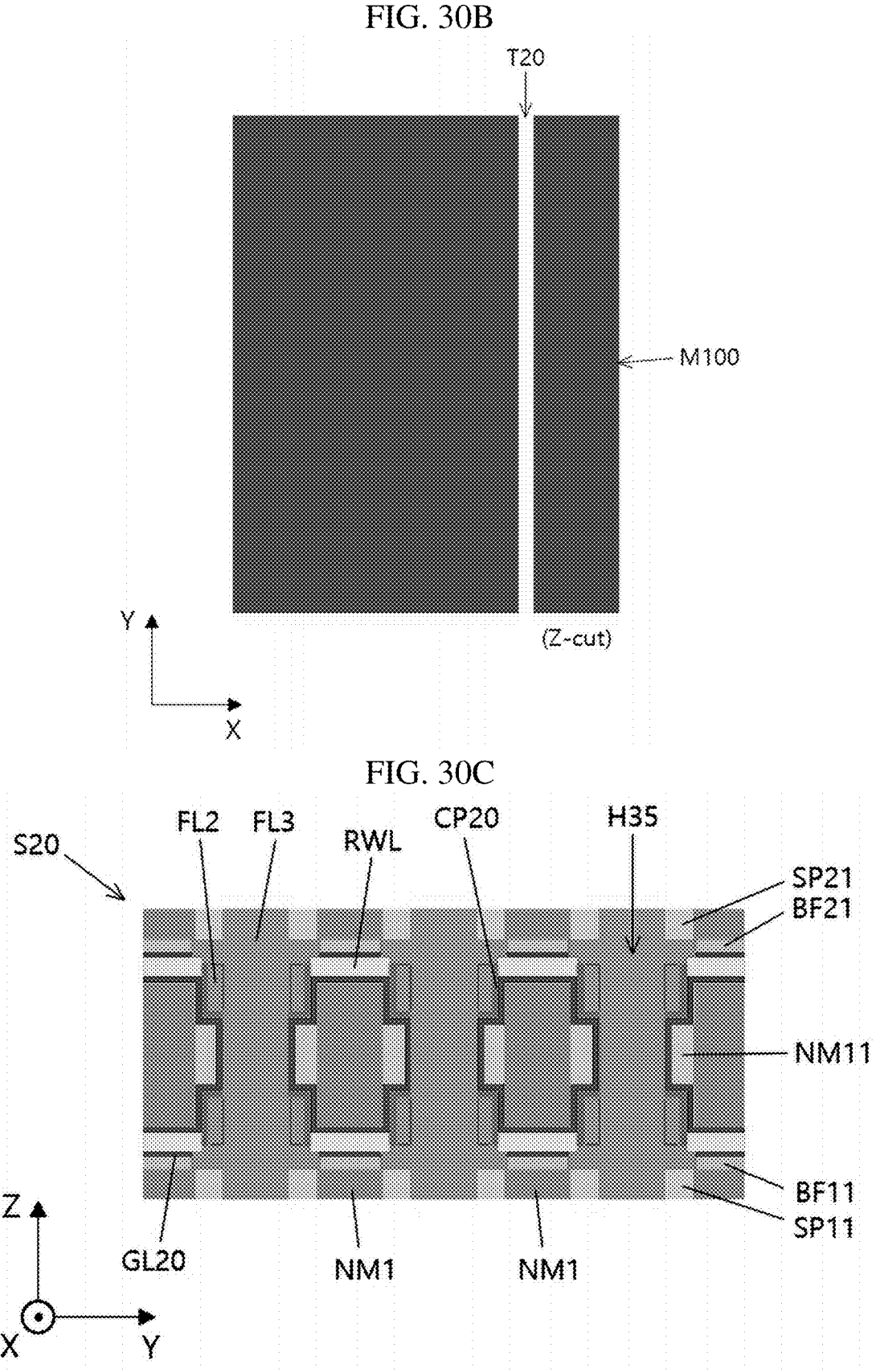

Referring to FIGS. 30A to 30C, a read word line RWL separated from the electrode member (EM1 in FIG. 29B) and a second channel layer pattern CP20 from the second channel material layer (CM20 of FIG. 29B) may be defined by forming a second etched portion T20 crossing the central portion of the third filling insulating layer (FL3 in FIG. 29B), the central portion of the first filling insulating layer (FL1 in FIG. 29B), and the central portion of the second channel material layer (CM20 in FIG. 29B), and the central portion of the electrode member (EM1 in FIG. 29B) in the second direction, that is, the Y-axis direction. The second etched portion T20 may be formed through a dry etching process. The second etched portion T20 may be considered a type of slit-type opening or trench. FIG. 30C is a cross-sectional diagram along the YZ plane observed from the region where the second etched portion T20 is formed. Afterwards, the tenth mask pattern M100 may be removed.

Figure 31A:
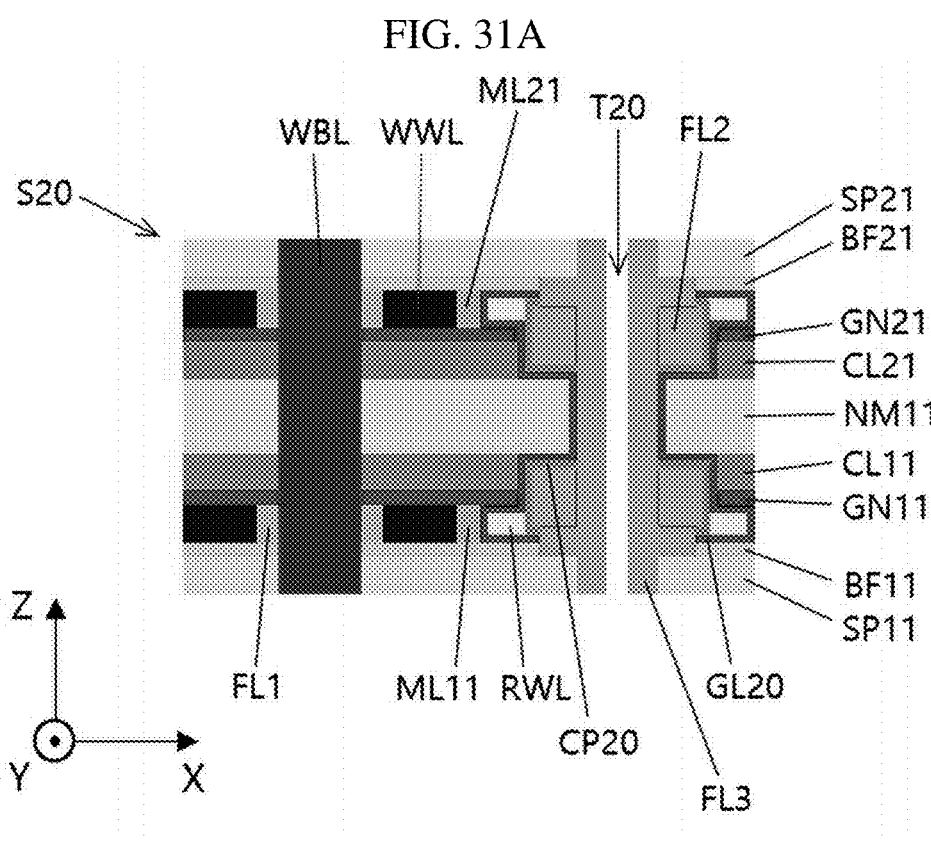
Figure 31B:
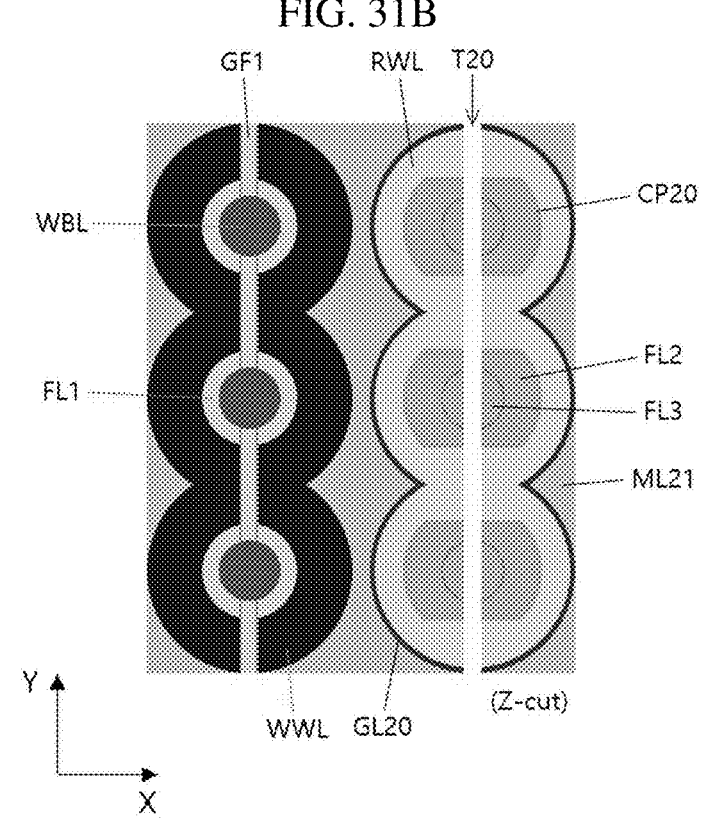
Figure 31C:
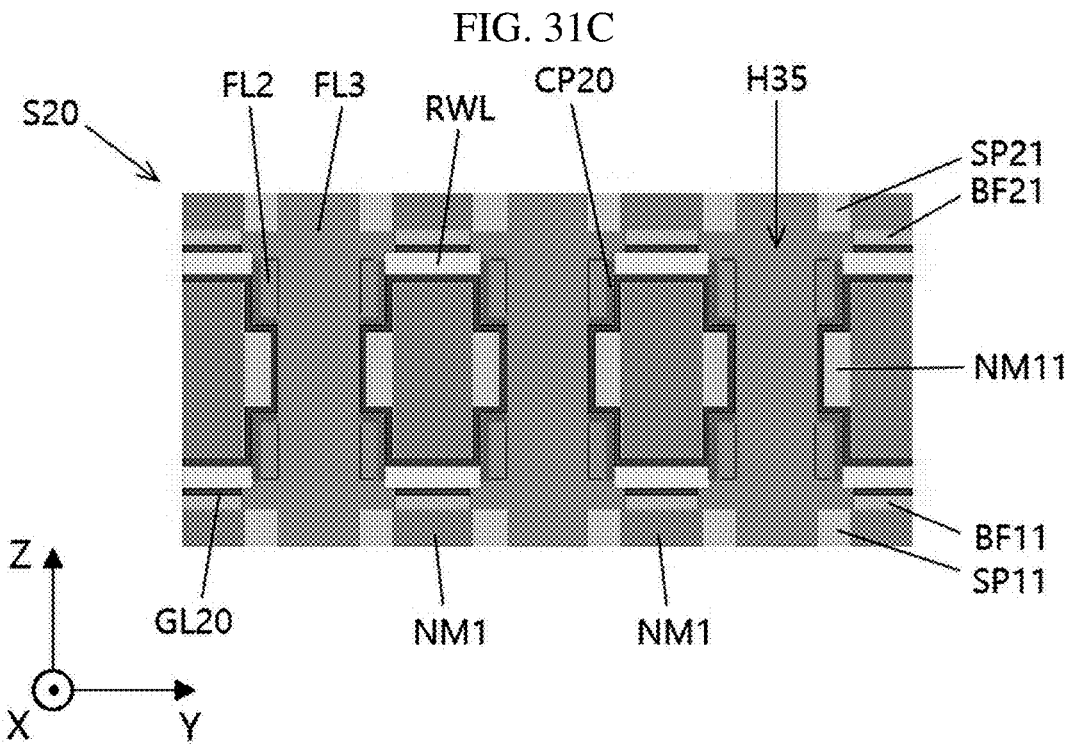

Referring to FIG. 31A to FIG. 31C, a diagram in which the tenth mask pattern M100 is removed from the structure of FIGS. 30A to 30C is illustrated. The read word line RWL and the second channel layer pattern CP20 may be defined on each of both sides of the second etched portion T20. The two read word lines RWL shown may be used as separate read word lines RWL. The read word line RWL may be a source electrode line. Furthermore, the second gate insulating layer GL20 may also be separated by the second etched portion T20.

Figure 32A:
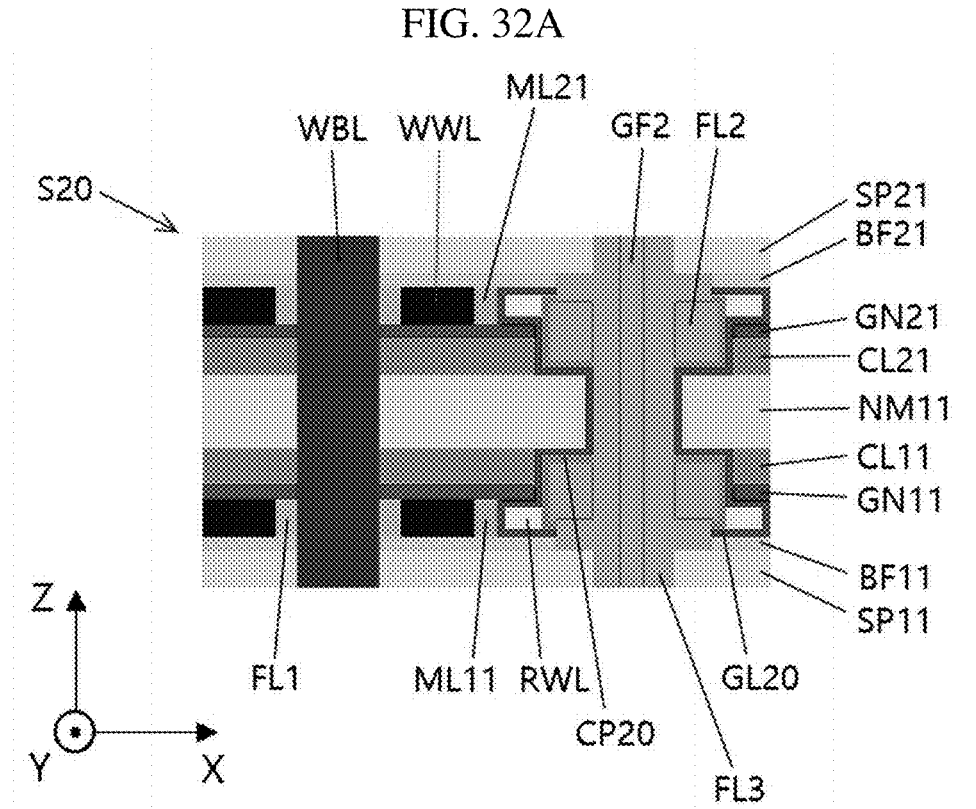
Figure 32B:
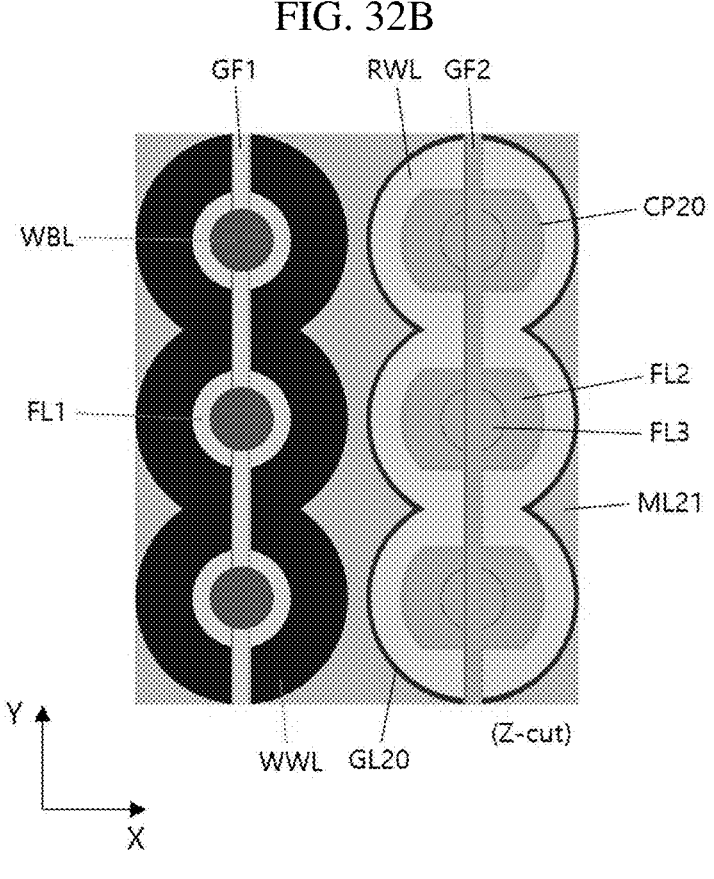
Figure 32C:
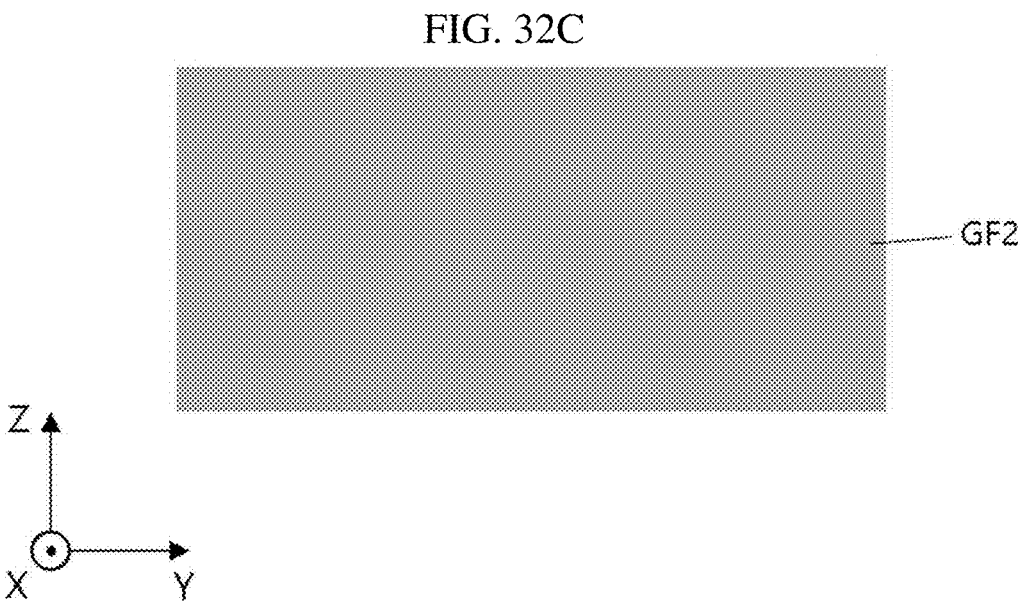

Referring to FIGS. 32A to 32C, a second gap fill insulating layer GF2 may be formed to fill the second etched portion (T20 in FIG. 31A). The second gap fill insulating layer GF2 may be formed of at least one of various insulating materials. As a non-limiting example, the second gap fill insulating layer GF2 may include a silicon oxide or be formed of a silicon oxide.

As described above, by using the method illustrated in FIGS. 29A to 32C, each of the electrode member (EM1 in FIG. 29A) and the second channel material layer (CM20 in FIG. 29A) may be separated so that the read word line RWL extending in the horizontal direction from the electrode member (EM1 in FIG. 29A) and the second channel layer pattern CP20 from the second channel material layer (CM20 in FIG. 29A) may be defined. As a result, a read transistor including the second channel layer pattern CP20 and the second gate insulating layer GL20 may be defined. In the embodiment of FIG. 32A, a lower read transistor structure disposed below the insulating material layer NM11 and an upper read transistor structure disposed above the insulating material layer NM11 may be defined. However, the method for defining the read transistor is only an example, and may vary in various ways.

Then, a read bit line (RBL in FIG. 34A) extending in the vertical direction at a position corresponding (roughly corresponding) to the second vertical hole (H20 in FIG. 15A) may be formed by using the method as illustrated in FIGS. 33A to 34C.

Figure 33A:
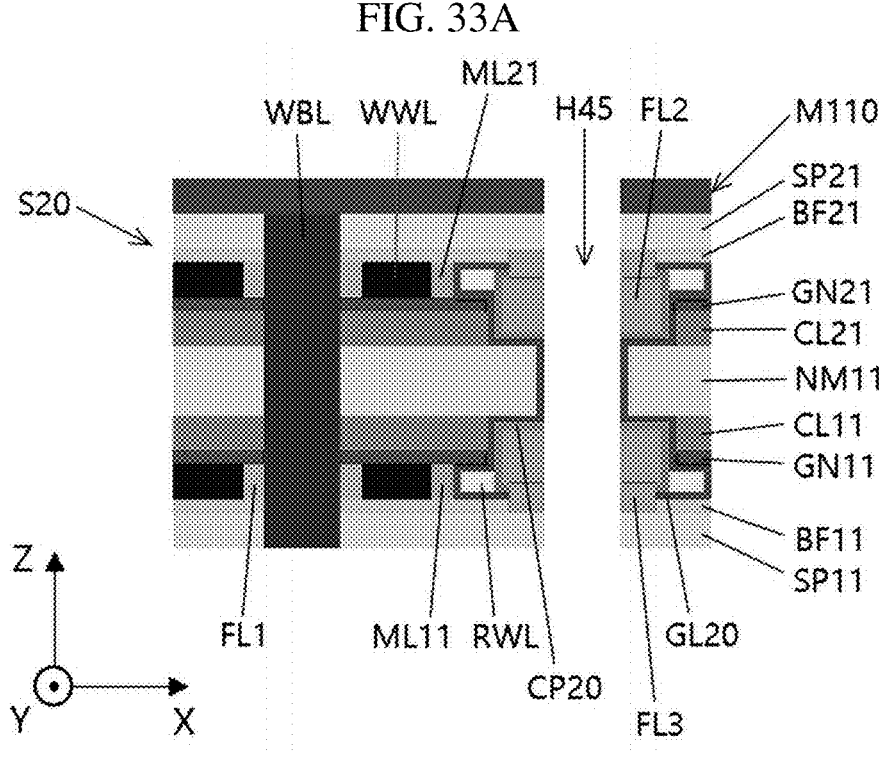
Figure 33B:
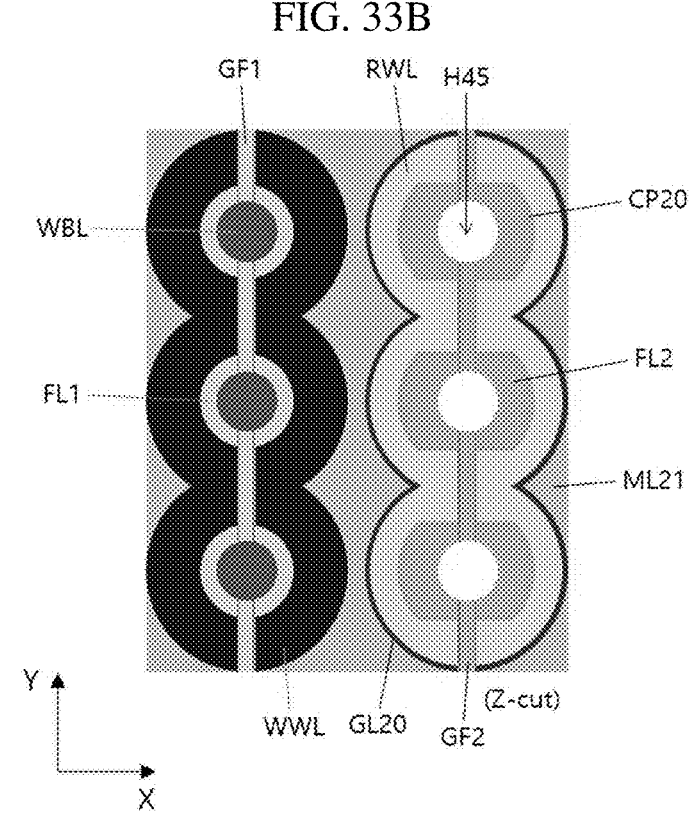
Figure 33C:
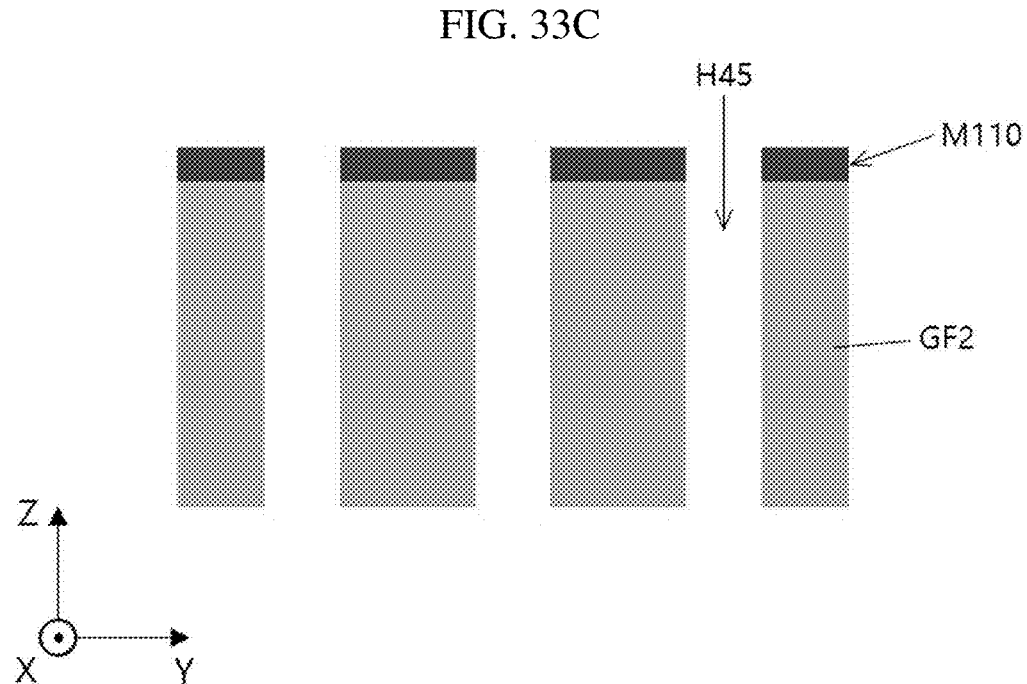

Referring to FIGS. 33A to 33C, a fourth through hole H45 may be formed by etching the third filling insulating layer FL3 and the second gap fill insulating layer GF2 at a position corresponding (roughly corresponding) to the second vertical hole (H20 in FIG. 15a) of the structure S20. An eleventh mask pattern M110 may be used to form the fourth through hole H45. The eleventh mask pattern M110 may have a predetermined opening pattern. The eleventh mask pattern M110 may be, for example, a photoresist pattern. After forming the fourth through hole H45, the eleventh mask pattern M110 may be removed. However, the removal timing of the eleventh mask pattern M110 may vary. For example, the eleventh mask pattern M110 may be removed after the process for forming the read bit line RBL described in FIG. 34A.

Figure 34A:
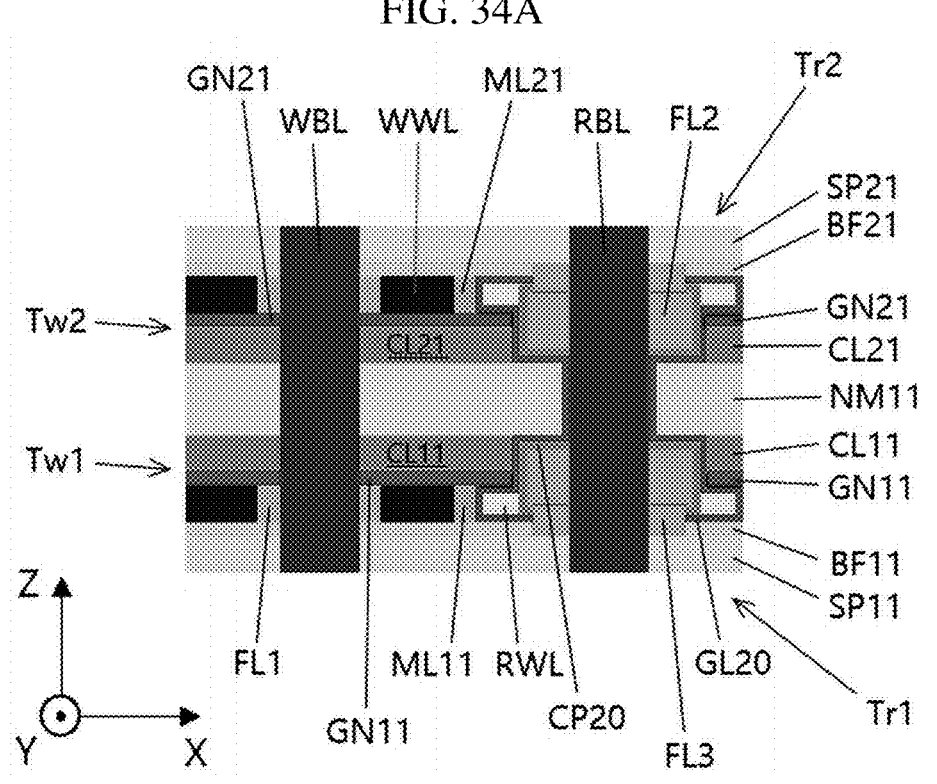
Figure 34B:
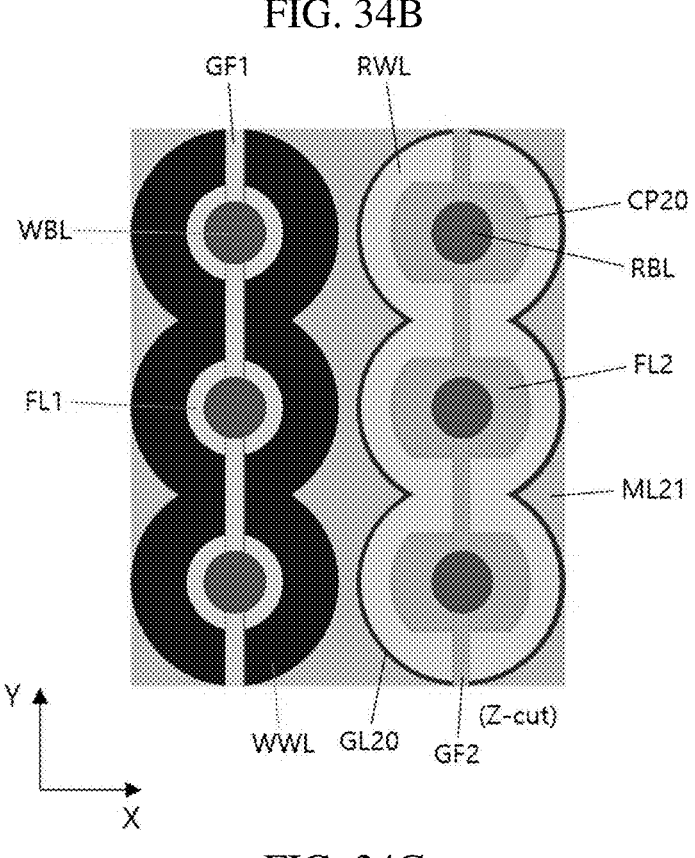
Figure 34C:
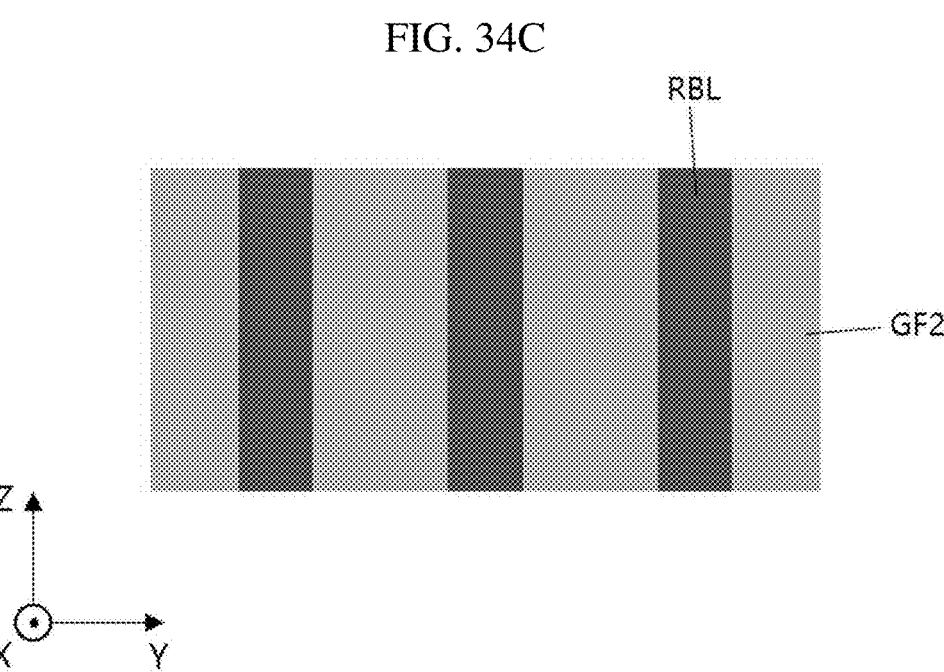

Referring to FIGS. 34A to 34C, the read bit line RBL may be formed in the fourth through hole (H45 in FIG. 33A). The read bit line RBL may include, for example, at least one of a metal, a metal compound, and a conductive silicon.

The capacitorless 3D DRAM device manufactured according to one embodiment may include a lower write transistor Tw1 and a lower read transistor Tr1 which are disposed under the insulating material layer NM11. Furthermore, the capacitorless 3D DRAM device may include an upper write transistor Tw2 and an upper read transistor Tr2 which are disposed above the insulating material layer NM11. The lower write transistor Tw1 and the lower read transistor Tr1 may constitute one lower memory cell. The upper write transistor Tw2 and the upper read transistor Tr2 may constitute one upper memory cell. The lower write transistor Tw1 and the lower read transistor Tr1 may be electrically connected to each other. The lower first channel material layer CL11 of the lower write transistor Tw1 may be electrically connected to the lower read transistor Tr1. A portion of the lower first channel material layer CL11 may be used as a gate of the lower read transistor Tr1. Accordingly, the lower read transistor Tr1 may include a portion of the lower first channel material layer CL11 as a gate. Similarly, the upper write transistor Tw2 and the upper read transistor Tr2 may be electrically connected to each other. The upper first channel material layer CL21 of the upper write transistor Tw2 may be electrically connected to the upper read transistor Tr2. A portion of the upper first channel material layer CL21 may be used as a gate of the upper read transistor Tr2. Accordingly, the upper read transistor Tr2 may include a portion of the upper first channel material layer CL21 as a gate.

The lower memory cell may have a structure in which the upper memory cell is upside down. The lower write transistor Tw1 may have a structure in which the upper write transistor Tw2 is upside down, and the lower read transistor Tr1 may have a structure in which the upper read transistor Tr2 is upside down.

A plurality of memory cell structures may be arranged to be spaced apart from each other in the horizontal direction and the vertical direction. In an actual manufacturing process, a much larger number of memory cell structures than those shown in FIGS. 34A to 34C may be arranged in the horizontal direction and the vertical direction.

In an embodiment of the present invention, since the write bit line WBL and the read bit line RBL may extend in the vertical direction, and the write word line WWL and the read word line RWL may extend in the horizontal direction, a capacitorless 3D DRAM device having very high integration degree and data storage density and excellent performance may be easily manufactured. According to this embodiment of the present invention, highly integrated and high-capacity devices may be easily manufactured, and mass production is possible. According to one example, the three-dimensional stack-type DRAM device may be a 2T0C type DRAM device or may be configured to include it.

Figure 35:
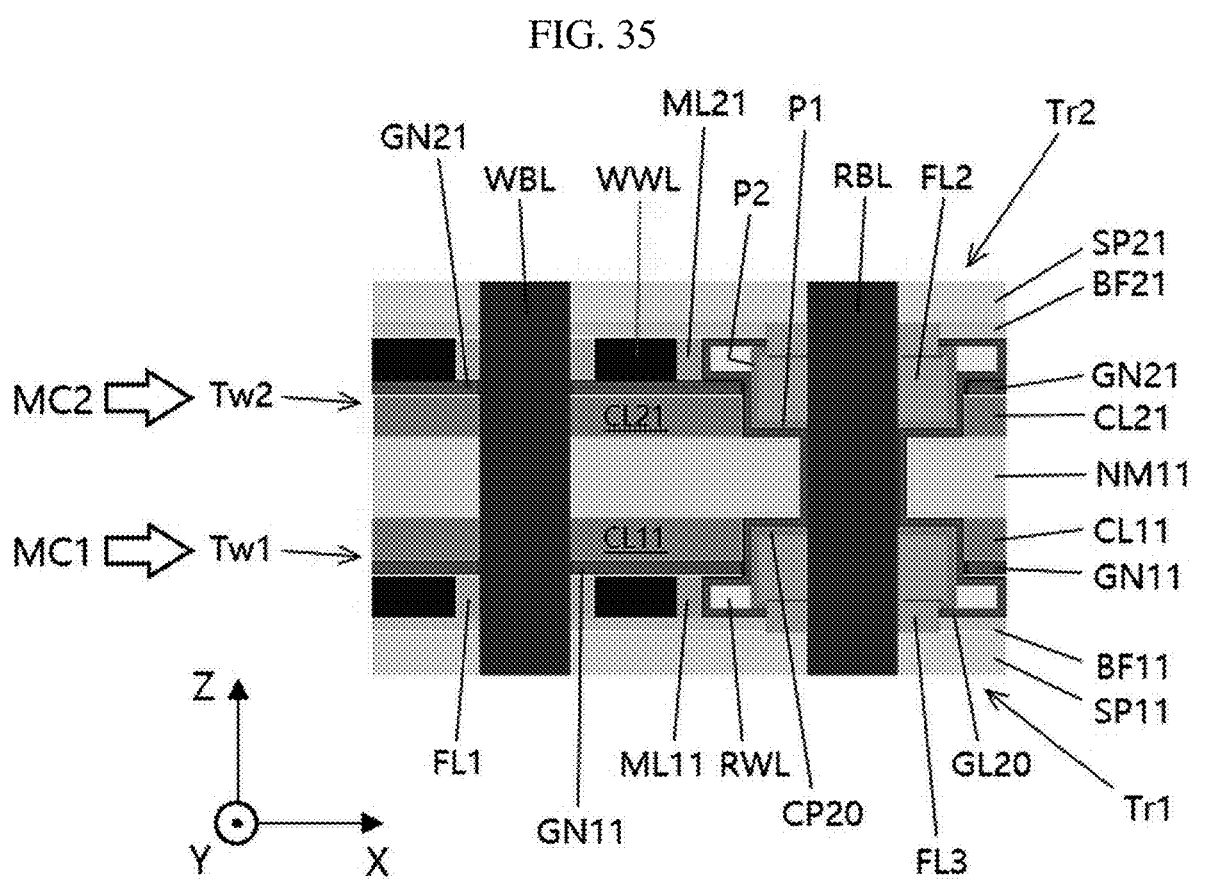
Figure 36:
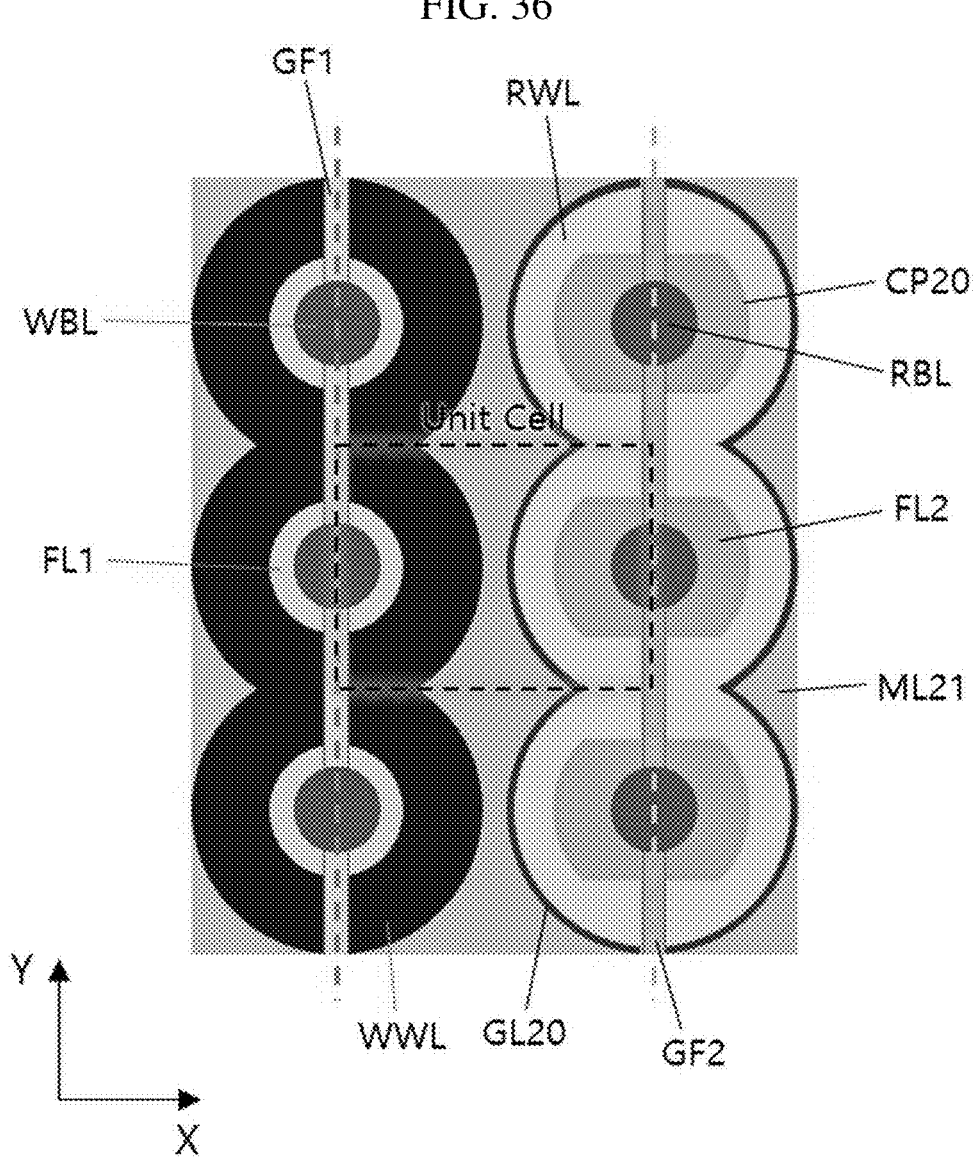
Figure 37:
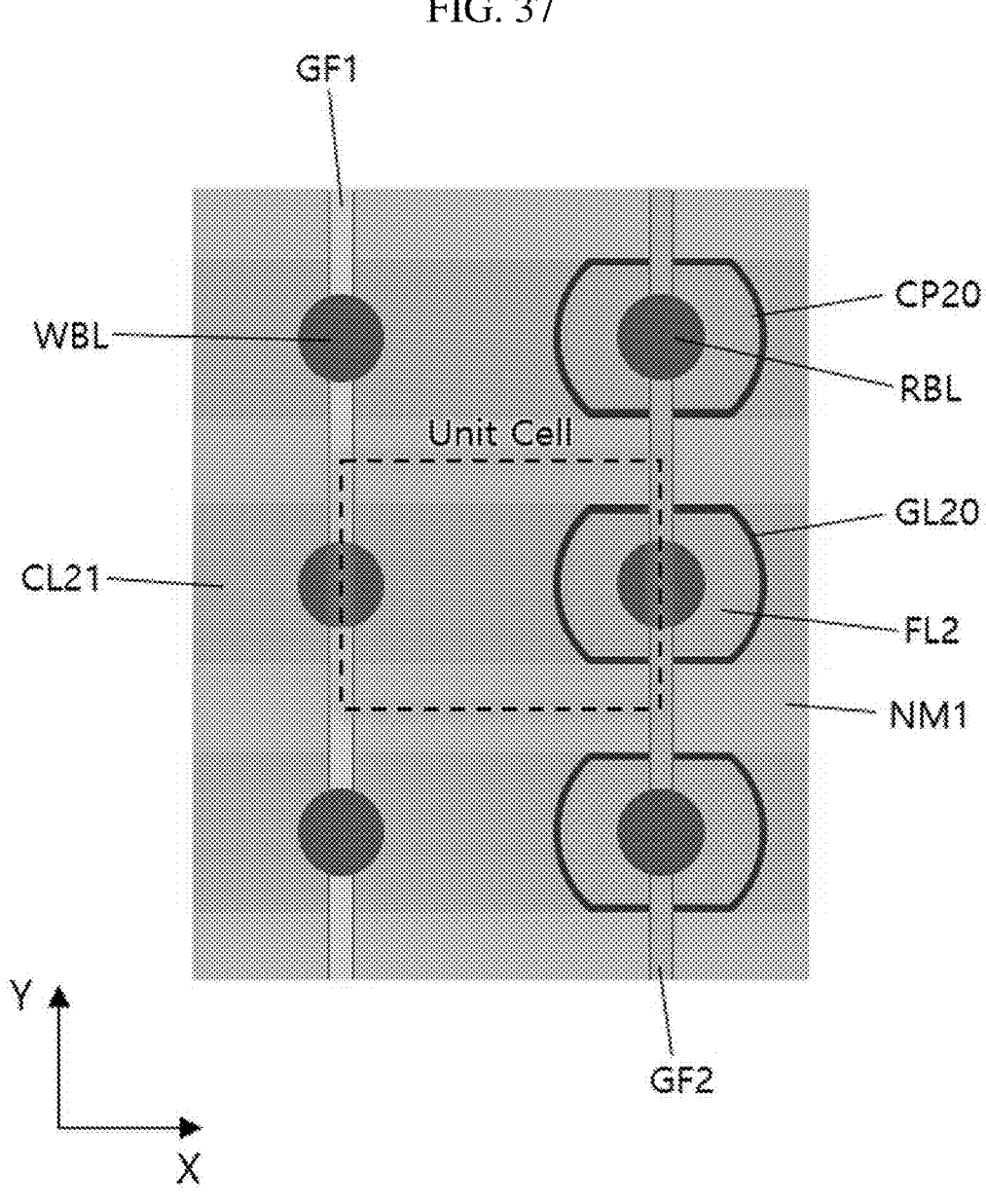

FIG. 35 to FIG. 37 are diagrams for explaining an example of a capacitorless 3D DRAM device according to an embodiment of the present invention. FIG. 35 is a cross-sectional diagram of the device cut along the XZ plane, and FIGS. 36 and 37 are cross-sectional diagrams (i.e., Z-cut diagram) of the device cut along the XY plane. FIG. 36 is a cross-sectional diagram cut in the XY plane at the level of the write word line WWL and the read word line RWL, and FIG. 37 is a cross-sectional diagram cut in the XY plane at the level of the upper first channel material layer CL21. The capacitorless 3D DRAM device may be a 3D stack-type DRAM device with a gain cell structure. For example, the capacitorless 3D DRAM device may be a 3D DRAM device having a two transistor zero capacitor (2T0C) cell structure.

Referring to FIGS. 35 to 37, a capacitorless 3D DRAM device according to an embodiment of the present invention may include a plurality of memory cells arranged to be spaced apart from each other in a horizontal direction and in a vertical direction. The capacitorless 3D DRAM device may include a write bit line WBL extending in the vertical direction, a write word line WWL extending in the horizontal direction, and a write transistor Tw2 which is connected to a write bit line WBL and a write word line WWL and is defined to include a first channel material layer CL21, a first gate insulating layer GN21, and a portion of the write word line WWL. In addition, the capacitorless 3D DRAM device may include a read bit line RBL extending in the vertical direction, a read word line RWL extending in the horizontal direction, and a read transistor Tr2 which is connected to the read bit line RBL and the read word line RWL and is defined to include a second channel layer pattern CP20 and a second gate insulating layer GL20. Here, the second channel layer pattern CP20 may include a first portion P1 which is disposed to be adjacent to the read bit line RBL and extends in the horizontal direction, and a second portion P2 which is spaced apart from the read bit line RBL and extends in a direction having a given angle with respect to the first portion P2.

According to one embodiment, the first portion P1 of the second channel layer pattern CP20 may be in contact with the read bit line RBL, the second portion P2 of the second channel layer pattern CP20 may extend in the vertical direction from the edge region of the first portion P1, and may be spaced apart from the read bit line RBL and may be configured to be partially surround the read bit line RBL.

According to one example, the second portion P2 may have a concave shape with respect to the read bit line RBL. The first portion P1 may have a horizontal plate structure, and the second portion P2 may have a vertical sidewall structure.

According to one embodiment, the read word line RWL may be arranged to surround a portion of an outer surface of the second portion P2 between the second gate insulating layer GL20 and the second channel layer pattern CP20.

According to one embodiment, the second gate insulating layer GL20 may be disposed between the first channel material layer CL21 and the second channel layer pattern CP20, and may have a structure surrounding the read word line RWL, and one end portion of the second gate insulating layer GL20 may be in contact with an end portion of the second portion P2.

According to one embodiment, as shown in FIG. 36, each of the read word line RWL may have a structure in which the arc-shaped electrode units are connected in series. Each of the arc-shaped electrode units may have a convex structure in the X-axis direction or in the opposite direction thereto. Similarly, as shown in FIG. 36, the write word line WWL may have a structure in which the arc-shaped electrode units are connected in series. Each of the arc-shaped electrode units may have a convex structure in the X-axis direction or in the opposite direction thereto.

According to one embodiment, the write word line WWL may be disposed between the write bit line WBL and the read word line RWL, and the read word line RWL may be disposed between the write word line WWL and the read bit line RBL.

Furthermore, the write bit line WBL may be shared by two adjacent memory cells on both sides thereof. Similarly, the read bit line RBL may be shared by two adjacent memory cells on both sides thereof. Because each of the write bit line WBL and the read bit line RBL may be shared by two adjacent memory cells on both sides thereof, according to an embodiment of the present invention, an area minimization per memory cell may be achieved.

According to one embodiment, the write transistor Tw2 may be an upper write transistor Tw2, the read transistor Tr2 may be an upper read transistor Tr2, and the upper write transistor Tw2 and the upper the read transistor Tr2 may form an upper memory cell MC2. Furthermore, a lower memory cell MC1 having a structure in which the upper memory cell MC2 is upside down may be disposed under the upper memory cell MC2. The lower memory cell MC1 may include a lower write transistor Tw1 having a structure in which the upper write transistor Tw2 is upside down, and a lower read transistor Tr1 having a structure in which the upper read transistor Tr2 is upside down.

The lower write transistor Tw1 and the lower read transistor Tr1 may be electrically connected to each other. The lower first channel material layer CL11 of the lower write transistor Tw1 may be electrically connected to the lower read transistor Tr1. A portion of the lower first channel material layer CL11 may be used as a gate of the lower read transistor Tr1. Accordingly, the lower read transistor Tr1 may include a portion of the lower first channel material layer CL11 as a gate. Similarly, the upper write transistor Tw2 and the upper read transistor Tr2 may be electrically connected to each other. The upper first channel material layer CL21 of the upper write transistor Tw2 may be electrically connected to the upper read transistor Tr2. A portion of the upper first channel material layer CL21 may be used as a gate of the upper read transistor Tr2. Accordingly, the upper read transistor Tr2 includes a portion of the upper first channel material layer CL21 as a gate.

According to one embodiment, at least one of the first channel material layers CL11 and CL21 and the second channel layer pattern CP20 may include an oxide semiconductor. However, the material of the first channel material layers CL11 and CL21 and the second channel layer pattern CP20 is not limited to the oxide semiconductor. In some cases, at least one of the first channel material layers CL11 and CL21 and the second channel layer pattern CP20 may include a non-oxide semiconductor.

In addition, the structure of the capacitorless 3D DRAM device according to an embodiment of the present invention may have various structures and modified configurations as described with reference to FIGS. 1A to 34C.

In the capacitorless 3D DRAM device according to an embodiment of the present invention, the gate capacitance of each of the read transistor structures Tr1 and Tr2 may be used as a storage element (i.e., a storage node). The capacitorless 3D DRAM device may have various advantages because it has a long data retention time and cells thereof may be composed of only a plurality of transistors without a capacitor.

The area indicated by a dotted box in FIGS. 36 and 37 may correspond to a unit memory area, that is, a unit cell area.

Referring to FIG. 36 and FIG. 37, since each of the write bit line WBL and the read bit line RBL may be shared by two adjacent memory cells on both sides thereof, in this regard, the size of the unit memory area may be reduced. Therefore, according to an embodiment of the present invention, an object to minimize the area per memory cell may be achieved. Since a plurality of the unit memory areas may be easily stacked repeatedly in the vertical direction, a highly integrated and high-capacity device may be easily implemented.

According to the embodiments of the present invention described above, it is possible to implement a capacitorless 3D DRAM device which may significantly improve degree of integration three-dimensionally, secure excellent performance, reduce unit cell size, and facilitate the manufacturing process. In particular, since the capacitorless 3D DRAM device according to an embodiment of the present invention has a structure in which the write bit line and the read bit line extend in the vertical direction and the write word line and the read word line extend in the horizontal direction, it may be easy to manufacture a three-dimensional stacked structure in which the cells are connected in the vertical direction. According to this embodiment of the present invention, highly integrated and high-capacity devices may be easily manufactured, and mass production is possible. Furthermore, the size of the unit cell (i.e., unit memory area) may be reduced by allowing two adjacent memory cells to share a write bit line and, in addition, two adjacent memory cells to share a read bit line. According to one example, the 3D DRAM device may be a 2T0C type DRAM device or may be configured to include it.

FIGS. 38A to 60C are diagrams for explaining an example of a manufacturing method of a capacitorless 3D dynamic random access memory (DRAM) device according to an embodiment of the present invention. The capacitorless 3D DRAM device may be a 3D DRAM device (3D stack-type DRAM device) having a gain cell structure. For example, the capacitorless 3D DRAM device may be a 3D DRAM device having a two transistor zero capacitor (2T0C) cell structure.

The same numbers in FIG. 38A to FIG. 60C (e.g., FIG. 38 in FIGS. 38A, 38B, and 38C) represent the same steps. FIGS. 38A, 39A, 40A, 41A, 42A, 43A, 44A, 45A, 46A, 47A, 48A, 49A, 50A, 51A, 52A, 53A, 54A, 55A, 56A, 57A, 58A, 59A, and 60A are cross-sectional diagrams cut along the XZ plane. FIGS. 38B, 39B, 40B, 41B, 42B, 43B, 44B, 45B, 46B, 47B, 48B, 49B, 50B, 51B, 52B, 53B, 54B, 55B, 56B, 57B, 58B, 59B, and 60B are cross-sectional diagrams cut along (i.e., Z-cut views) the XY plane at a predetermined level. FIGS. 38C, 39C, 40C, 41C, 42C, 43C, 44C, 45C, 46C, 47C, 48C, 49C, 50C, 51C, 52C, 53C, 54C, 55C, 56C, 57C, 58C, 59C, and 60C are cross-sectional diagrams (i.e., Z-cut views) cut along the XY plane at a different level.

Figure 38A:
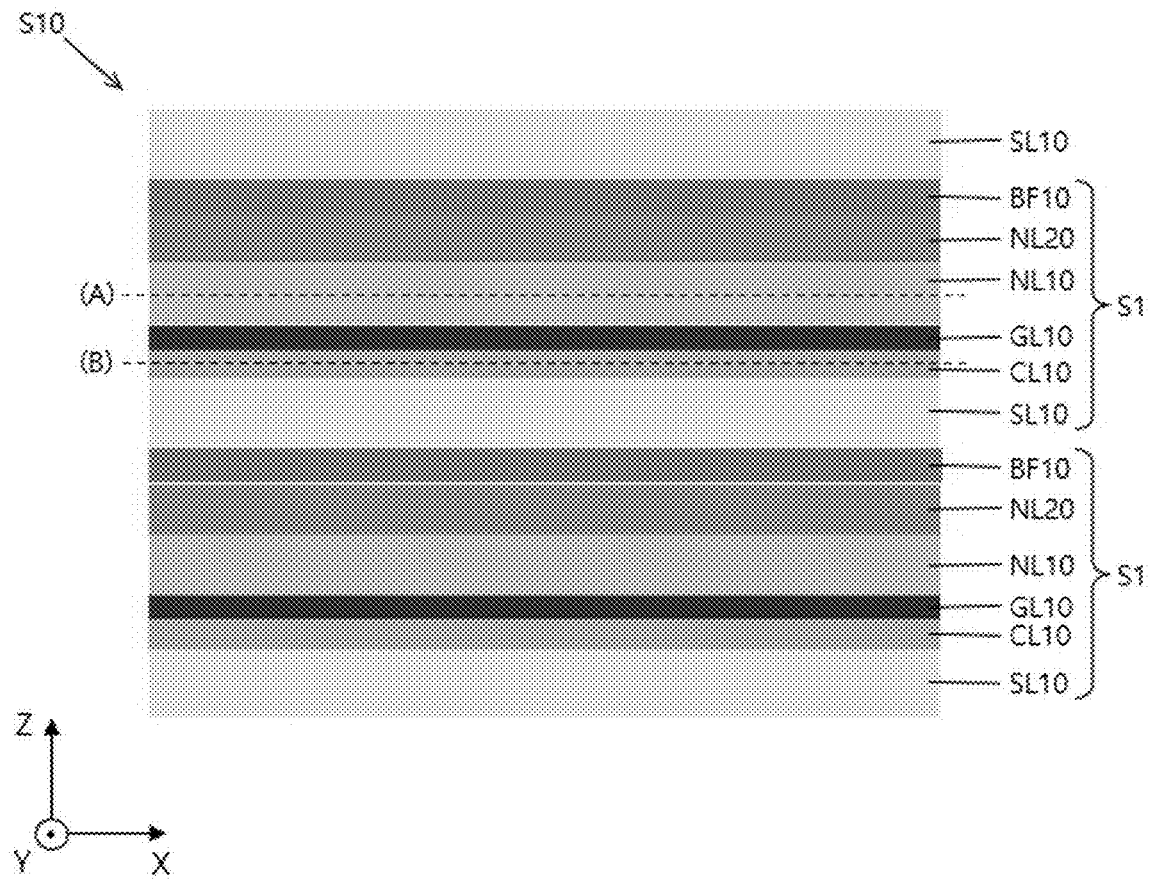
Figure 38B:
Figure 38C:
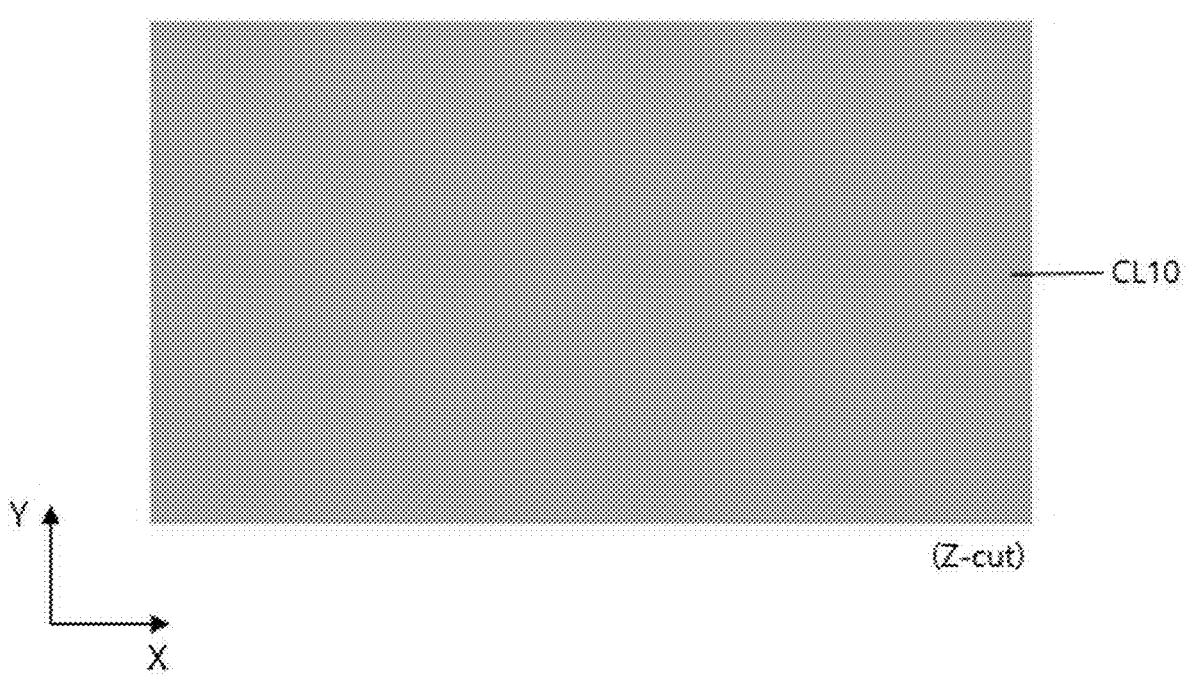

Referring to FIGS. 38A to 38C, a stack S10 may be formed on a predetermined substrate (not shown). The material of the substrate may be selected from a variety of materials. The substrate may include a semiconductor material or an insulating material. The substrate may include a semiconductor wafer. The substrate may include a bulk silicon substrate, a silicon-on-insulator (SOI) substrate, a germanium substrate, or a germanium-on-insulator (GOI), a silicon-germanium substrate, or a substrate formed by an epitaxial growth process.

The stack S10 may include a stacked structure S1. The stacked structure S1 may include a separation layer SL10, and a first channel material layer CL10, a first gate insulating layer GL10, a first insulating layer NL10, a second insulating layer NL20, and a buffer layer BF10 which are sequentially stacked on the separation layer SL10.

The first insulating layer NL10 may be formed of or include, for example, a silicon nitride (e.g., $SiN_x$). The second insulating layer NL20 may be formed of a material different from the first insulating layer NL10 and the buffer layer BF10. The second insulating layer NL20 may be formed as a layer having an etching rate different from the first insulating layer NL10 and the buffer layer BF10 in a later etching process step. For example, the second insulating layer NL20 may be formed of or include an insulating material such as a silicon oxide. The buffer layer BF10 may be formed of a material different from the first insulating layer NL10, the second insulating layer NL20, and the separation layer SL10. The buffer layer BF10 may be formed as a layer having an etching rate different from the first insulating layer NL10, the second insulating layer NL20, and the separation layer SL10 in a later etching process step. The buffer layer BF10, the first insulating layer NL10, the second insulating layer NL20, and the separation layer SL10 may have an etching selectivity to each other. For example, the buffer layer BF10 may include silicon. As a specific example, the buffer layer BF10 may be formed of or include a polysilicon layer.

The second insulating layer NL20 may be formed of a different layer from the separation layer SL10. The second insulating layer NL20 may be formed as a layer having an etching rate different from that of the separation layer SL10 in a later etching process step. For example, the second insulating layer NL20 may include porous silicon oxide. The separation layer SL10 may be formed to include a silicon oxide layer more densely than the second insulating layer NL20. The separation layer SL10 may be formed of or include a silicon oxide having a first density, and the second insulating layer NL20 may be formed of or include a silicon oxide having a second density less than the first density.

The first insulating layer NL10 may have a greater thickness than that of the second insulating layer NL20. The buffer layer BF10 may have a thinner thickness than those of the first insulating layer NL10 and the second insulating layer NL20. The separation layer SL10 may have a greater thickness than that of the second insulating layer NL20 and the buffer layer BF10. However, the specific material and thickness conditions of each of the separation layer SL10, the first insulating layer NL10, the second insulating layer NL20, and the buffer layer BF10 are not limited to the above and may vary depending on the case.

The stack S10 may include a structure in which the stacked structure S1 is repeatedly stacked. The stacked structure S1 may be a unit stacked structure and may be repeatedly stacked on the substrate. Here, as an example, a case where two stacked structures S1 are stacked and a separation layer SL10 is further disposed thereon is shown. It may be considered that the first channel material layer CL10, the first gate insulating layer GL10, the first insulating layer NL10, the second insulating layer NL20, and the buffer layer BF10 which are sequentially stacked constitute one unit stack, and a plurality of the above unit stacks may be repeatedly stacked with the separation layer SL10 interposed therebetween. The unit stack may be a configuration to form a one-layer memory cell unit. The separation layer SL10 may be an insulating layer to separate a lower memory cell and an upper memory cell.

The processes for depositing individual layers constituting the stack S10 may be performed by using various deposition techniques. For example, the above-mentioned layers may be deposited by a thermal chemical vapor deposition (a thermal CVD), a plasma enhanced CVD, a physical vapor deposition (PVD), or an atomic layer deposition (ALD) technology, etc.

FIG. 38B may be a cross-sectional view taken along line (A) of FIG. 38A, and FIG. 38C may be a cross-sectional view taken along line (B) of FIG. 38A. This may be the same up to FIGS. 47B and 47C.

Figure 39A:
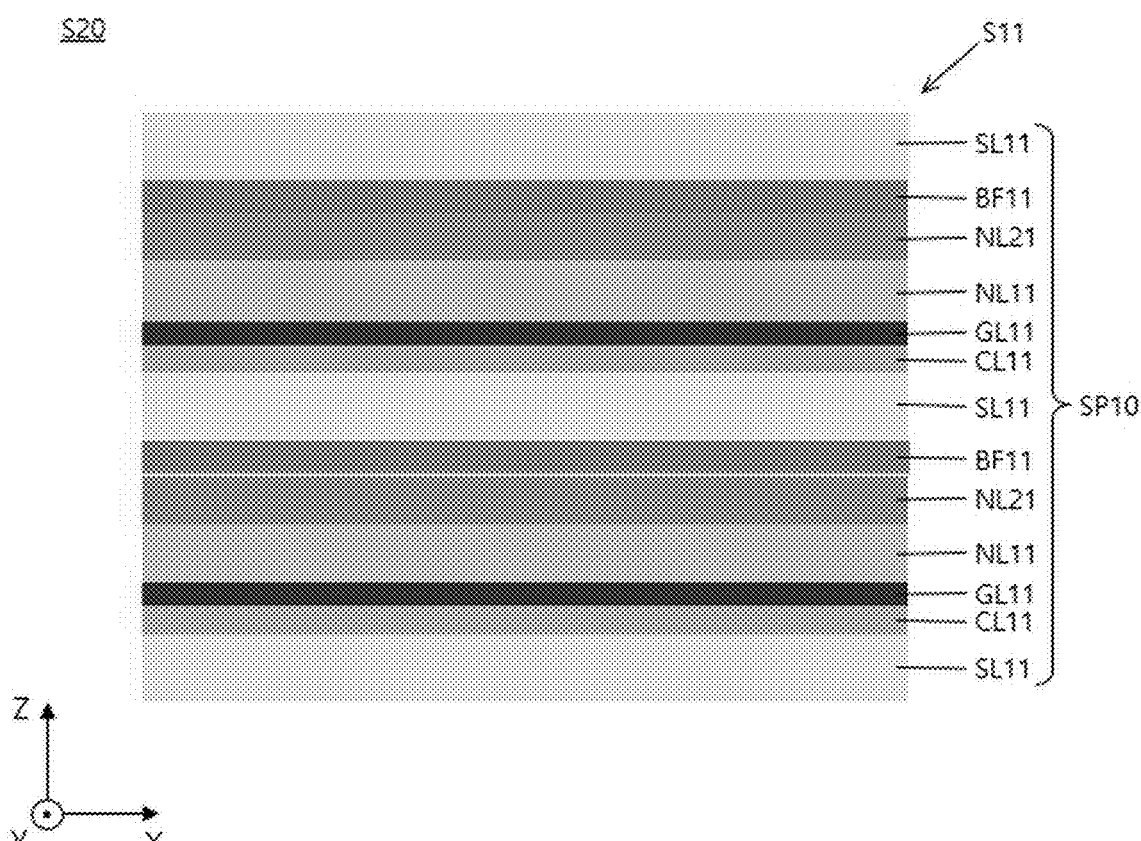
Figure 39B:
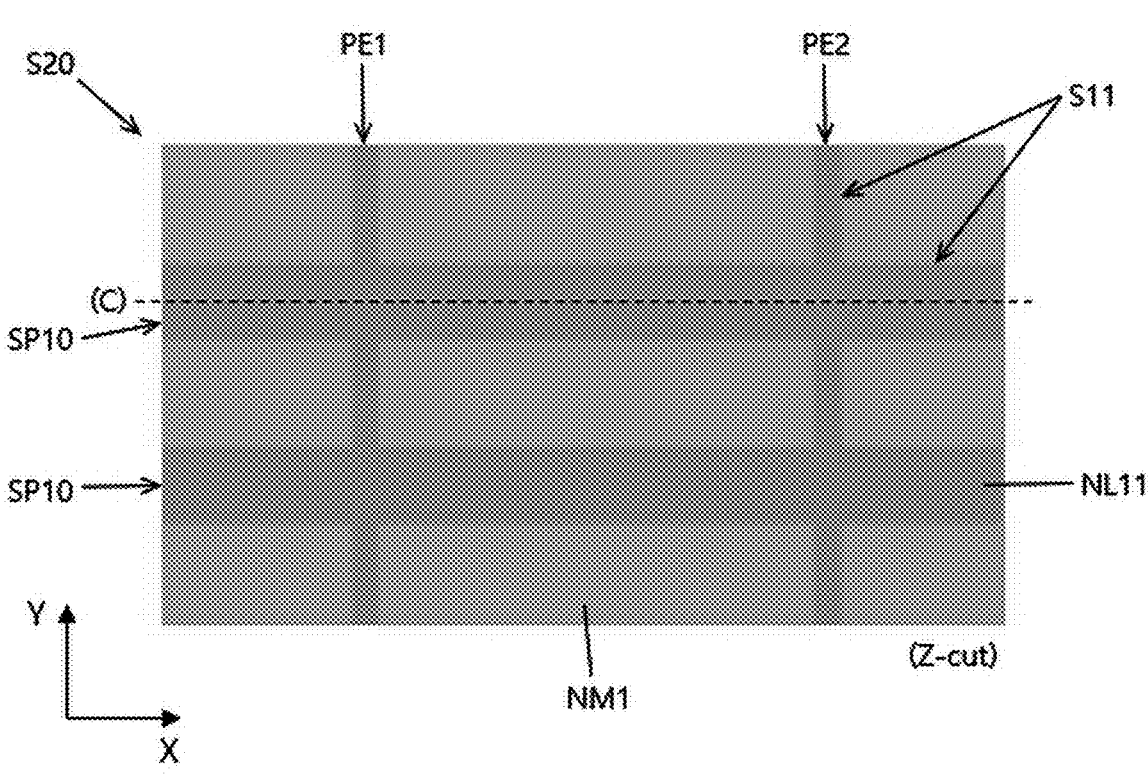
Figure 39C:
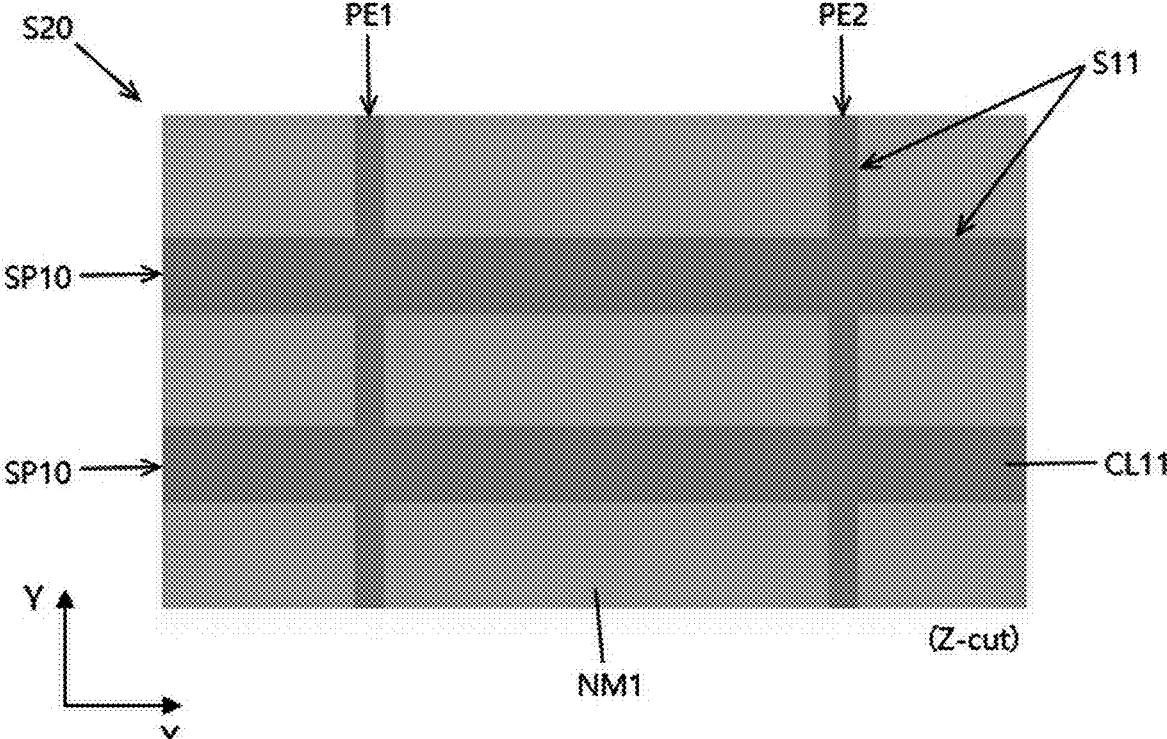

Referring to FIGS. 39A to 39C, a patterned stack S11 may be formed by patterning the stack (S10 in FIG. 38A). The patterned stack S11 may include a plurality of pattern portions SP10 and first and second pattern extension portions PE1 and PE2 extending in a direction connecting the plurality of pattern portions SP10. The plurality of pattern portions SP10 may have a shape extending in a first direction, for example, the X-axis direction, and they may be spaced apart from each other in a second direction orthogonal (perpendicular) to the first direction, for example, the Y-axis direction. The first and second pattern extension portions PE1 and PE2 may extend in the second direction, for example, the Y-axis direction. The first pattern extension portion PE1 may be formed in a region where a write transistor will be formed (a write transistor formation region), and the second pattern extension portion PE2 may be formed in a region where a read transistor will be formed (a read transistor formation region). The first and second pattern extension portions PE1 and PE2 may be arranged side by side and spaced apart from each other. Each of the first and second pattern extension portions PE1 and PE2 may form a line shape together with a portion of the pattern portion SP10. The first and second pattern extension portions PE1 and PE2 may be formed to have a relatively smaller line width than that of the pattern portion SP10. The patterning of the stack (S10 in FIG. 38A) may be a patterning step to define regions where cells will be formed, that is, a cell patterning step. FIG. 39A may be a cross-sectional view corresponding to line (C) in FIG. 39B.

The pattern portion SP10 may include the separation layer SL11, the first channel material layer CL11, the first gate insulating layer GL11, the first insulating layer NL11, the second insulating layer NL21, and the buffer layer BF11. The pattern portion SP10 may have the same stacked structure as that described in FIG. 38A. Each of the separation layer SL11, the first channel material layer CL11, the first gate insulating layer GL11, the first insulating layer NL11, the second insulating layer NL21, and the buffer layer BF11 may be a patterned material layer. The first and second pattern extension portions PE1 and PE2 may also have the same stacked structure as that of the pattern portion SP10.

Then, a first structure S20 including the patterned stack S11 and a first filling material NM1 may be formed by filling the first filling material NM1 between the plurality of pattern portions SP10 and between the first and second pattern extension portions PE1 and PE2. In other words, the first structure S20 including the patterned stack S11 and the first filling material NM1 may be formed by filling the first filling material NM1 into the empty space around the plurality of pattern portions SP10 and the first and second pattern extension portions PE1 and PE2.

The first filling material NM1 may have the same (or substantially the same) height as that of the pattern portion SP10. The first filling material NM1 may be a type of cell separator. The first filling material NM1 may be, for example, an insulating material. In this case, the first filling material NM1 may be referred to as an 'insulating material layer' or an 'insulating material layer pattern'. The first filling material NM1 may be formed of a material having etching selectivity with respect to the first insulating layer NL11, the second insulating layer NL21, and the buffer layer BF11. Furthermore, the first filling material NM1 may be formed of a material having etching selectivity with respect to the separation layer SL11, the first channel material layer CL11, and the first gate insulating layer GL11. In some cases, the first filling material NM1 may not be an insulating material.

Figure 40A:
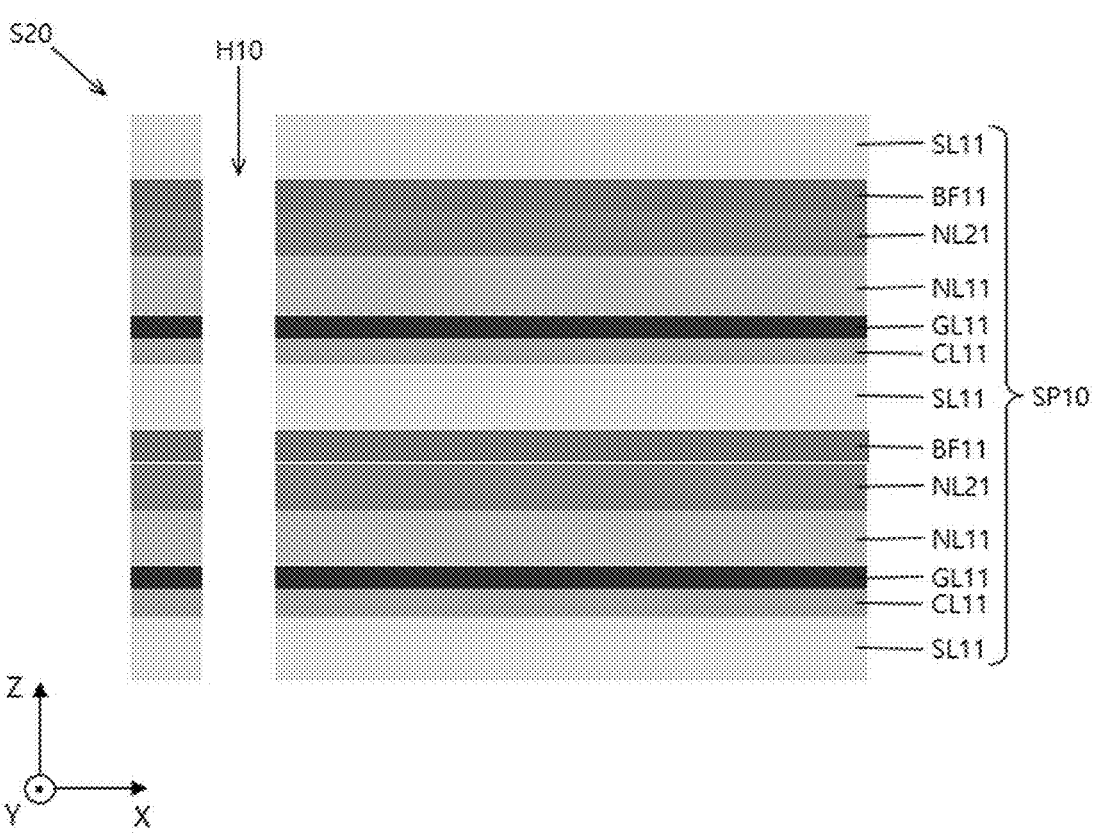
Figure 40B:
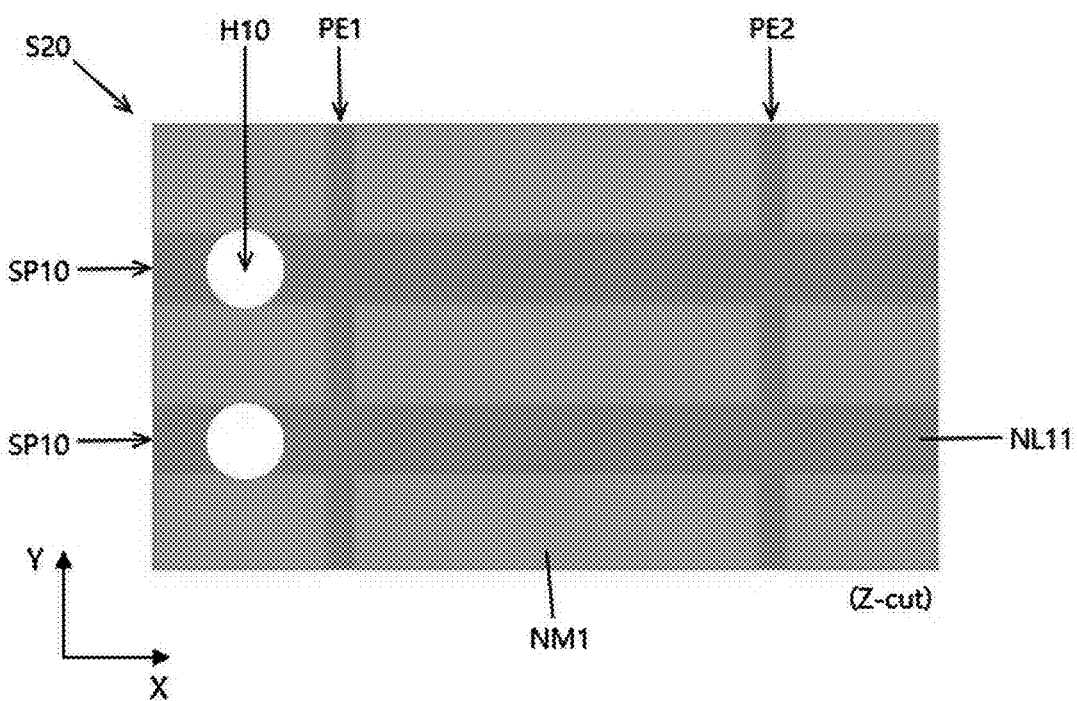
Figures 40C, 41A:
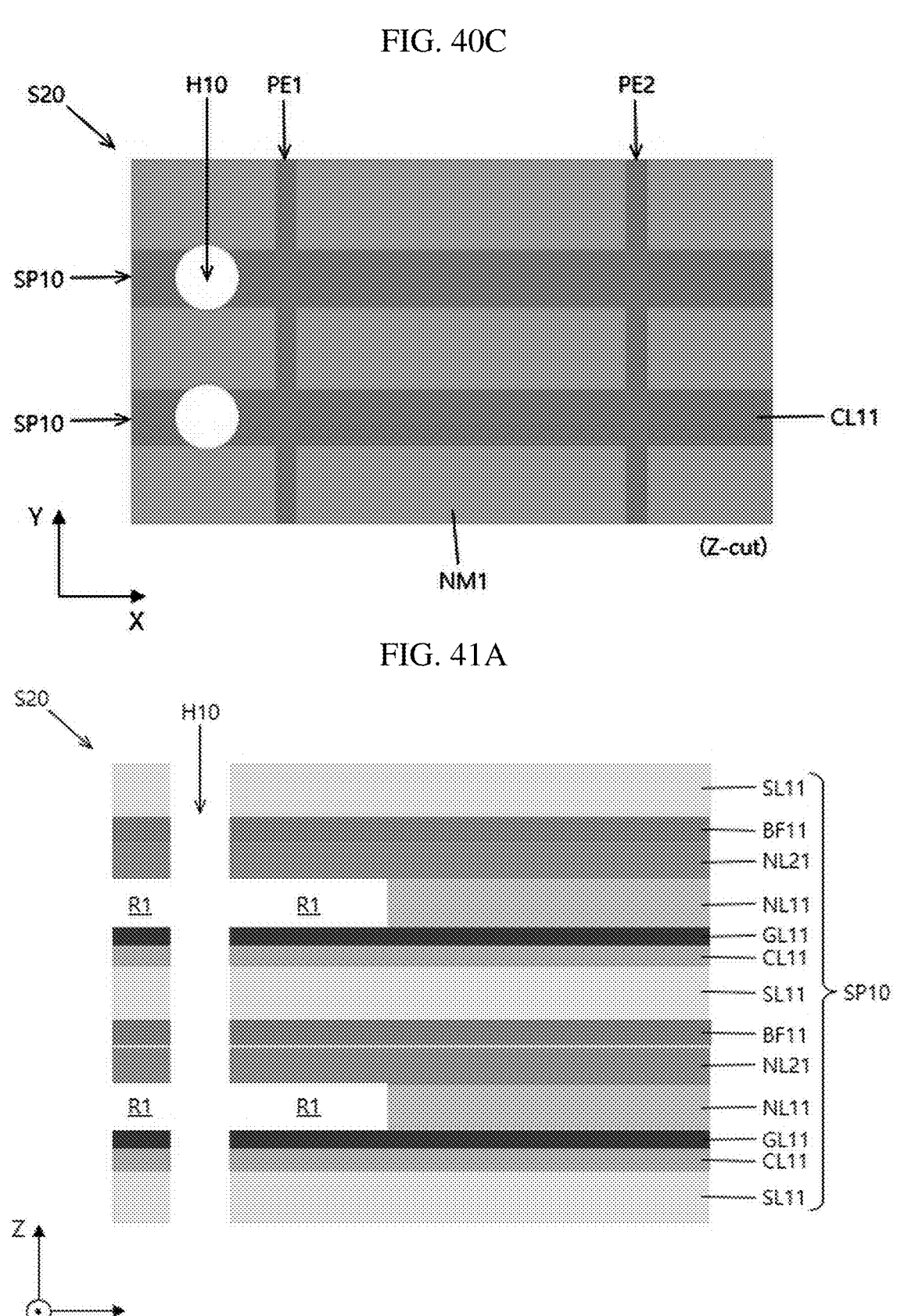

Referring to FIGS. 40A to 40C, a first vertical hole H10 penetrating through each of the plurality of pattern portions SP10 in the vertical direction may be formed in the first structure S20. Each of the first vertical hole H10 may be formed to penetrate from the uppermost layer to the lowermost layer of the pattern portion SP10 in a predetermined region of the first structure S20. The first vertical hole H10 may correspond to a region where a write bit line will be formed later. Accordingly, it may be said that the first vertical hole H10 is formed in the write transistor formation region (that is, write transistor formation planned region). The first vertical hole H10 may be formed to be adjacent to the first pattern extension portion PE1. The first vertical hole H10 may be formed on a side opposite to the first pattern extension portion PE1 where the second pattern extension portion PE2 is disposed. A plurality of first vertical holes H10 may be formed to be spaced apart from each other in the Y-axis direction. The first vertical hole H10 may be formed through a dry etching process.

Figure 41B:
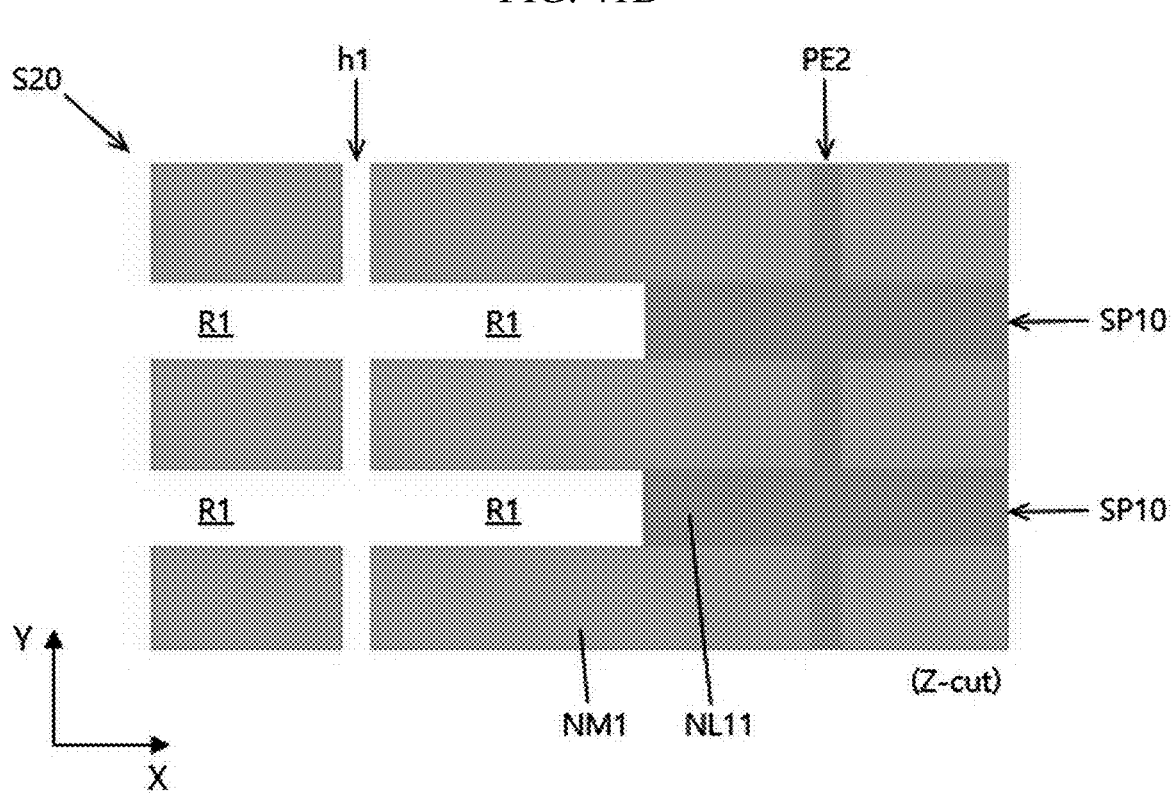
Figure 41C:
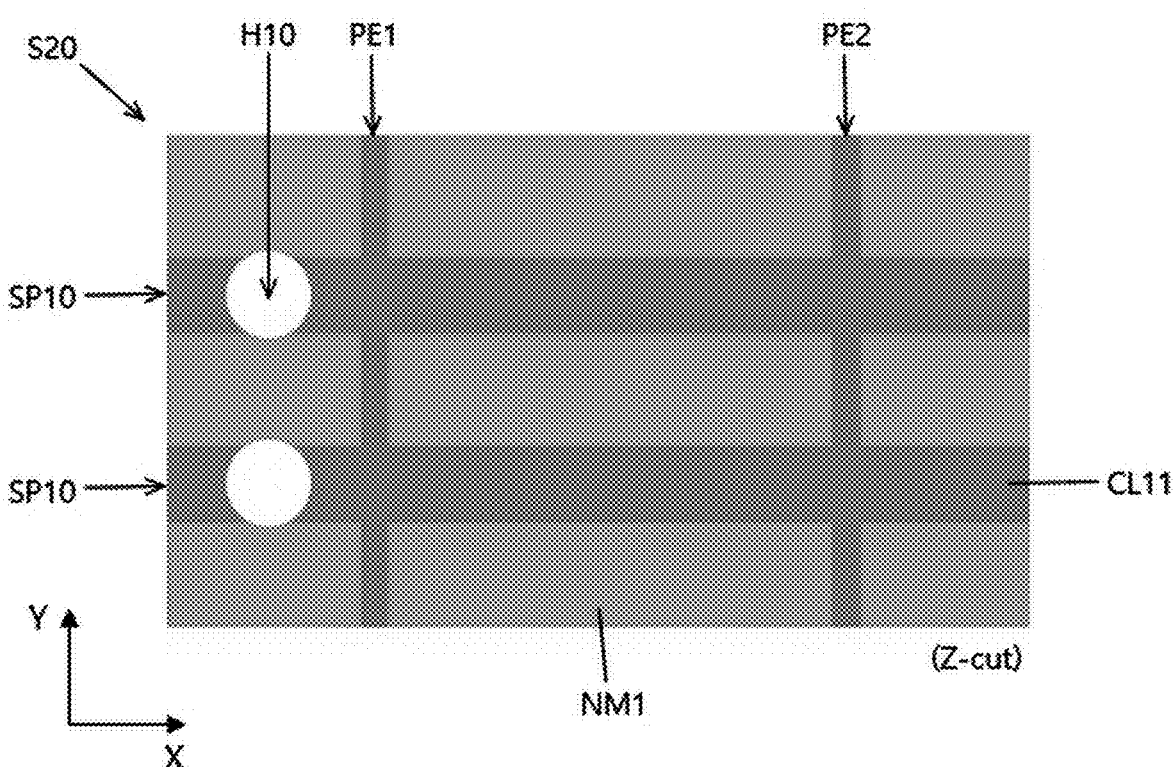

Referring to FIGS. 41A to 41C, a first horizontal hole h1 may be formed by removing the first insulating layer NL11 from the first pattern extension portion PE1 while forming a first recess R1 by recessing the first insulating layer NL11 around the first vertical hole H10 of the first structure S20. A portion of the first insulating layer NL11 may be selectively recessed (etched) by using a wet etching process using a wet etchant having etching selectivity. Since the portion of the first insulating layer NL11 included in the first pattern extension portion PE1 has a relatively small line width, all portions of the first insulating layer NL11 included in the first pattern extension portion PE1 may be removed. An upper surface of the first gate insulating layer GL11 and a lower surface of the second insulating layer NL21 may be exposed by the first recess R1. Although not shown, when forming the first recess R1, the separation layer SL11 may also be slightly recessed.

Figures 42A, 42B:
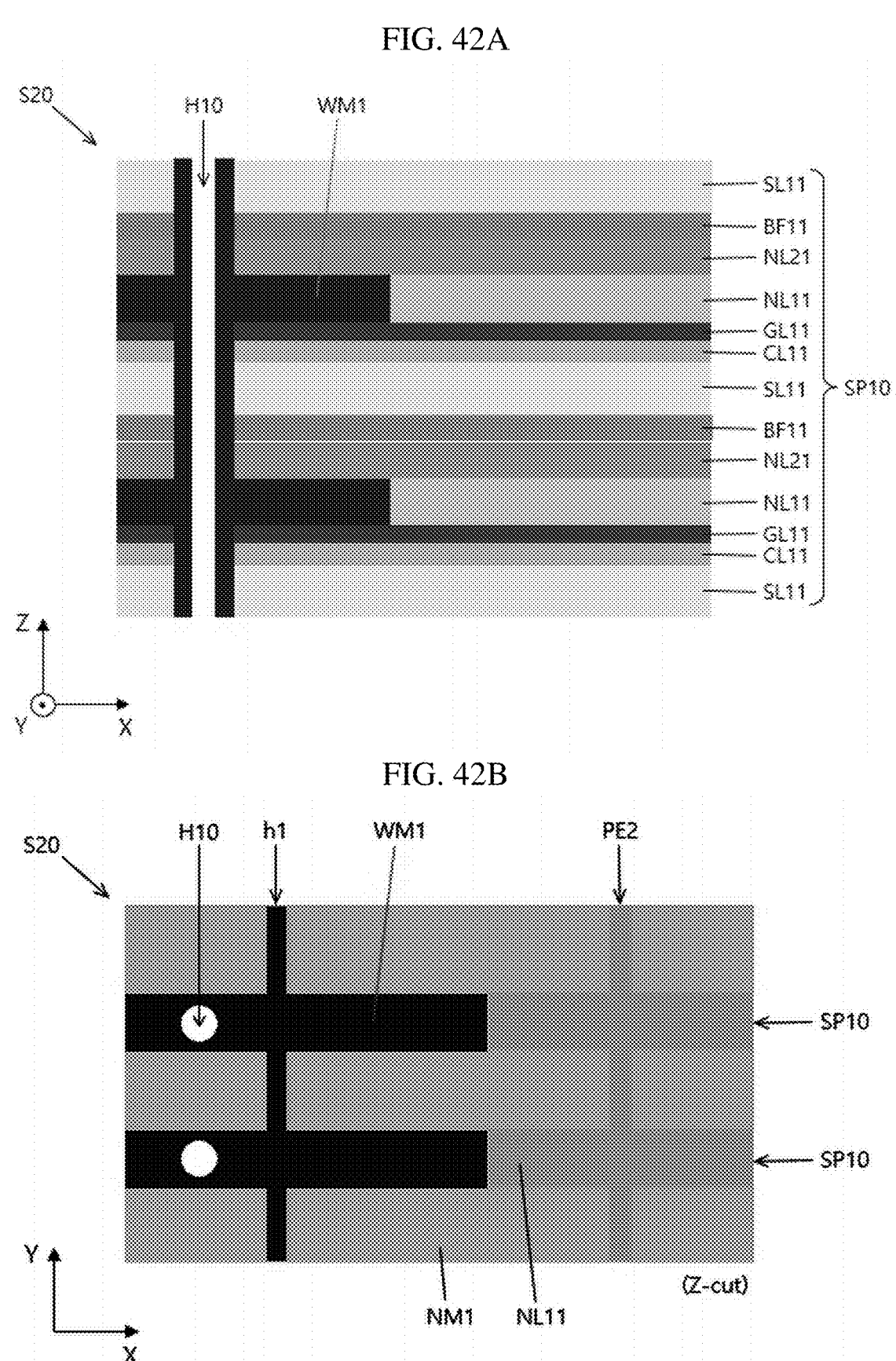
Figure 42C:
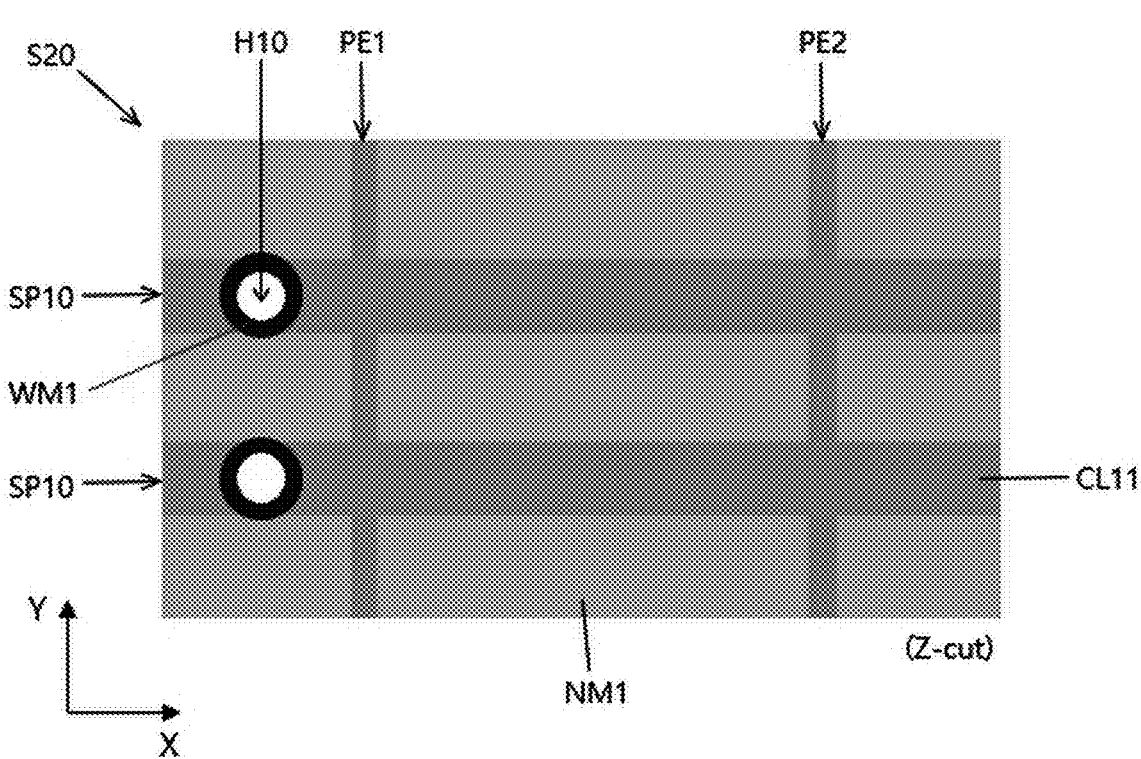

Referring to FIGS. 42A to 42C, a write word line material layer WM1 may be formed (deposited) in the inside of the first recess (R1 in FIG. 41A) and the first horizontal hole h1, and the inner surface of the first vertical hole H10. The write word line material layer WM1 may include at least one of a metal, a metal compound, and conductive silicon. As the write word line material layer WM1 is filled in the first horizontal hole h1, a conductive line may be formed.

Figure 43A:
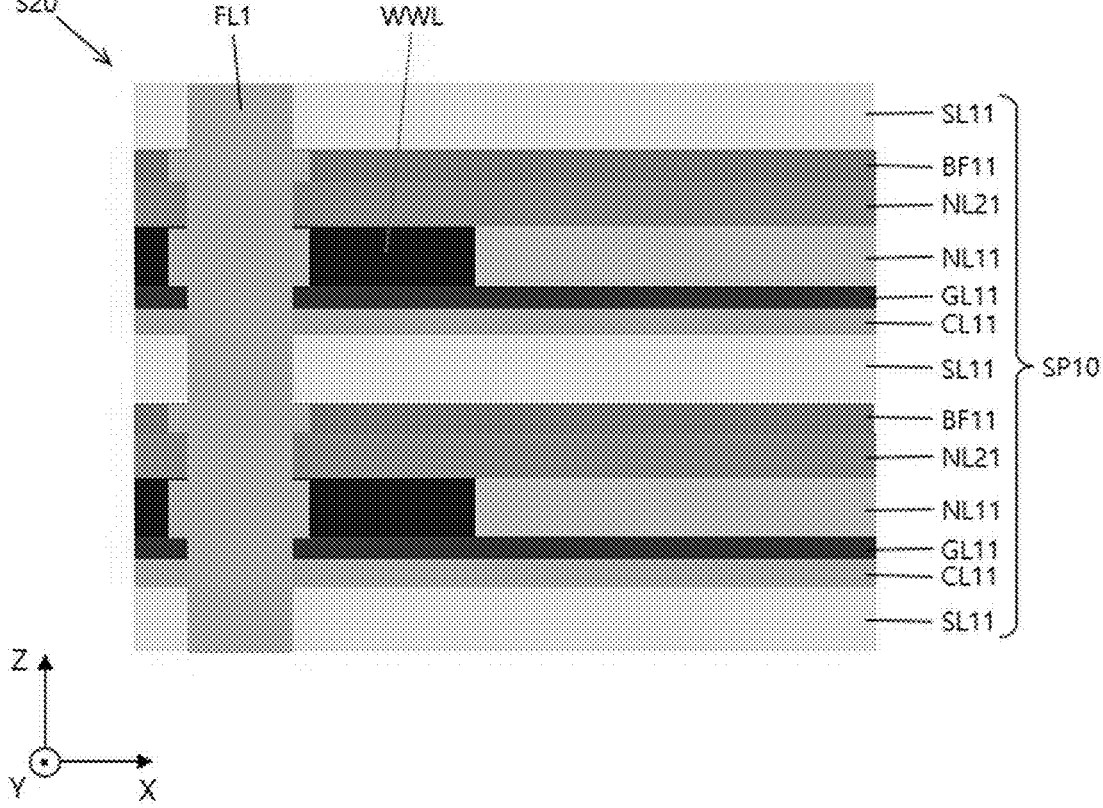
Figure 43B:
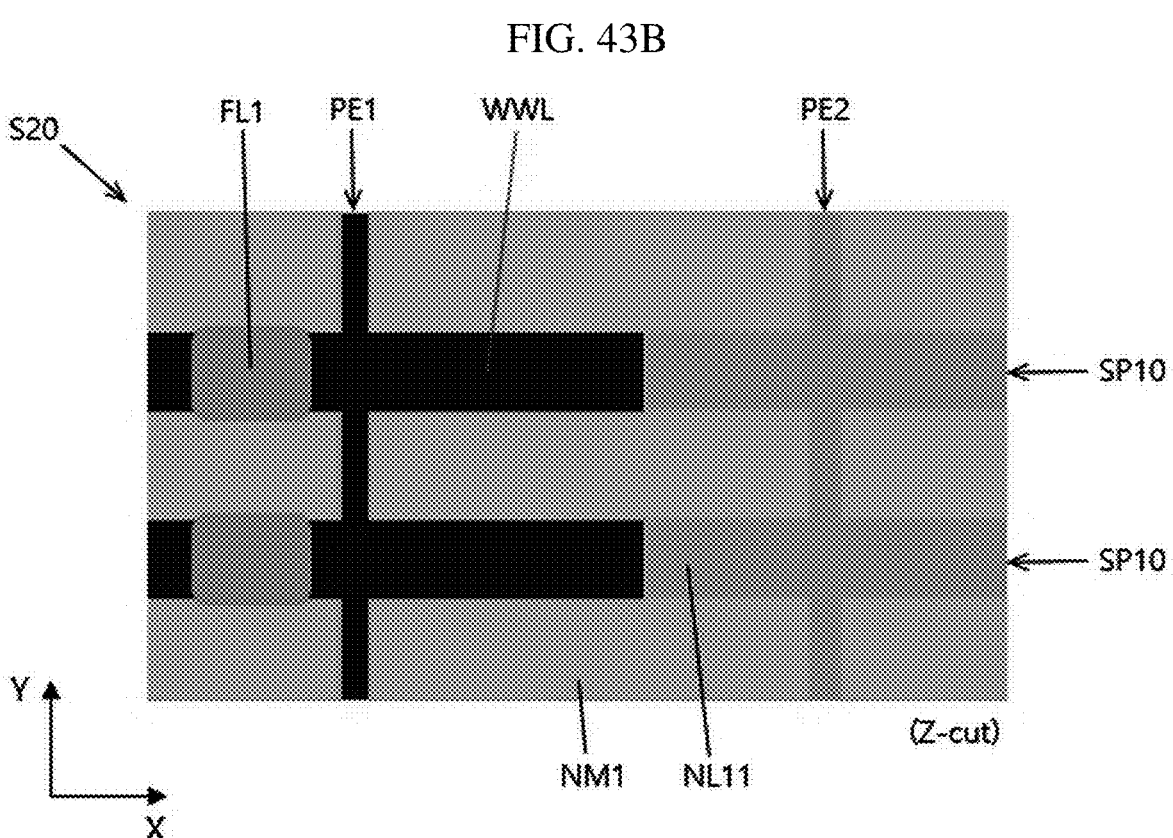
Figure 43C:
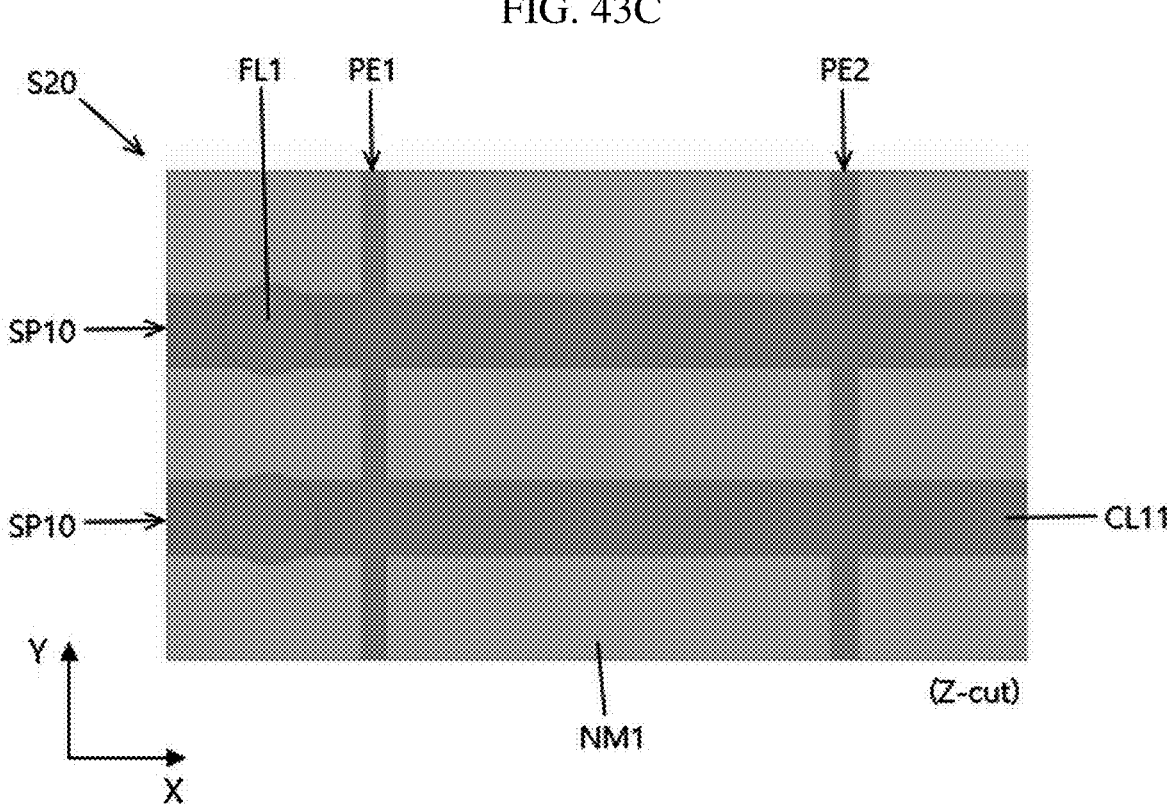

Referring to FIGS. 43A to 43C, a portion formed on the inner surface of the first vertical hole (H10 in FIG. 42A) in the write word line material layer (WM1 in FIG. 42A) may be removed. For this purpose, a wet etching process may be used. At this time, the write word line material layer (WM1 in FIG. 42A) adjacent to the inner surface of the first vertical hole (H10 in FIG. 42A) may also be partially recessed. Accordingly, a write word line WWL separated from the write word line material layer (WM1 in FIG. 42A) may be formed. A plurality of write word lines WWL separated from the write word line material layer (WM1 in FIG. 42A) may be formed. Each of the write word lines WWL may have a line shape due to the portion filled in the first horizontal hole h1.

According to one embodiment, after removing the portion formed on the inner surface of the first vertical hole (H10 in FIG. 42A) from the write word line material layer (WM1 in FIG. 42A), a step for recessing a portion of the buffer layer BF11 exposed by the first vertical hole (FIG. H10 of FIG. 42a) may be further performed. This step may be performed to electrically separate the buffer layer BF11 and a write bit line to be formed later in a region corresponding to the first vertical hole (H10 in FIG. 42A). However, depending on the material of the buffer layer BF11, the step for recessing a portion of the buffer layer BF11 may be omitted.

Next, a first filling insulating layer FL1 may be formed to fill the first vertical hole (H10 in FIG. 42A). The first filling insulating layer FL1 may be a type of gap fill material layer. As a non-limiting example, the first filling insulating layer FL1 may include a silicon oxide, be formed of a silicon oxide, or be formed of another insulating material. The first filling insulating layer FL1 may be formed to fill the first vertical hole (H10 in FIG. 42A) and fill the empty space around it.

As described above, as the write word line WWL extending in the horizontal direction is formed in the first recess (R1 in FIG. 41A) and the first horizontal hole (h1 in FIG. 41B) by using the method as illustrated in FIGS. 42A to 43C, it is possible to define a write transistor including the first channel material layer CL11, the first gate insulating layer GL11, and a portion of the write word line WWL. In the embodiment of FIG. 43A, a lower write transistor structure and an upper write transistor structure may be defined. However, the method for defining the write transistor is only an example and may vary.

Figures 44A, 44B:
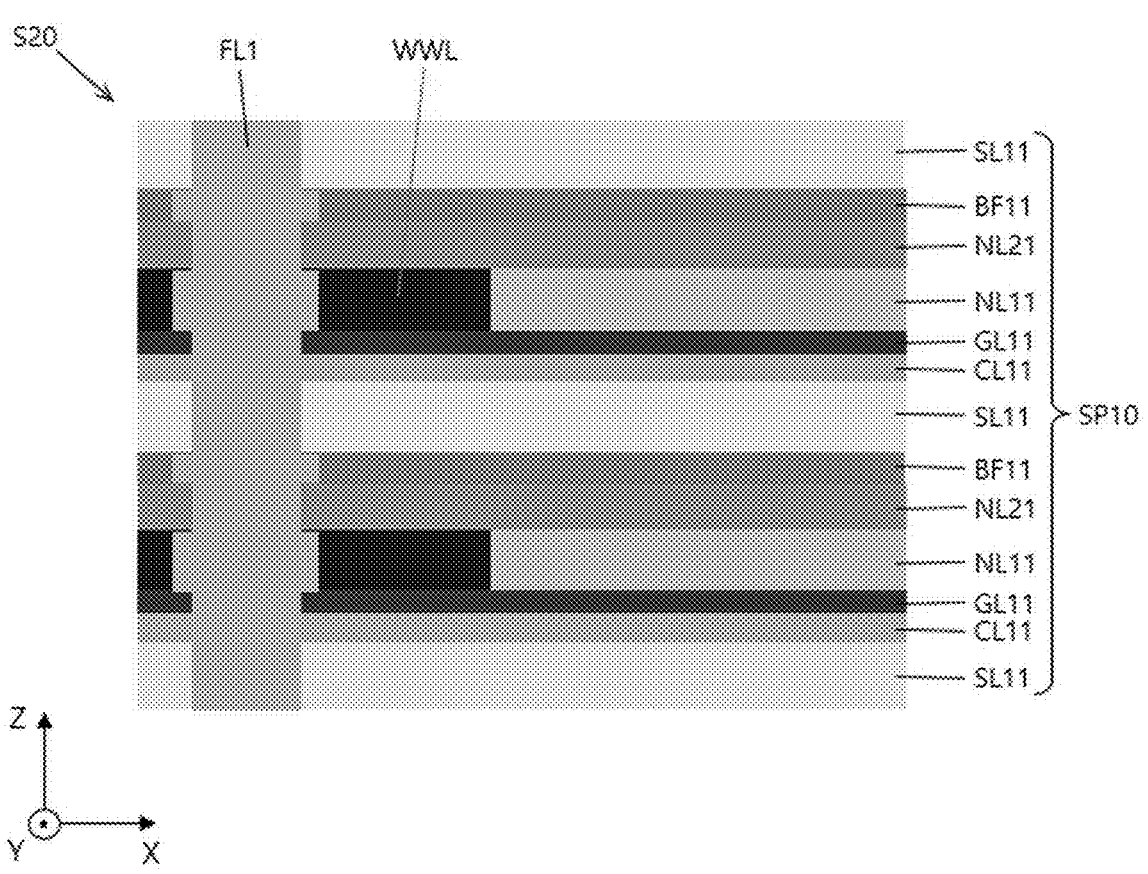
Figures 44C, 45A:
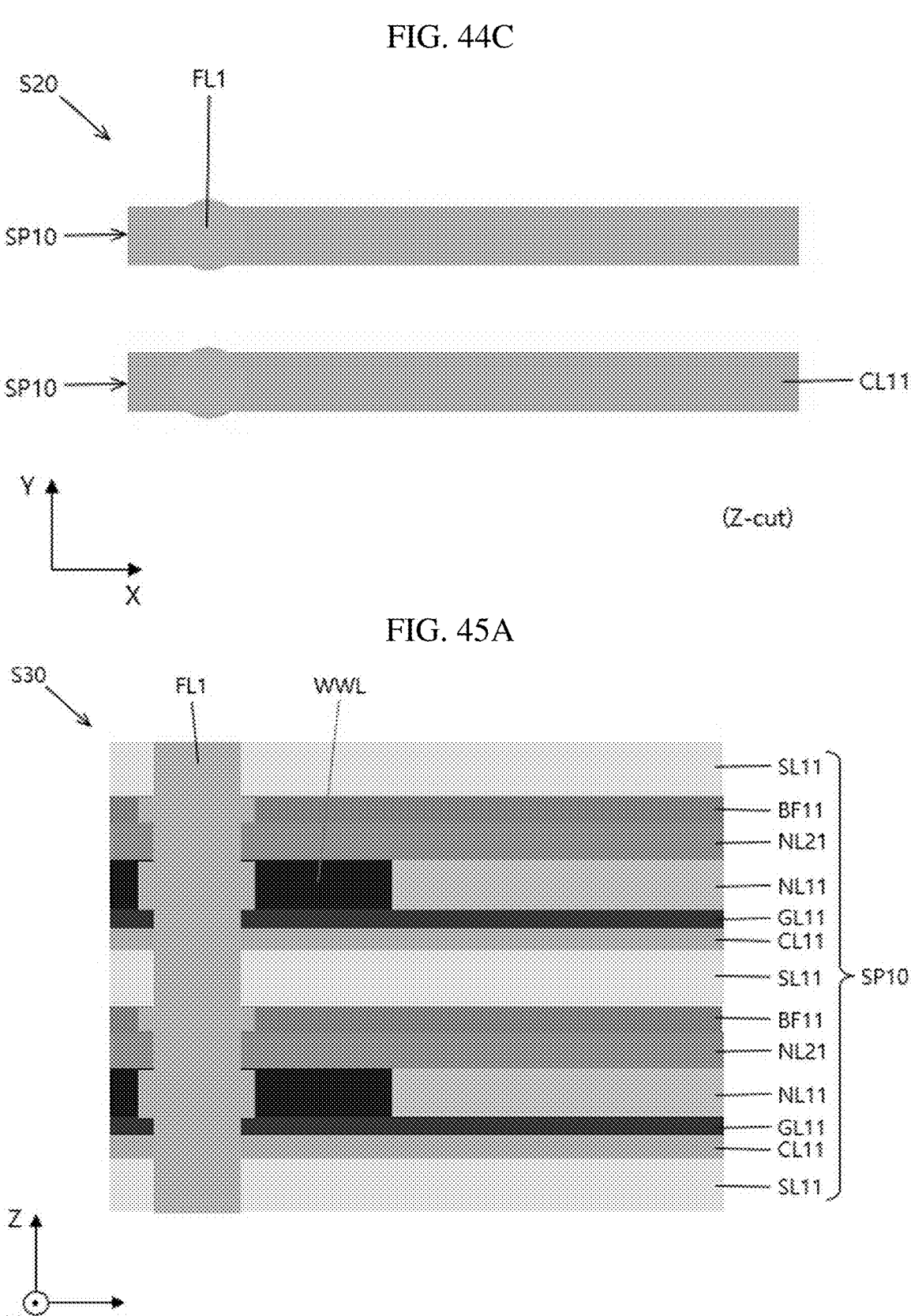

Referring to FIGS. 44A to 44C, the first filling material (NM1 in FIGS. 43B and 43C) may be removed from the first structure S20, and the first channel material layer CL11 may be removed from the first and second pattern extension portions PE1 and PE2. A cell patterning of the first channel material layer CL11 may be completed by removing the portion of the first channel material layer CL11 from the first and second pattern extension portions PE1 and PE2. Since the first channel material layer CL11 included in the first and second pattern extension portions PE1 and PE2 may have a relatively small line width, this layer portion may be easily removed.

Figures 45B, 45C:
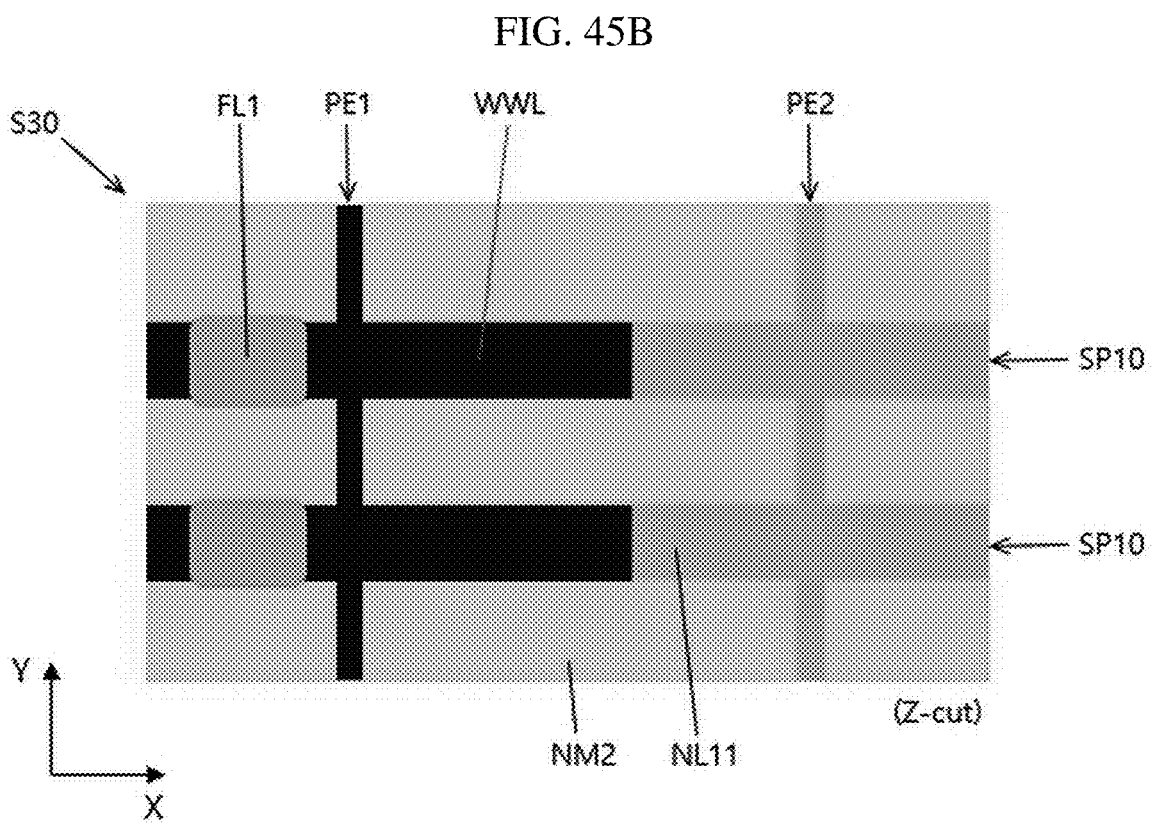

Referring to FIGS. 45A to 45C, a second structure S30 including the plurality of pattern portions SP10, the first and second pattern extension portions PE1, PE2, and a second filling material NM2 may be formed by filling the second filling material NM2 between the plurality of pattern portion SP10 in which the write transistor is defined, and between the first and second pattern extension portions PE1 and PE2. In other words, the second structure S30 including the plurality of pattern portions SP10, the first and second pattern extension portions PE1 and PE2, and the second filling material NM2 may be formed by filling the empty spaces around the plurality of pattern portions SP10 and the first and second pattern extension portions PE1 and PE2 with the second filling material NM2.

The second filling material NM2 may have the same (or substantially the same) height as the pattern portion SP10. The second filling material NM2 may be a type of cell separator. The second filling material NM2 may be, for example, an insulating material. In this case, the second filling material NM2 may be referred to as an 'insulating material layer' or an 'insulating material layer pattern'. The second filling material NM2 may be formed of a material having etching selectivity with respect to the first insulating layer NL11, the second insulating layer NL21, and the buffer layer BF11. Furthermore, the second filling material NM2 may be formed of a material having etching selectivity with respect to the separation layer SL11, the first channel material layer CL11, and the first gate insulating layer GL11.

Then, by using the method as illustrated in FIGS. 46A to 47C, a write bit line (WBL in FIG. 47A) extending in the vertical direction may be formed at a position corresponding to the first vertical hole (H10 in FIG. 40A). For reference, the expression 'corresponding' in this specification may mean the same thing, but may be a concept which broadly encompasses substantially the same or similar things. This may be applied equally throughout this specification.

Figures 46A, 46B:
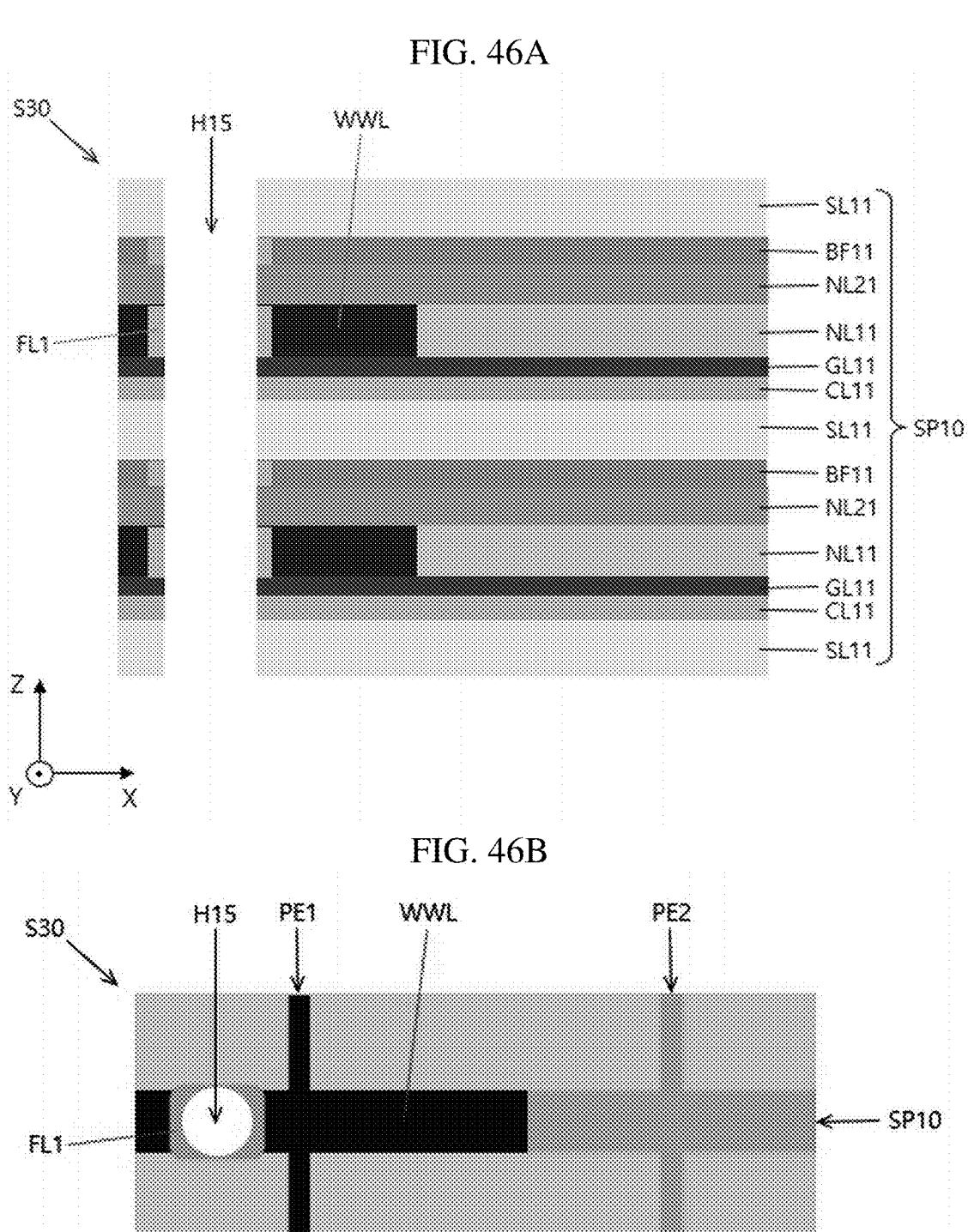
Figure 46C:
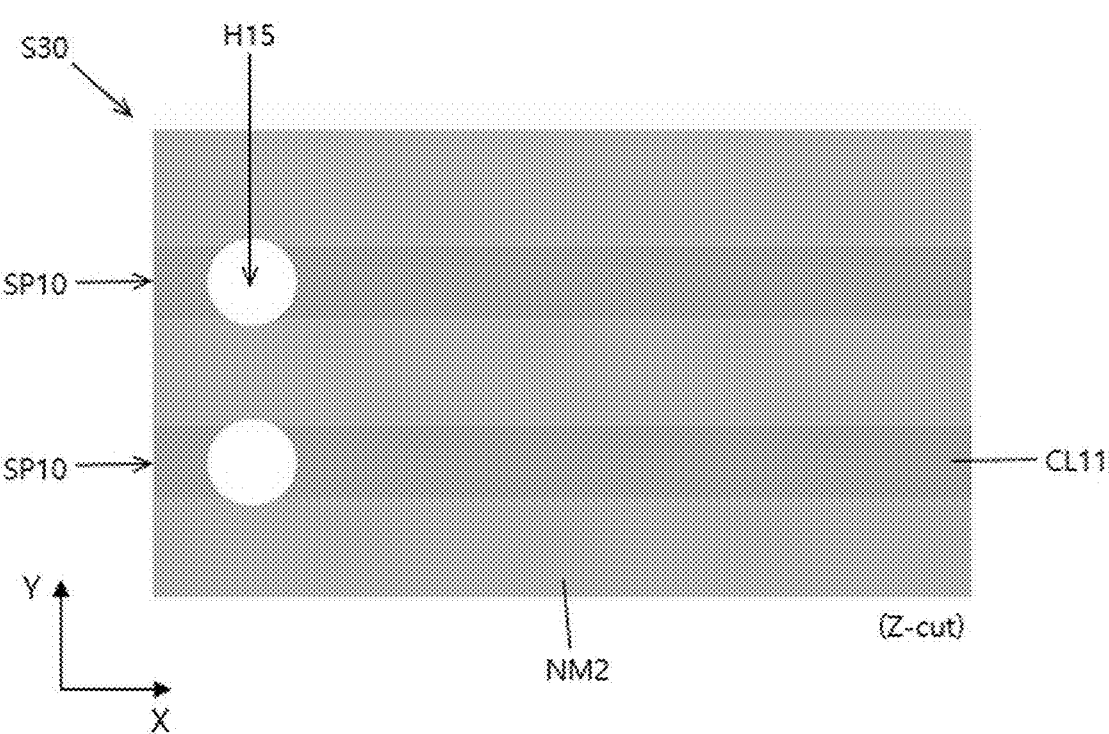

Referring to FIGS. 46A to 46C, a first through hole H15 may be formed by etching the first filling insulating layer FL1 at a position corresponding to the first vertical hole (H10 in FIG. 40A) of the second structure S30. The first through hole H15 may be formed through a dry etching process.

Figure 47A:
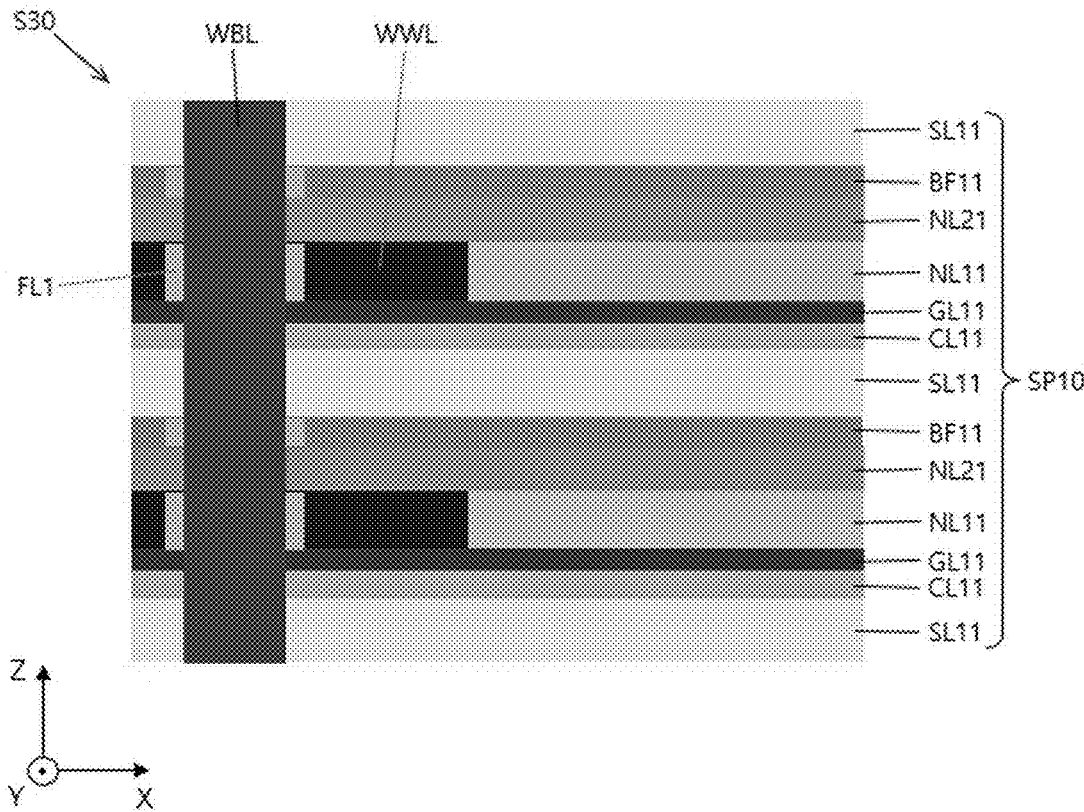
Figures 47B, 47C:
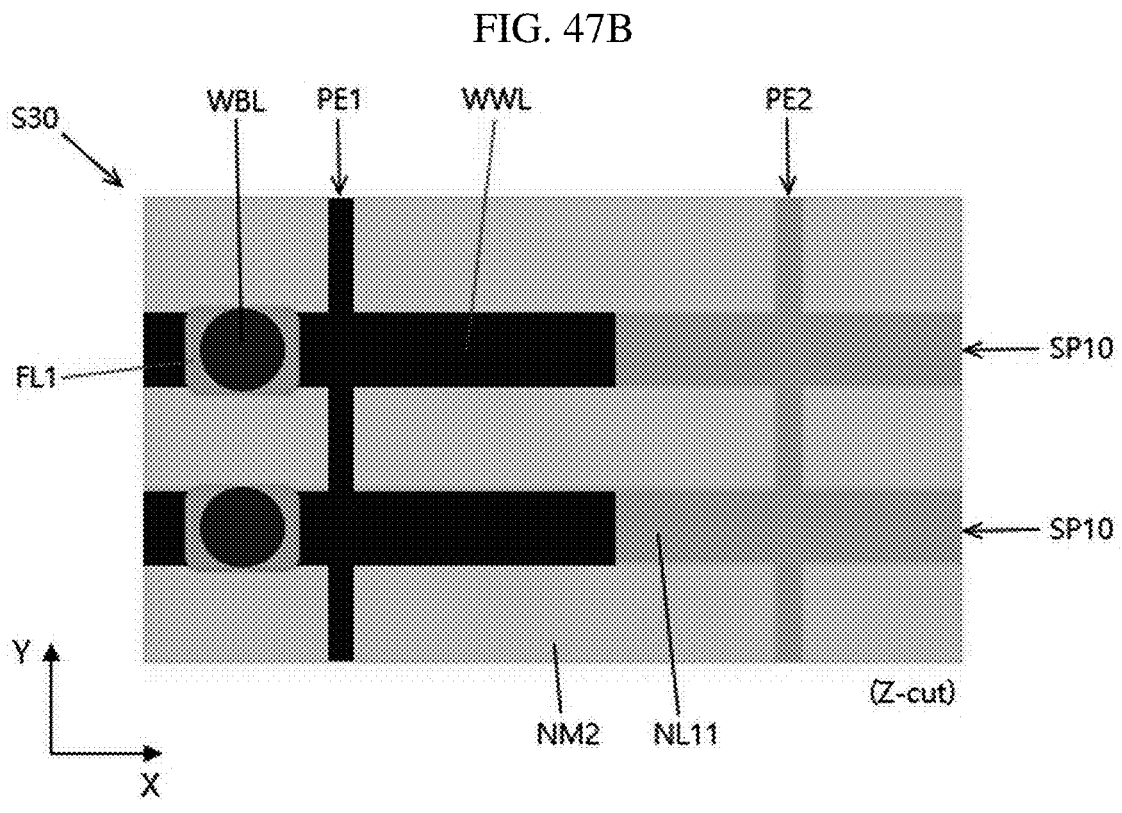

Referring to FIGS. 47A to 47C, a write bit line WBL may be formed in the first through hole (H15 in FIG. 46A). The write bit line WBL may include, for example, at least one of a metal, a metal compound, and a conductive silicon.

Figure 48A:
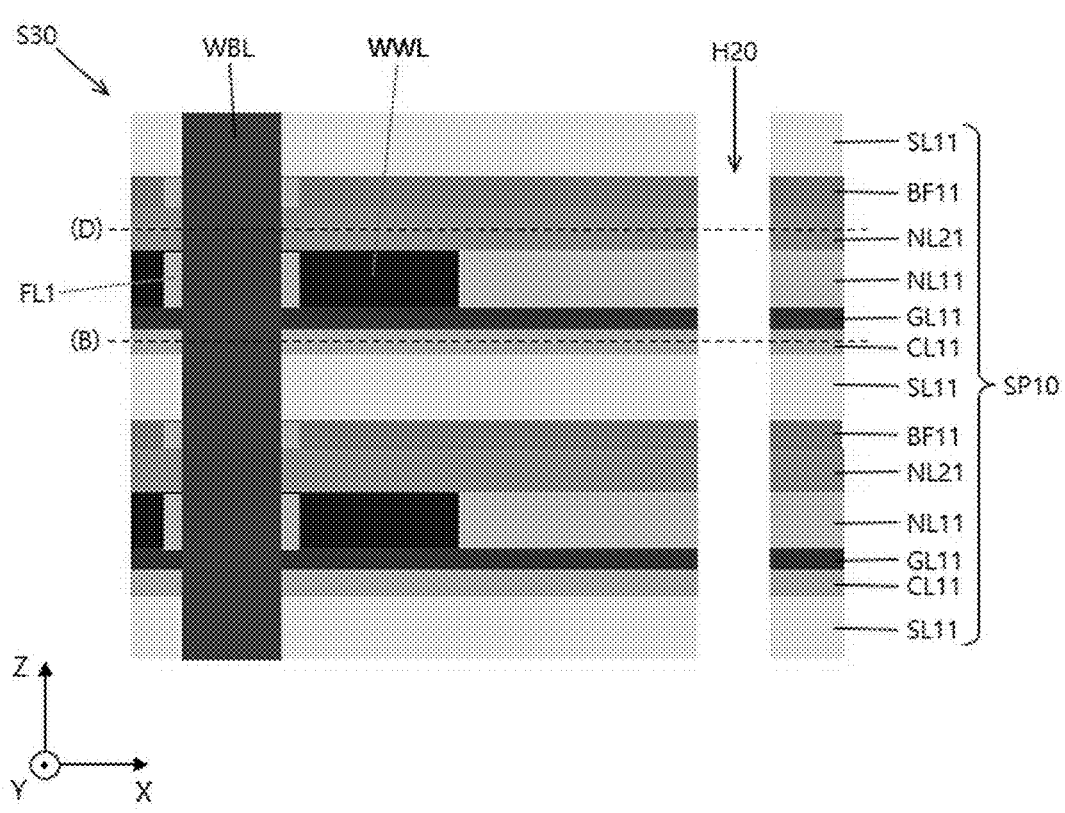
Figure 48B:
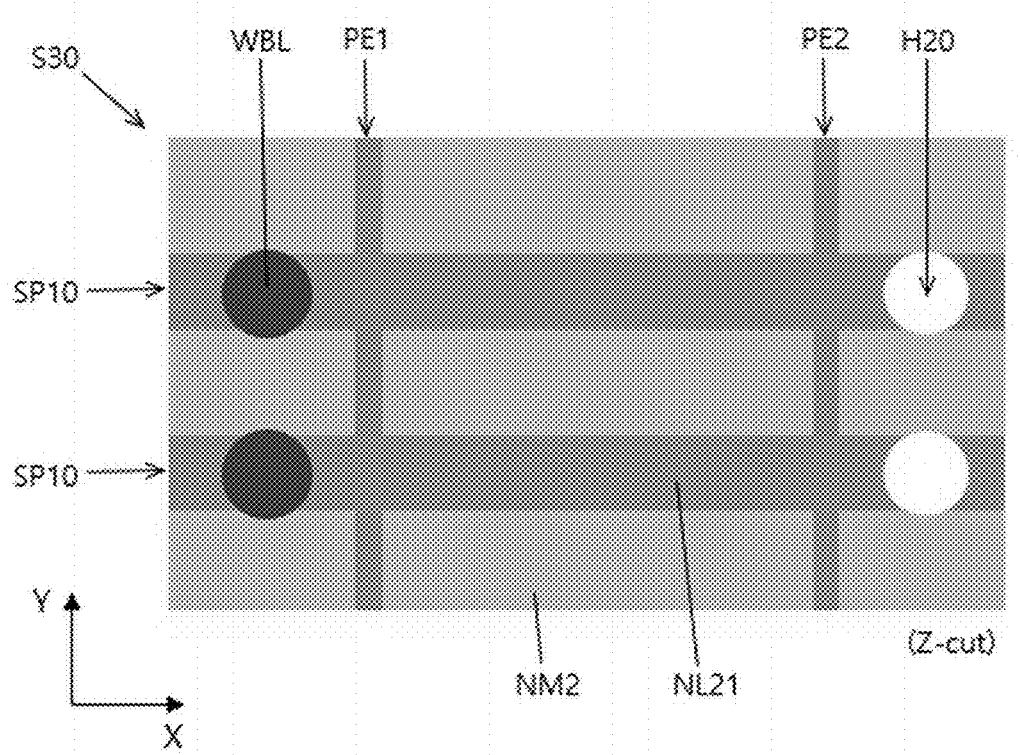
Figure 48C:
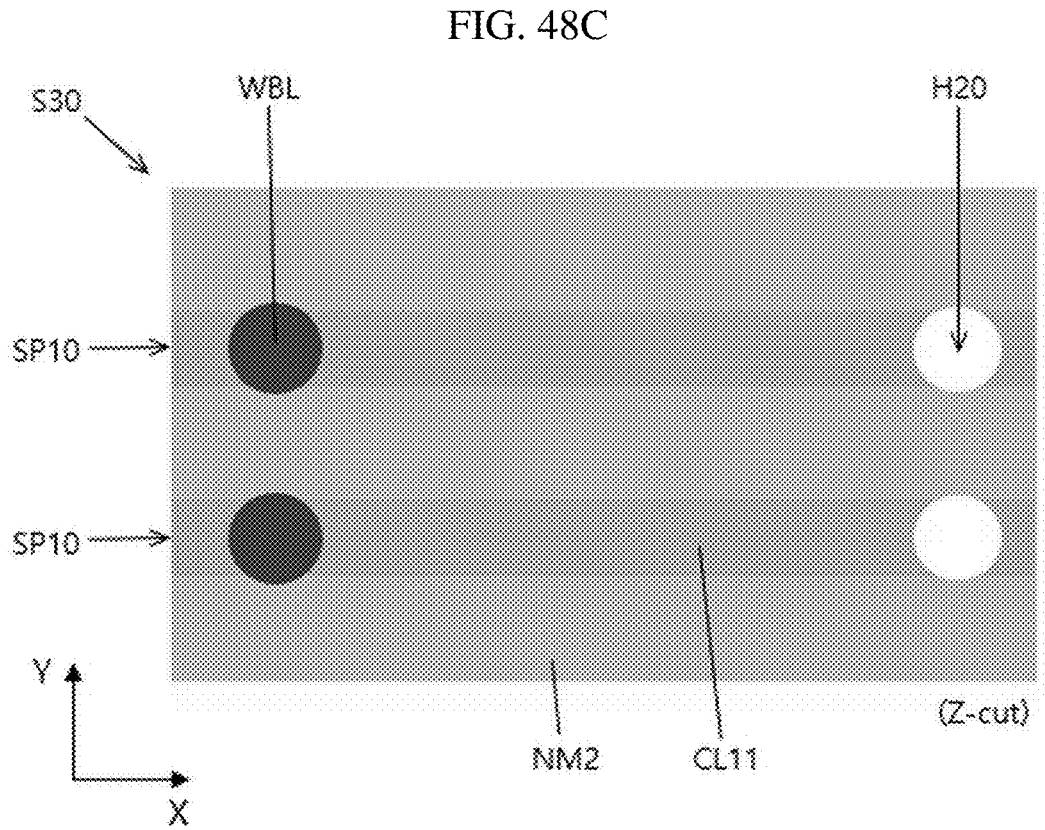

Referring to FIGS. 48A to 48C, a second vertical hole H20 which vertically penetrate through each of the plurality of pattern portions SP10 may be formed in the second structure S30. The second vertical hole H20 may be formed in a region where a read transistor is to be formed, that is, a read transistor formation planned region.

Each of the second vertical hole H20 may be formed to penetrate from the uppermost layer to the lowermost layer of the pattern portion SP10 in a predetermined region of the second structure S30. The second vertical hole H20 may correspond to a region where a read bit line will be formed later. The second vertical hole H20 may be formed to be adjacent to the second pattern extension portion PE2. The second vertical hole H20 may be formed on the opposite side of the second pattern extension portion PE2 from the side where the first pattern extension portion PE1 is disposed. A plurality of second vertical holes H20 may be formed to be spaced apart from each other in the Y-axis direction. The second vertical hole H20 may be formed through a dry etching process.

FIG. 48B may be a cross-sectional view taken along line (D) of FIG. 48A, and FIG. 48C may be a cross-sectional view taken along line (B) of FIG. 48A. This may be the same up to FIGS. 60B and 60C.

Figure 49A:
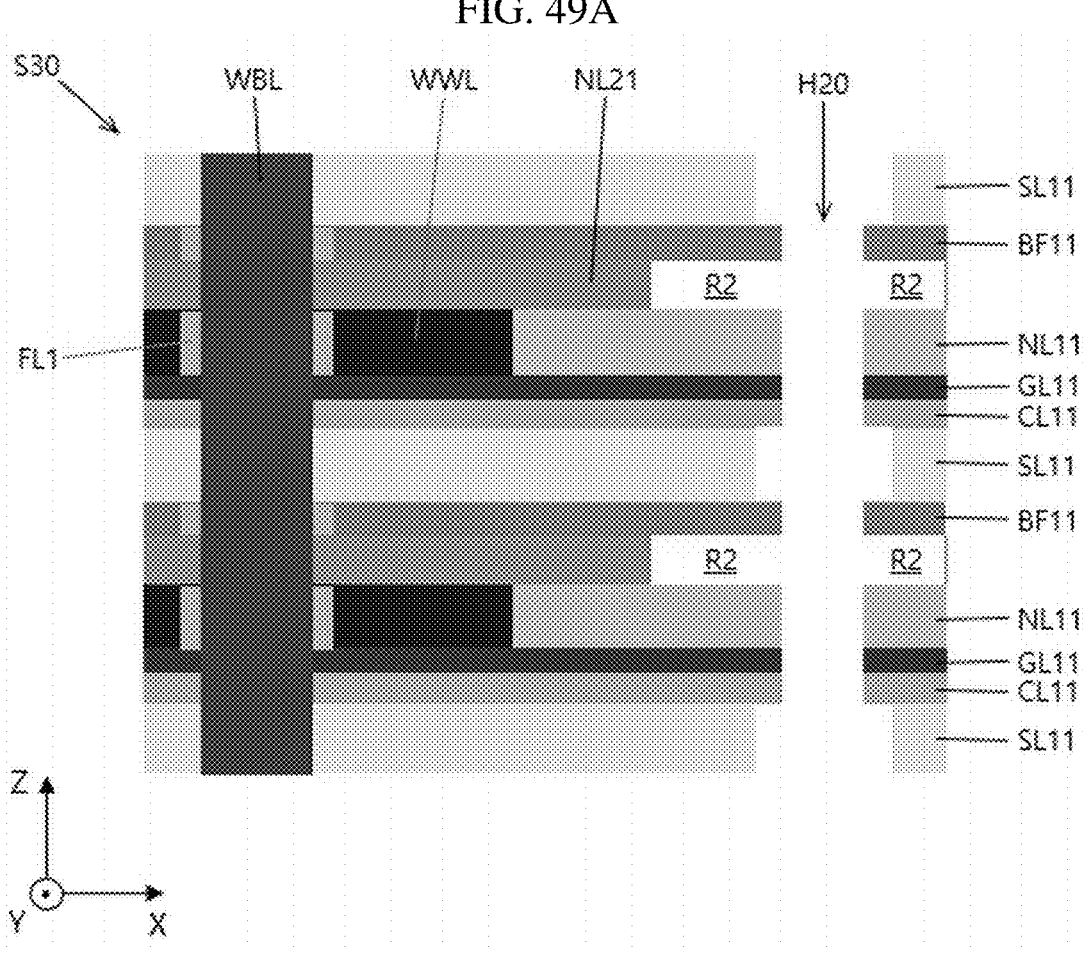
Figures 49B, 49C:
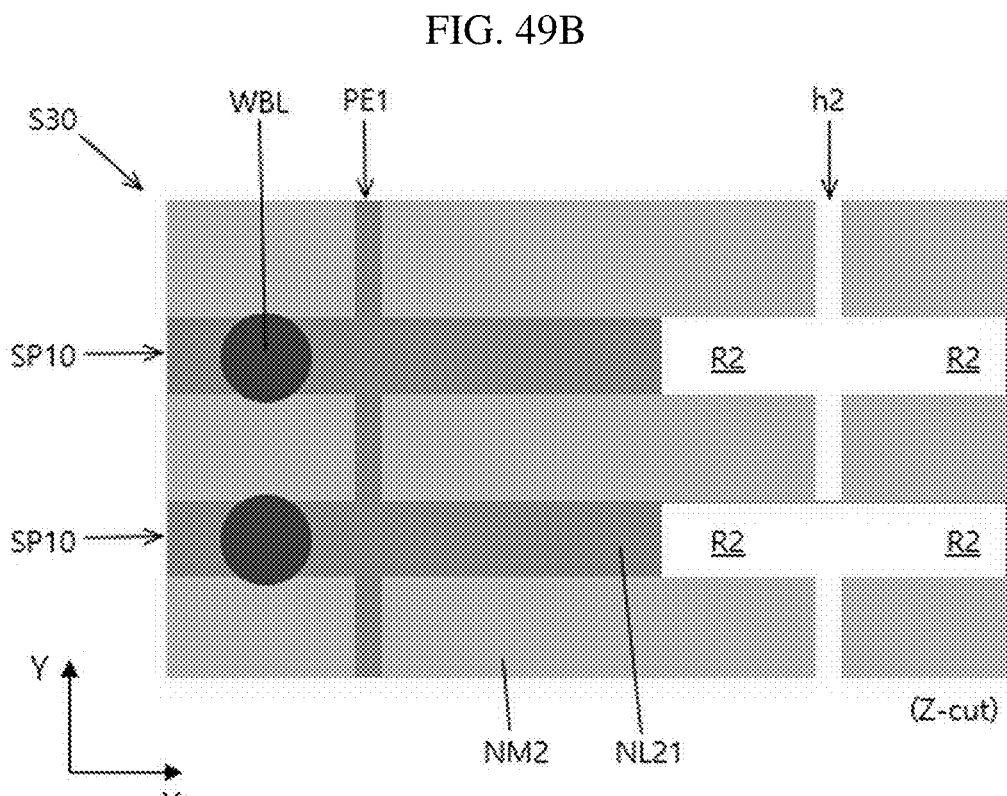

Referring to FIG. 49A to FIG. 49C, a second horizontal hole h2 may be formed by removing the second insulating layer NL21 from the second pattern extension portion PE2 while forming a second recess R2 by recessing the second insulating layer NL21 around the second vertical hole H20 of the second structure S30. A portion of the second insulating layer NL21 may be selectively recessed (etched) by using a wet etching process using a wet etchant having etching selectivity. Since the second insulating layer NL2 included in the second pattern extension portion PE2 has a relatively small line width, all portions of the second insulating layer NL21 included in the second pattern extension portion PE2 may be removed. An upper surface of the first insulating layer NL11 and a lower surface of the buffer layer BF11 may be exposed by the second recess R2. When forming the second recess R2, the separation layer SL11 may also be slightly recessed.

Figure 50A:
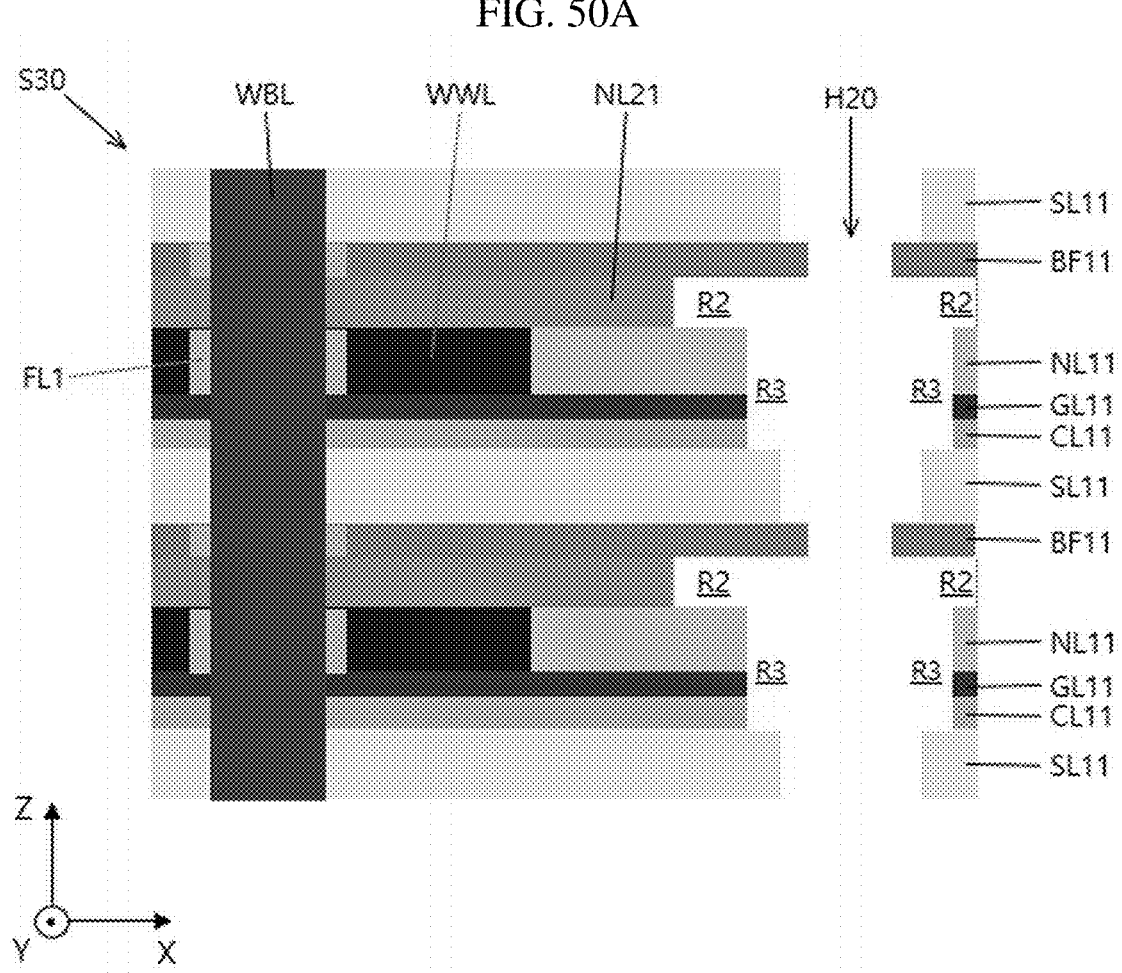
Figure 50B:
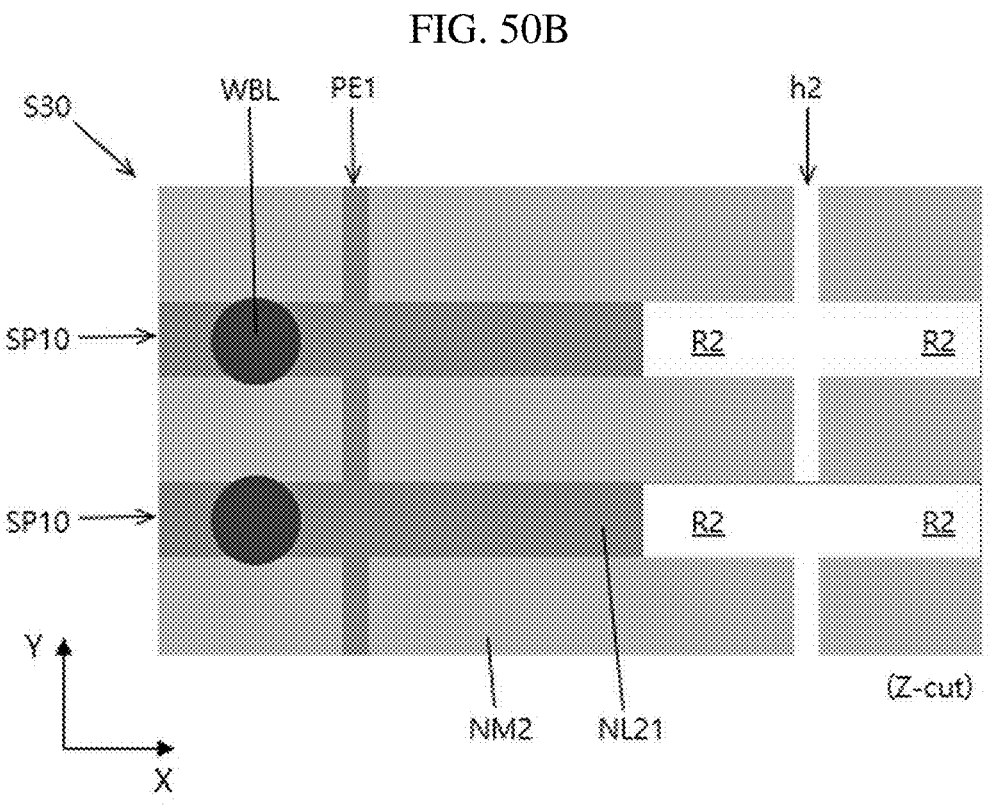
Figure 50C:
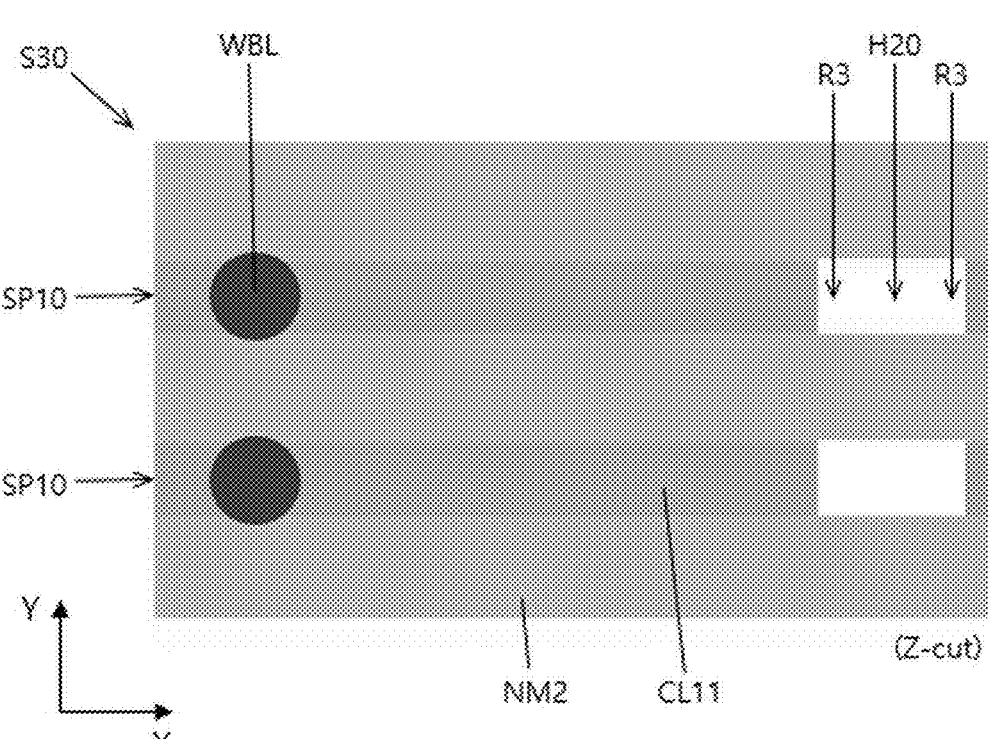

Referring to FIGS. 50A to 50C, a third recess R3 may be formed by recessing the first insulating layer NL11, the first gate insulating layer GL11, and the first channel material layer CL11 exposed by the second vertical hole H20. A recess depth of the third recesses R3 may be smaller than that of the second recess R2. Each of the first insulating layer NL11, the first gate insulating layer GL11, and the first channel material layer CL11 may be recessed by using etching selectivity of the wet etching process.

Figure 51A:
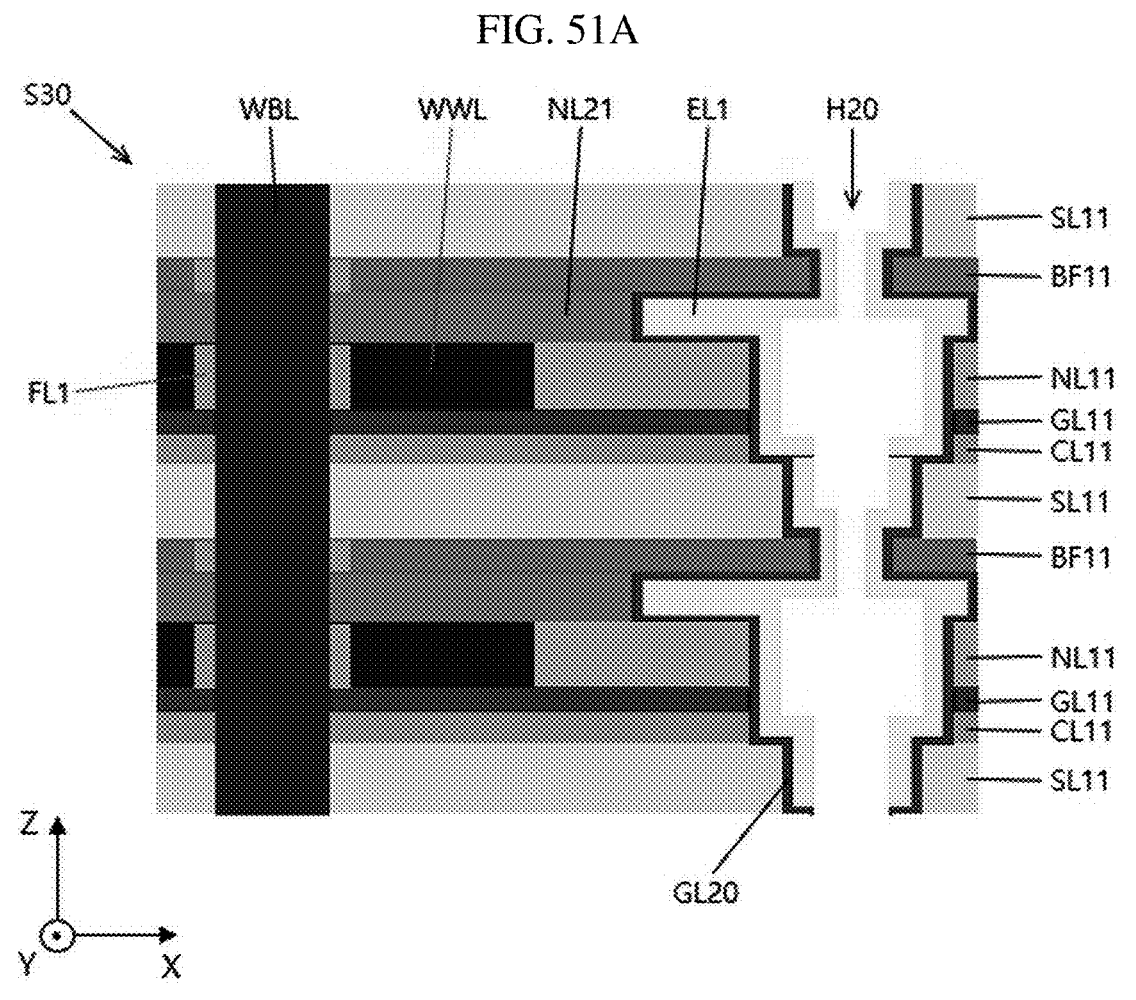
Figure 51B:
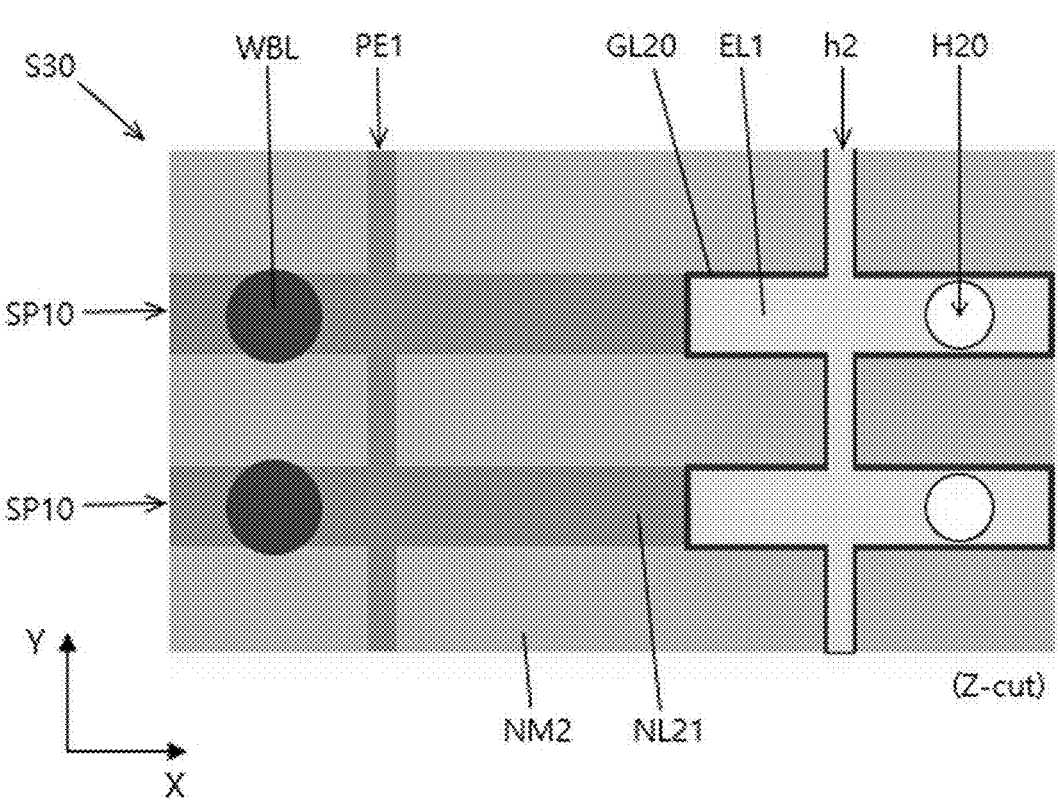
Figure 51C:
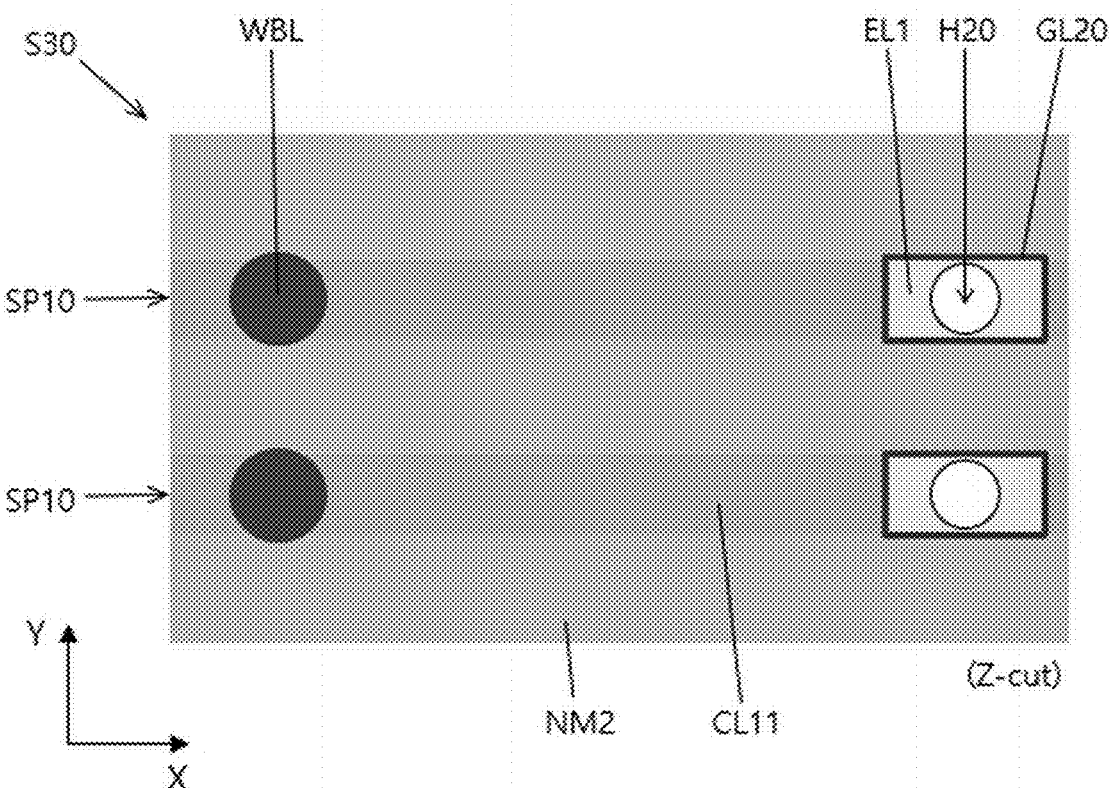

Referring to FIGS. 51A to 51C, a second gate insulating layer GL20 may be formed on the inner surface of the second vertical hole H20 including surfaces of the second and third recesses (R2 and R3 in FIG. 50A), and the inner surface of the second horizontal hole h2. The second gate insulating layer GL20 may be formed to include at least one of various insulating materials, and, as a non-limiting example, may be formed through an atomic layer deposition (ALD) process. The second gate insulating layer GL20 may be formed conformally according to the shape of the surface on which the second gate insulating layer GL20 is deposited.

Then, an electrode material layer EL1 to fill the second recess (R2 in FIG. 50A) and the second horizontal hole h2 may be formed on the second gate insulating layer GL20. The electrode material layer EL1 may be formed on the entire surface of the second gate insulating layer GL20 and may have a thickness to fill the second recess (R2 in FIG. 50A). The electrode material layer EL1 may be formed conformally according to the surface shape of the second gate insulating layer GL20. The second horizontal hole h2 may be filled with the material of the electrode material layer EL1.

Figure 52A:
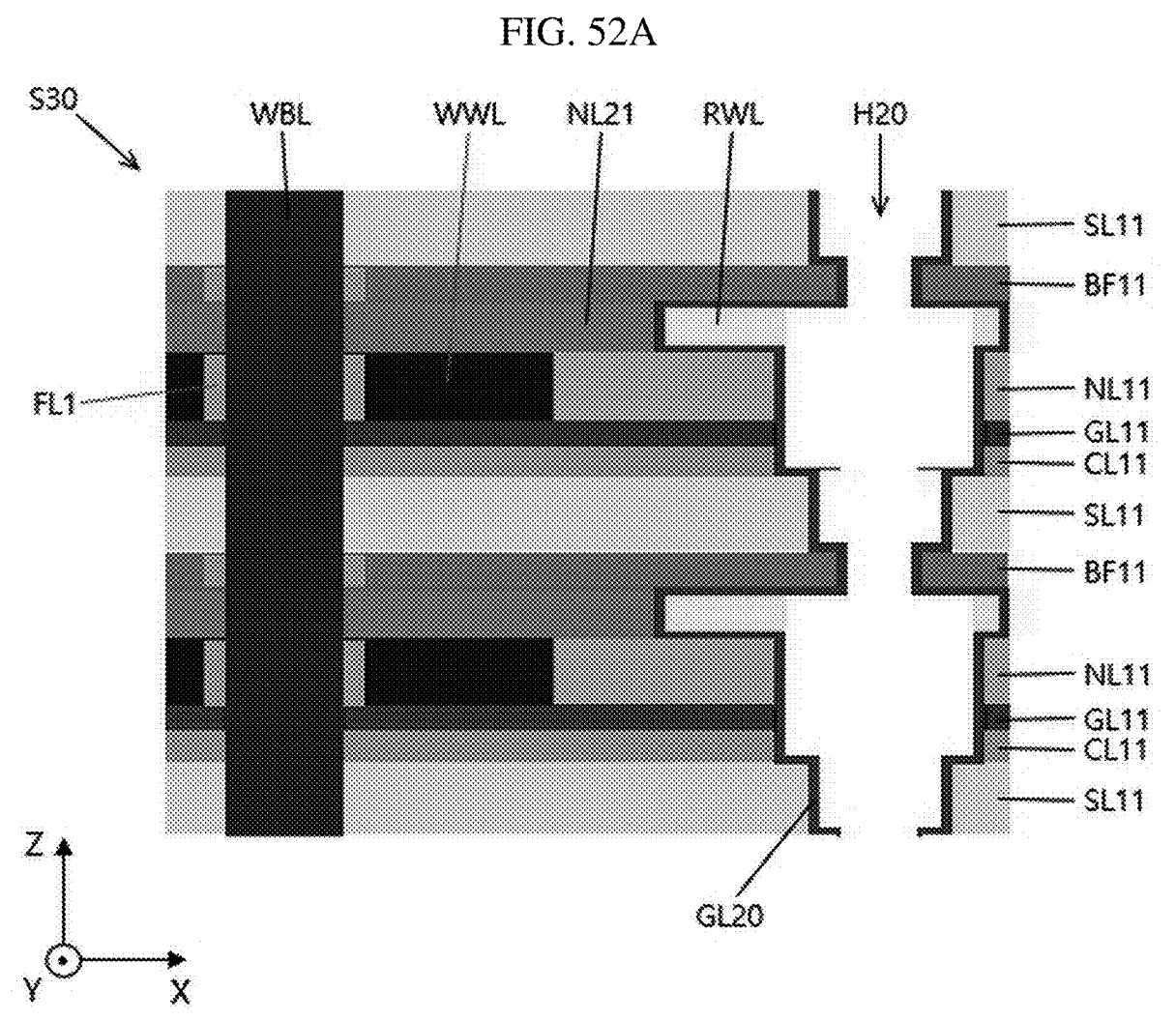
Figures 52B, 52C:
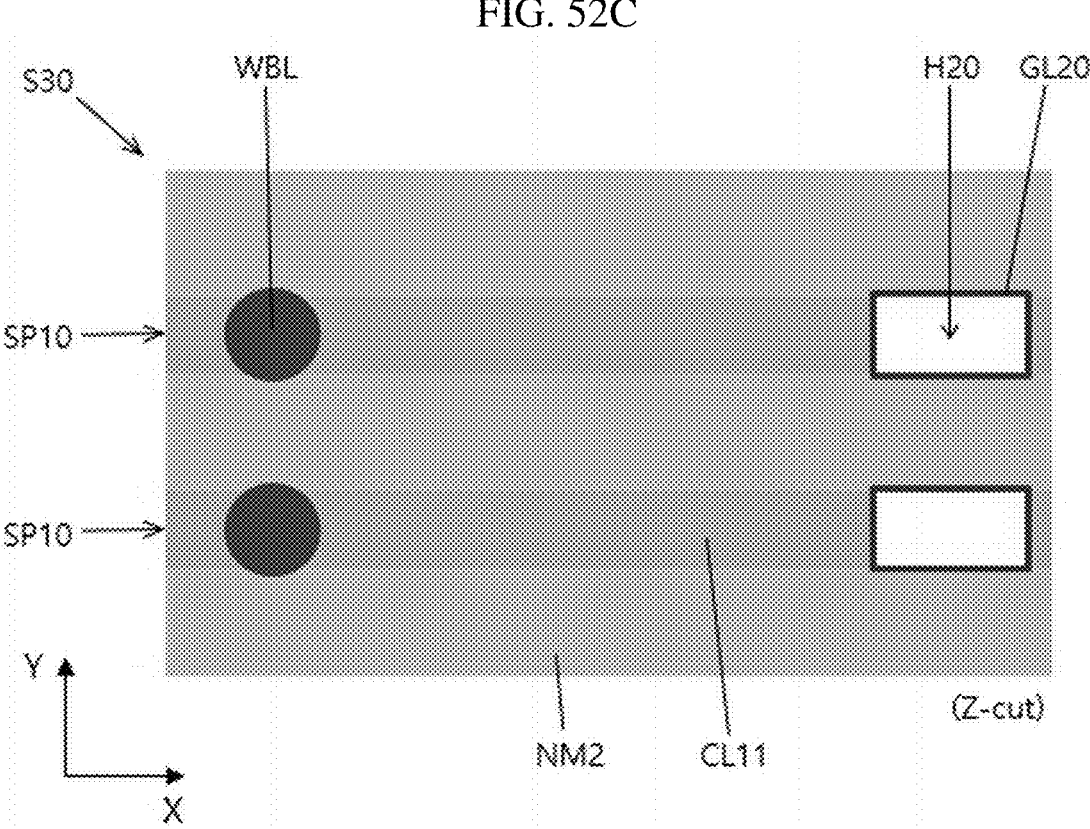

Referring to FIGS. 52A to 52C, a read word line RWL remaining in the second recess (R2 in FIG. 50A) and the second horizontal hole h2 may be formed from the electrode material layer (EL1 in FIG. 51A) by removing a remaining portion except for the portion disposed in the second recess (R2 in FIG. 50A) and the second horizontal hole h2 in the electrode material layer (EL1 in FIG. 51A). For example, the remaining portion may be removed while leaving only the read word line RWL provided in the second recess (R2 in FIG. 50A) and the second horizontal hole h2 by using a difference in dimension for each region of the electrode material layer (EL1 in FIG. 51A) through a wet etching process which may remove a metal or a metal compound. The read word line RWL may be a line member extending in the horizontal direction. The specific method of forming the read word line RWL is not limited to the method described in FIGS. 51A to 52C and may vary depending on the cases.

The read word line RWL separated from the electrode material layer (EL1 in FIG. 51A) may be formed. A plurality of read word lines RWL separated from the electrode material layer (EL1 in FIG. 51A) may be formed. Each of the read word lines RWL may have a line shape due to the portion filled in the second horizontal hole h2. The read word line RWL may be a source electrode line.

Figure 53A:
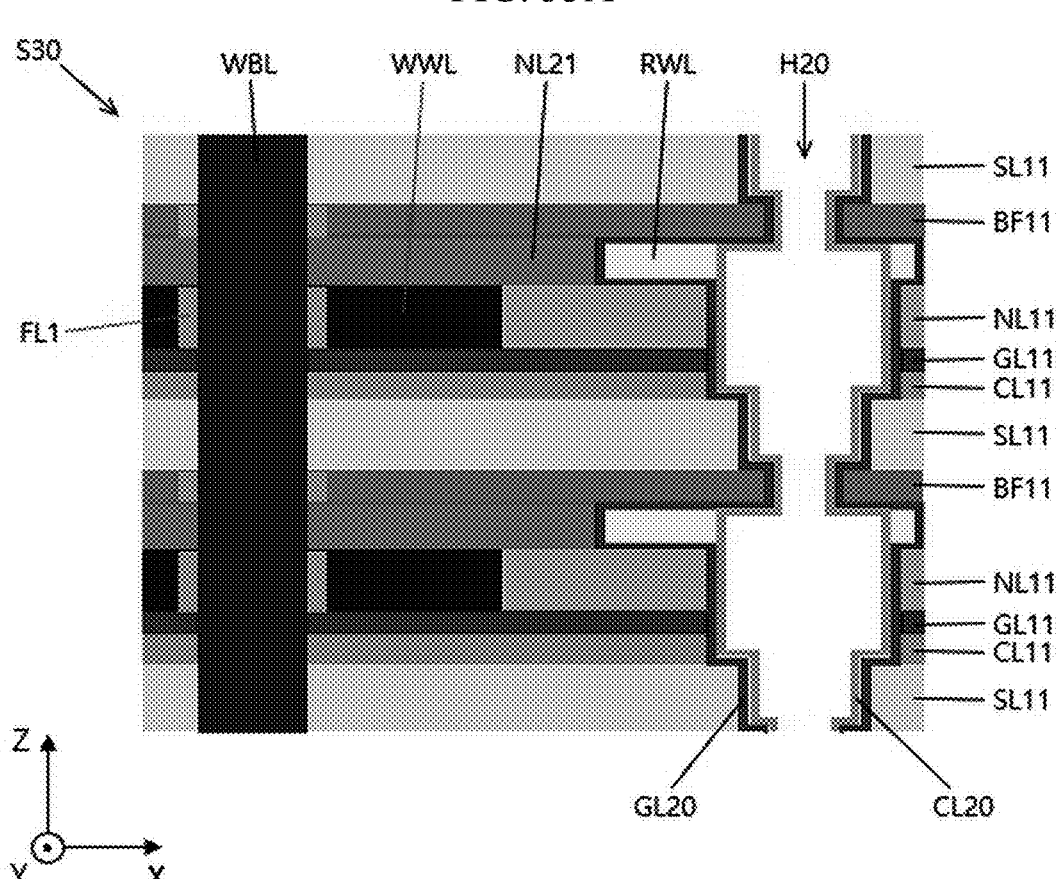
Figure 53B:
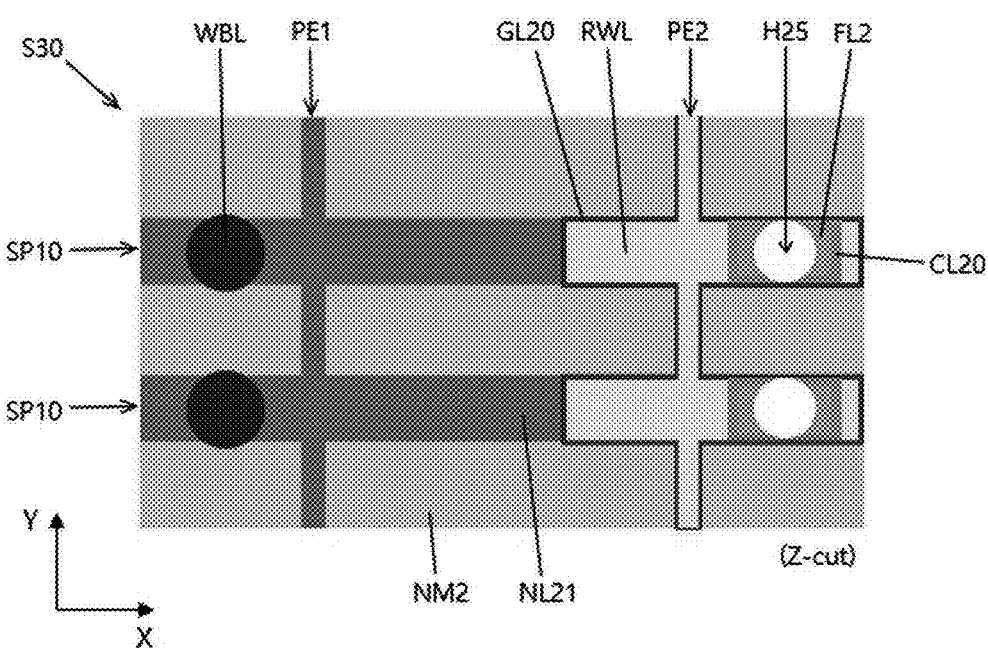
Figure 53C:
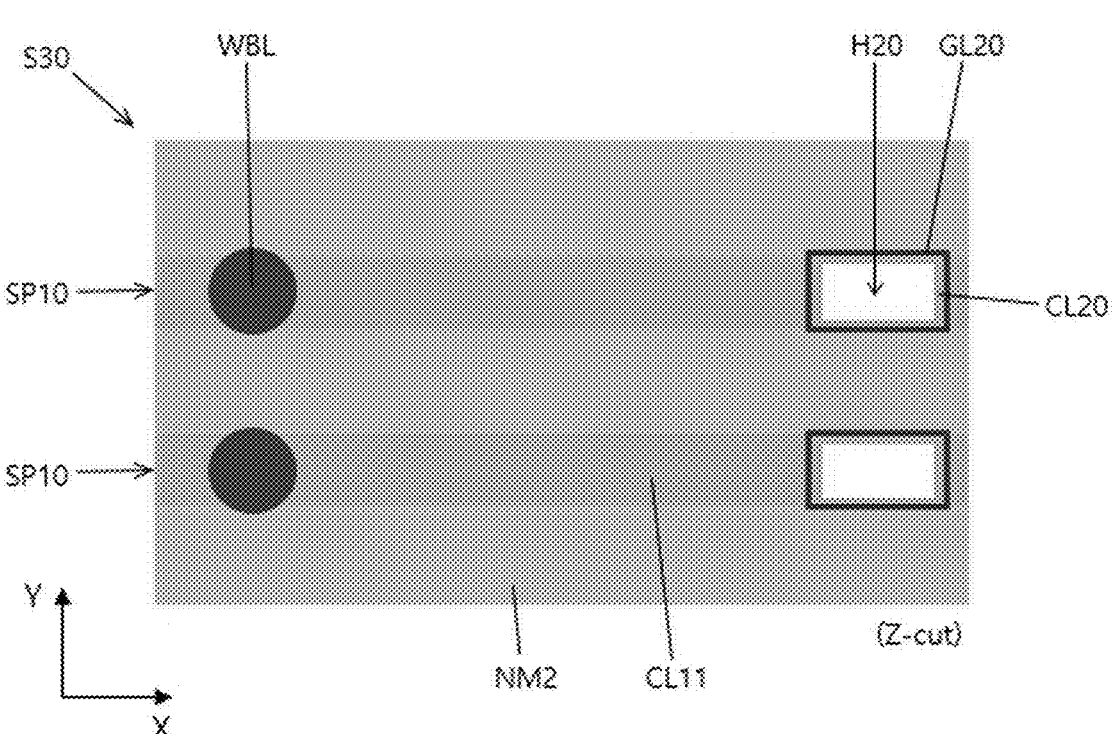

Referring to FIG. 53A to FIG. 53C, a second channel material layer CL20 may be formed on the second gate insulating layer GL20 and the read word line RWL exposed on the inner surface of the second vertical hole H20. As a non-limiting example, the second channel material layer CL20 may be formed through an ALD process. The second channel material layer CL20 may be formed conformally along the surface shapes of the second gate insulating layer GL20 and the read word line RWL.

Figure 54A:
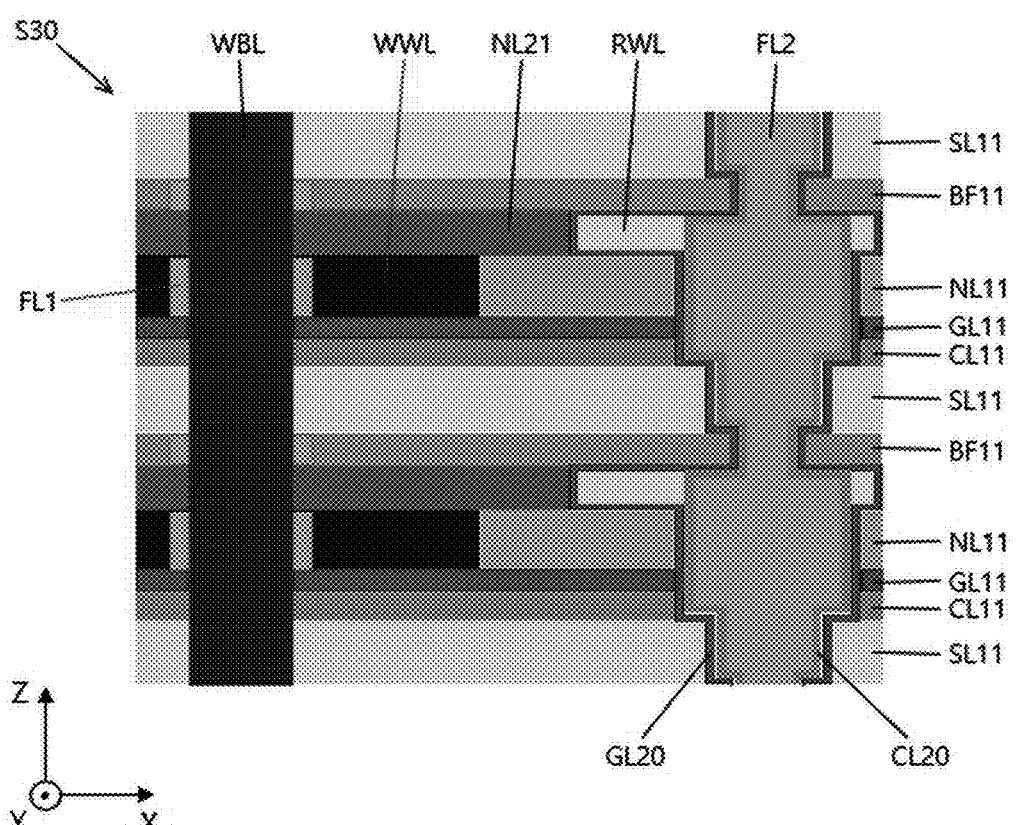
Figure 54B:
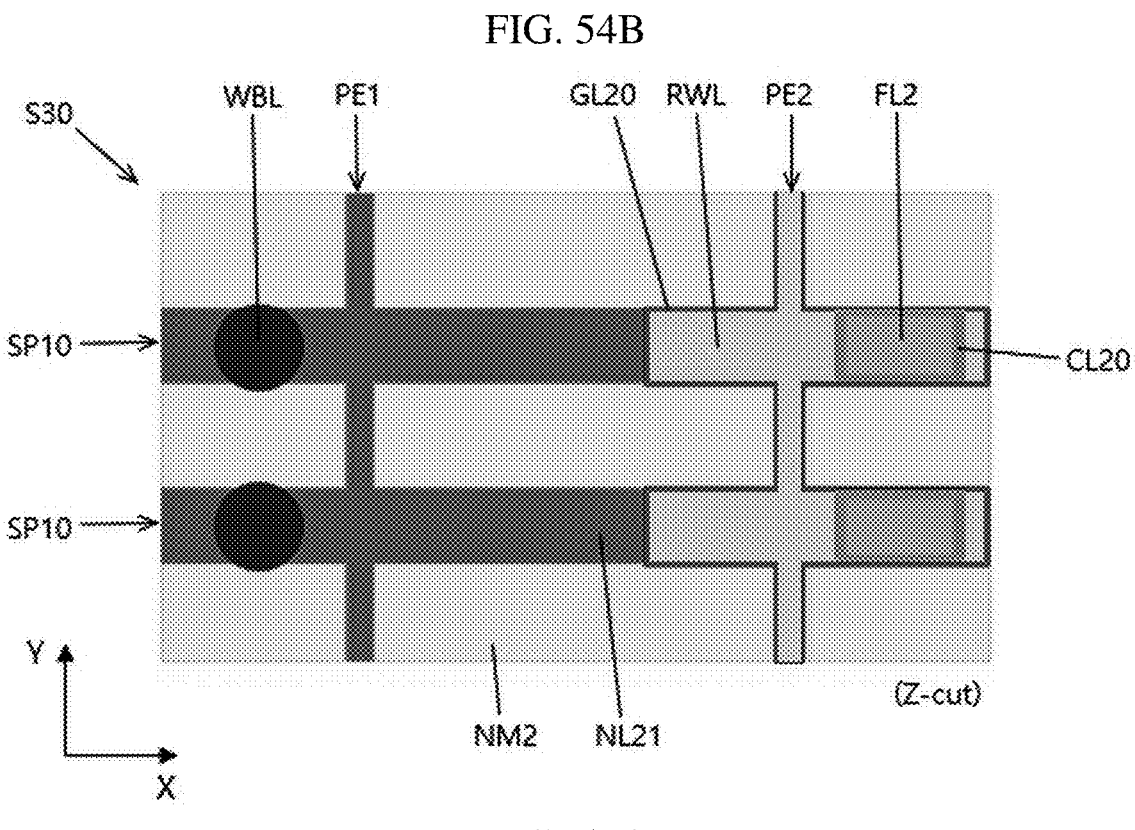
Figure 54C:
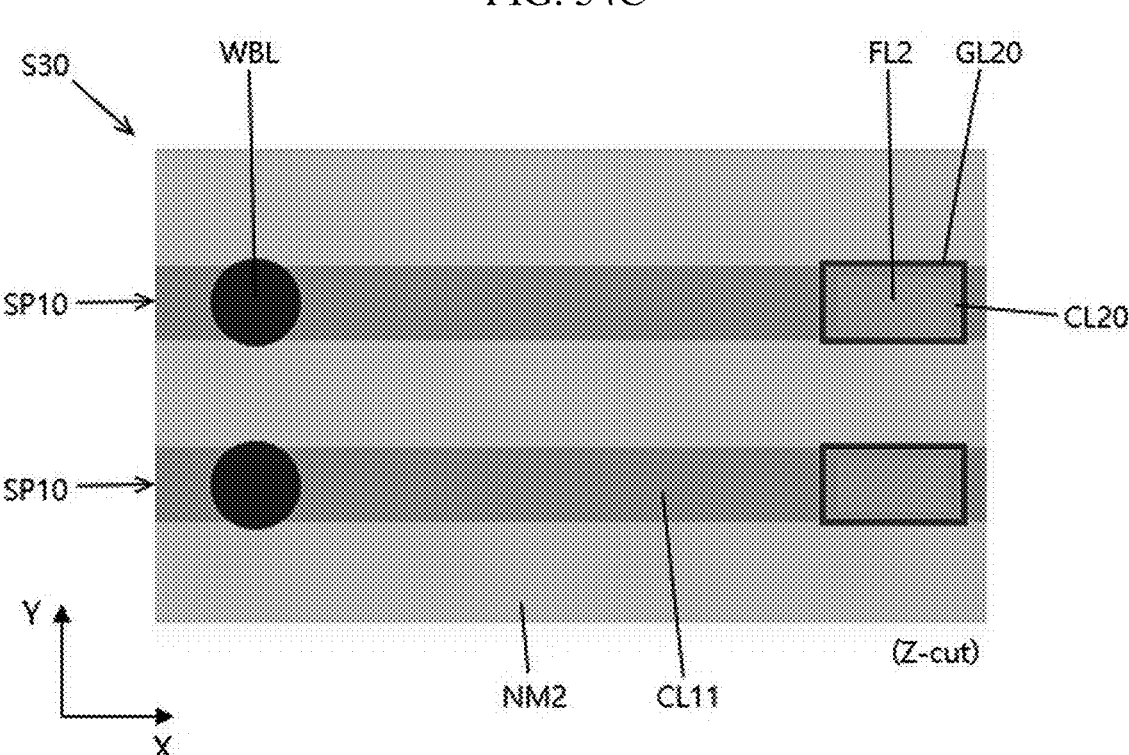

Referring to FIGS. 54A to 54C, a second filling insulation FL2 which fills the third recess (R3 in FIG. 50A), and the second vertical hole (H20 in FIG. 53A) may be formed on the second channel material layer CL20. As a non-limiting example, the second filling insulating layer FL2 may include a silicon oxide, or be formed of a silicon oxide, or be formed of another insulating material.

Figure 55A:
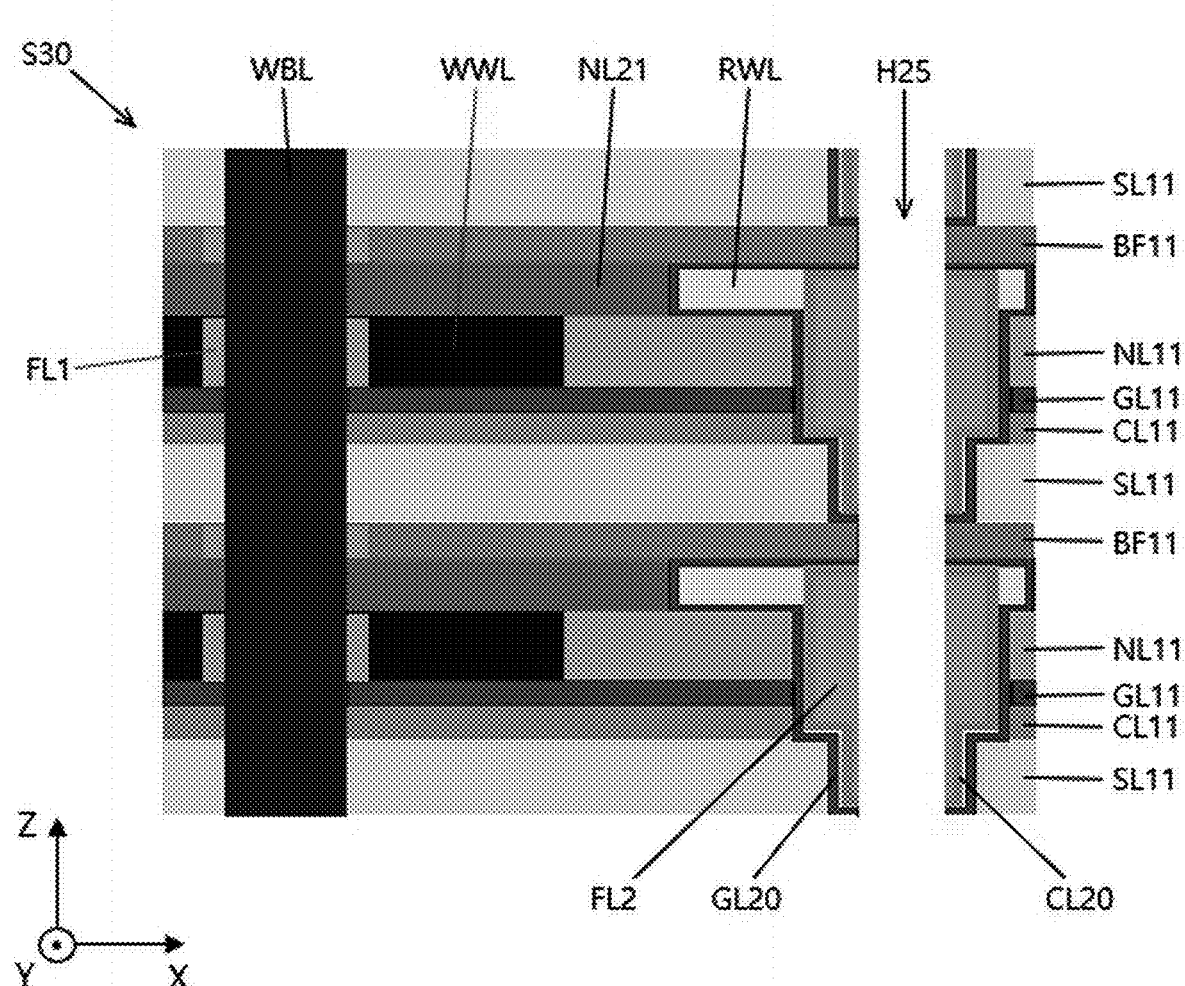
Figures 55B, 55C:
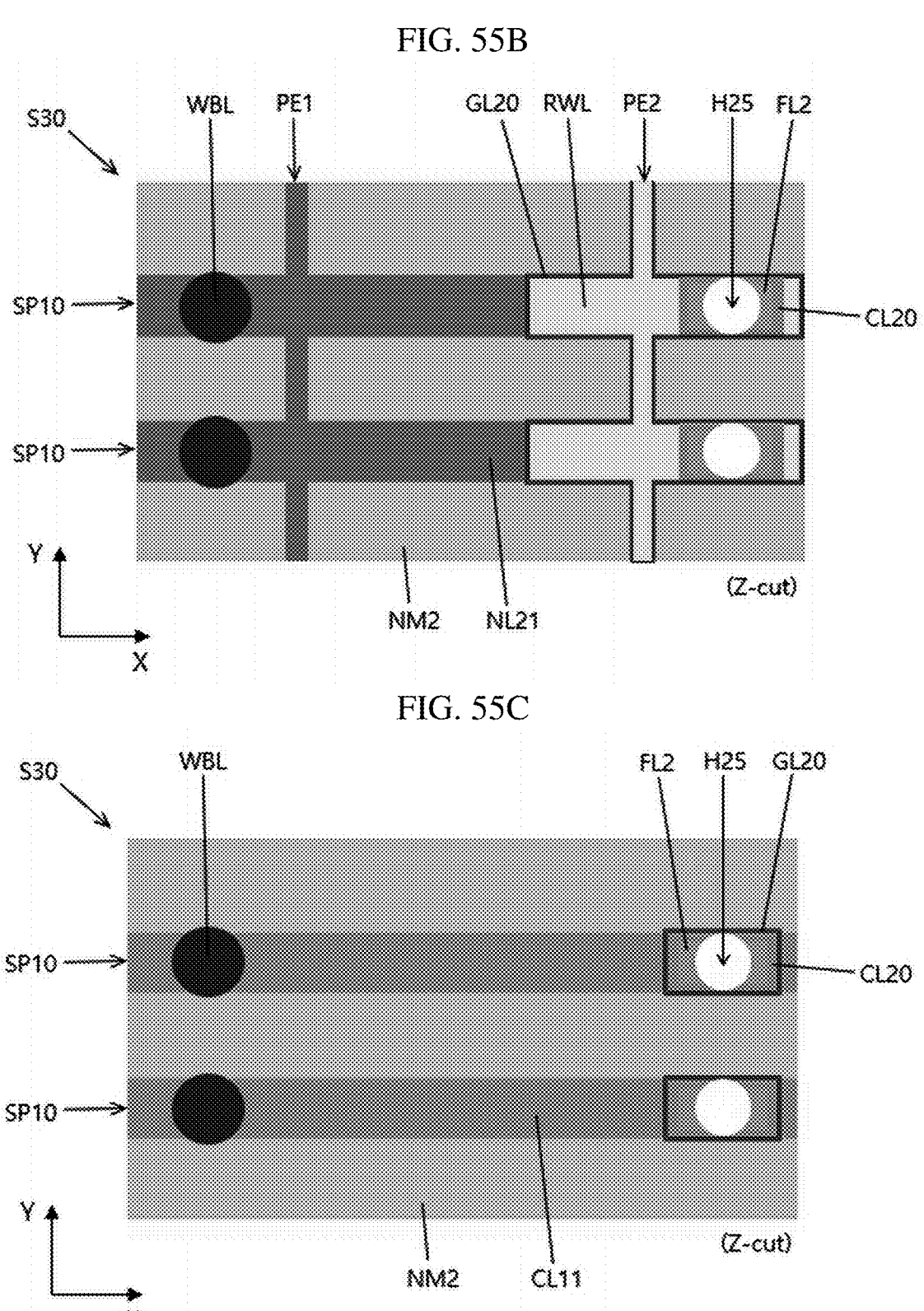

Referring to FIGS. 55A to 55C, a second through hole H25 may be formed at a position corresponding to the second vertical hole (H20 in FIG. 53A) of the second filling insulating layer FL2. The second through hole H25 may be formed through a dry etching process.

Figure 56A:
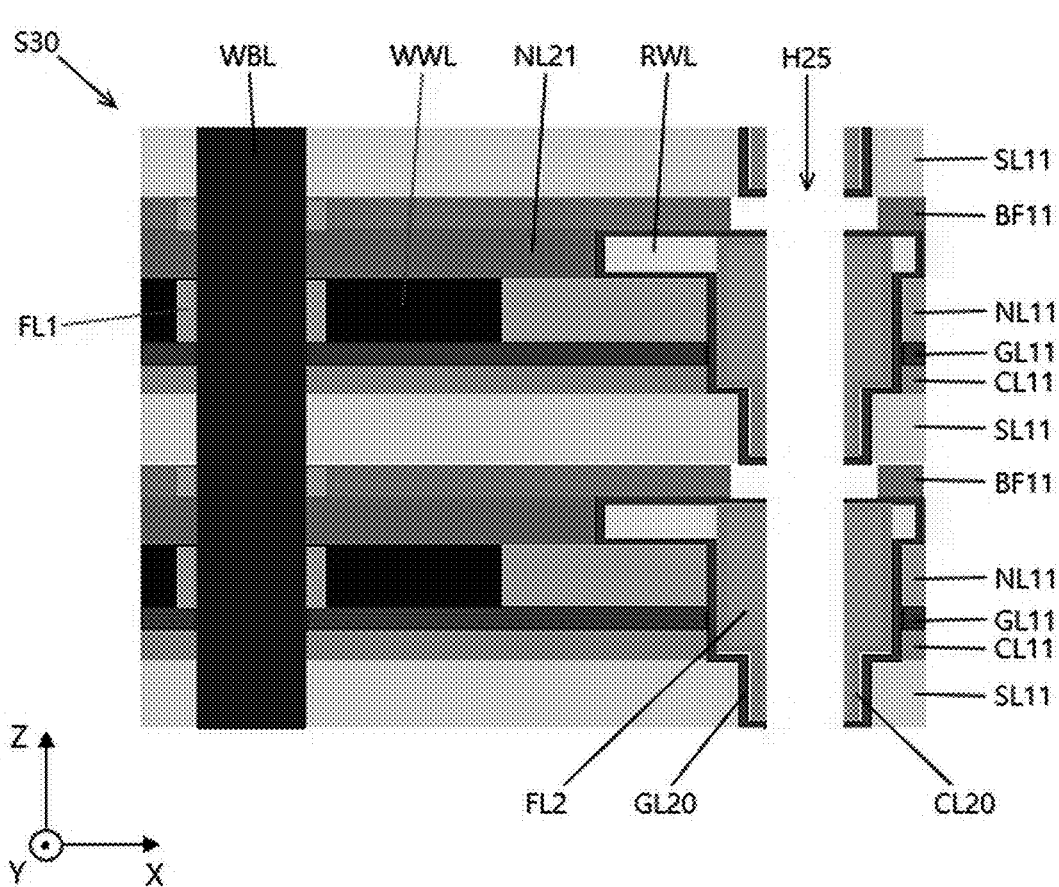
Figure 56B:
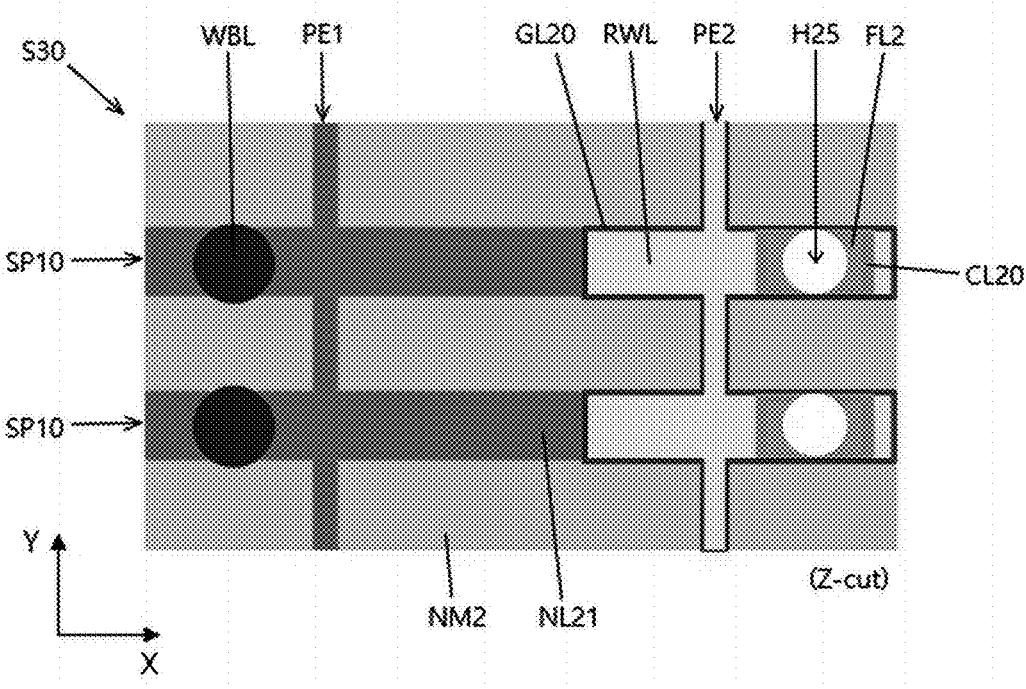
Figures 56C, 57A:
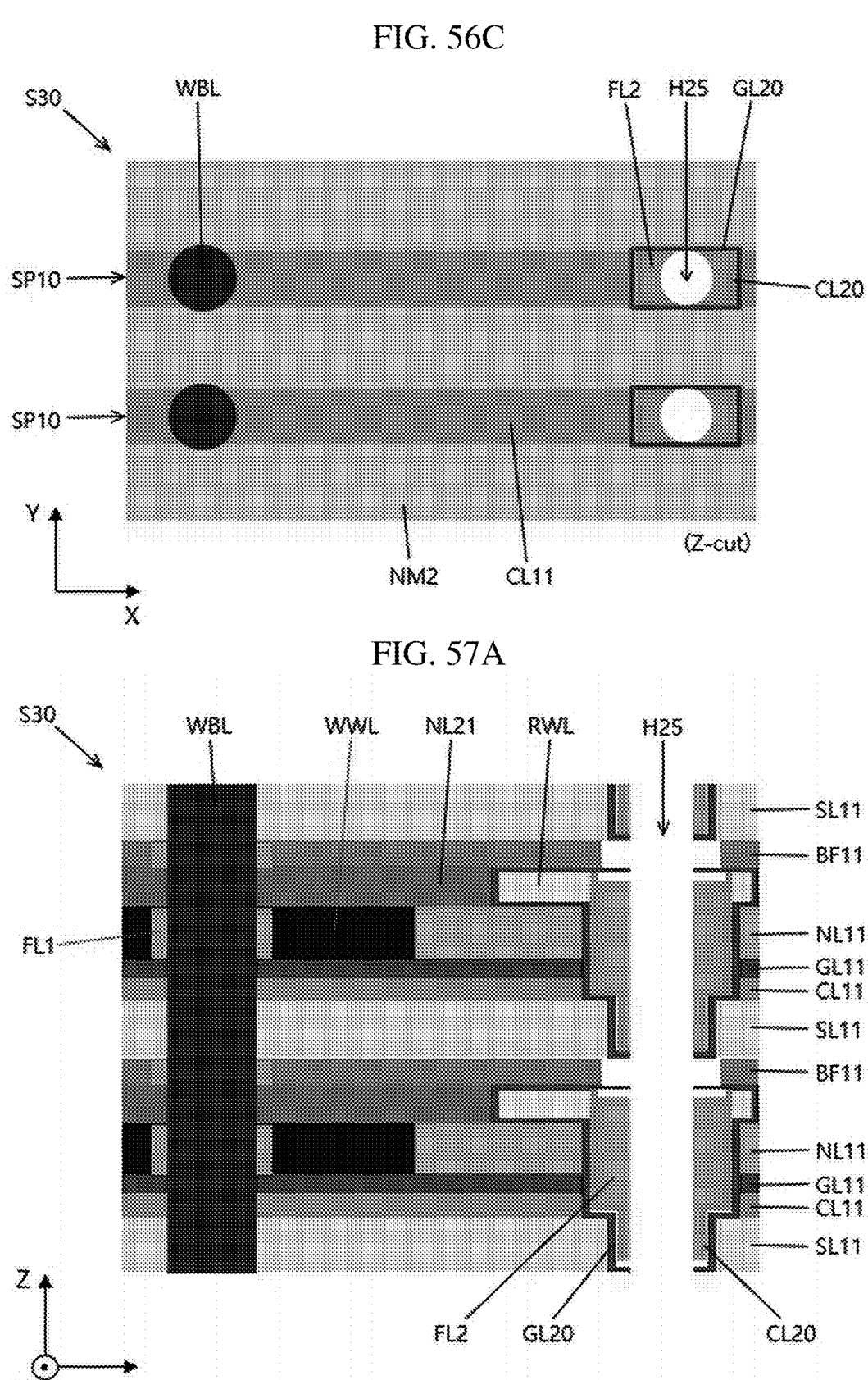

Referring to FIGS. 56A to 56C, a portion of the buffer layer BF11 exposed by the second through hole H25 may be recessed by using a wet etching method. This recess may be performed to electrically separate the buffer layer BF11 and a read bit line to be formed later in a region corresponding to the second vertical hole (H20 in FIG. 48A). However, depending on the material of the buffer layer BF11, the step for recessing a portion of the buffer layer BF11 may be omitted.

Figures 57B, 57C:
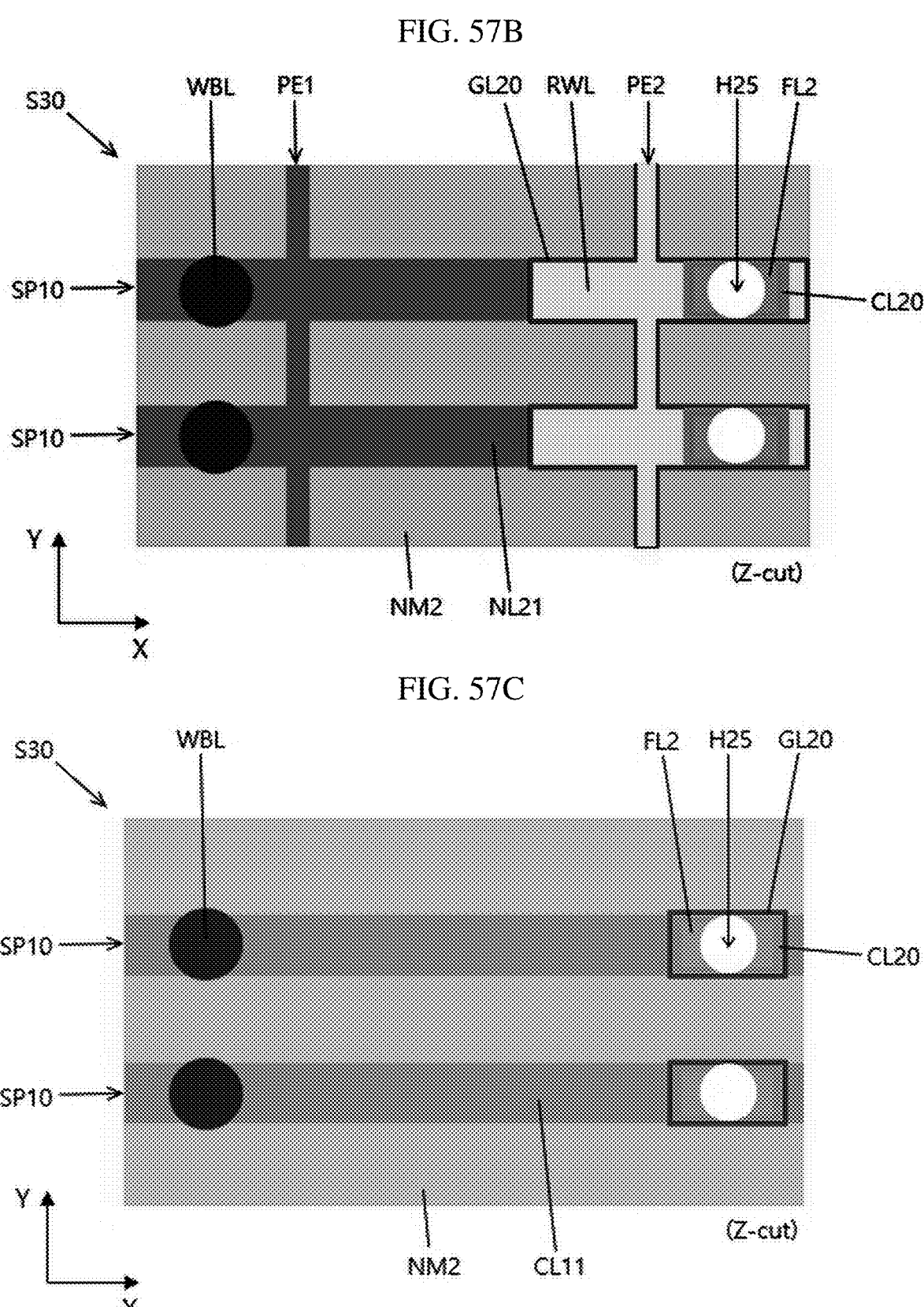

Referring to FIGS. 57A to 57C, a portion of the second channel material layer CL20 exposed by the second through hole H25 may be recessed using a wet etching method. This may be to prevent the read bit line to be formed later in the region corresponding to the second vertical hole (H20 in FIG. 48A) from contacting the second channel material layer CL20.

Figures 58A, 58B:
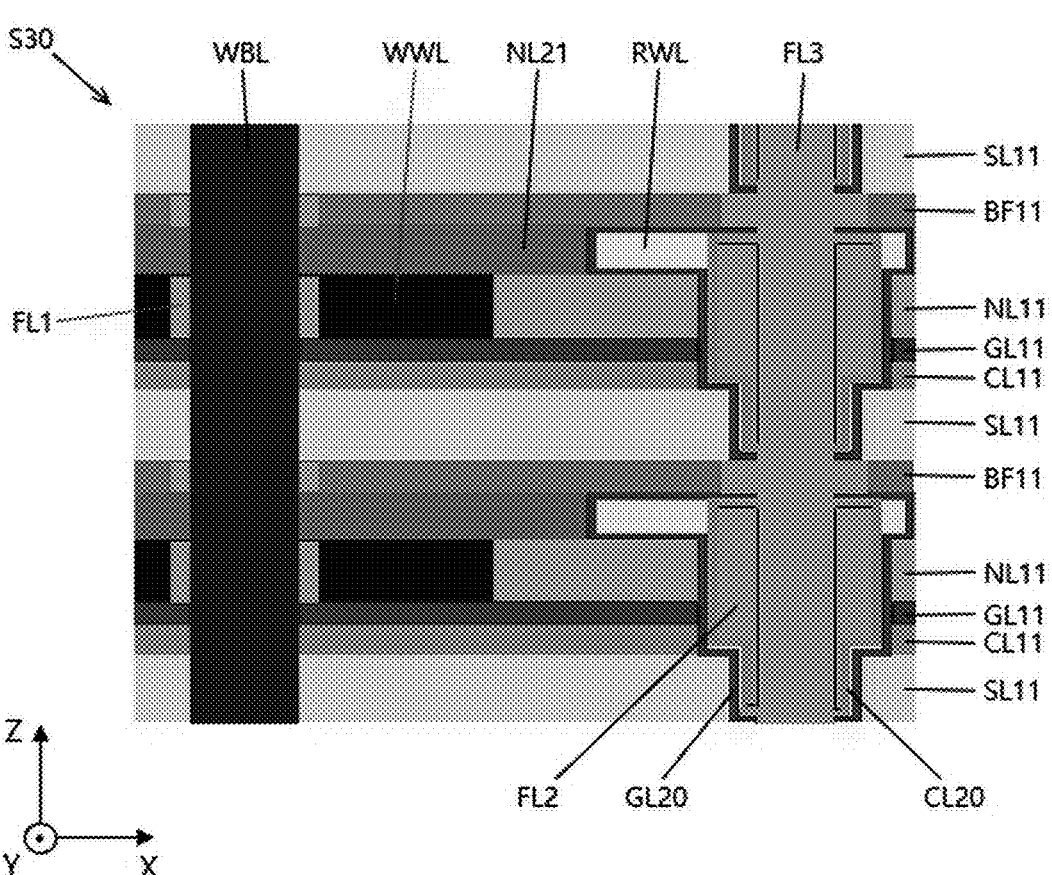
Figure 58C:
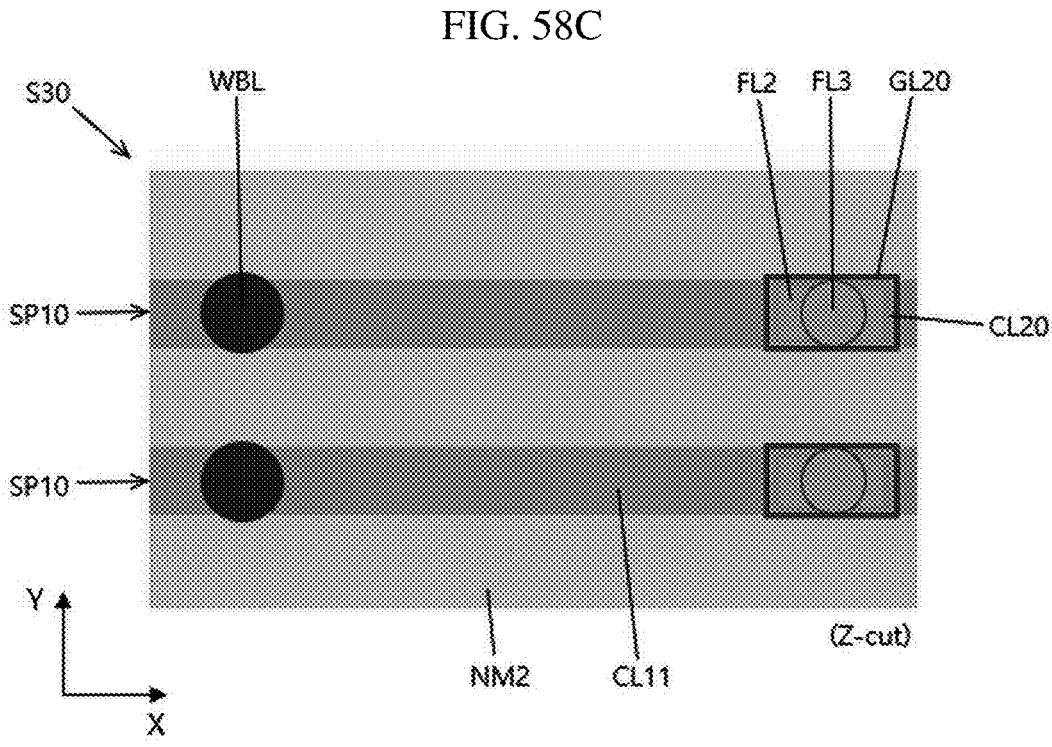

Referring to FIGS. 58A to 58C, a third filling insulating layer FL3 may be formed to fill the second through hole (H25 in FIG. 57A). As a non-limiting example, the third filling insulating layer FL3 may be formed of the same or similar material as the second filling insulating layer FL2. The third filling insulating layer FL3 may be formed to fill the empty space around the second through hole (H25 in FIG. 57A).

Figure 59A:
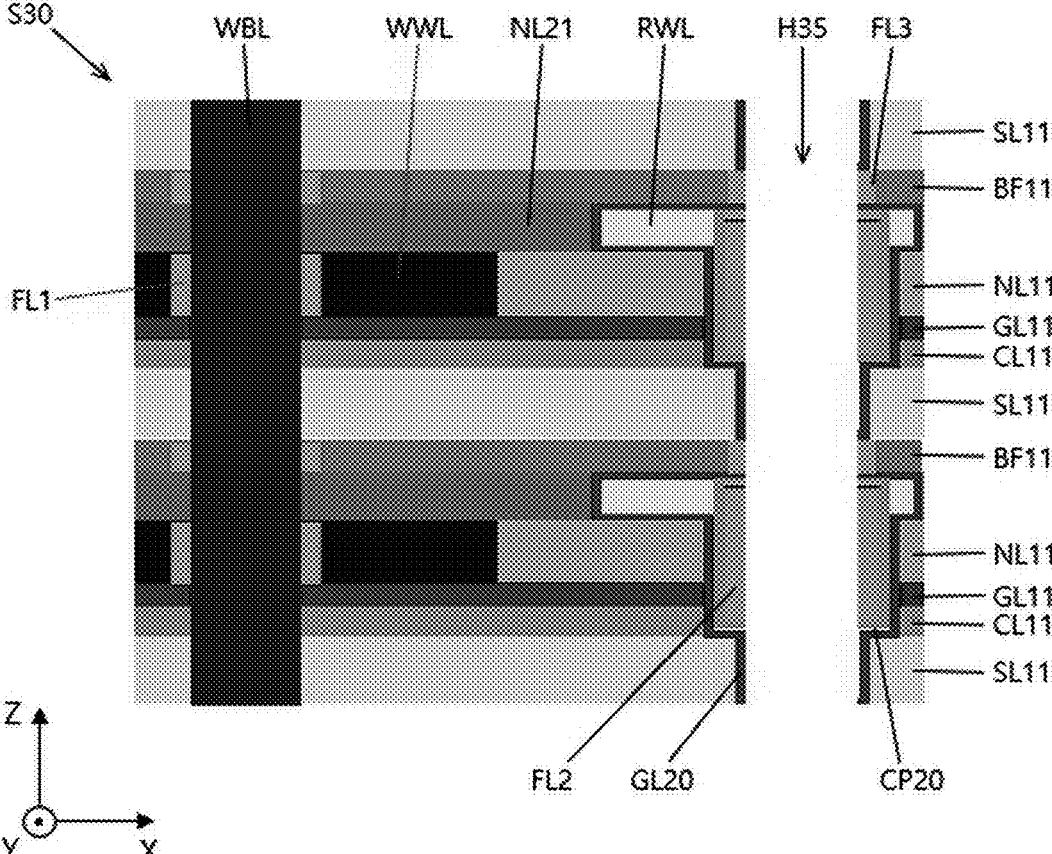
Figures 59B, 59C:
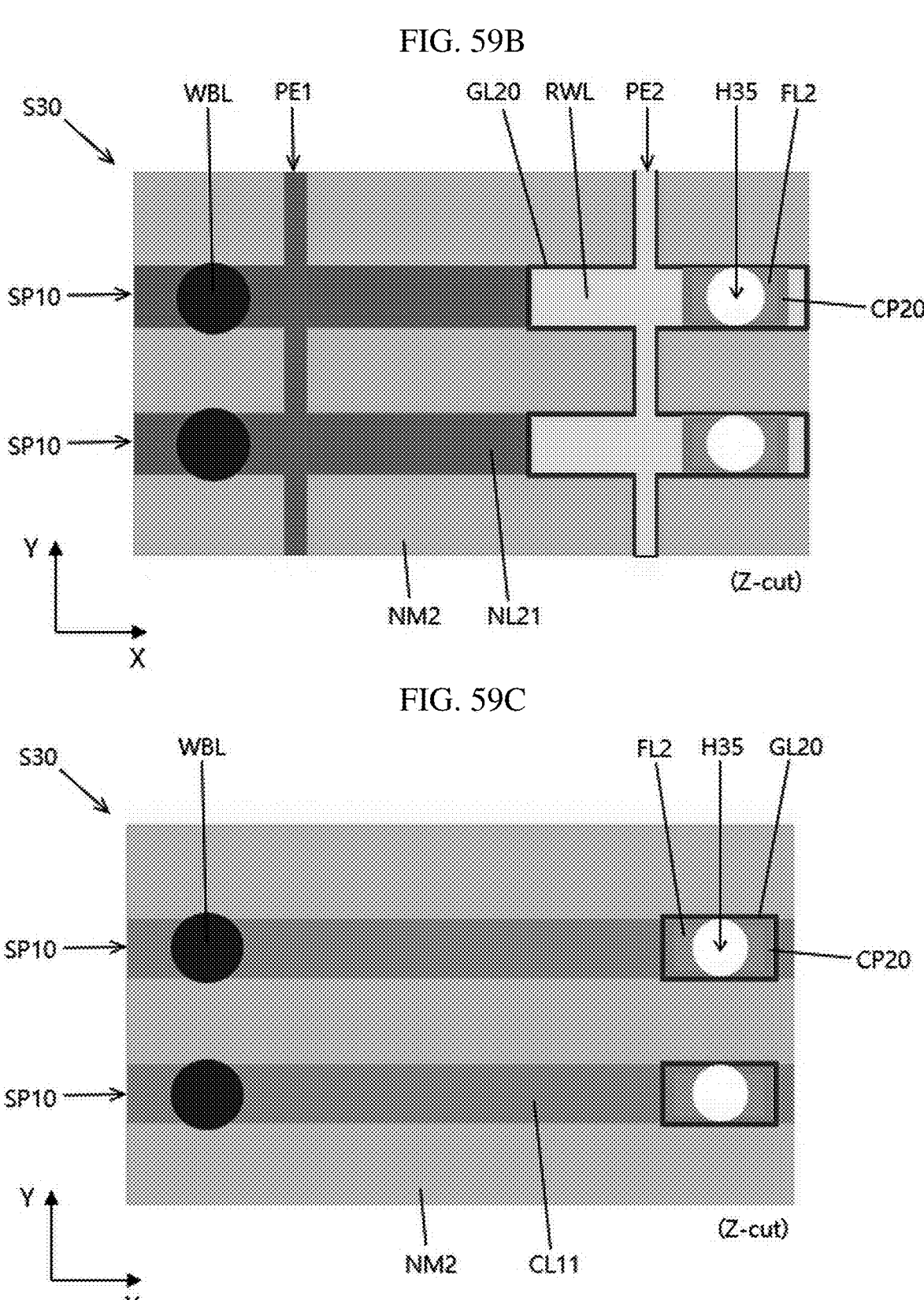

Referring to FIGS. 59A to 59C, a through hole H35 may be formed by etching the third filling insulating layer FL3 or the second and third filling insulating layers FL2, FL3 at a position corresponding to the second vertical hole (H20 in FIG. 48A) of the second structure S30. The third through hole H35 may be formed through a dry etching process.

In the process of forming the third through hole H35, a portion of the second channel material layer (CL20 in FIG. 58A) may be etched, and a second channel layer pattern CP20 may be defined from the second channel material layer (CL20 in FIG. 58A). As the second channel layer pattern CP20 is defined, a read transistor including the second channel layer pattern CP20 and the second gate insulating layer GL20 may be defined. In the embodiment of FIG. 59A, a lower read transistor structure and an upper read transistor structure may be defined. However, the method for defining the read transistor is only an example and may change in various ways.

Figure 60A:
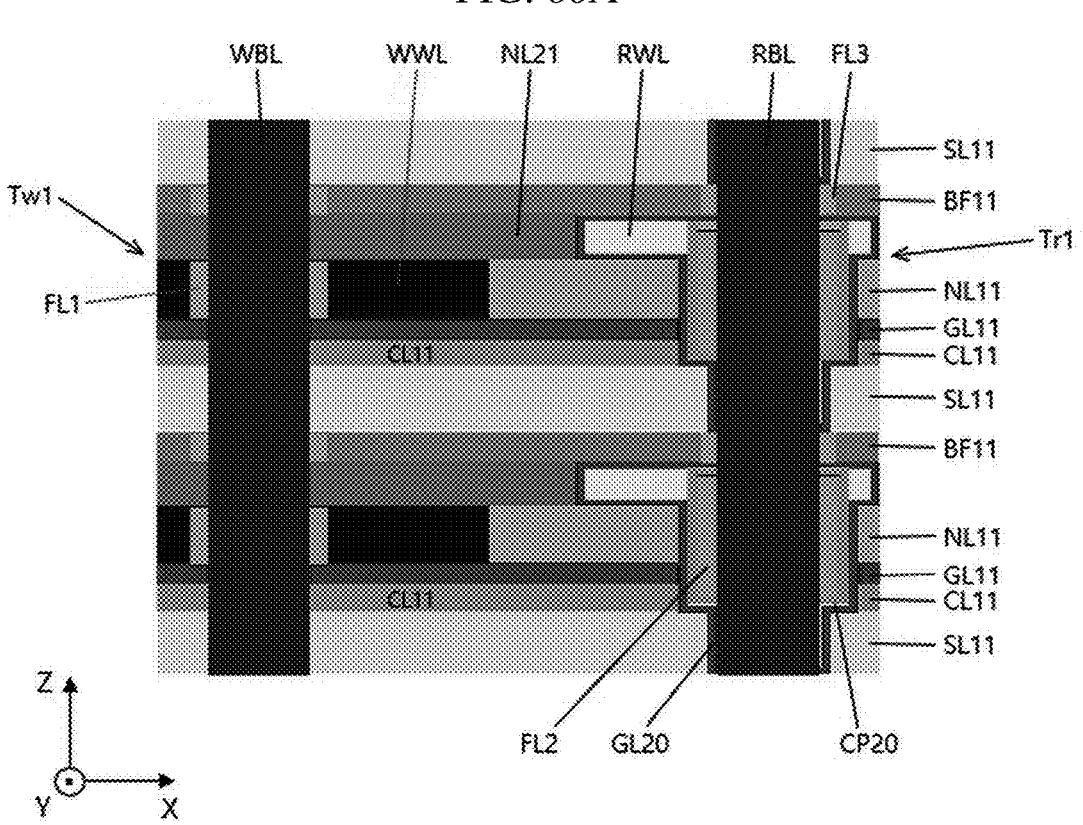
Figure 60B:
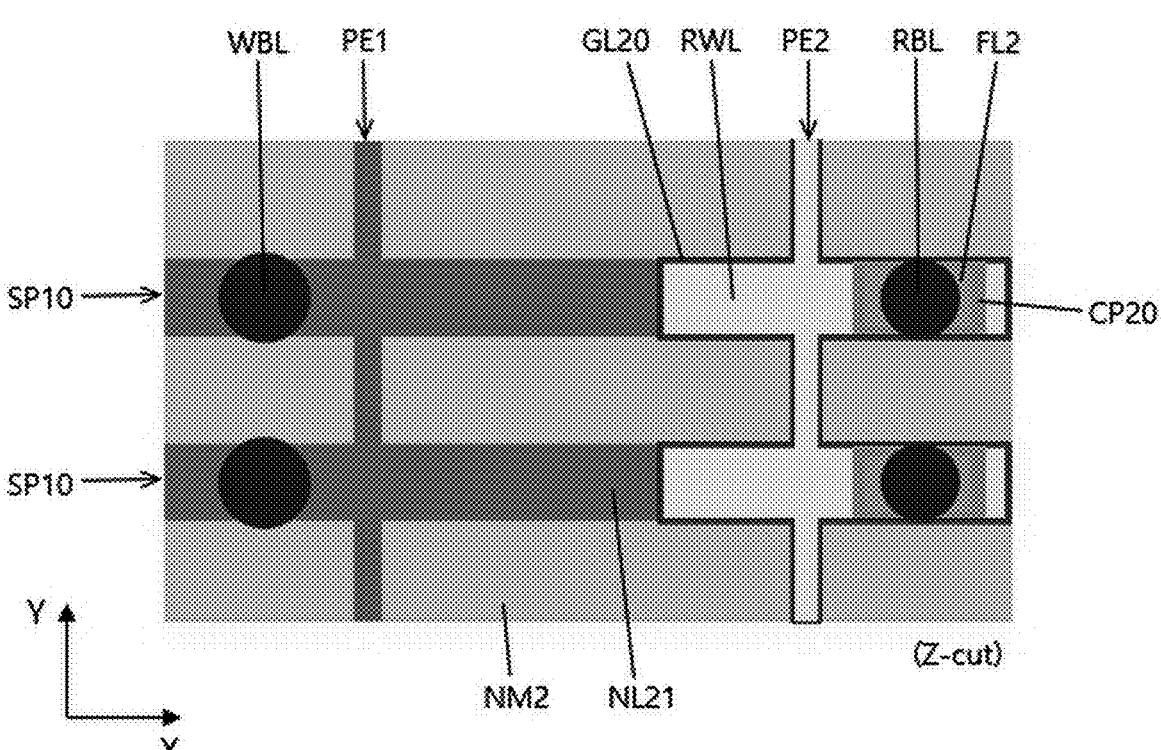
Figures 60C, 61:
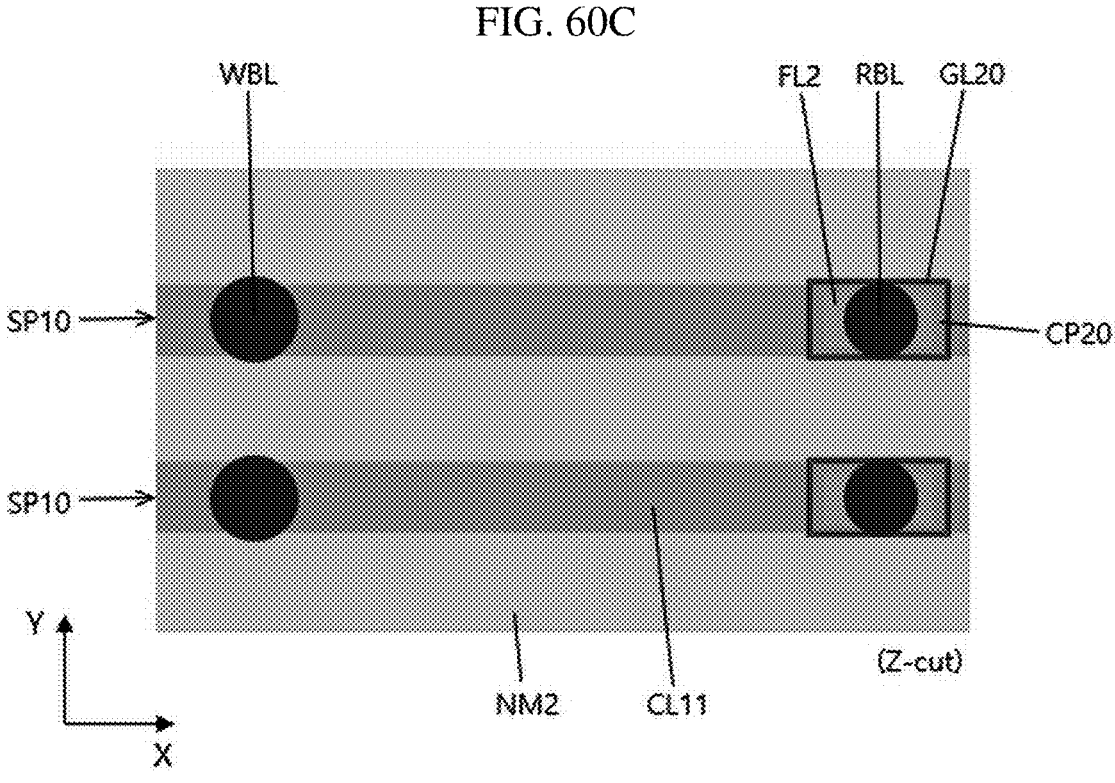

Referring to FIGS. 60A to 60C, a read bit line RBL may be formed in the third through hole (H35 in FIG. 59A). The read bit line RBL may include, for example, at least one of metal, a metal compound, and a conductive silicon. Accordingly, the read bit line RBL extending in the vertical direction may be formed at a position corresponding to (or approximately corresponding to) the second vertical hole (H20 in FIG. 48A). The method for forming the read bit line RBL is not limited to the above and may vary in various ways.

A capacitorless 3D DRAM device manufactured according to an embodiment may include a write transistor Tw1 and a read transistor Tr1 connected thereto. The write transistor Tw1 and the read transistor Tr1 connected thereto may form one memory cell. The first channel material layer CL11 of the write transistor Tw1 may be electrically connected to the read transistor Tr1. A portion of the first channel material layer CL11 may be used as a gate of the read transistor Tr1. Accordingly, the read transistor Tr1 may include a portion of the first channel material layer CL11 as a gate.

A plurality of memory cells may be stacked in a vertical direction, and the separation layer SL11 may be disposed between the plurality of memory cells. A plurality of write transistors Tw1 may be stacked vertically spaced apart from each other, and a plurality of read transistors Tr1 may be stacked vertically spaced apart from each other. The write bit line WBL may be commonly connected to a plurality of write transistors Tw1 spaced apart in the vertical direction, and the read bit line RBL may be commonly connected to a plurality of read transistors Tr1 spaced apart in the vertical direction.

A plurality of memory cell structures may be arranged to be spaced apart from each other in the horizontal direction and the vertical direction. In an actual manufacturing process, a much larger number of memory cell structures than those shown in FIGS. 60A to 60C may be arranged in the horizontal direction and the vertical direction.

According to an embodiment of the present invention, a portion of the first insulating layer NL11 may remain and disposed between the first channel material layer CL11 of the write transistor Tw1 and the read word line RWL connected to the read transistor Tr1. The portion of the first insulating layer NL11, that is, a pattern portion of the first insulating layer NL11, may be disposed between the first gate insulating layer GL11 and the second gate insulating layer GL20, in a region between the first channel material layer CL11 of the write transistor Tw1 and the read word line RWL connected to the read transistor Tr1. Accordingly, an effect to prevent coupling phenomenon between the first channel material layer CL11 and the read word line RWL may be obtained.

According to one embodiment of the present invention, the write word line WWL and the read word line RWL extending in the horizontal direction may be formed easily by forming a line-type extension portion across the cell separating film (filling material) using a layout. In other words, in the above-described embodiment, the write word line WWL and the read word line RWL extending in the horizontal direction may be easily formed by using the first and second pattern extension portions PE1 and PE2. Therefore, the manufacturing process may be simplified.

In an embodiment of the present invention, as the write bit line WBL and the read bit line RBL may extend in the vertical direction, and the write word line WWL and the read word line RWL may extend in the horizontal direction, a capacitorless 3D DRAM device with very high integration degree and data storage density and excellent performance may be easily manufactured. According to this embodiment of the present invention, highly integrated and high-capacity devices may be easily manufactured, and mass production is possible. According to one example, the three-dimensional stack-type DRAM device may be a 2T0C type DRAM device or may be configured to include it.

Figure 62:
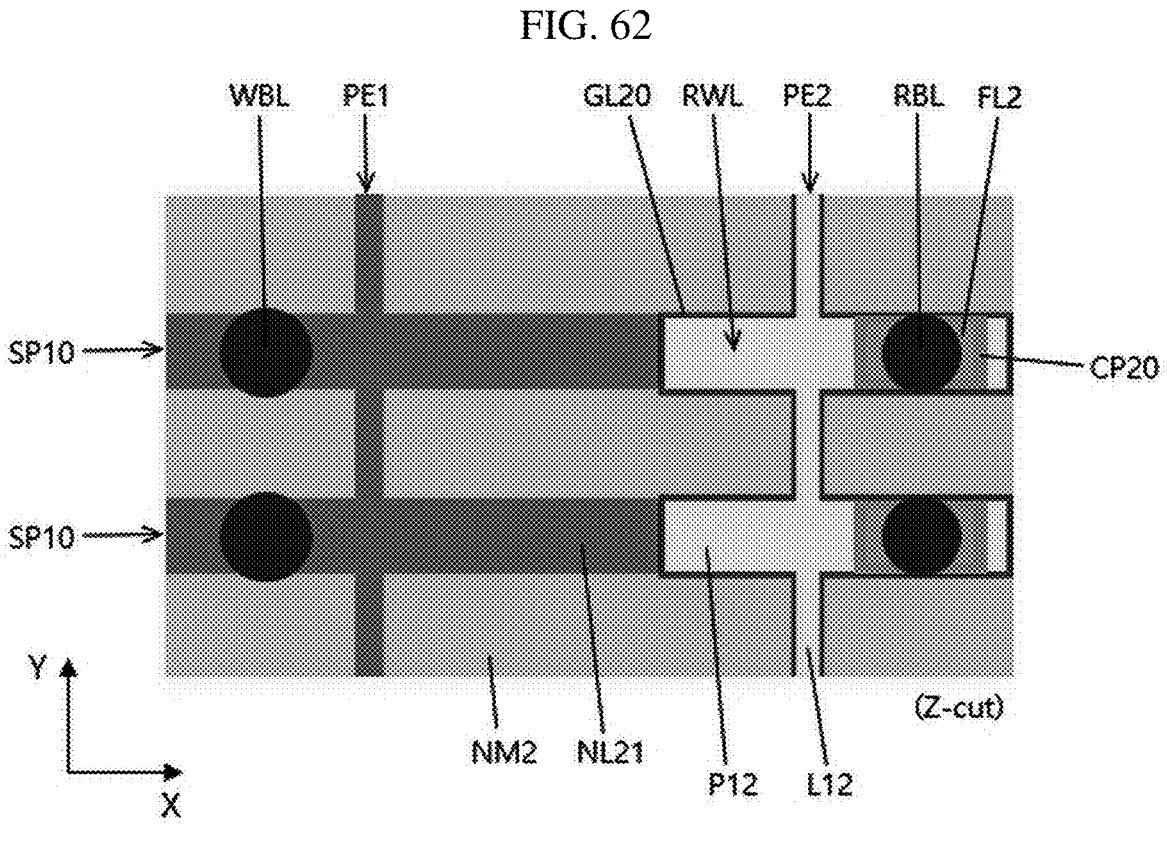
Figure 63:
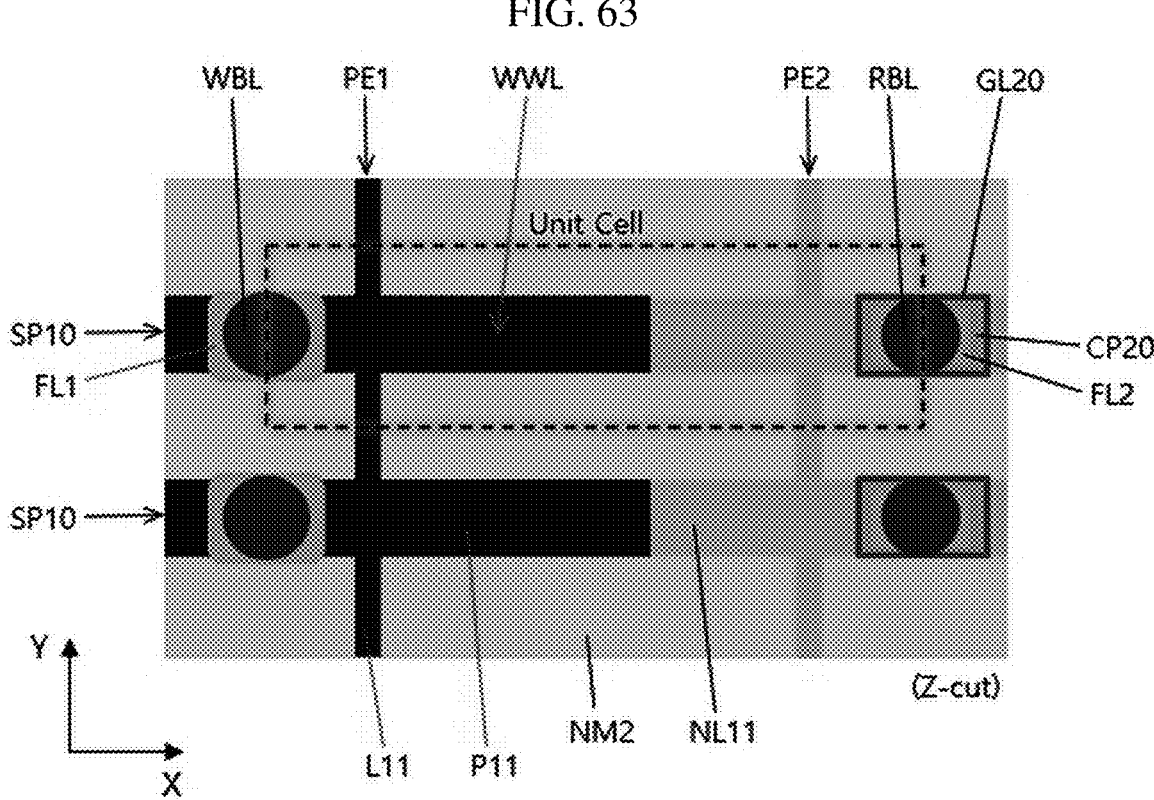
Figure 64:
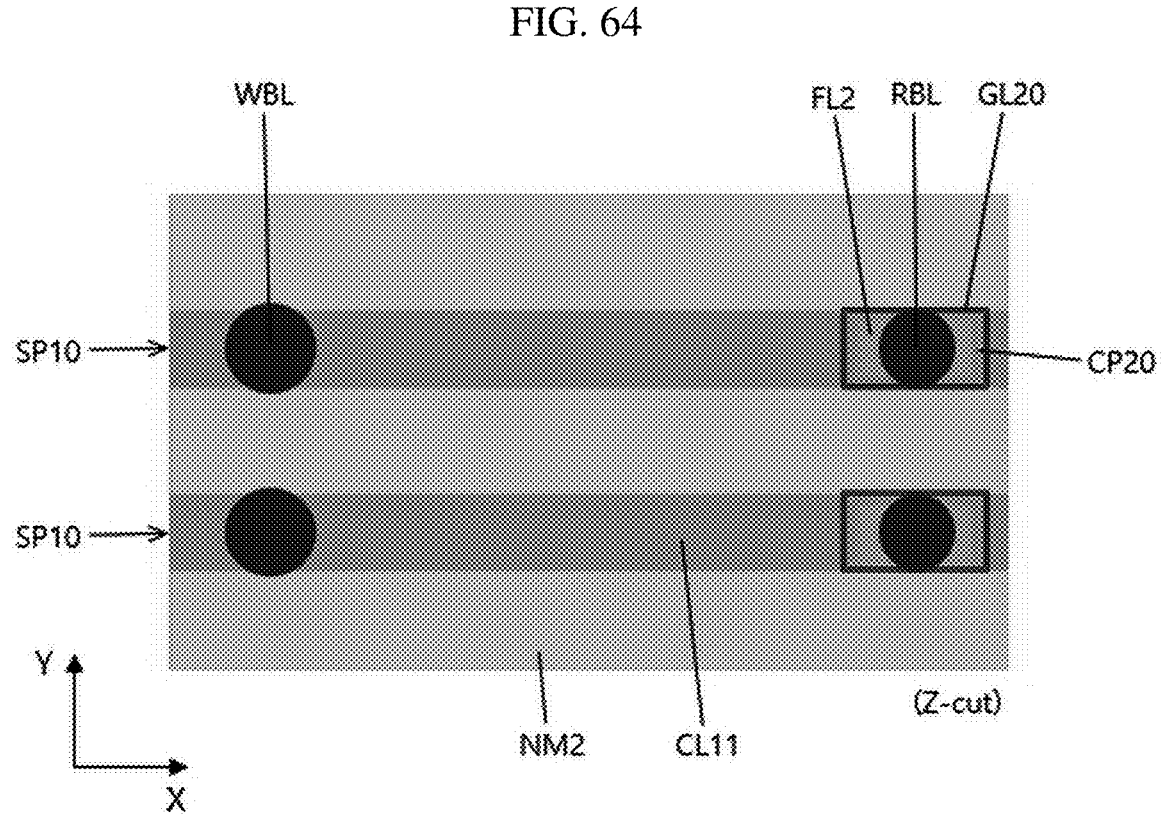

FIG. 61 to FIG. 64 are diagrams for explaining an example of a capacitorless 3D DRAM device according to an embodiment of the present invention. FIG. 61 is a cross-sectional view of the device cut along the XZ plane, and FIGS. 62 to 64 are cross-sectional diagrams (i.e., Z-cut view) of the device cut along the XY plane. FIG. 62 is a cross-sectional view cut in the XY plane at the level of the read word line RWL, FIG. 63 is a cross-sectional view cut in the XY plane at the level of the write word line WWL, FIG. 64 is a cross-sectional view cut in the XY plane at the level of the first channel material layer CL11. The capacitorless 3D DRAM device may be a 3D stack-type DRAM device having a gain cell structure. For example, the capacitorless 3D DRAM device may be a 3D DRAM device having a two transistor zero capacitor (2T0C) cell structure.

Referring to FIGS. 61 to 64, a capacitorless 3D DRAM device according to an embodiment of the present invention may include a plurality of memory cells arranged to be spaced apart from each other in the horizontal and vertical directions. The capacitorless 3D DRAM device may include a write bit line WBL extending in the vertical direction, a write word line WWL extending in the horizontal direction, and a write transistor Tw1 which is connected to a write bit line WBL and a write word line WWL, and which is defined to include a first channel material layer CL11, a first gate insulating layer GL11, and a portion of the write word line WWL. In addition, the capacitorless 3D DRAM device may include a read bit line RBL extending in the vertical direction, a read word line RWL extending in the horizontal direction, and a read transistor Tr1 which is connected to the read bit line RBL and the read word line RWL, and which is defined to include a second channel layer pattern CP20 and a second gate insulating layer GL20.

According to one embodiment, the write transistor Tw1 and the read transistor Tr1 connected thereto may constitute one memory cell, and the write word line WWL and the read word line RWL connected to the one memory cell may be disposed at different heights (levels). For example, the read word line RWL may be disposed at a higher position than the write word line WWL. The write word line WWL and the read word line RWL may not overlap laterally when observed from a side direction.

According to one embodiment, as shown in FIG. 63, the write word line WWL may include a line-type extension portion L11 extending as line shape in a direction (Y-axis direction in the drawing) orthogonal to the direction connecting the write transistor Tw1 and the read transistor Tr1, and a protruding-type expansion portion P11 which protrudes and expands from the line-type extension portion L11 in a direction (X-axis direction in the drawing) parallel to the direction connecting the write transistor Tw1 and the read transistor T1. The protruding-type expansion portion P11 may have a shape extended to both sides of the line-type extension portion L11. A plurality of protruding-type expansion portions P11 expanding from one line-type extension portion L11 may be disposed. The plurality of protruding-type expansion portions P11 may be arranged to be spaced apart from each other in the Y-axis direction. A write transistor Tw1 may be defined corresponding to each of the protruding-type expansion portion P11.

According to one embodiment, as shown in FIG. 62, the read word line RWL may include a line-type extension portion L12 extending as a line shape in a direction (Y-axis direction in the drawing) perpendicular to the direction connecting the write transistor Tw1 and the read transistor Tr1, and a protruding-type expansion portion P12 protrudes and expands from the line-type extension portion L12 in a direction parallel to the direction connecting the write transistor Tw1 and the read transistor Tr1 (X-axis direction in the drawing). The protruding-type expansion portion P12 may have a shape extended to both sides of the line-type extension portion L12. A plurality of protruding-type expansion portions P12 extending from one line-type extension portion L12 may be disposed. The plurality of protruding-type expansion portions P12 may be arranged to be spaced apart from each other in the Y-axis direction. A read transistor Tr1 corresponding to each of the protruding-type expansion portion P12 may be defined.

According to one embodiment, as shown in FIG. 61, a first insulating layer pattern NL11 may be disposed between a first gate insulating layer GL11 and the second gate insulating layer GL20, between the first channel material layer CL11 of the write transistor Tw1 and the read word line RWL connected to the read transistor Tr1. For example, the first insulating layer pattern NL11 may be in contact with a side surface of the write word line WWL and may be disposed at the same height as the write word line WWL. Accordingly, the effect to prevent coupling phenomenon between the first channel material layer CL11 and the read word line RWL may be obtained.

According to one embodiment, the second channel layer pattern CP20 has a first portion P1 connected to the read bit line RBL and extending in the horizontal direction, and a second portion P2 extending in a direction having a given angle with respect to the first portion P1. The first portion P1 of the second channel layer pattern CP20 may be in contact with the read bit line RBL, and the second portion P2 of the second channel layer pattern CP20 may extend in vertical direction of an edge region of the first portion P1, and may be configured to partially surround the read bit line RBL. According to one example, the second portion P2 may have a concave shape with respect to the read bit line RBL. The first portion P1 may have a horizontal plate structure, and the second portion P2 may have a vertical sidewall structure.

According to one embodiment, the read word line RWL may be arranged to surround a portion of an outer surface of the second portion P2 between the second gate insulating layer GL20 and the second channel layer pattern CP20.

According to one embodiment, the second gate insulating layer GL20 may be disposed between the first channel material layer CL21 and the second channel layer pattern CP20 and may have a structure surrounding the read word line RWL.

According to one embodiment, the write word line WWL may be disposed between the write bit line WBL and the read word line RWL, and the read word line RWL may be disposed between the write word line WWL and the read bit line RBL.

According to one embodiment, the first channel material layer CL11 of the write transistor Tw1 may be electrically connected to the read transistor Tr1. A portion of the first channel material layer CL11 may be used as a gate of the read transistor Tr1. Accordingly, the read transistor Tr1 includes a portion of the first channel material layer CL11 as a gate.

According to one embodiment, a plurality of write transistors Tw1 may be stacked in the vertical direction while being spaced apart from each other, and a plurality of read transistors Tr1 may be stacked in the vertical direction while being spaced apart from each other. The write bit line WBL may be commonly connected to a plurality of write transistors Tw1 spaced apart in the vertical direction, and the read bit line RBL may be commonly connected to a plurality of read transistors Tr1 spaced apart in the vertical direction.

According to one embodiment, at least one of the first channel material layer CL11 and the second channel layer pattern CP20 may include an oxide semiconductor. However, the material of the first channel material layer CL11 and the second channel layer pattern CP20 is not limited to the oxide semiconductor. In some cases, at least one of the first channel material layer CL11 and the second channel layer pattern CP20 may include a non-oxide semiconductor.

In addition, the structure of the capacitorless 3D DRAM device according to an embodiment of the present invention may have various structures and modified configurations as described with reference to FIGS. 38A to 60C.

In the capacitorless 3D DRAM device according to an embodiment of the present invention, the gate capacitance of each read transistor structure Tr1 may be used as a storage element (i.e., a storage node). The capacitorless 3D DRAM device may have various advantages that it has a long data retention time and only a plurality of transistors may constitute a cell without a capacitor.

Meanwhile, the area marked with a dotted box in FIG. 63 may correspond to a unit memory area, that is, a unit cell area. Each of the write bit line WBL and read bit line RBL may be shared with an adjacent unit memory area (a unit cell). Since a plurality of the unit memory areas may be easily stacked repeatedly in the vertical direction, a highly integrated and high-capacity device may be easily implemented.

According to the embodiments of the present invention described above, it is possible to implement a capacitorless 3D DRAM device which may significantly improve degree of integration three-dimensionally, secure excellent performance, and facilitate the manufacturing process. In particular, since the capacitorless 3D DRAM device according to an embodiment of the present invention has a structure in which the write bit line and the read bit line extend in the vertical direction, and the write word line and the read word line extend in the horizontal direction, it may be easy to manufacture a three-dimensional stacked structure in which the cells are connected in the vertical direction. According to this embodiment of the present invention, highly integrated and high-capacity devices may be easily manufactured, and mass production is possible. According to one example, the 3D DRAM device may be a 2T0C type DRAM device or may be configured to include it. In addition, according to an embodiment of the present invention, a line-type extension portion across a cell separator (filling material) may be formed by using a layout so that a write word line and a read word line extending in the horizontal direction may be easily formed. Furthermore, according to this embodiment of the present invention, highly integrated and high-capacity devices may be easily manufactured, and mass production is possible. According to one example, the 3D DRAM device may be a 2T0C type DRAM device or may be configured to include it. In addition, according to an embodiment of the present invention, the coupling phenomenon between a first channel material layer and a read word line may be prevented by disposing a first insulating layer pattern between the first channel material layer of a write transistor and the read word line connected to a read transistor.

In this specification, the preferred embodiments of the present invention have been disclosed, and although specific terms have been used, they are only used in a general sense to easily explain the technical content of the present invention and to help understanding the present invention, and they are not used to limit the scope of the present invention. It is obvious to those having ordinary skill in the related art to which the present invention belong that other modifications based on the technical idea of the present invention can be implemented in addition to the embodiments disclosed herein. It will be understood to those having ordinary skill in the related art that in connection with capacitorless three-dimensional DRAM devices and methods of manufacturing the same according to the embodiments described with reference to FIGS. 1A to 37 and 38A to 64, various substitutions, changes, and modifications may be made without departing from the technological spirit of the present invention. Therefore, the scope of the invention should not be determined by the described embodiments, but should be determined by the technological concepts described in the claims.

INDUSTRIAL APPLICABILITY

The embodiments of the present invention may be applied to semiconductor/electronic devices and manufacturing methods thereof. For example, the embodiments of the present invention may be applied to memory devices and manufacturing methods thereof.

The invention claimed is:

1. A manufacturing method of a capacitorless 3D DRAM device comprising:

forming a stack unit including a stack portion including an insulating material layer, and a first channel material layer, a first gate insulating layer, an intermediate layer, a buffer layer, a separation layer which are sequentially stacked on the insulating material layer;

forming a patterned stack having a plurality of pattern portions by patterning the stack unit, wherein the plurality of pattern portions extend in the first direction and are spaced apart from each other in a second direction orthogonal to the first direction;

forming a structure including the patterned stack and a filling material by filling the filling material between the plurality of pattern portions;

forming a first vertical hole penetrating through each of the plurality of pattern portions in a vertical direction in the structure;

forming a first recess exposing the first gate insulating layer and the buffer layer by recessing the intermediate layer and the filling material around the first vertical hole of the structure;

defining a write transistor including the first channel material layer, the first gate insulating layer, and a portion of a write word line by forming the write word line extending in a horizontal direction in the first recess;

forming a write bit line extending in a vertical direction at a position corresponding to the first vertical hole;

forming a second vertical hole penetrating through each of the plurality of pattern portions in a vertical direction in the structure;

forming a second recess exposing the first gate insulating layer and the buffer layer by recessing the intermediate layer and the filling material around the second vertical hole of the structure;

forming a third recess by recessing the first channel material layer and the first gate insulating layer exposed by the second vertical hole;

forming a second gate insulating layer on an inner surface of the second vertical hole including surfaces of the second and third recesses;

forming an electrode member filling an end region of the second recess on an area of the second gate insulating layer formed in the second recess;

forming a second channel material layer on the second gate insulating layer and the electrode member exposed on the inner surface of the second vertical hole;

defining a read transistor including a second channel layer pattern and the second gate insulating layer by defining a read word line extending in a horizontal direction from the electrode member and defining the second channel layer pattern from the second channel material layer by separating each of the electrode member and the second channel material layer; and forming a read bit line extending in a vertical direction at a position corresponding to the second vertical hole.

2. The manufacturing method of a capacitorless 3D DRAM device of claim 1, wherein the intermediate layer includes a silicon nitride, wherein the buffer layer includes a silicon, wherein the separation layer includes a silicon oxide.

3. The manufacturing method of a capacitorless 3D DRAM device of claim 1, wherein a plurality of first recesses are connected in the second direction in the forming the first recess.

4. The manufacturing method of a capacitorless 3D DRAM device of claim 1, wherein the defining the write transistor includes:

forming a write word line material layer inside the first recess and on an inner surface of the first vertical hole;

removing a portion formed on the inner surface of the first vertical hole from the write word line material layer; and forming a first filling insulating layer which fills the first vertical hole.

5. The manufacturing method of a capacitorless 3D DRAM device of claim 4, wherein the defining the write transistor further includes:

defining the write word line separated from the write word line material layer by forming a first etched portion crossing a central portion of the write word line material layer, and a central portion of the first filling insulating layer in the second direction; and forming a first gap fill insulating layer which fills the first etched portion.

6. The manufacturing method of a capacitorless 3D DRAM device of claim 5, wherein the forming the write bit line includes:

forming a first through hole by etching the first filling insulating layer and the first gap fill insulating layer at a position corresponding to the first vertical hole of the structure; and forming the write bit line in the first through hole.

7. The manufacturing method of a capacitorless 3D DRAM device of claim 1, wherein a plurality of second recesses are connected in the second direction in the forming the second recess.

8. The manufacturing method of a capacitorless 3D DRAM device of claim 1, wherein the forming the electrode member includes:

forming an electrode material layer filling the end region of the second recess on the second gate insulating layer; and removing a remaining portion of the electrode material layer except for a portion disposed at the end region of the second recess by using a wet etching method.

9. The manufacturing method of a capacitorless 3D DRAM device of claim 1, after the forming the second channel material layer, further comprising:

removing portions formed on side surfaces of the separation layer and the buffer layer from the second channel material layer and the second gate insulating layer formed on the inner surface of the second vertical hole;

forming a second filling insulating layer on the second channel material layer to fill the second and third recesses and the second vertical hole;

forming a second through hole at a position corresponding to the second vertical hole in the second filling insulating layer;

recessing the buffer layer, the second gate insulating layer, and the second channel material layer exposed by the second through hole;

removing a portion formed on a side surface of the insulating material layer from the second channel material layer by forming a third through hole having a larger size than that of the second through hole at a position corresponding to the second through hole; and forming a third filling insulating layer to fill the third through hole.

10. The manufacturing method of a capacitorless 3D DRAM device of claim 9, after the forming the third filling insulating layer, further comprising:

defining the read word line separated from the electrode member and the second channel layer pattern separated from the second channel material layer by forming a second etched portion crossing the central portion of the electrode member, the central portion of the second channel material layer, and central portions of the second and third filled insulating layers in the second direction; and forming a second gap fill insulating layer which fills the second etched portion.

11. The manufacturing method of a capacitorless 3D DRAM device of claim 10, wherein the forming the read bit line includes:

forming a fourth through hole by etching the third filling insulating layer and the second gap fill insulating layer at a position corresponding to the second vertical hole of the structure; and forming the read bit line in the fourth through hole.

12. The manufacturing method of a capacitorless 3D DRAM device of claim 1, wherein the stack portion is an upper stack portion, wherein the first channel material layer, the first gate insulating layer, the intermediate layer, the buffer layer, and the separation layer are an upper first channel material layer, an upper first gate insulating layer, and an upper intermediate layer, an upper buffer layer and an upper separation layer, respectively, wherein the stack unit further includes a lower stack portion disposed below the insulating material layer, wherein the lower stack portion includes a lower separation layer, a lower buffer layer, a lower intermediate layer, a lower first gate insulating layer, and a lower first channel material layer which are sequentially stacked from below.

13. The manufacturing method of a capacitorless 3D DRAM device of claim 1, wherein the write transistor is an upper write transistor, wherein the read transistor is an upper read transistor, wherein the upper write transistor and the upper read transistor constitute an upper memory cell.

14. The manufacturing method of a capacitorless 3D DRAM device of claim 13, wherein a lower memory cell having a structure in which the upper memory cell is upside down is formed under the insulating material layer, wherein the lower memory cell includes a lower write transistor having a structure in which the upper write transistor is upside down, and a lower read transistor having a structure in which the upper read transistor is upside down.

15. A capacitorless 3D DRAM device comprising:

a write bit line extending in a vertical direction;

a write word line extending in a horizontal direction;

a write transistor connected to the write bit line and the write word line, and defined to include a first channel material layer, a first gate insulating layer, and a portion of the write word line;

a read bit line extending in the vertical direction;

a read word line extending in the horizontal direction; and a read transistor connected to the read bit line and the read word line, and defined to include a second channel layer pattern including a first portion which is disposed to be adjacent to the read bit line and extends in a horizontal direction, and a second portion which is spaced apart from the read bit line and extends in a direction having a given angle with respect to the first portion, and a second gate insulating layer.

16. The capacitorless 3D DRAM device of claim 15, wherein the first portion of the second channel layer pattern is in contact with the read bit line, wherein the second portion of the second channel layer pattern extends in a vertical direction from an edge region of the first portion and is spaced apart from the read bit line and is configured to partially surround the read bit line.

17. The capacitorless 3D DRAM device of claim 15, wherein the second portion has a concave shape with respect to the read bit line.

18. The capacitorless 3D DRAM device of claim 15, wherein the read word line is arranged to surround a portion of an outer surface of the second portion between the second gate insulating layer and the second channel layer pattern.

19. The capacitorless 3D DRAM device of claim 15, wherein the second gate insulating layer is disposed between the first channel material layer and the second channel layer pattern and has a structure surrounding the read word line, and one end portion of the second gate insulating layer is in contact with an end portion of the second portion.

20. The capacitorless 3D DRAM device of claim 15, wherein the read word line has a structure in which arc-shaped electrode units are connected in series.

21. The capacitorless 3D DRAM device of claim 15, wherein the write word line has a structure in which arc-shaped electrode units are connected in series.

22. The capacitorless 3D DRAM device of claim 15, wherein the write word line is disposed between the write bit line and the read word line, and the read word line is disposed between the write word line and the read bit line.

23. The capacitorless 3D DRAM device of claim 15, wherein the write bit line is shared by two adjacent memory cells on both sides of it, and the read bit line is shared by two adjacent memory cells on both sides of it.

24. The capacitorless 3D DRAM device of claim 15, wherein the write transistor is an upper write transistor, wherein the read transistor is an upper read transistor, wherein the upper write transistor and the upper read transistor constitute an upper memory cell.

25. The capacitorless 3D DRAM device of claim 24, wherein a lower memory cell having a structure in which the upper memory cell is upside down is disposed below the upper memory cell, wherein the lower memory cell includes a lower write transistor having a structure in which the upper write transistor is upside down, and a lower read transistor having a structure in which the upper read transistor is upside down.

26. A manufacturing method of capacitorless 3D DRAM comprising:

forming a stack having a stacked structure including a separation layer, and a first channel material layer, a first gate insulating layer, a first insulating layer, a second insulating layer, and a buffer layer which are sequentially stacked on the separation layer;

forming a patterned stack including a plurality of pattern portions and first and second pattern extension portions extending in a direction connecting the plurality of pattern portions by patterning the stack, wherein the plurality of pattern portions extend in a first direction, and are spaced apart from each other in a second direction orthogonal to the first direction, and the first and second pattern extension portions extend in the second direction;

a first structure including the patterned stack and a first filling material by filling the first filling material between the plurality of pattern portions and between the first and second pattern extension portions;

forming a first vertical hole penetrating through each of the plurality of pattern portions in a vertical direction in the first structure;

forming a first horizontal hole by removing the first insulating layer from the first pattern extension portion while forming a first recess by recessing the first insulating layer around the first vertical hole of the first structure;

defining a write transistor including the first channel material layer, the first gate insulating layer, and a portion of a write word line by forming the write word line extending in a horizontal direction in the first recess and the first horizontal hole;

removing the first filling material from the first structure and removing a portion of the first channel material layer from the first and second pattern extension portions;

forming a second structure including the plurality of pattern portions, the first and second pattern extension portions, and a second filling material by filling the second filling material between the plurality of pattern portions where the write transistor is defined, and between the first and second pattern extension portions;

forming a write bit line extending in a vertical direction at a position corresponding to the first vertical hole;

forming a second vertical hole penetrating through each of the plurality of pattern portions in a vertical direction in the second structure;

forming a second horizontal hole by removing the second insulating layer from the second pattern extension portion while forming a second recess by recessing the second insulating layer around the second vertical hole of the second structure;

forming a third recess by recessing the first insulating layer, the first gate insulating layer, and the first channel material layer exposed by the second vertical hole;

forming a second gate insulating layer on an inner surface of the second vertical hole including surfaces of the second and third recesses, and an inner surface of the second horizontal hole;

forming a read word line extending in a horizontal direction on the second gate insulating layer in the second recess and the second horizontal hole;

forming a second channel material layer on the second gate insulating layer and the read word line exposed on the inner surface of the second vertical hole;

defining a read transistor including a second channel layer pattern and the second gate insulating layer by defining the second channel layer pattern from the second channel material layer; and forming a read bit line extending in a vertical direction at a position corresponding to the second vertical hole.

27. The manufacturing method of capacitorless 3D DRAM of claim 26, wherein the first insulating layer includes a silicon nitride, wherein the second insulating layer includes a silicon oxide, wherein the buffer layer includes a silicon.

28. The manufacturing method of capacitorless 3D DRAM of claim 26, wherein the separation layer includes a silicon oxide having a first density, wherein the second insulating layer includes a silicon oxide having a second density less than the first density.

29. The manufacturing method of capacitorless 3D DRAM of claim 26, wherein the defining the write transistor includes:

forming a write word line material layer inside the first recess and the first horizontal hole and an inner surface of the first vertical hole;

removing a portion formed on the inner surface of the first vertical hole from the write word line material layer; and forming a first filling insulating layer which fills the first vertical hole.

30. The manufacturing method of capacitorless 3D DRAM of claim 29, further comprising recessing a portion of the buffer layer exposed by the first vertical hole after the removing a portion formed on the inner surface of the first vertical hole from the write word line material layer.

31. The manufacturing method of capacitorless 3D DRAM of claim 29, wherein the forming the write bit line includes:

forming a first through hole by etching the first filling insulating layer at a position corresponding to the first vertical hole of the second structure; and forming the write bit line in the first through hole.

32. The manufacturing method of capacitorless 3D DRAM of claim 26, wherein the forming the read word line includes:

forming an electrode material layer filling the second recess and the second vertical hole on the second gate insulating layer; and removing a remaining portion except for a portion disposed at the second recess and the second vertical hole in the electrode material layer.

33. The manufacturing method of capacitorless 3D DRAM of claim 26, after the forming the second channel material layer, further comprising:

forming a second filling insulating layer on the second channel material layer to fill the third recess and the second vertical hole;

forming a second through hole in a position corresponding to the second vertical hole in the second filling insulating layer;

recessing the buffer layer and the second channel material layer exposed by the second through hole; and forming a third filling insulating layer to fill the second through hole.

34. The manufacturing method of capacitorless 3D DRAM of claim 33, wherein the forming the read bit line includes:

forming a third through hole by etching the third filling insulating layer or the second and third filling insulating layers at a position corresponding to the second vertical hole of the second structure; and forming the read bit line in the third through hole.

35. The manufacturing method of capacitorless 3D DRAM of claim 26, wherein a portion of the first insulating layer remains between the first channel material layer of the write transistor and the read word line connected to the read transistor.

36. The manufacturing method of capacitorless 3D DRAM of claim 26, wherein the stack includes a structure in which the stacked structure is repeatedly stacked, wherein a plurality of write transistors corresponding to the write transistor are stacked in the vertical direction and spaced apart from each other, wherein a plurality of read transistors corresponding to the read transistor are stacked in the vertical direction and spaced apart from each other, wherein the write bit line is commonly connected to a plurality of write transistors spaced apart in the vertical direction, wherein the read bit line is commonly connected to a plurality of read transistors spaced apart in the vertical direction.

37. A capacitorless 3D DRAM device comprising:

a write bit line extending in a vertical direction;

a write word line extending in a horizontal direction;

a write transistor connected to the write bit line and the write word line, and defined to include a first channel material layer, a first gate insulating layer, and a portion of the write word line;

a read bit line extending in the vertical direction;

a read word line extending in the horizontal direction; and a read transistor connected to the read bit line and the read word line, and defined to include a second channel layer pattern and a second gate insulating layer, wherein the write transistor and the read transistor constitute one memory cell, and the write word line and the read word line connected to the one memory cell are arranged at different heights.

38. The capacitorless 3D DRAM device of claim 37, wherein the read word line is disposed at a higher position than the write word line.

39. The capacitorless 3D DRAM device of claim 37, wherein the write word line includes:

a line-type extension portion extending as a line shape in a direction perpendicular to a direction connecting the write transistor and the read transistor; and a protruding-type expansion portion protruding and expanding from the line-type extension portion to a direction parallel to the direction connecting the write transistor and the read transistor.

40. The capacitorless 3D DRAM device of claim 37, wherein the read word line includes:

a line-type extension portion extending as a line shape in a direction perpendicular to a direction connecting the write transistor and the read transistor; and a protruding-type expansion portion protruding and expanding from the line-type extension portion to a direction parallel to the direction connecting the write transistor and the read transistor.

41. The capacitorless 3D DRAM device of claim 37, wherein a first insulating layer pattern is disposed between the first gate insulating layer and the second gate insulating layer, in a region between the first channel material layer of the write transistor and the read word line connected to the read transistor.

42. The capacitorless 3D DRAM device of claim 41, wherein the first insulating layer pattern is in contact with a side surface of the write word line and thus, is disposed at the same height as that of the write word line.

43. The capacitorless 3D DRAM device of claim 37, wherein the second channel layer pattern includes:

a first portion connected to the read bit line and extending in a horizontal direction; and a second portion extending in a direction having a given angle with respect to the first portion.

44. The capacitorless 3D DRAM device of claim 37, wherein a plurality of write transistors corresponding to the write transistor are spaced apart from each other and stacked in the vertical direction, wherein a plurality of read transistors corresponding to the read transistor spaced apart from each other and stacked in the vertical direction, wherein the write bit line is commonly connected to a plurality of write transistors spaced apart in the vertical direction, wherein the read bit line is commonly connected to a plurality of read transistors spaced apart in the vertical direction.

\* \* \* \* \*